US012705151B2

(12) United States Patent
Pachoud et al.

(10) Patent No.: US 12,705,151 B2
(45) Date of Patent: Aug. 11, 2026

(54) BRANCHING POWER CORD SYSTEM

(71) Applicant: Zonit Structured Solutions, LLC, Boulder, CO (US)

(72) Inventors: William Pachoud, Boulder, CO (US); Steve Chapel, Iliff, CO (US)

(*) Notice: Subject to any disclaimer, the term of this patent is extended or adjusted under 35 U.S.C. 154(b) by 0 days.

(21) Appl. No.: 16/905,822

(22) Filed: Jun. 18, 2020

(65) Prior Publication Data

US 2021/0076529 A1 Mar. 11, 2021

Related U.S. Application Data

(63) Continuation of application No. 16/666,118, filed on Oct. 28, 2019, now abandoned, which is a (Continued)

(51) Int. Cl.

| | |
|---|---|
| ***G06F 11/30*** | (2006.01) |
| ***G06F 1/26*** | (2006.01) |
| ***H01R 24/20*** | (2011.01) |
| ***H02G 15/113*** | (2006.01) |
| ***H02J 1/00*** | (2006.01) |

(Continued)

(52) U.S. Cl.

CPC ............ *G06F 11/3058* (2013.01); *G06F 1/26* (2013.01); *H01R 24/20* (2013.01); *H02G 15/113* (2013.01); *H02J 1/001* (2020.01); *H02J 1/14* (2013.01); *H02J 9/061* (2013.01); *H05K 7/1491* (2013.01); *H05K 7/1492* (2013.01); *H01R 13/20* (2013.01)

(58) Field of Classification Search

CPC .............................. H05K 7/1492; H01R 24/20

See application file for complete search history.

(56) References Cited

U.S. PATENT DOCUMENTS 3,049,688 A * 8/1962 Sinopoli .............. H01R 25/006 439/41

3,239,791 A * 3/1966 Fyrk .................... H01R 13/447 439/144

(Continued)

FOREIGN PATENT DOCUMENTS

CN 101464684 6/2009

CN 102047514 5/2011

(Continued)

OTHER PUBLICATIONS

International Search Report and Written Opinion issued in co-pending International Application No. PCT/US2019/021936, Korean Intellectual Property Office, dated Aug. 2, 2019, 13 pages.

(Continued)

*Primary Examiner* — Neil Abrams

(74) *Attorney, Agent, or Firm* — Davis Graham & Stubbs

(57) ABSTRACT

The invention addresses the needs associated with the entire data center power distribution lifecycle—design, build, operation and upgrades. The design and construction is facilitated by a system for prefabricating power whips that accommodate changing data center needs. The invention also allows for upgrading power supply components without powering down critical equipment. Improved power and network strips and associated logic further facilitate data center operation.

11 Claims, 104 Drawing Sheets

Related U.S. Application Data continuation of application No. 16/351,431, filed on Mar. 12, 2019, now abandoned.

(60) Provisional application No. 62/641,943, filed on Mar. 12, 2018, provisional application No. 62/641,929, filed on Mar. 12, 2018.

(51) Int. Cl.
*H02J 1/14* (2006.01)
*H02J 9/06* (2006.01)
*H05K 7/14* (2006.01)
*H01R 13/20* (2006.01)

(56) References Cited

U.S. PATENT DOCUMENTS 3,297,886 A * 1/1967 Danner ................ H01R 25/006 307/112
3,786,312 A * 1/1974 Roussard ................ H02B 1/52 361/625
4,208,643 A 6/1980 Snaper
4,245,880 A * 1/1981 Zimmerman, Jr. .. H01R 25/006 439/406
4,489,995 A * 12/1984 Barr ........................ F25D 29/00 312/236
4,500,150 A * 2/1985 Leibensperger ....... H01R 13/72 439/502
4,721,475 A 1/1988 Burke, Jr.
5,236,374 A * 8/1993 Leonard ................. H01R 31/02 439/505
5,348,485 A * 9/1994 Briechle ................ H01R 25/14 439/121
5,352,132 A 10/1994 O'Keefe et al.
5,507,664 A 4/1996 Carmo
5,581,192 A 12/1996 Shea
6,113,198 A * 9/2000 Hommes ................. A47F 3/001 211/26
6,329,616 B1 * 12/2001 Lee ...................... H01R 25/003 200/51.03
6,410,994 B1 * 6/2002 Jones ................... H01R 13/514 307/42
6,507,882 B1 * 1/2003 Golka ..................... G06F 1/184 710/305
6,666,712 B1 * 12/2003 Kramer ................ H01R 25/003 439/535
6,805,579 B2 * 10/2004 Marchand ............ H01R 25/003 439/502
6,827,583 B2 * 12/2004 Izzo ..................... H05K 7/1459 361/752
6,879,088 B2 4/2005 Wong
6,894,237 B2 5/2005 Wong
7,210,960 B2 * 5/2007 Mak ..................... H01R 25/003 439/505
7,229,302 B1 * 6/2007 Lai ....................... H01R 25/003 439/214
7,510,426 B2 * 3/2009 Hwang .................. H01R 13/60 191/12.4
7,553,181 B1 6/2009 Van Dalinda, III
7,791,890 B2 * 9/2010 Ishida .................. H05K 7/1492 361/796
7,977,825 B2 * 7/2011 Gilbert .................... G06F 1/266 307/131
7,994,654 B2 * 8/2011 Lee ...................... H01R 13/665 307/39
8,004,115 B2 8/2011 Chapel et al.
8,061,534 B2 * 11/2011 Laursen ................... H04Q 1/09 211/26
8,152,554 B2 4/2012 Chapel et al.
8,174,149 B2 5/2012 Chapel et al.
8,374,729 B2 2/2013 Chapel et al.
8,376,782 B2 * 2/2013 Govekar .............. H01R 25/006 439/502
8,400,765 B2 * 3/2013 Ross .................. H05K 7/20836 360/99.18
8,453,471 B2 6/2013 Chapel et al.
8,476,540 B2 7/2013 Dahl et al.
8,582,299 B1 * 11/2013 Phillips ................ H05K 7/1492 361/727
8,729,730 B2 5/2014 Lathrop
8,801,122 B2 8/2014 Chapel et al.
8,848,722 B2 9/2014 Chapel et al.
8,907,520 B2 12/2014 Chapel et al.
8,917,493 B2 * 12/2014 Wang .................. H05K 7/1492 174/70 B
9,065,207 B2 6/2015 Chapel et al.
9,160,168 B2 10/2015 Chapel et al.
9,281,617 B2 3/2016 Reaves et al.
9,431,763 B2 8/2016 Chapel et al.
9,588,534 B2 3/2017 Chapel et al.
9,601,284 B2 3/2017 Chapel et al.
9,618,270 B2 4/2017 Chapel et al.
9,646,789 B2 5/2017 Chapel et al.
9,658,665 B2 5/2017 Chapel et al.
9,722,381 B1 * 8/2017 Moen ..................... H01R 33/88
9,793,887 B2 10/2017 Chapel et al.
9,829,960 B2 11/2017 Pachoud et al.
9,918,413 B2 3/2018 Chapel et al.
9,941,648 B2 * 4/2018 Ziobro ................. H01R 13/652
9,958,925 B2 5/2018 Chapel et al.
9,978,548 B2 5/2018 Rohner
9,996,128 B2 6/2018 Chapel et al.
9,997,957 B2 6/2018 Chapel et al.
10,034,406 B2 7/2018 Chapel et al.
10,050,441 B2 8/2018 Chapel et al.
10,068,730 B2 9/2018 Chapel et al.
10,135,268 B1 * 11/2018 Gokcebay ............. H02J 7/0013
10,209,727 B2 2/2019 Chapel et al.
10,297,958 B2 5/2019 Chapel et al.
10,326,240 B2 6/2019 Chapel et al.
10,361,050 B2 7/2019 Chapel et al.
10,474,220 B2 11/2019 Pachoud et al.
10,673,429 B2 6/2020 Chapel et al.
10,698,469 B2 6/2020 Chapel et al.
10,945,351 B2 3/2021 Chapel et al.
11,085,714 B2 8/2021 Doll et al.
11,289,844 B2 3/2022 Pachoud et al.
2003/0117761 A1 6/2003 Pebles et al.
2003/0228803 A1 * 12/2003 Toering ................ H01R 25/003 439/652
2007/0187343 A1 8/2007 Colucci et al.
2007/0206630 A1 9/2007 Bird
2007/0259548 A1 11/2007 Byrne
2008/0150659 A1 6/2008 Yokoyama
2008/0236863 A1 10/2008 Keeven et al.
2009/0267564 A1 * 10/2009 Gerber .................. H02J 7/0013 320/114
2010/0068913 A1 3/2010 Edge
2010/0141038 A1 6/2010 Chapel et al.
2011/0205693 A1 8/2011 Jansma et al.
2011/0207362 A1 8/2011 Lifson
2012/0092811 A1 4/2012 Chapel et al.
2012/0095610 A1 4/2012 Chapel et al.
2012/0204418 A1 8/2012 Van Beveren et al.
2013/0093249 A1 4/2013 Chapel et al.
2013/0122750 A1 5/2013 Jansma et al.
2014/0025221 A1 1/2014 Chapel et al.
2014/0051273 A1 * 2/2014 Han ..................... H01R 13/447 439/136
2015/0200509 A1 7/2015 Chapel et al.
2016/0036269 A1 2/2016 Yoshida
2016/0070282 A1 3/2016 Chapel et al.
2016/0195911 A1 7/2016 Chapel et al.
2017/0005510 A1 1/2017 Rohr et al.
2017/0008638 A1 1/2017 Wavering et al.
2017/0207576 A1 7/2017 Chapel et al.
2017/0279267 A1 9/2017 Cheng
2017/0308109 A1 10/2017 Chapel et al.
2017/0367210 A1 12/2017 Chen et al.

(56) References Cited

U.S. PATENT DOCUMENTS

| | | | |
|---|---|---|---|
| 2018/0375268 A1 | 12/2018 | Chapel et al. |
| 2021/0006020 A1 | 1/2021 | Pachoud et al. |

FOREIGN PATENT DOCUMENTS

| | | | |
|---|---|---|---|
| CN | 102841635 | | 12/2012 |
| CN | 104868439 | | 8/2015 |
| CN | 105027020 | | 11/2015 |
| CN | 105556798 | | 5/2016 |
| CN | 112136369 | A | 12/2020 |
| EP | 2 483 977 | B1 | 11/2014 |
| EP | 3766315 | A1 | 1/2021 |
| JP | H06181078 | | 6/1994 |
| JP | H06181078 | A | 6/1994 |
| WO | 2008113054 | | 9/2008 |
| WO | 2013/095352 | A1 | 6/2013 |
| WO | 2013095352 | A | 6/2013 |
| WO | 2014/134218 | A1 | 9/2014 |

OTHER PUBLICATIONS

"Electrical Power Systems Simulation," MathWorks—MATLAB and Simulink Consulting Services, retrieved from https://www.mathworks.com/services/consulting/proven-solutions/electrical-power-systems-simulation.html on Oct. 15, 2021, 2 pp.

U.S. Appl. No. 12/049,130, by Chapel et al., filed Mar. 14, 2008.

U.S. Appl. No. 12/531,212, by Chapel, filed Sep. 14, 2009.

U.S. Appl. No. 12/531,231, by Chapel, filed Sep. 14, 2009.

U.S. Appl. No. 12/531,235, by Chapel et al., filed Sep. 14, 2009.

U.S. Appl. No. 12/531,240, by Chapel, filed Sep. 14, 2009.

U.S. Appl. No. 12/891,500, by Chapel et al., filed Sep. 27, 2010.

U.S. Appl. No. 12/892,009, by Chapel et al., filed Sep. 28, 2010.

U.S. Appl. No. 15/064,368, by Chapel et al., filed Mar. 8, 2016.

Extended European Search Report of European Application No. 19768681.9 mailed Nov. 5, 2021, 12 pp.

Examination report under sections 12 & 13 of the Patents Act, 1970 and the Patents Rules, 2003, dated Jul. 28, 2022, issued in IN Application No. 202017041133.

Non-Final Office Action, dated Aug. 25, 2022, issued in U.S. Appl. No. 16/817,504.

Office Action, dated Oct. 28, 2022, issued in CA Application No. 3,133,279.

Extended European Search Report, dated Nov. 8, 2022, issued in EP Application No. 20772758.7.

Office Action, dated Nov. 14, 2022, issued in CA Application No. 3,134,050.

Non-Final Office Action, dated Nov. 23, 2022, issued in U.S. Appl. No. 17/707,862.

Communication pursuant to Rules 70(2) and 70a(2) EPC, dated Nov. 25, 2022, issued in EP Application No. 20772758.7.

Extended European Search Report, dated Nov. 29, 2022, issued in EP Application No. 20769754.1.

Final Office Action, dated Dec. 5, 2022, issued in U.S. Appl. No. 17/093,485.

Final Office Action, dated Dec. 7, 2022, issued in U.S. Appl. No. 16/905,846.

Office Action, dated Jan. 4, 2023, issued in CA Application No. 3,134,065.

Notice of Allowance, dated Jan. 19, 2023, issued in U.S. Appl. No. 16/824,554.

* cited by examiner

This table shows what combinations of power distribution devices and power cords result in which rack dimension changes. It assumes a compact standard rack optimized for 30" servers (42U, 20.75"x36") and then adds volume as needed to match the device and cord choices. Note that the ratio of total rack cross-section (wXd) to payload cross-section in this example is 76.3%. This allows a focus on 2D data center floor space utilization efficiency, which is easier to visualize.

| Power Distribution Device (Height listed in RU) | Power Cord Method | Payload Space Used | Payload Space Loss by % | Zero-U capable | Rack Width Delta | Rack Depth Delta | Rack Volume Delta | Rack X-Section Delta |
|---|---|---|---|---|---|---|---|---|
| **Zonit ZPDU @ 1.5 RU & Zonit ZPDU w/ ATS @ 1.5 RU** [1] | Zonit Z-strip or Zonit Hydra Cords | 0.5-1.5U per rack | -1.1-3.6% per rack | ZPDU – No Cords - Yes | 0" | 0" | 0% | 0% |
| **Zonit ZPDU @ 1.5 RU & Zonit ZPDU w/ ATS @ 1.5 RU** | Zonit Z-strip or Zonit Hydra Cords | 0.5-1.5U per rack | -1.1-3.6% per rack | ZPDU – No Cords - Yes | 0" | 0" | 0% | 0% |
| **Zonit Busway ATS w/Zonit Plug-Adapter single or 3ϕ** | Zonit Z-strip or Zonit Hydra Cords | 0U | 0U | ZPDU – No Cords - Yes | 0" | 0" | 0% | 0% |
| **Zonit Arrowhead @ 1U w/ or w/o ATS (2 units required)** [2] | Zonit Hydra Cords or Standard Cords | 2U per rack | -4.8% per rack | ArrowH – No Cords - Yes | 0" | 0" | 0% | 0% |
| **Zonit Arrowhead @ 2U w/ or w/o ATS (1 unit required)** [3] | Zonit Hydra Cords or Standard | 2U per rack | -4.8% per rack | ArrowH – No Cords - Yes | 0" | 0" | 0% | 0% |
| **Standard Power whips or busway to Zonit Z-Strip or Zonit Hydra Cords** | Zonit Z-strip or Zonit Hydra Cords | 0U | 0U | Yes | 0" | 0" | 0% | 0% |
| **Vertical Plugstrips mounted in the sides of the rack @ rear** [6] | Standard Cords | 0U | 0U | Yes | +3.25-5" in width | 0" | +16%-24% | +16%-24% |
| **Vertical Plugstrips mounted in the back of the rack @ rear** [6] | Standard Cords | 0U | 0U | No | +4-6" in depth | 0" | +11%-17% | +11%-17% |

1. The amount of rack space used by the ZPDU depends on the selected power density as described in the patent(s) and patents pending. Using modern power density targets, a ZPDU can easily power 2-3 racks w/ 60A inputs or more racks if the power density target is lower. This yields the number of RU used per rack as shown above.
2. Zonit Arrowhead @ 1U is a single phase distribution device w/ approximately 21 receptacles. It can be offered as a horizontal plugstrip or an ATS. It is Zonit patented and patents pending.
3. Zonit Arrowhead @ 2U is a 3 phase distribution device w/ approximately 42 receptacles. It is the only ATS design available w/ sufficient receptacles to power an entire rack, which is very important as this table shows! It can be offered as a horizontal plugstrip or an ATS. It is Zonit patented and patents pending.
4. Rack Volume Delta numbers are rounded to the nearest integer value for convenience.
5. The Rack X-Section (cross-section) is a horizontal cross-section of an upright rack, as would be seen in a plan view of the data center floor layout.
6. Vertical Plugstrips are assumed to be 2'x2'x~66" and to be intelligent. This is on the slim side. There are a number of plugstrips that are larger in their cross section, up to 3.5" in depth. They require even larger racks!
7. In actual practice, the situation in most data centers is even worse than modeled here, and the floor space/payload volume losses are higher.

The Zonit ZPDU Control Module, the Zonit Micro-ATS & Mini-ATS product family, Zonit Z-Strip and Zonit Hydra Cords are all designed to be ZeroU products that do NOT increase the external dimensions of the rack, like many traditional power distribution products do! Other Zonit inventions share this characteristic for example the Zonit Mega-ATS, Zonit Busway-ATS. Zonit Z-Cool trades a slight increase in the depth of the rack door for the ability to eliminate entire cold aisles, a huge data center floor space savings. Z-Cool also enables significantly higher server density per rack, another big win.

Figure 25

T-Slot
Industry Clip-On
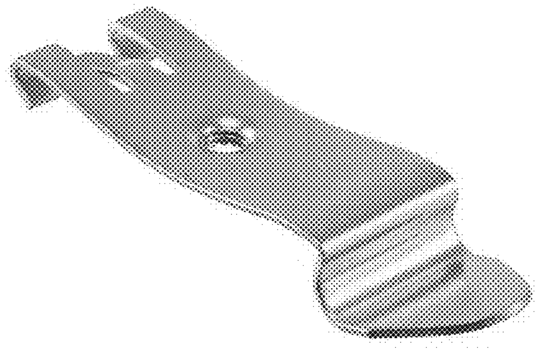
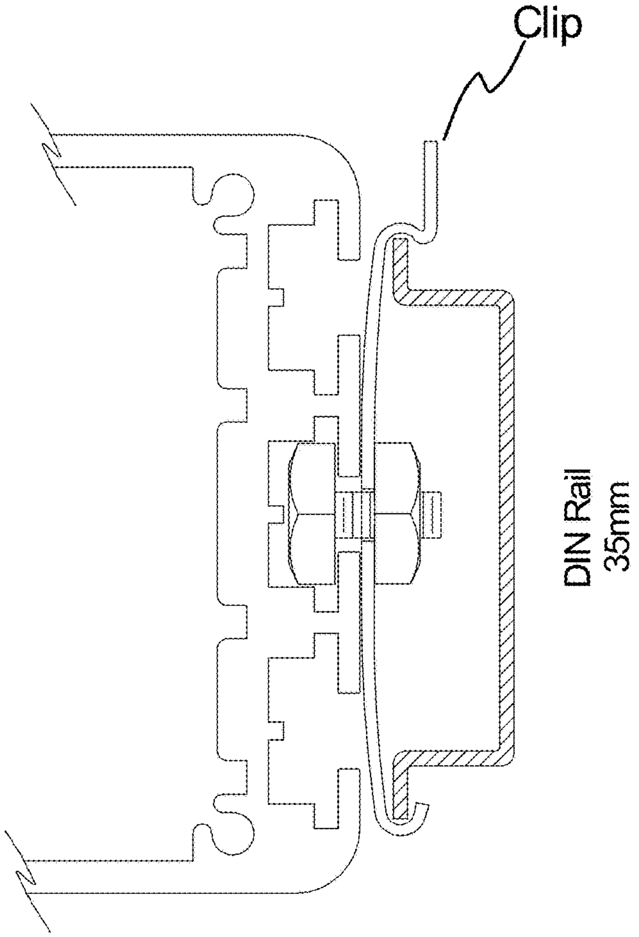
Figure 31

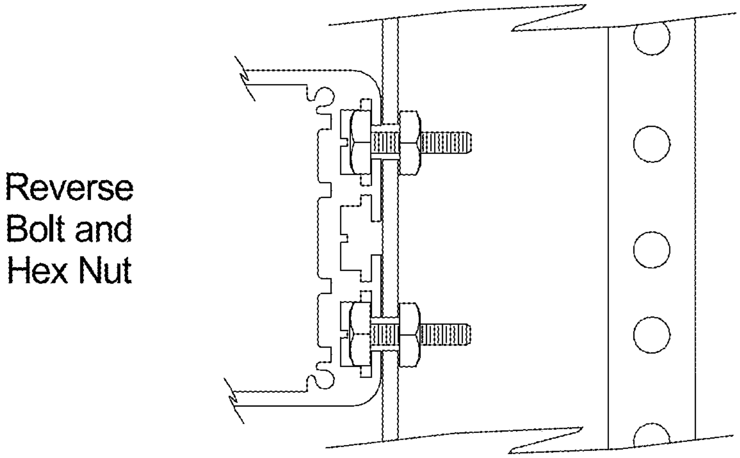
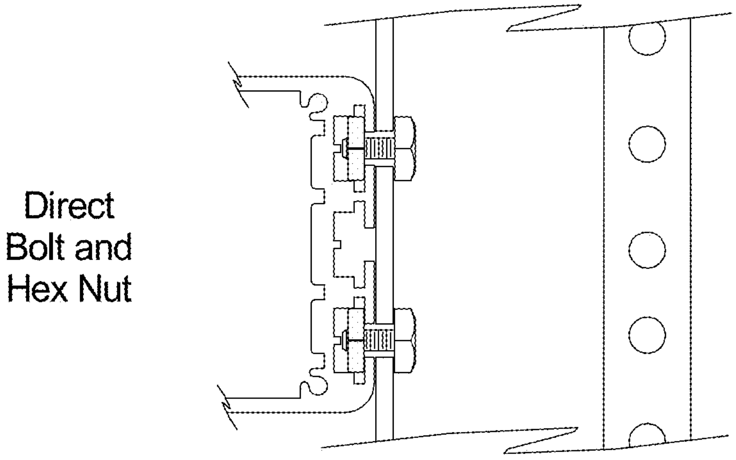
Figure 32

Hook on
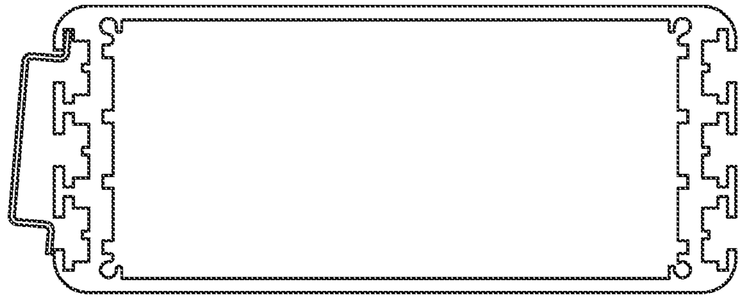
Zonit Clip On
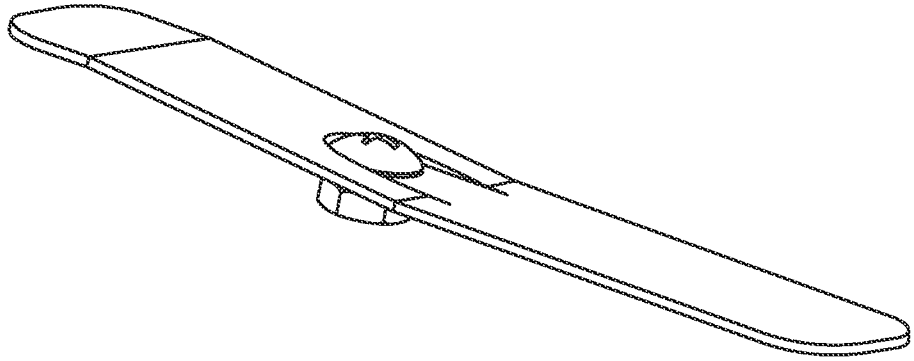
FIG.34

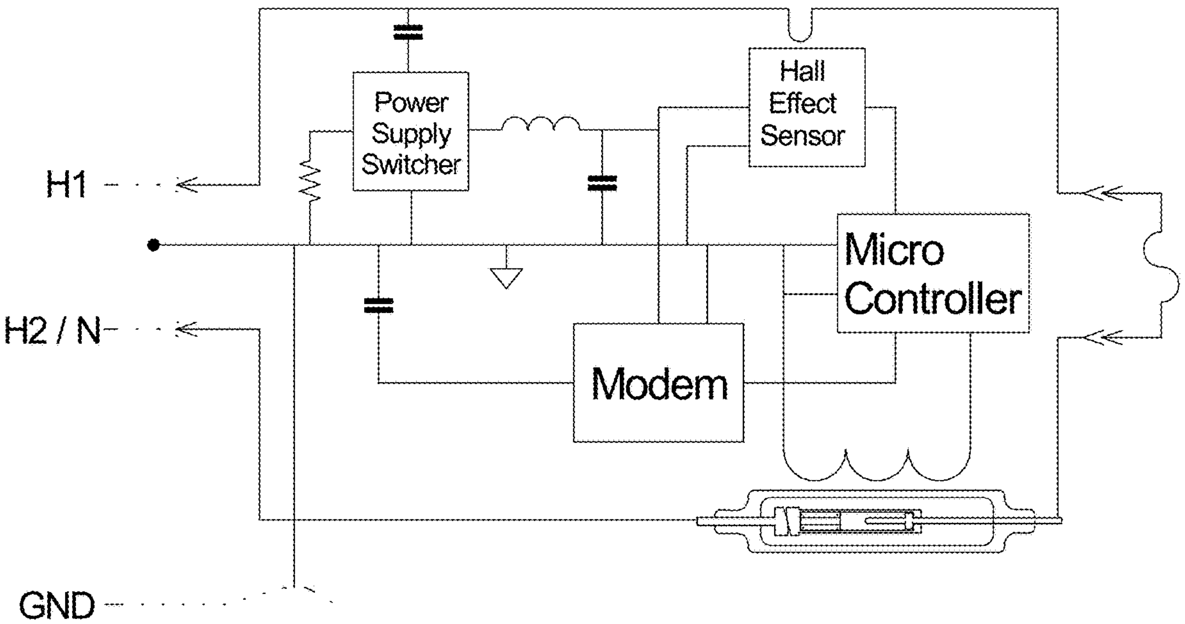
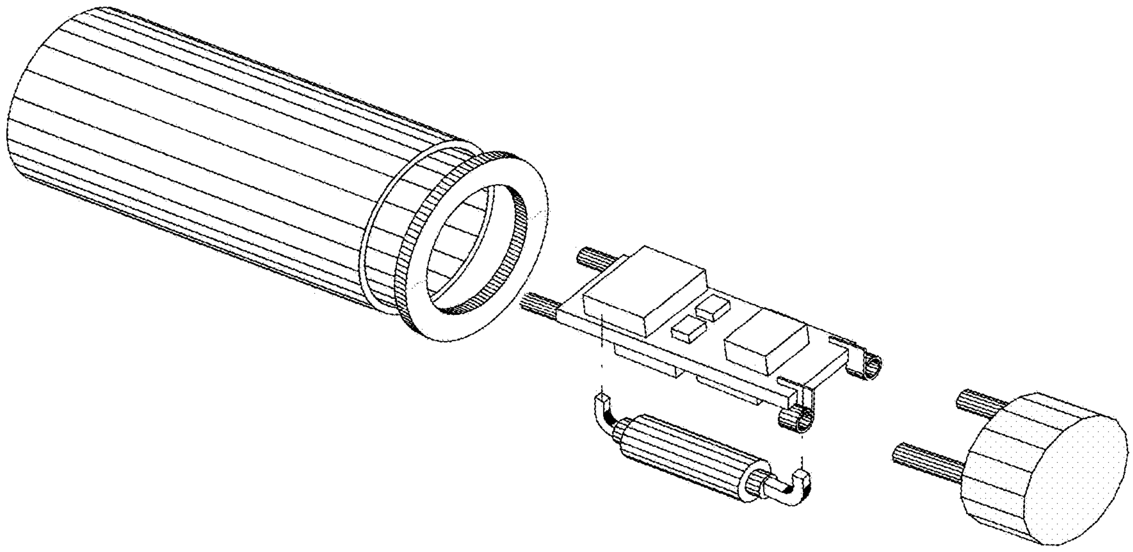
Figure 43

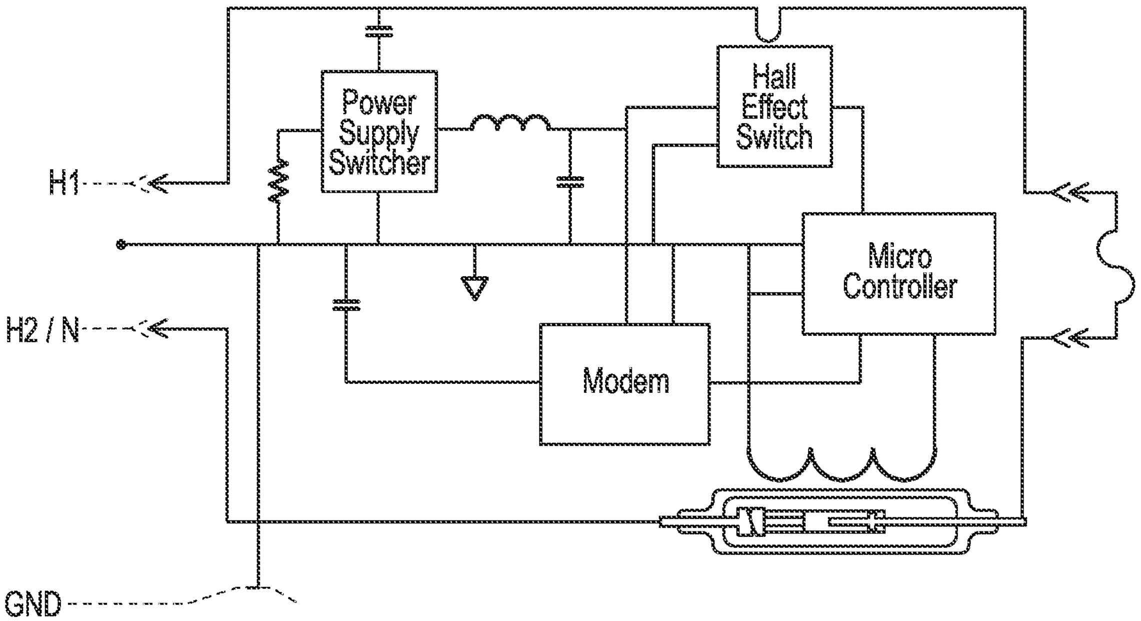
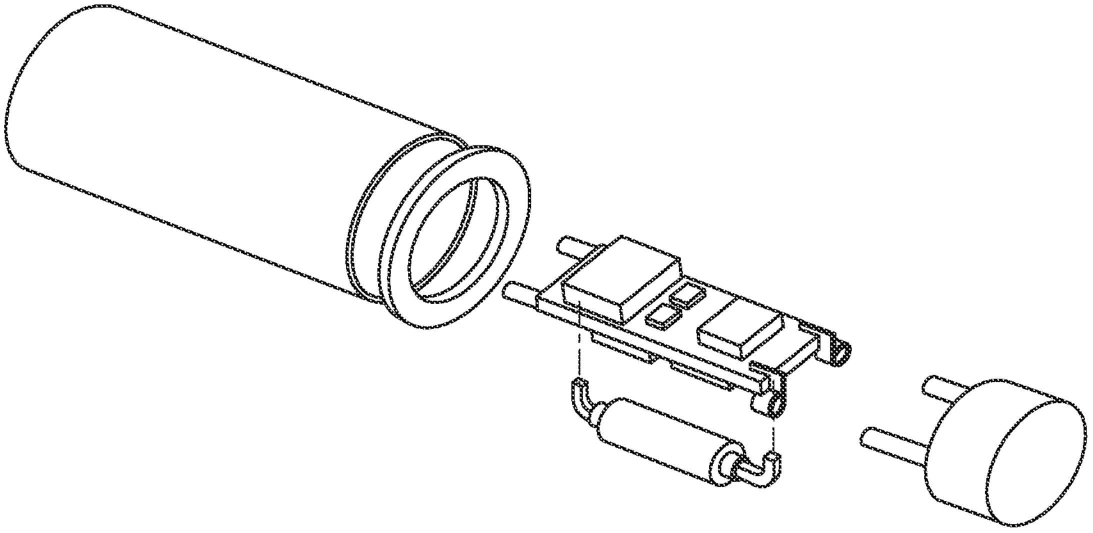
FIG.44

Mini-ATS Model - Mini-ATS-AR-20A

Notes:

1. Clear Ring under Endplate for LED indicator viewing; LED's can be on input or output end depending on model 2. Clear Ring can be perforated &/or crenellated for better LED viewing & providing airflow passages for models with cooling fans, and used at both ends.

3. Reset button can change A-B power preference or clear overload trip

4. Comm port is located above Reset button.

5. Comm port shown is USB Type C, other connectors can be used on other models

6. Pigtail input/output models work the same

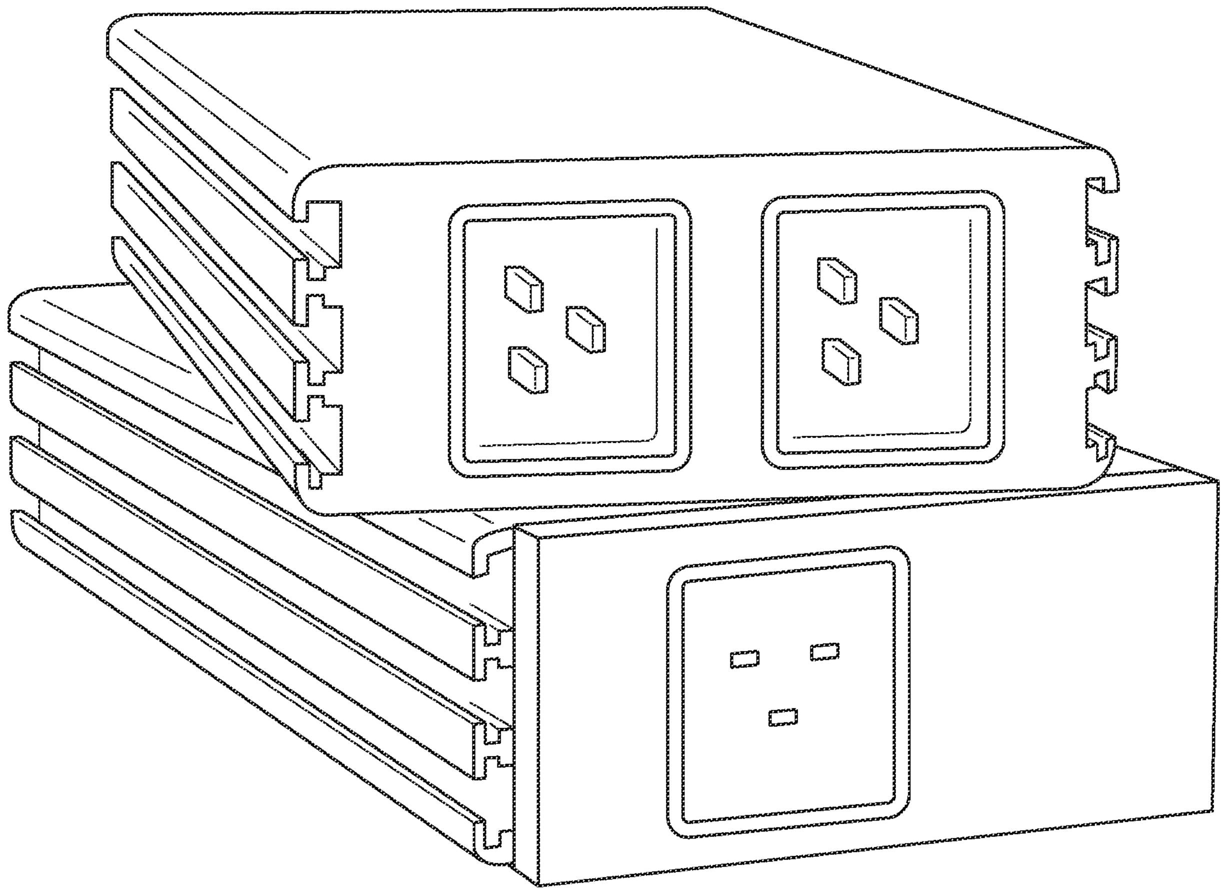

FIG.72B

ZONIT
Structured Solutions

Zonit D 1, Boulder, Colorado - 2-'-1-22-7-U20/F
2 devices, 5 sensors connected

Current status History Settings About

Recent Events
2019-03-10 22:49:43 Power Transfer:B→A
2019-03-10 22:48:09 Power Transfer:A→B Network
Hostname zonit-dc-demo
Ethernet 192.88.205.55

Uptime
MM Uptime Days 1 Hrs 8 Min :18 Sec :27

Sensor Readings Sensor Type: PQM Sensor x Humidity x x v Location: Showing All...

Temperature
Airflow
Moisture Present
Rack Door Open

Mini-ATS
○ Src. A Over-Volt High Current ○ Over C... High Current ○ Over Current ○ Src. 8

| Source | Status | Current | Voltage | Current | Voltage | Line Freq. |
|---|---|---|---|---|---|---|
| A | Active | 2.46 A | 120.2V | 2.29 A | 120.2V | 58.7 Hz. |
| B | Standby | | 120.2V | | 120.2V | 58.7 Hz. |

Env. Sensor
Humidity 10.83
Temperature 27.19

Sensor Readings Sensor Type: Temperature x Humidity x Location: Showing All...

Env. Sensor
Temperature 25.81

Env. Sensor
Temperature 23.18

Env. Sensor
Temperature 33.25

Env. Sensor
Temperature 26.00

Env. Sensor
Humidity 10.83
Temperature 27.19

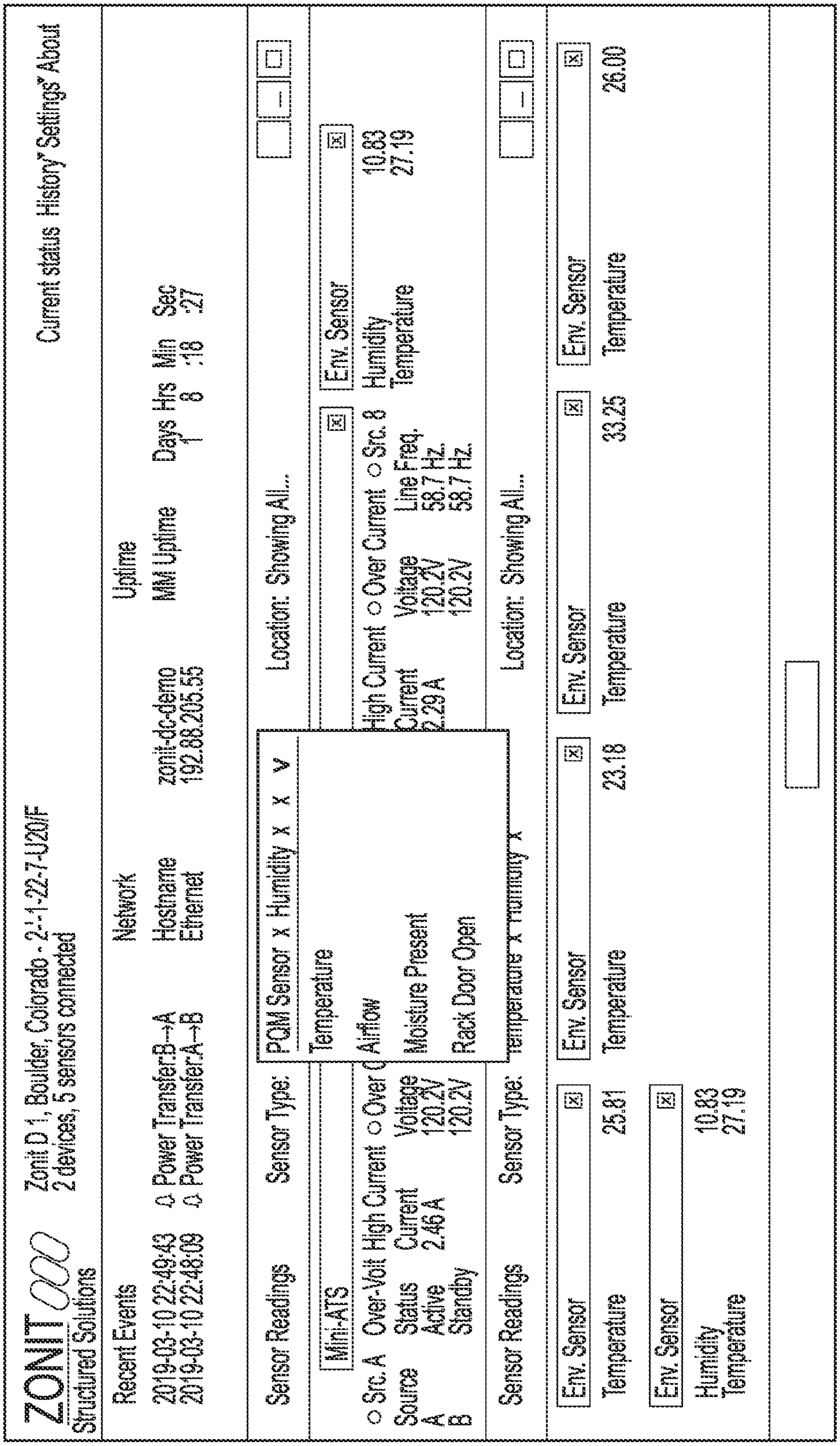

FIG.78

ZONIT
Structured Solutions
Zonit DC 1, Boulder, Colorado -2-1-22-7 - U20/F
2 Devices, 5 Sensors connected
Current status History Settings About Settings - General Location
State Colorado
City Boulder
Facility Zonit DC 1
Floor 2
Room
Cage 1
Row 22
Rack 7
U-position 20
Front/Back Unknown Front Back Save Units of Measure
Imperial

BRANCHING POWER CORD SYSTEM

CROSS-REFERENCE TO RELATED APPLICATION

This application is a continuation of U.S. patent application Ser. No. 16/351,431, entitled, "MANAGEMENT MODULE, Z-STRIP, AND MINI-ATS SYSTEMS AND RELATED COMPONENTS," filed on Mar. 12, 2019, which is a non-provisional of U.S. Provisional Application No. 62/641,929, entitled, "MANAGEMENT MODULE, Z-STRIP, AND MINI-ATS SYSTEMS AND RELATED COMPONENTS," filed Mar. 12, 2018 and a non-provisional of U.S. Provisional Application No. 62/641,943, entitled, "POWER DISTRIBUTION USING HYDRA CABLE SYSTEMS," filed, Mar. 12, 2018. The contents of the above-noted applications are incorporated by reference herein as if set forth in full and priority to this application is claimed to the full extent allowable under U.S. law and regulations.

FIELD OF INVENTION

The present invention relates to the design and operation of data centers and, in particular, to systems and functionality to supplying power in data center environments.

BACKGROUND OF THE INVENTION

The present invention addresses specific issues that arise in the design, implementation, operation and upgrading of data center environments. Data centers have a specific set of issues that they must face in relation to power supply and management, and the traditional methods in this area were developed from prior industrial electrical practice in a time when a typical data center held very small numbers of mainframe computers and the change rate was low. Now, data centers often contain tens of thousands of electronic data processing (EDP) devices with high rates of change and growth. Data centers are also experiencing rapidly growing power capacity demands driven by CPU power consumption that is currently increasing at a rate of approximately 1.2 annually. The methods developed in the past were not adopted to cope with these change rates, and data centers are therefore having great difficulty in scaling to meet those needs.

SUMMARY OF THE INVENTION

The present invention is directed to systems and methods for addressing needs associated with the entire data center power distribution system lifecycle; design, build, operation and upgrades. It enables professional design practice, consistent and reliable buildouts, high operational change rates with minimum cost and disruption, supports almost all needed power configurations and allows data center power distribution capacity upgrades to be easily accomplished while delivering very high reliability power distribution and meeting the service availability levels demanded of modern 7×24×365 data center environments.

At a high level, the invention enables a superior design process, coupled with an improved materials fabrication and installation method. It also delivers a superior operational environment and provides a pre-engineered turnkey A-B redundant power distribution layer that enables and encapsulates the vast majority of changes needed in power delivery configurations, capacity provisioning and upgrades to equipment racks during the data center lifecycle. This reduces operational costs enormously and reduces risk compared to the traditional methodology where every power configuration change is made "hot" at the PDU's by adding or removing power whips.

It also greatly reduces the difficulty and costs of upgrading power distribution capacity which in the traditional methodology is both expensive and operationally disruptive. Further, it also enables embedded power/environmental/security monitoring and management capabilities at the rack level, where they can best be used to gather data that can be used to assemble a very detailed and coherent picture of what is really happening in the data center.

The objectives of the present invention include the following:

- To allow engineers and architects to design a power distribution system all the way to the rack, by isolating the power type and receptacle dependencies in the rack from the power whips (the power system is uniformly A-B redundant by design with two independent power sources, identified as power sources A and B);
- To enable prefabrication of the power branch distribution lines (whips) based on the design plan to allow quicker, cheaper, well documented and more error free installation;
- To reduce or eliminate the need to install multiple data communication cabling systems in parallel in the data center, reducing cost and improving cooling airflow. The invention thereby also reduces cabling clutter in the rack for required communication cabling while enabling unique Universal Serial Bus (USB)/Keyboard Video Mouse (KVM) connectivity features;
- To reduce or eliminate the need to install multiple network cables for TCP/IP connectivity in the equipment cabinet;
- To allow power distribution configuration changes to be made at the rack with little or no changes to the power whips (this greatly lowers cost, minimizes risk and eliminates the constant need for re-configuration by electricians);
- To allow the power receptacle configuration in the rack to be changed with minimum effort and disruption;
- To allow the data center manager to select between multiple modes of power distribution in the rack and have a secured level of control of power distribution;
- To provide unique in-cabinet User Interface features that make the system much easier to use for data center staff and end users;
- To allow data center managers to provision power as desired to one or any arbitrary set of power receptacles to meet customer needs and set policy based reactions to over-limit capacity demands (This can further be used to control power startup timing and sequencing in cold start or power restoration scenarios, It can also be used to control the shutdown of one or any arbitrary set of receptacles in any desired sequence or sets of sequences to accomplish intelligent load shedding in the data center);
- To allow power capacity to be upgraded with minimum disturbance to power whips, power distribution components and equipment installed and running in racks;
- To enable reporting of a per receptacle power quality with very high accuracy, and allow multiple individual power quality measurements to be integrated into a larger overall report of power quality in the data center for, among other things, isolation and reporting of quality power issues, (this capability to "see" the power quality in high detail can also be used to diagnose problems with equipment connected to monitored receptacles because equipment that is starting to fail (particularly in its power supplies) create disturbances in the power waveform that can be recognized and analyzed, this is commonly referred to as "signature analysis");

To allow detailed control and reporting of the power distribution configuration, and power/security/environment status and energy usage in the data center;

These objectives and others are addressed in accordance with the present invention by providing various systems, components and processes for improving power distribution. Many aspects of the invention, as discussed below, are applicable in a variety of contexts. However, the invention has particular advantages in connection with data center applications. In this regard, the invention provides considerable flexibility in configuring and reconfiguring data center environments. The invention also assists personnel in configuring and servicing data center equipment as may be advantageous, particularly in co-location data centers. The invention also reduces downtime of data center equipment and facilitates remote operation of data center equipment as well as organized powering down and powering up of equipment.

In accordance with one aspect of the present invention, a method and apparatus are provided for distributing power via plug strip modules. The plug strip modules include a number of plug receptacles, a first connector for interconnecting the power strip module to another power strip module, and a power plug port for receiving a detachable power plug for providing power to the power strip module. The modules can be physically interconnected to form a power strip of the desired size. The modules may also be electrically interconnected to function as a single power strip. Alternatively, each module may have its own power cord thus providing significant operational flexibility. The electrical and mechanical connections can be integrated into a single coupling.

In one implementation, a power strip module has a length that is no more than about one-half the height of a data center rack. The power strip module can be mounted to the data center rack in a substantially vertical orientation using the same hardware that is used to mount a full-height power strip. Moreover, two of the modules may be interconnected to form a full-height power strip. The modules may be electrically interconnected to function as a single full-height power strip, or they may each a separate power cord so as to provide greater power density to the rack. The receptacle type in a single module can also be different in each module to add deployment flexibility so long as total amperage limits of the branch circuit are respected. This allows modules to be connected with different receptacle types to meet power deployment requirements.

In accordance with another aspect of the present invention, an intelligent power distribution system is provided. The system includes: a monitoring device for monitoring a power signal delivered to one or more electrical devices via a set of one or more receptacles; a controller for performing a comparison of monitored values to reference values defined by a policy; and a switch system for selectively interrupting the delivery of power to one or more receptacles of the set of receptacles based on the comparison. For example, the intelligent power distribution system may function as a set of intelligent circuit breakers. In this regard, the loading of each receptacle, or each subset of receptacles, may be monitored in relation to a power distribution policy. When a policy violation is identified, power may be interrupted to the monitored receptacle or subset of receptacles. In this manner, the circuit breaker functionality can be implemented intelligently and with respect to specific devices associated with specific receptacles. In addition, the inventive system allows electrical devices to be turned on or turned off in a defined sequence as may be desired particularly in a data center context.

In accordance with a still further aspect of the present invention, an apparatus and associated methodology are provided for allowing manual configuration of a plug strip or outlet (collectively, "receptacle device"). The system includes a receptacle device having one or more plug receptacles and a controller having a first configuration for monitoring power delivery via the receptacle device and a second configuration for monitoring and controlling power delivery via the receptacle device. For example, in the second configuration, logic may be enabled for remotely controlling one or more of the plug receptacles, for example, to enable or interrupt power delivery via the receptacle. It will be appreciated that some operators may choose to disable such remote operation, at least for certain equipment or at certain times. This may be desired for security purposes.

Accordingly, in one implementation, the controller may be manually operable to select either the first configuration or the second configuration. For example, a key may be required to switch a plug strip between the first and second configurations. In one implementation, more than two configurations may be supported in this regard. For example, a four configuration implementation may include the following configurations: 1) monitored and switched—all receptacles can be remotely turned on or off, 2) monitored only—the last set receptacle on/off configuration remains active, but no changes can be made 3) monitored only—all receptacles on, and 4) all receptacles powered off. In this manner, significant flexibility is provided in allowing intelligent remote operation or conventional operation.

In accordance with another aspect of the present invention, light signaling is provided in connection with a receptacle device. An associated apparatus includes a receptacle device having one or more plug receptacles, at least one optical device (e.g., an LED) associated with at least one plug receptacle of the receptacle device, and logic for operating the optical device. For example, an operator may thereby control the optical device, e.g., via a LAN or WAN, to activate the optical device. This may be done for a variety of reasons such as to light the vicinity of the receptacle device, identify the receptacle device where servicing is required, to signal state information or display signaling to identify a power source, phase, etc. The optical devices in a plug strip with a number of receptacles can also be used as a group or sub-groups to indicate other information such as plugstrip or equipment cabinet state, location, etc. It will be appreciated that this may be particularly advantageous in co-location data center environments where servicing personnel may be unsophisticated or unfamiliar with the data center configuration.

In accordance with a still further aspect of the present invention, a method is provided for facilitating reconfiguration of a power distribution environment. An associated method involves redundantly connecting an electrical device to a first receptacle device associated with an A power source and a second receptacle device associated with a B power source, configuring the receptacle devices so that the A and B power sources are provided by separate first and second power supply units, disconnecting the electrical device from the first power supply unit and upgrading one of the first power supply unit and the first receptacle device. In one implementation, electrical devices are associated with multiple power supplies, and each of the power supplies include multiple power sources. Appropriate switches are provided for automatically switching between power sources in the event that a primary power source is interrupted. In this manner, the power distribution environment can be reconfigured without concern regarding interrupting power to critical equipment.

In accordance with another aspect of the present invention, a side access system is provided for use in distributing power to data center equipment. The system is used in connection with an enclosure having a number of vertically distributed shelves, each shelf having a front with a first side-to-side dimension and a side with a second front-to-back dimension, where the second dimension is greater than the first dimension. As noted above, the enclosure may be, for example, an enclosure or rack. The system includes a power strip having a number of electrical outlets spatially distributed along a longitudinal axis and support structure for supporting the power strip on the enclosure such that the longitudinal axis extends along a side of one of the shelves. For example, the power strip may be aligned with a front-to-back axis of the enclosure or may be disposed at an angle relative to the front-to-back axis, preferably any such angle is less than approximately 30 degrees. The power strip may be disposed adjacent a side edge of the enclosure or some space may be provided therebetween. For example, as discussed above, some enclosures include some additional space at the sides for running power cords or for enhancing equipment access/ventilation. In connection with such enclosures, the power strip of the present invention may be spaced from a side edge of the enclosure, for example, by up to about 6 inches. Such spacing would allow the plugs and power cords to be retained within the enclosure as may be desired.

Optionally, more than one power strip may be used in connection with a given shelf of an enclosure. For example, power strips may be provided along both side edges of a shelf. In addition, where the enclosure geometry allows, a power strip may include more than one row of outlets or power strips may be vertically stacked along a side of the shelf. The power strip may also facilitate access to separate power sources, which may be desired, as discussed above, for certain mission critical systems. In this regard, outlets associated with different power sources may be integrated into the power strip or one or more power strips may be used in conjunction with a power distribution unit associated with multiple power sources. For example, a power strip disposed along one side edge of a shelf may be plugged into a first power source of a power distribution unit, and a second power strip disposed along the opposite side of the shelf may be plugged into a second source of the power distribution unit. In this manner, convenient access to redundant power sources can be provided for any equipment in the enclosure or adjacent enclosures. In one implementation, a compact power switching unit, operative to switch between first and second power sources, may extend between first and second power strips (each of which is associated with a separate power source), for example, along a back edge of an enclosure. It will be appreciated that the side access power strips provide easy access, increase the number of outlets that are available and improve routing of power cords and ventilation.

In accordance with another aspect of the present invention, a method for using a side access power strip is provided. The method involves providing a power strip with a number of outlets, disposing the power strip on an enclosure such that a longitudinal axis of the power strip extends along the side of one of the shelves, and accessing the power strip via a side of one of the shelves so as to plug a power center equipment device into one of the electrical outlets. As discussed above, the power strip can be immediately adjacent to an edge of the enclosure or spaced at a distance therefrom. In addition, the power strip can be aligned with the front-back access of the enclosure or offset at an angle in relation thereto.

The present invention thus provides a number of advantages in connection with the design, implementation, operation and upgrading of data center environments. In particular, data centers can be laid out efficiently and in a manner that reduces the need for reconfigurations and allows such reconfigurations to be accomplished efficiently, when necessary, and with little or no down time. In addition, any changes to data center environments can be effectively and accurately executed even by relatively unskilled personnel. Moreover, power is reliably delivered to critical equipment via redundant power sources. Data centers can also be monitored more effectively to identify potential problems or to execute user policies regarding power usage or sequencing for powering up and powering down. The invention thus provides improved operational effectiveness and efficiencies throughout the lifecycle of a data center.

BRIEF DESCRIPTION OF DRAWINGS

For a more complete understanding of the present invention and further advantages thereof, reference is now made to the following detailed description taken in conjunction with the drawings in which:

FIG. 25 is a table showing features and functionality of various power distribution devices in accordance with the present invention;

FIGS. 26-38A show a mini-ATS and associated functionality in accordance with the present invention;

FIGS. 43-45 show a power controller in accordance with the present invention;

FIGS. 75-82 show user interface screens of a mini-ATS in accordance with the present invention;

DETAILED DESCRIPTION

Figure 1:
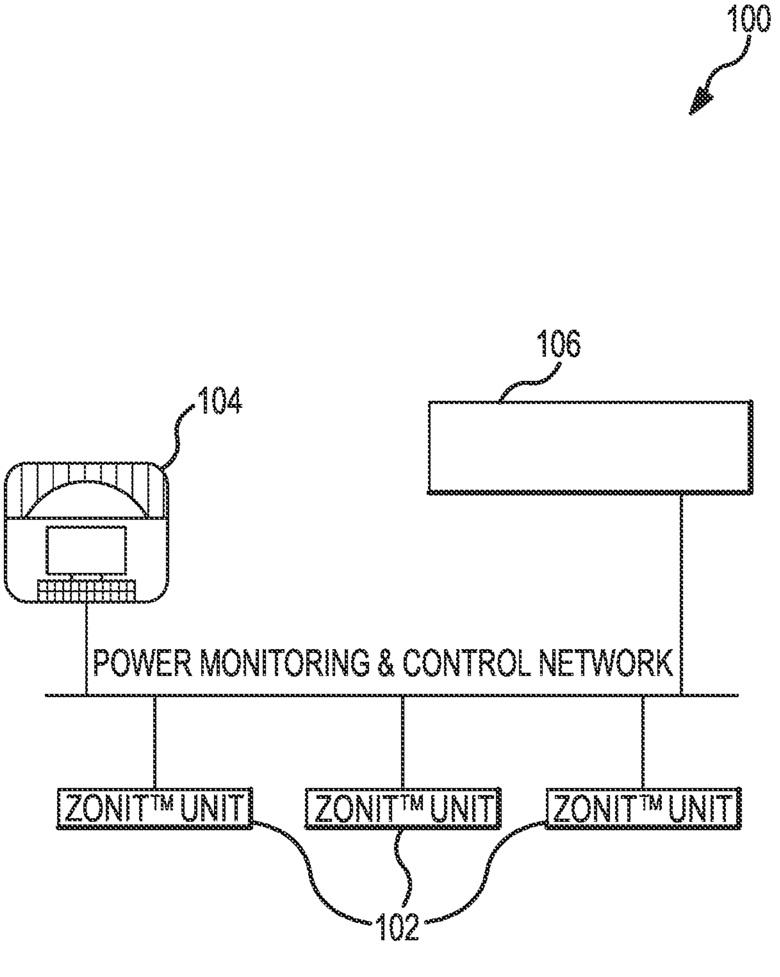
FIGS. 1 and 1A are schematic diagrams of a power management system in accordance with the present invention.

In the following description, the invention is set forth with respect to various systems, components and processes for use in a data center environment. It will be appreciated that various aspects of the invention are applicable in other contexts. Accordingly, the specific structure and functionality set forth below should be understood as exemplifying the invention and not by way of limitation. Moreover, for convenience of reference, various systems, components and methodology are identified by the Zonit trademark. The Zonit trademark is owned by Zonit Structural Solutions, LLC, the assignee of the present application.

The systems, components and processes described herein build on and can be combined with a number of technologies of Zonit to yield synergies or combinative advantages such as improved efficiency of rack space, reduced rack size for a given payload of equipment, enhanced functionality, enhanced networking and monitoring of equipment, reduced equipment requirements and costs, and others. Accordingly, reference is made at various points in the description to one or more of the following families of U.S. cases (patents and applications) of Zonit (it is intended to reference all related U.S. application and patents in each family that are available to be incorporated by reference), all of which are incorporated by reference herein in their entireties.

1 U.S. Pat. Appl. Ser. Nos. 60/894,842; 12/049,130; 12/531,212; 12/569,733 (the ATS cases);

2. U.S. Pat. Appl. Ser. Nos. 60/894,844; 12/531,215; 13/889,181; 15/353,590; 14/217,225 (the Z-cool cases);

3. U.S. Pat. Appl. Ser. Nos. 60/894,846; 12/531,226; 12/569,377; 13/763,480; 14/717,899; 15/655,620; 15/656,229 (the Smart Outlets cases);

Ser. No. 13/757,156;

4. U.S. Pat. Appl. Ser. Nos. 60/894,848; 12/531,231; 12/569,745; 13/466,950; 14/249,151; 13/208,333; 14/191,339; 14/564,489; 15/603,217; 15/797,756; 61/970,267; 61/372,752; 61/372,756; 13/208,333; 61/769,688; 14/191,339; 14/564,489; 15/603,217; 15/797,756 (the Auto-Switching cases);

5. U.S. Pat. Appl. Ser. Nos. 61/324,557; 13/088,234; 14/217,278; 15/250,523; 15/914,877; 60/894,849; 12/531,235; 12/568,444; 13/228,331; 61/610,183; 61/619,137; 61/799,971; 61/944,506; 15/064,368; 15/332,878 (the Locking Receptacle cases);

6. U.S. Pat. Appl. Ser. Nos. 60/894,850; 12/531,240; 12/569,609; 14/470,691; 15/673,153 (the NetStrip cases);

7. U.S. Pat. Appl. Ser. Nos. 61/039,716; 12/891,500; 13/108,824; 14/217,204; 14/680,802; 15/450,281 (the Power Distribution Methodology cases);

8. U.S. Pat. Appl. Ser. Nos. 61/040,542; 12/892,009; 13/108,838; 14/327,212 (the UCAB cases);

9. U.S. patent application Ser. No. 09/680,670 (the ZPDS case);

10. U.S. patent application Ser. Nos. 14/217,159; 15/452,917; 14/217,172; 15/425,831; 14/217,179; 15/706,368 (the Relay cases);

These are occasionally referred to collectively herein as the Zonit cases.

I. Introduction

The Zonit Power Distribution System includes certain methodology as described in detail below and apparatus to instantiate or execute the methodology. In one embodiment, the system includes (these items are shown and described in more detail below):

1. Zonit Specification Power Whips

These are prefabricated power whip cables that are keyed to the Zonit design and installation methodology. These whips have several advantages over traditional electrical installation methods. They also can be specified in a way such that power capacity upgrades can be done later with minimal changes.

2. Zonit Power Management Station

Zonit's management architecture is designed to meet current and future data center management needs. These are in the areas of power monitoring, control and environmental and security monitoring.

The management architecture 100 may be implemented as a distributed two tier design as shown in FIG. 1. In the illustrated embodiment, individual Zonit Power Distribution Units (ZPDUs) 102 each have an optional embedded control module. To be clear, the control module can be mounted in the enclosure of the ZPDU or in a separate standalone case. This module is a field replaceable unit (FRU) that is field upgradable/replaceable. The module has an embedded hardened Linux (or other suitable operating system such as Android, a Linux derivative) instance that offers easy implementation of current and future network management capabilities.

The choice of embedded Linux (or Android its derivative) offers a very significant set of benefits to the control module. It is a modern operating system with a rich software ecosystem. It is efficient and has a small footprint, which is important with limited hardware resources. It can be made very secure. Most importantly, the software ecosystem means that any needed feature is likely to be developed by the open-source community and vetted by that community to insure its quality and security. This is a huge advantage over the traditional hardware and software methods used for monitoring and management capabilities in data center power, cooling and environmental monitoring and security devices. They typically use a PIC processor running firmware. This was the accepted method for doing these types of devices. It was traditional and chosen because of cost and especially form-factor limitations of more general purpose computer hardware. However the limitations of that methodology in terms of time to develop, and ability to add new needed features have made using cell phone derived hardware and embedded Linux a vastly superior option. Our choice of this technology as described herein and other potential applications yields advantages that have not been recognized in this field.

Figure 16:
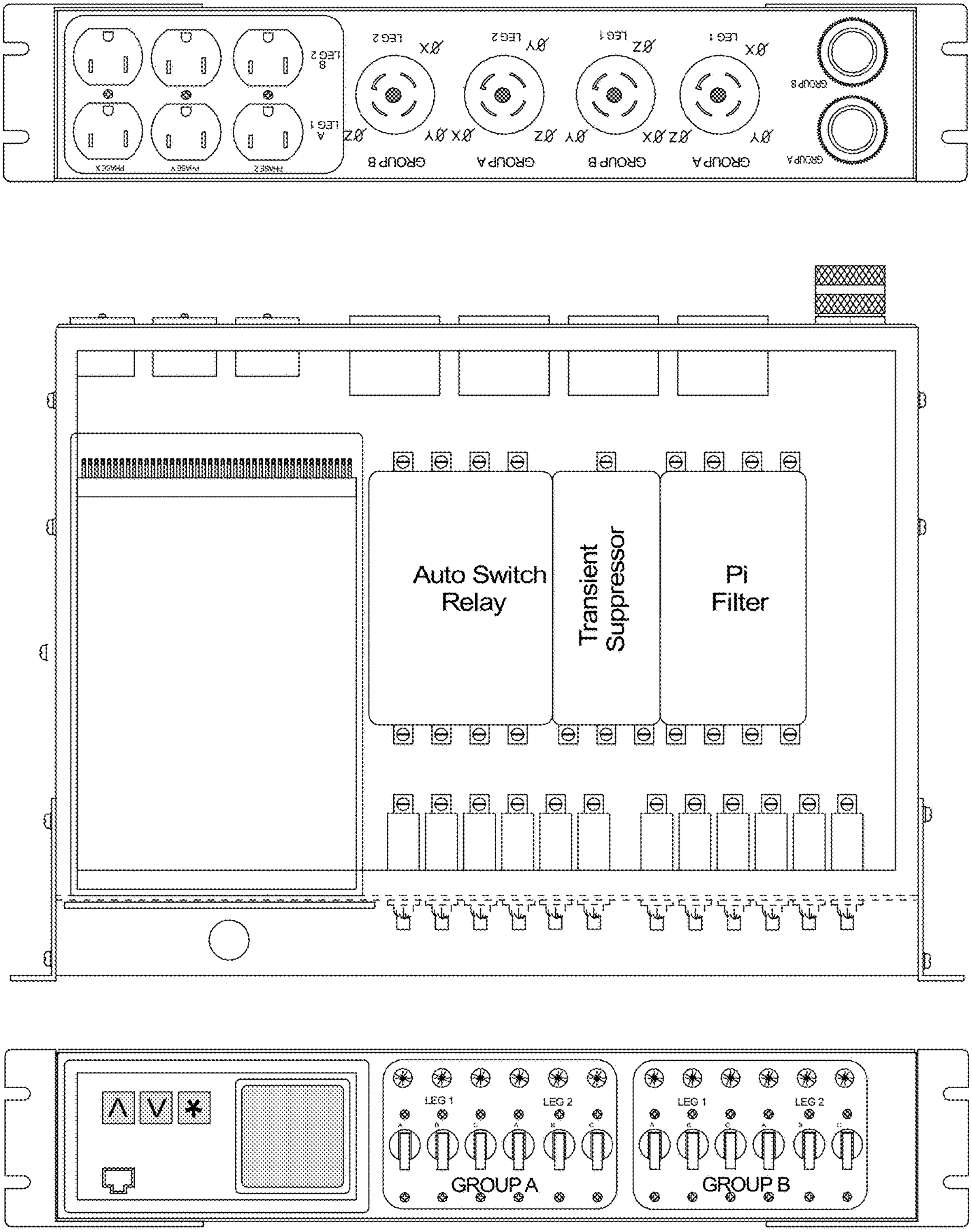
FIGS. 16-20 are diagrams of a 3-phase power controller in accordance with the present invention.
Figure 17:
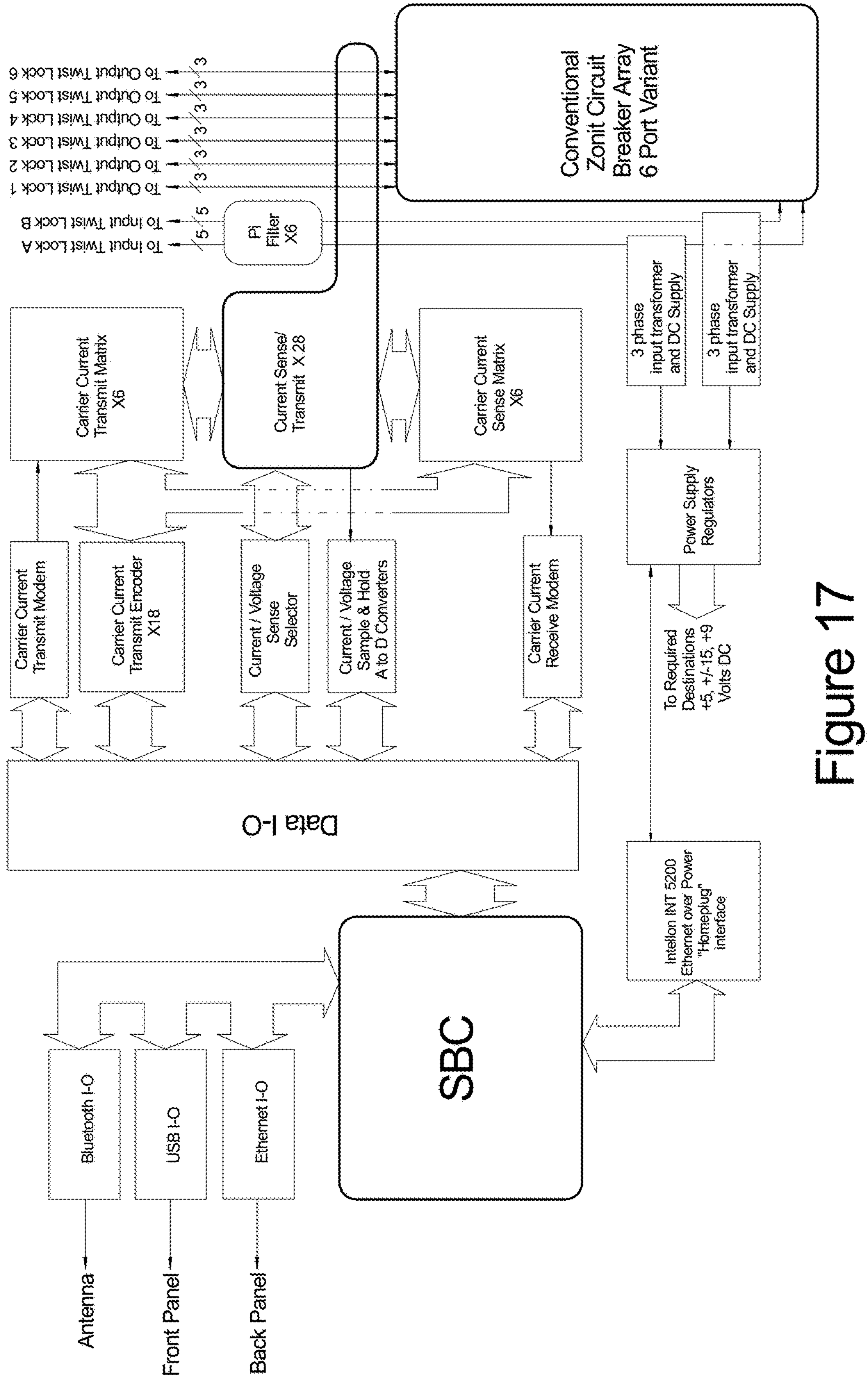

As shown in FIGS. 16-17 the control module can be located be a stand-alone case. This has the advantage of making it easy to use and its display easy to read by locating the control module in a visible and accessible location. The ZPDU main enclosure may be mounted in an inconvenient and hard to see and or touch location, such as at the bottom or top of a rack, on top of the rack, under an overhead cable tray, etc. In this instance the control module and main enclosure can connected via a suitable communication mechanism, including serial data (for example USB, RS-485, others). The communications mechanism can also be done via Ethernet, Ethernet over power wiring, X10 or another suitable method. The communications mechanism can also be implemented using wireless connections (Bluetooth, 802.11, proprietary, others) if that is desirable. The protocol used over the communications mechanism can be TCP/IP, X10, Zonit proprietary Z-Protocol or another suitable protocol. The communications may optionally be encrypted for security and may optionally employ other security mechanisms, such as a standards defined or proprietary device handshake. This insures that if standard protocols, cables and connectors (for example USB) are used that unauthorized devices or computers cannot communicate to the ZPDU enclosure and control module by being plugged into them, if that is not desired. Another way of helping to accomplish this is to mix the physical connector type used with the communication mechanism used. An example of this is to use RJ style connectors with an appropriate (and possibly non-standard) number of wires as is shown in FIGS. 16-17. Any compatible protocol can be run over that cabling, such as RS-485, USB, etc. The RJ connector is not a standard USB connector, which makes it both less convenient and less likely that somebody would try to connect the USB or Ethernet port on their laptop computer to the RJ connector and try to hack into the control module. Another example would be to run Ethernet over RJ-11, not standard RJ-45. The RJ connector also is locking and standard USB connectors are not, although locking standard USB cable compatible USB connectors can be used, but the cables they require to lock are not commonly available at retail outlets, while RJ style cords commonly are. The communication mechanism allows the sensors that may be disposed inside the main enclosure or networked with the main enclosure and/or FRU (e.g., current sensing, power quality sensing, circuit breaker status and control, device internal environment and health, other sensing, etc.) to be monitored and/or controlled by the control module. The communication mechanism used may allow extended multi-device topologies, (for example RS-485, USB, others) or offer extended multi-device topologies and be routable (for example Ethernet/TCP, FDDI/TCP or USB encapsulated in TCP/IP, or others). Routable communication mechanisms offer the capability of having the devices and/or sensors connected to the control module to be quite remote, which can be useful for some applications, such as a co-location data center with a client occupying multiple racks that are not located together or an industrial environment with large spaces and multiple buildings. The communication mechanism therefore allows the possibility of connecting multiple devices (for example multiple ZPDU devices) and/or sensors to the control module using the described multi-device capable communication mechanisms and having the control module monitor and/or control them. One or more USB hubs or an Ethernet hub (or switch) optionally connected to a TCP network, either possibly running Z-Protocol or other suitable protocols, which could be secure protocols, are examples of ways this could easily be done. This offers both economic and technical advantages. It is more cost effective to use one control module and connect multiple devices and/or sensors to it. Those devices and/or sensors can be as described in the present application. To help insure uptime, the control module can be equipped with the ability to accept two separate power inputs, even if it does not have dual power supplies. Further, if the control module is connected to and managing a suitable Zonit ATS device, like the Mini-ATS, the control module can be powered by suitable auto-switched power from the ATS, which again helps insure that the control module will remain up during power outages or power distribution system maintenance window downtime.

In yet another embodiment, serial data such as USB or RS-485, for example, can be routed over TCP/IP as a communication mechanism for use with the control module. An example of this mechanism is described in the Netstrip cases. Serial data can thereby be used as a routable communications mechanism to connect devices and/or sensors to the control module.

There are four infrastructure elements of the data center to, at and in the rack. They are 1) the rack (or cabinet) structure itself. The rack is usually designed as a system, with mounting hardware, equipment shelfs, air fans, etc. 2) Power distribution to and in the rack. This is usually done via vertical or horizontal plugstrips in the rack, typically fed by power whips or busway tap boxes. 3) Cooling, which is typically done via air cooling, although water cooling and phase-change gas coolant systems are also used. 4) Network distribution to and in the rack, using copper, fiber or wireless. Other infrastructure elements which are not strictly required but often desired are environmental and security monitoring in the data center room and/or at the rack. Zonit has designed a set of inventions described in the Zonit cases that work together at the rack to provide an optimal solution or can each individually be deployed as a "best-in-class" displacement technology. . . . These solutions also allow IT equipment to be moved in the data center (or between data centers), providing mobility at the 1 or more rack unit RU level, while either shutting the equipment down or keeping it running. See description in the Netstrip and UCAB cases.

As is noted in the UCAB cases there are no strong dimensional standards for NEMA and other common data center racks other than 1) the width between the vertical mounting rails, typically 19" or 23" wide; 2) the arrangement of the holes (but not the fastener type) in the vertical mounting rails, which are organized in a pattern that is designed to insure that a device is mounted within 1 or more Rack Units (1 RU=1.75" of rack height) in the rack, and not straddle the boundary between any two rack units, thereby wasting equipment mounting space in the rack. The other dimensions of the rack such as its overall width and its overall depth and equipment mounting depth are chosen by the user. The height of the rack can go up to around 50U, higher is possible, but usually requires additional stabilization hardware to insure that the rack will not tip over. The key thing about the rack is the central volume where IT equipment (such as servers, network switches and storage units) can be mounted. This is the “payload” volume. The other dimensions of the rack can and usually are larger than the minimum needed to enclose the payload volume required to mount the desired IT equipment so as to provide space to route the required infrastructure components. Examples of infrastructure components include power distribution hardware (e.g., plugstrips and PDUs), power management hardware (e.g., automatic transfer switches), cooling hardware (e.g., fans, ducts, etc.), environmental monitoring (e.g., sensors and associated network elements), and cabling (e.g., for power and networking). Any rack space occupied by, or rendered unavailable for payload due to infrastructure components, and any rack volume necessitated to accommodate infrastructure components, may be considered overhead. Mounting any equipment or cabling in the rack that does not occupy the “payload volume” such as power distribution equipment, cooling equipment or other equipment is called Zero-U mounting, because it takes up no RU of space that could be used to mount equipment. This is considered desirable and often is mandatory. However, it can be appreciated that making any required or desired infrastructure component smaller allows the overall dimensions of the rack to be minimized and thereby allow more racks to be deployed in the same floor area of a data center. This minimizes the amount of volume in the rack that is used by infrastructure devices and allows the rack to be designed to fit the planned “payload” maximum dimension which is highly desirable. Data center floor space is expensive to build and operate! Most data center designers think in 2D terms and look at the floor plan of the data center, but the real design issue is management of volume in the data center and maximizing payload volume. Zonit’s inventions are designed to make this possible and practical.

We will now consider some individual infrastructure components, noting that the design goal of putting more equipment in a given amount of data center floor space occupied by equipment racks is repeated in many Zonit inventions. One example of infrastructure components is the equipment rack (or cabinet) network and power cabling, including their service loops (slack provided to allow IT equipment to be pulled partially out off the rack for servicing without disconnecting or shutting down the equipment if desired). Vertical plugstrips are a common method of mounting power receptacles in the rack. However, Zero-U equipment such as power distribution plugstrips DO occupy volume and intelligent plugstrips usually occupy more volume, due to the space required for the intelligence hardware. These plugstrips have to go somewhere in the rack and they force the rack to be either wider or deeper (or both) so that they can be mounted. The same is true of all the other rack infrastructure equipment elements, for example the depth (from front to back) of a rack door. Minimizing the rack dimensions is important, because it allows more racks to be deployed in a given amount of data center floor space, maximizing efficiency and return on investment. Therefore making the infrastructure elements smaller, while still allowing the needed changes at the rack and user activities to be efficiently done is a very high priority with great value to data center designers and operators.

Figure 18:
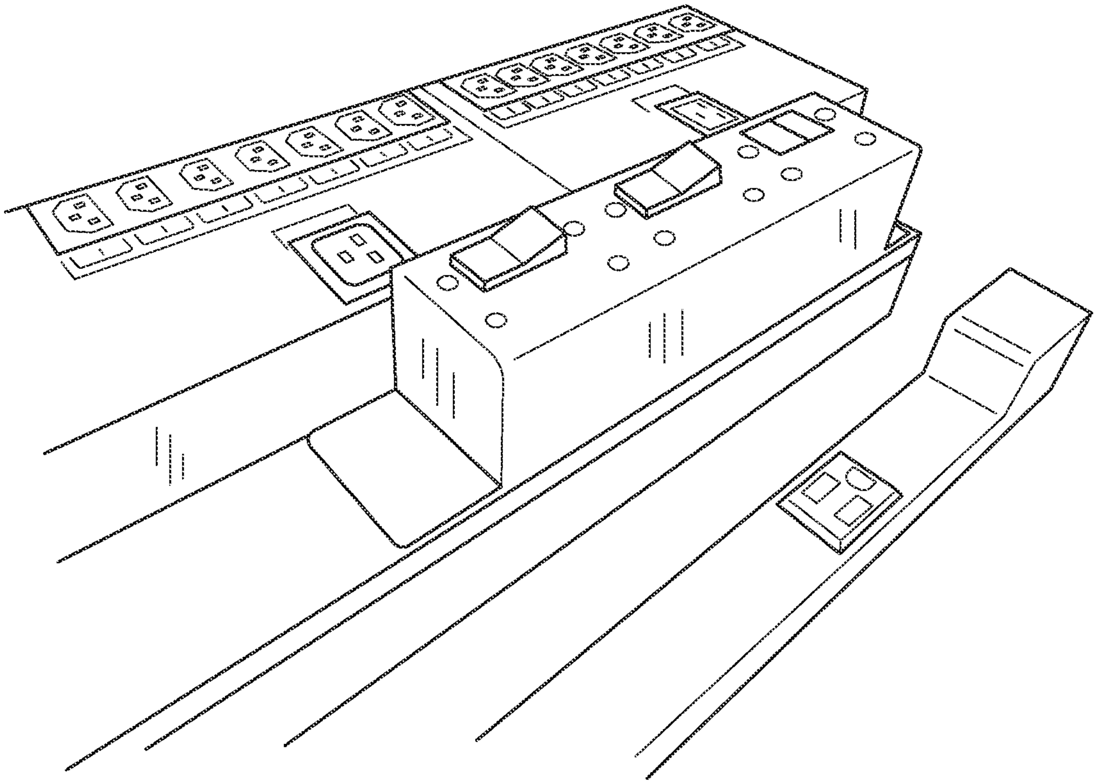
Figure 19:
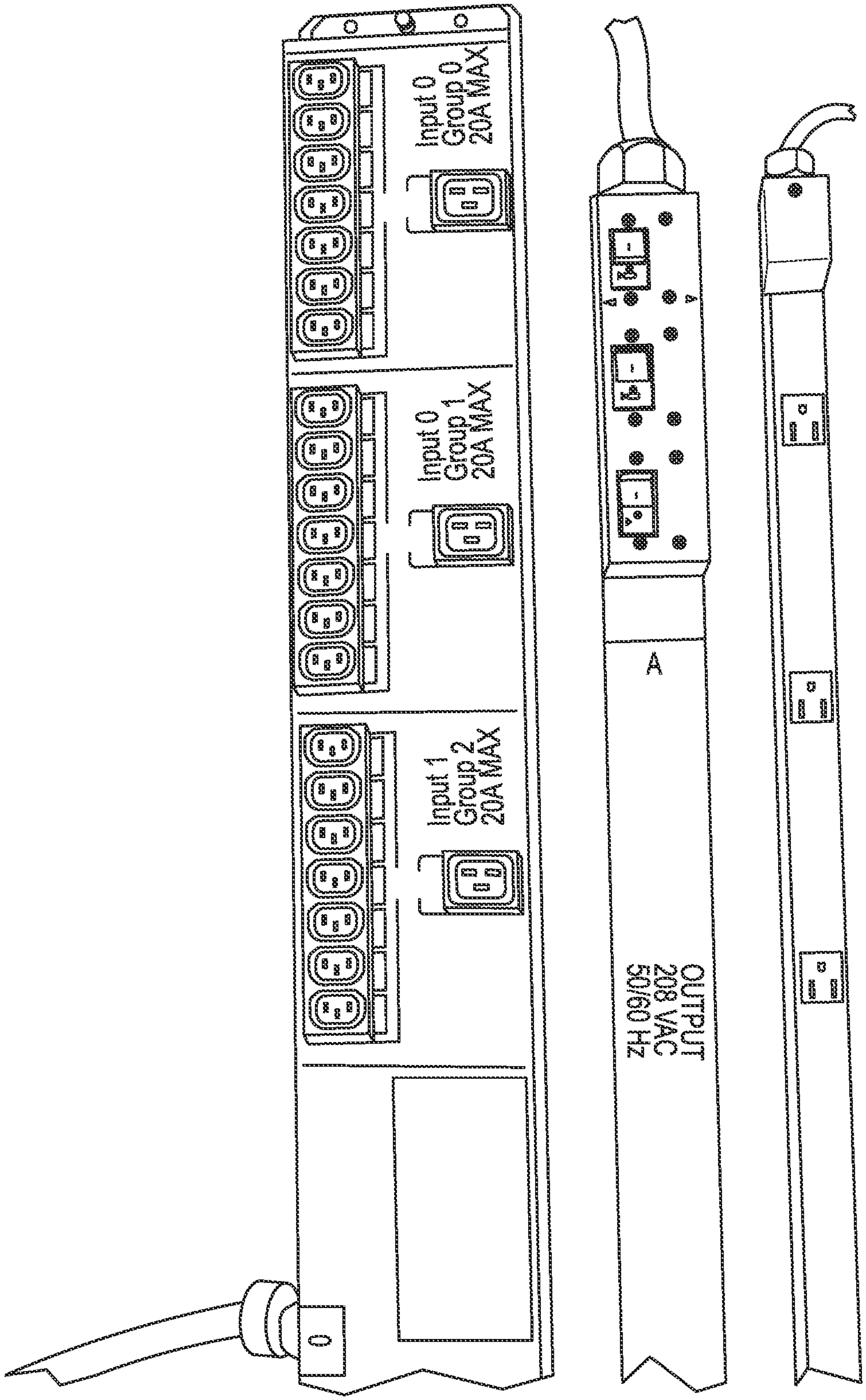
Figure 20:
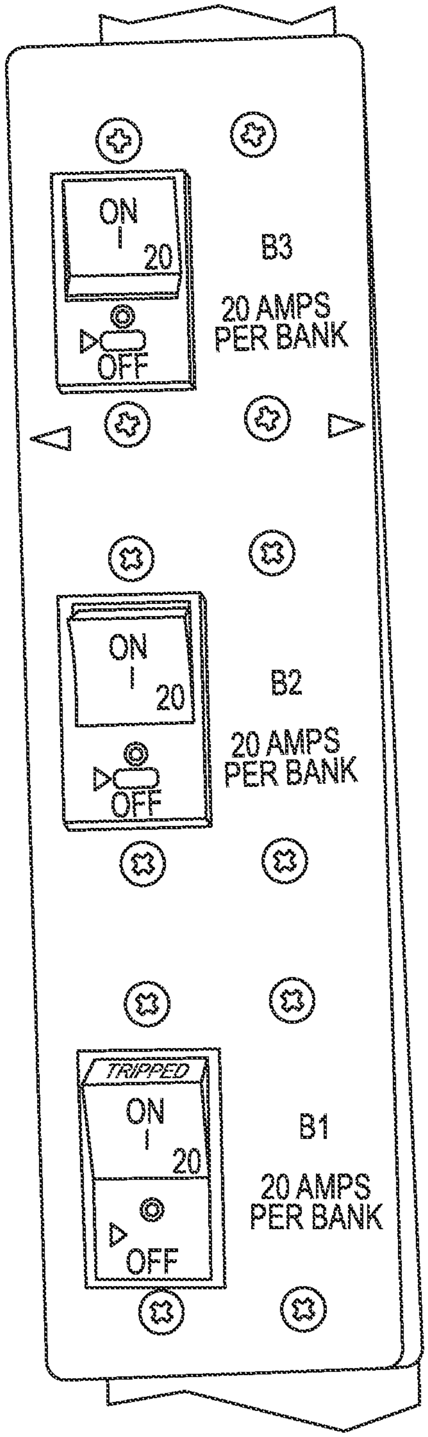
Figure 21:
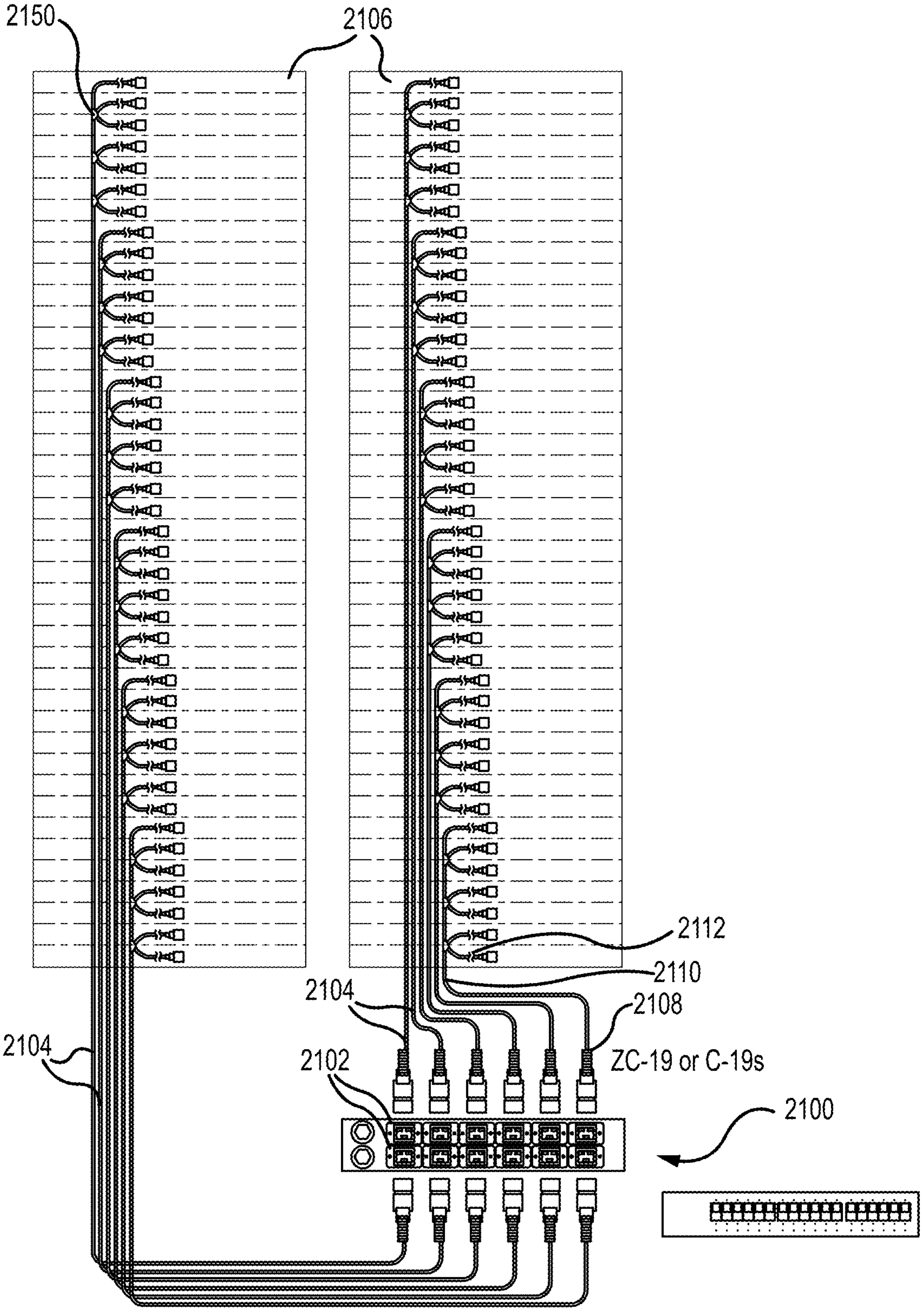
FIGS. 21-24 show hydra cards connected to various units in accordance with the present invention.
Figure 22:
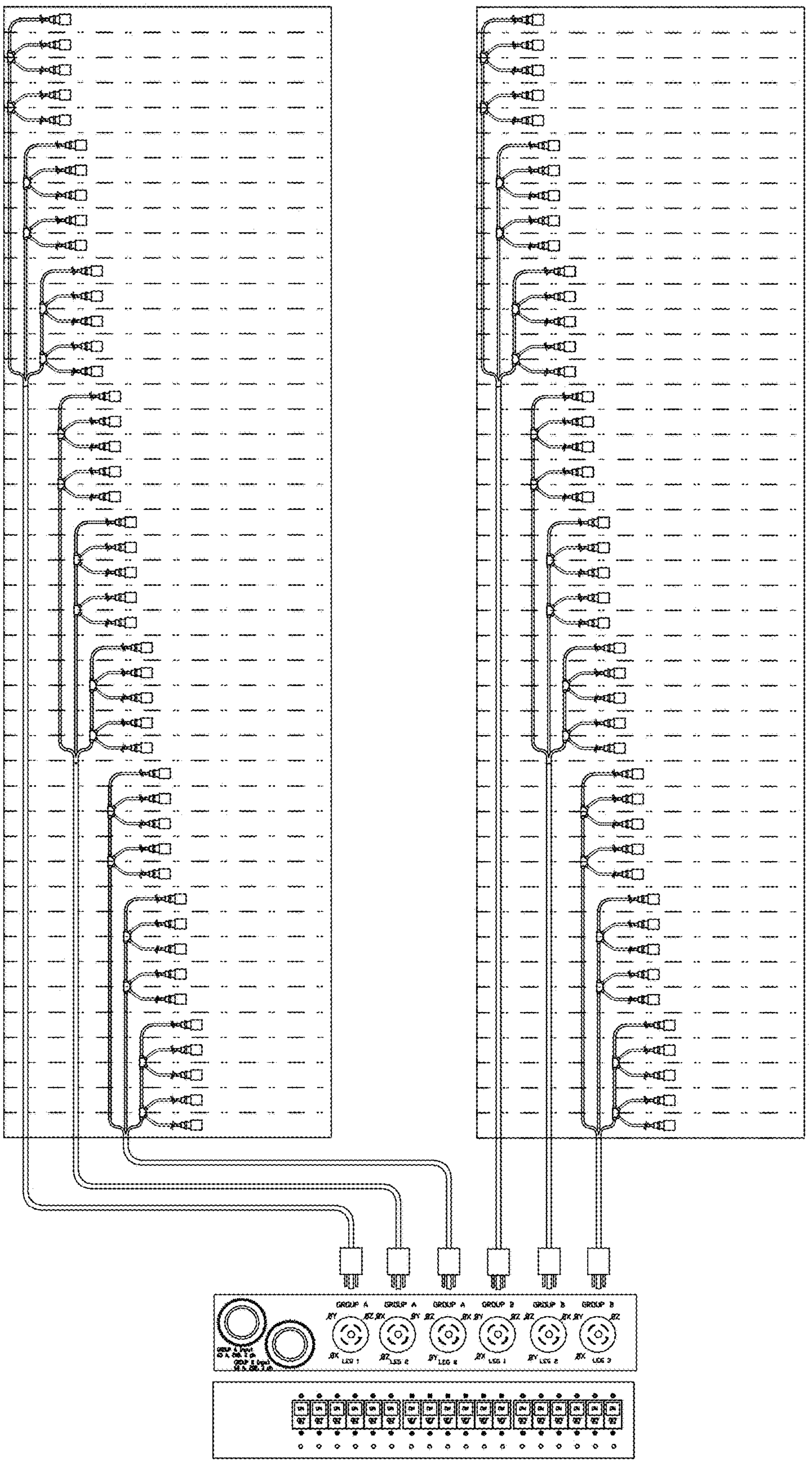
Figure 23:
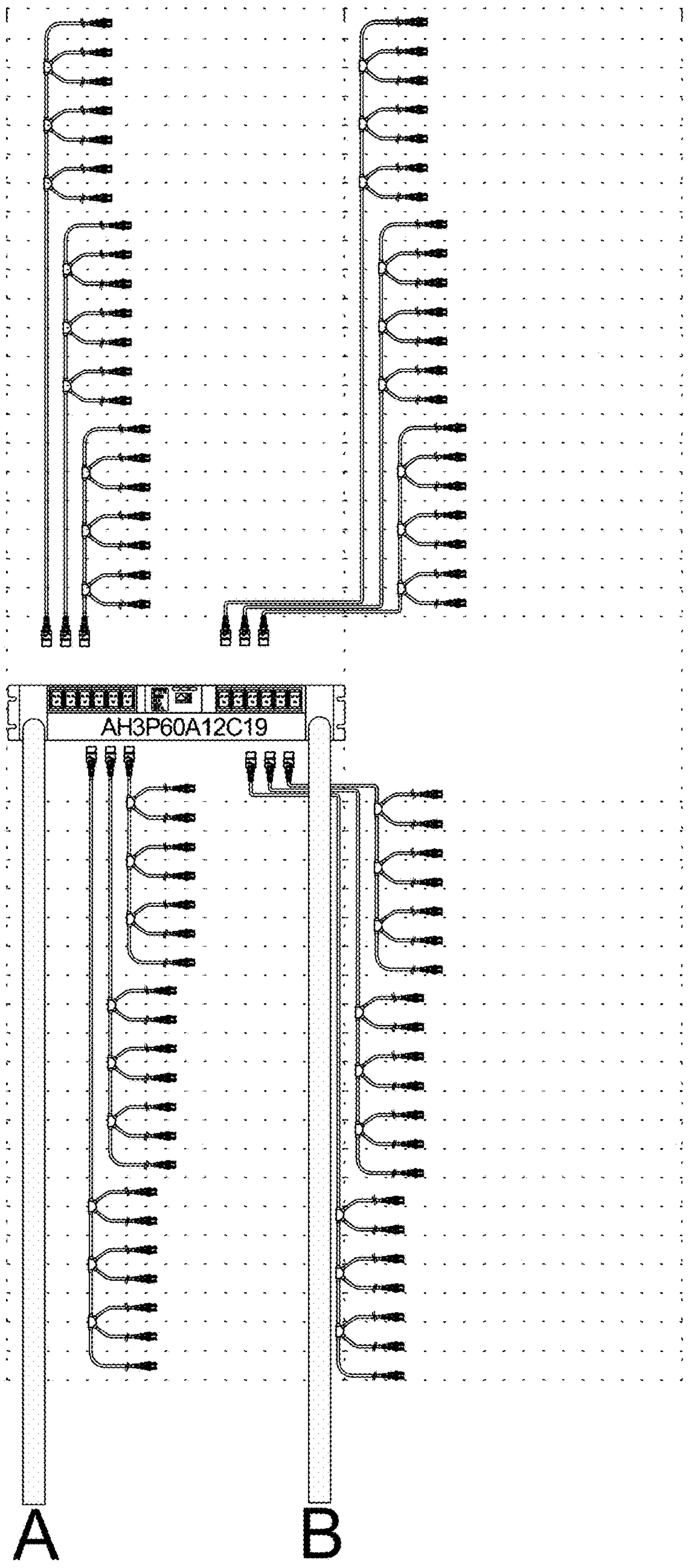
Figure 24:
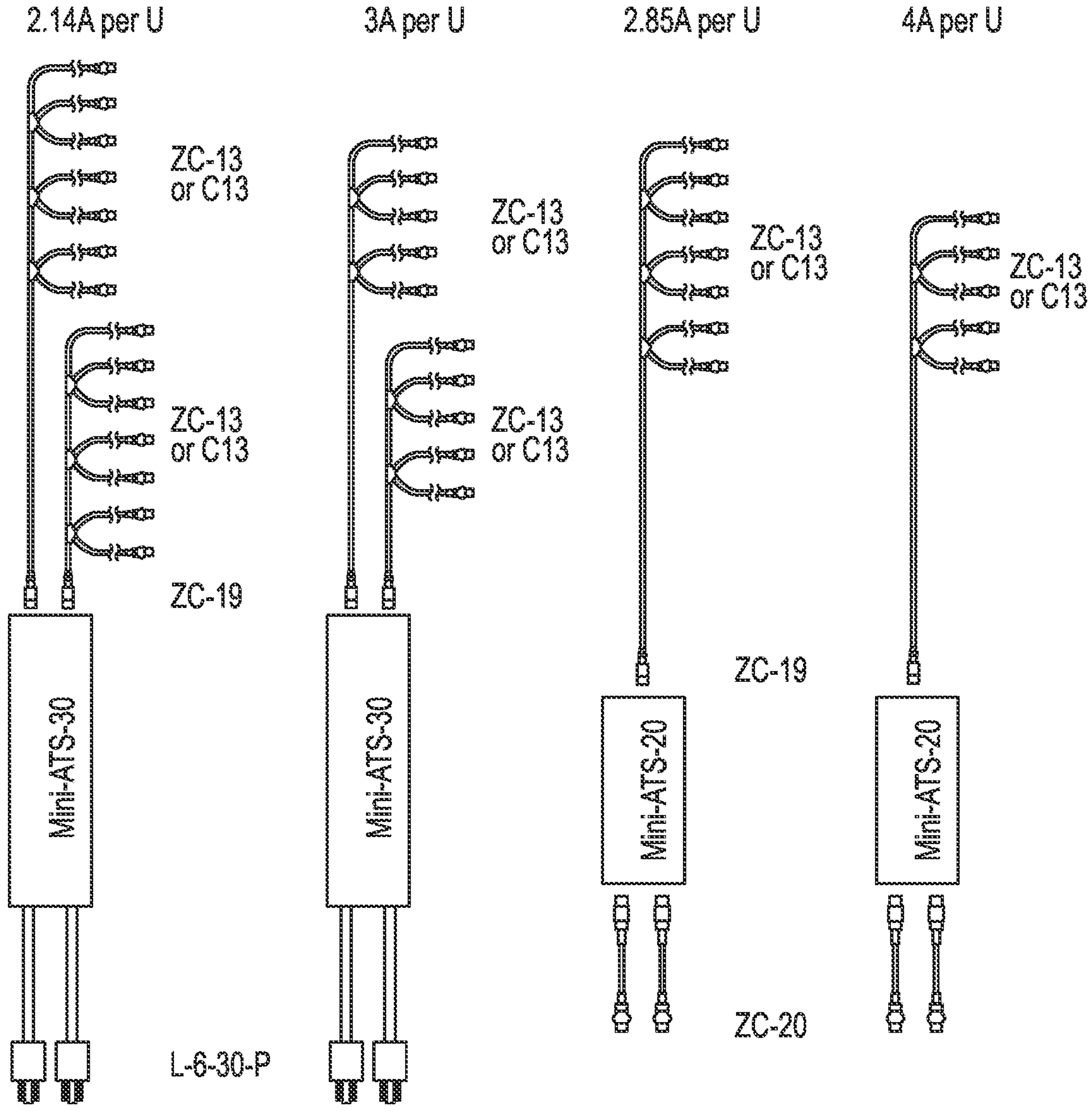
Figure 26:
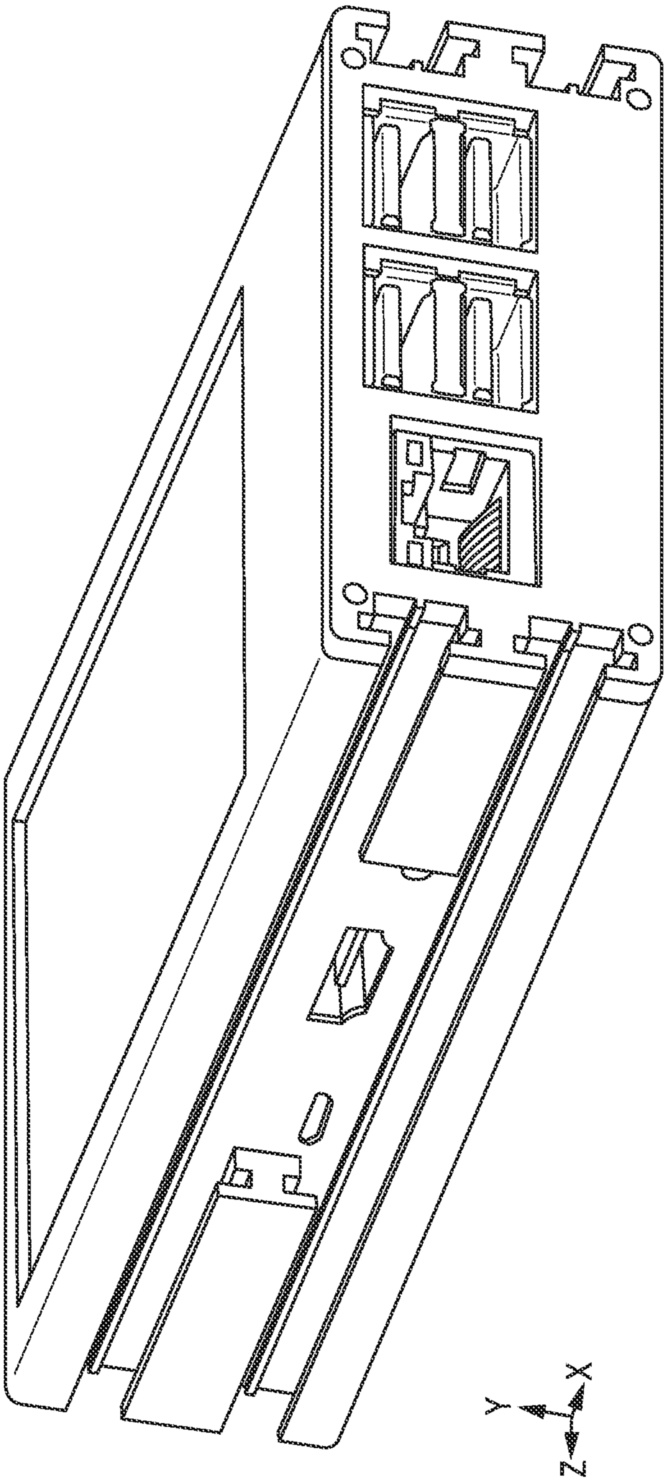

For example, we can look at designing a data center rack and rack layout for a server farm such as used by Google, Ebay, Amazon Web Services and a number of similar “hyperscale” data center operators. These companies have control of every design element of the rack. They are big enough customers that they buy in volumes to make any customization of any rack or IT equipment component or device practical. Also, they deploy complete, pre-built racks in volume and then take the racks out and refresh them with new equipment, often offsite. They often do not replace failed equipment unless it is necessary, they may elect to leave a failed server in a rack and just fix it when they refresh that rack. They have many data centers and so this refresh cycle is going on constantly across the set of data centers they operate. We can now compare some volume savings methods using Zonit inventions, e.g., as described in the Zonit cases. The rack can be optimized with regards to minimizing its overall dimensions and overhead vs. its internal “payload” volume. The equipment put in the rack can be chosen to have a depth that is no more than a set length, for example, approximately 24-30" is common for many servers. Some devices like network switches can be and often are shorter than servers, 14-18" is common, but this offers the use of a partial RU space that can be used to advantage by infrastructure devices that are small enough to use it. An example of this is the ZPDU control module in a stand-alone case or a small form factor Zonit Automatic Transfer Switch as described in the Auto-Switching and ATS cases. If the rack external dimensions are minimized, a minimum width that can be used is about 20.75" for NEMA 19" racks. A minimum depth would be approximately 1-2" in front of the rack between the equipment and the inside of the front rack door and approximately 4-8" between the back of the equipment and the interior of the back rack door. As noted above, the plugstrips must be mounted in the rack somewhere. Vertical plugstrips are favored because they minimize the length of power cords between the plugstrip and the power inlet of the IT equipment. Traditional plugstrips with intelligence cannot be made much smaller than about 2"×2" in cross-section. A traditional plugstrip without intelligence can be made with a cross-section as small as 1"×0.75." Examples of such plug strips and related components are shown in FIGS. 18-20. In contrast and as previously described, that means that intelligent plugstrips force the rack to be larger, consuming more floor space. Power cords can be and usually are bought to length for this type of rack design. Mounting the vertical plugstrips in the sides of rack generally means that the external rack width must increase to at least 24-25". Mounting in the rear of the rack means that the depth of rack must increase by 4"-8" to mount the plugstrips and leave enough room to route the power cords from the IT equipment to the plugstrip. Zonit offers the ability to use a 1.5U to 1U ZPDU unit (or Zonit ZPDU w/integral ATS) for a number of racks, or a 1-2U Zonit Arrowhead plugstrip (w/or without integral ATS unit) or a zeroU Zonit mini-ATS unit. These power distribution devices and others can be used with dual locking power connections. Dual locking means both the input connection and the output connections (male and female ends) of the power cord are secure locking connections. The locking feature can be provided via the plug and/or the receptacle of a given connection, either of which can be incorporated into any device or invention such as described herein as desired as is most convenient for the application and can provide maximum flexibility and compatibility with standard non-locking plugs and receptacles as needed. Dual locking is a feature of Zonit hydra cords described in the Power Distribution Methodology cases or herein or Zonit G2 plugstrips or Zonit G2 Z-strip plugstrips with new design features described in this filing. Note that the locking feature can be provided via a standard feature (NEMA twist-lock plugs and receptacles for example), the Locking Receptacle cases or other third-party designs as is most convenient for the intended application. The Zonit hydra cords or Z-strip plugstrips solutions are very low volume and can fit in the sides of the smallest width or depth rack described above. An example ZPDU using Zonit hydra cords is shown in FIGS. 21-23. Examples of Zonit Mini-ATS units using hydra cords are in FIG. 24. Let's now do the volume math. The Zonit system allows the width to be 20.75" and uses 0.75-2 RU per rack for the power distribution infrastructure and includes intelligent power monitoring, control and analysis. The traditional system with intelligent power monitoring and control (but not equivalent to the Zonit system features and capabilities) requires that the rack width increase by 3.25" or 15.6%. If the plugstrips are located in the back, for a 36" depth rack for 30" max depth servers, the depth could be reduced by 4" using Zonit solutions. So the rack must be 4" deeper for the vertical plugstrip to mount in the back, for an increase of 12.5%. If an average of 1RU per 42U rack is used to mount Zonit devices that is a use of 2.4% per rack, which is much more efficient. If the rack is 50U high, that percentage shrinks to 2%. Zonit also has power distribution solutions that do not require mounting any devices in the rack "payload" volume, which is even more efficient. If approximately 10-12% more servers can be deployed on the same floor space, that is a huge financial win for the customer. The table shown in FIG. 25 shows these calculations in more detail.

Figure 33:
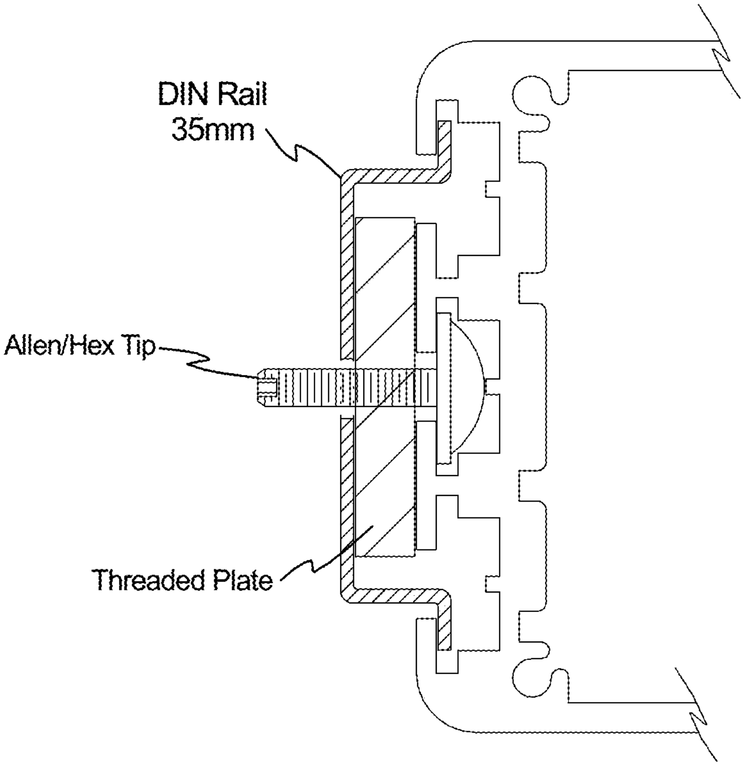

In yet another embodiment, the standalone case of the control module can be provided with a variety of mounting mechanisms to make it easy to see and use in the rack or data center. This is shown in FIGS. 26-30. The case of the control module can formed to provide T-slots as shown. The T-slots in FIG. 30 capture and are sized to work optimally with the most common hardware fasteners used in data center racks, 10-32 or 12-24 or M5 bolts or screws. These can be bought at local hardware stores. The bolt or screw heads and are prevented from turning by structure or dimensions of the T-slot, e.g., the walls of the T-slot. A groove can be provided at the base of each T-slot as shown which can be used to allow washers to be used with the screws or bolts. The washers can be round or square. They can optionally prevent a bolt or screw from turning if designed to do so. Screws with round heads can also be captured by the T-slots. The T-slots can have a small ridge 3000 which runs down the center of the bottom of the T-slot as shown. This prevents round-head screws or bolts with a straight-blade screwdriver slot from turning in the T-slot. A DIN rail adapter can also be provided as shown in FIG. 31 and other DIN rail adapters can easily be designed or sourced so that they can be used as shown in FIG. 31. The T-Slot concept could also be used to make very flexible mounting brackets for IT equipment enclosures which attach to the sides of the IT equipment. An adapter bracket to mount the control module as described in the UCAB cases can also be provided. A similar adapter bracket for attaching IT equipment with T-slot concept mounting brackets to the UCAB could easily be provided. As can be appreciated, the T-slots provide additional surface area for cooling. This is especially true when the case (or IT equipment mounting bracket) is formed from extruded aluminum or other thermally conductive materials. The T-slots also provide sufficient flat surface area to attach adhesives to their sides (which finned cases do not), another way to attach a mounting bracket. The T-slots can also be used with a slide-on mounting bracket shown in FIGS. 33-34 which can be injection molded or 3D printed or made via another method. The control module can also be mounted via a bracket that has a hinge. This allows the control module to be moved to a good display and touch position during use and then moved out of the way when not in use. This can allow equipment to be slid out for maintenance or be removed from the rack without the control module location preventing that activity. The display of the control module case can also be hinge mounted via a multi-axis hinge, in the same manner as a camcorder display, for best viewing and use. The control module can also be mounted on a flexible stalk mount which allows it to be moved to multiple positions when in use or not in use. The control module can also just be attached to the rack or placed on a shelf such that the user can hold it in his hand to use it. This is a unique feature in the intended application.

A number of Zonit inventions as described in the Zonit cases (for example Zonit casesG2 plugstrips, Zonit G2 Z-strip plugstrips, Zonit hybrid hydra cords and Zonit hydra cords described in this and other Zonit filings) could all be so connected, monitored and/or controlled by the control module, as described in this filing. In this case a ZPDU main unit is not required, but could be present. Other compatible devices could also be so connected, monitored and/or controlled by the control module. The Zonit inventions and compatible devices could also communicate selected information to the control module but not be monitored and/or controlled by it. The control module can have sensors connected to it directly or remotely as described. The sensors can be environmental in nature (temperature, air flow, humidity, liquid moisture, IR camera and others). The sensors can be security/safety oriented in nature (video monitoring, rack door lock status, smoke detection, CO2 or other poisonous/non-breathable gas (used with cooling systems that employ such gases) and others. Other additional types of sensors could be advantageous to connect to the control module. The sensors can be connected to the control module using the described communications mechanisms.

Figure 35:
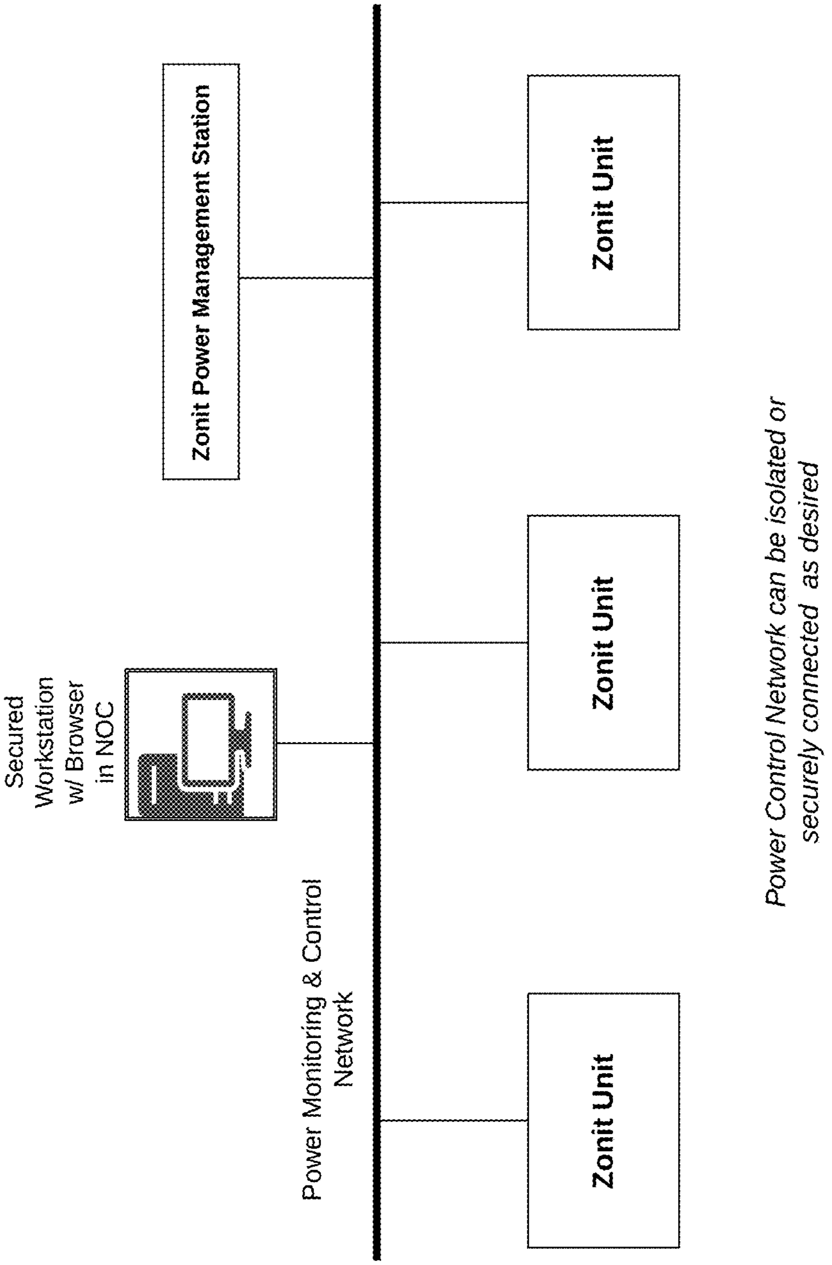
Figure 36:
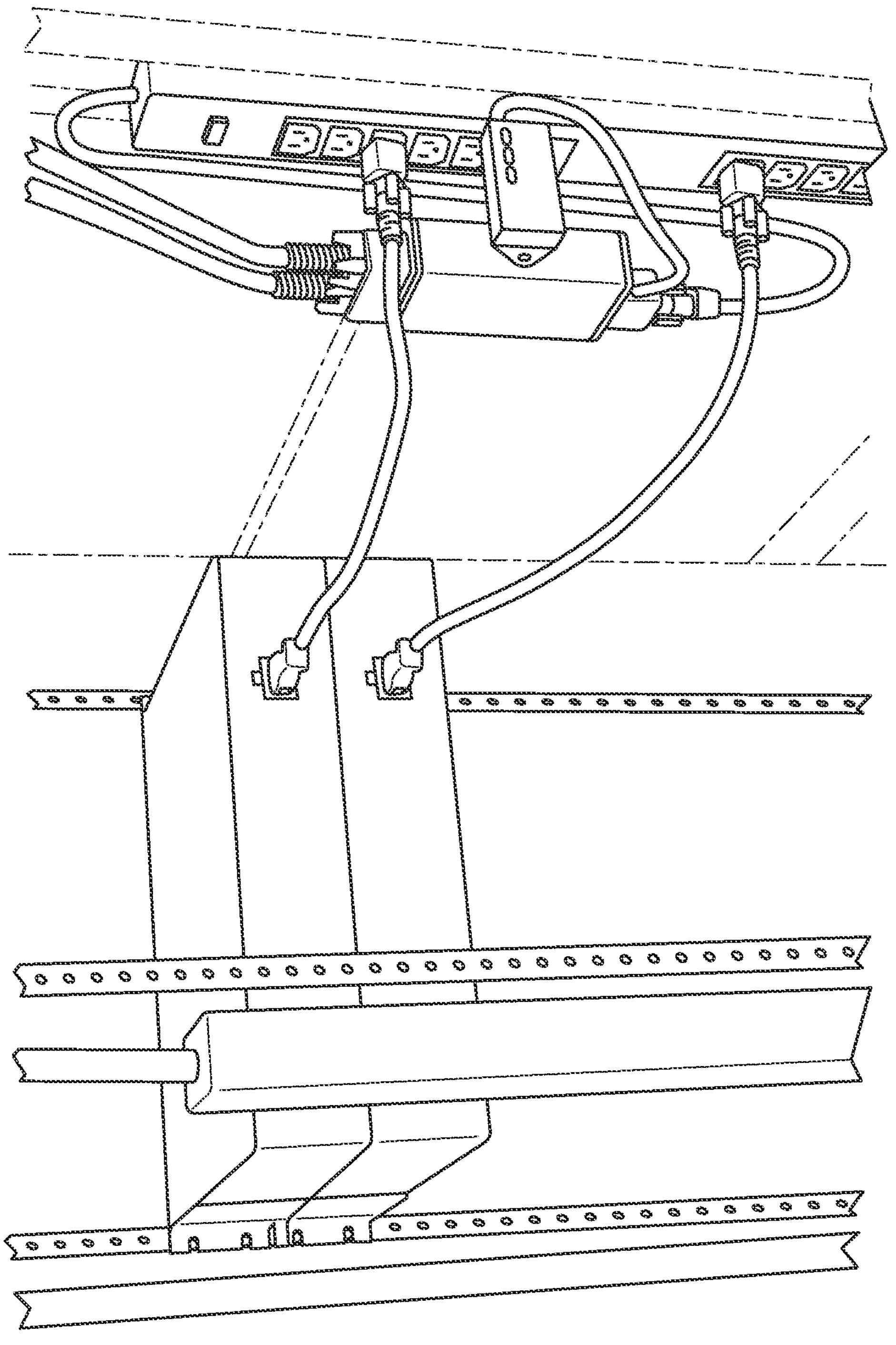
Figure 37:
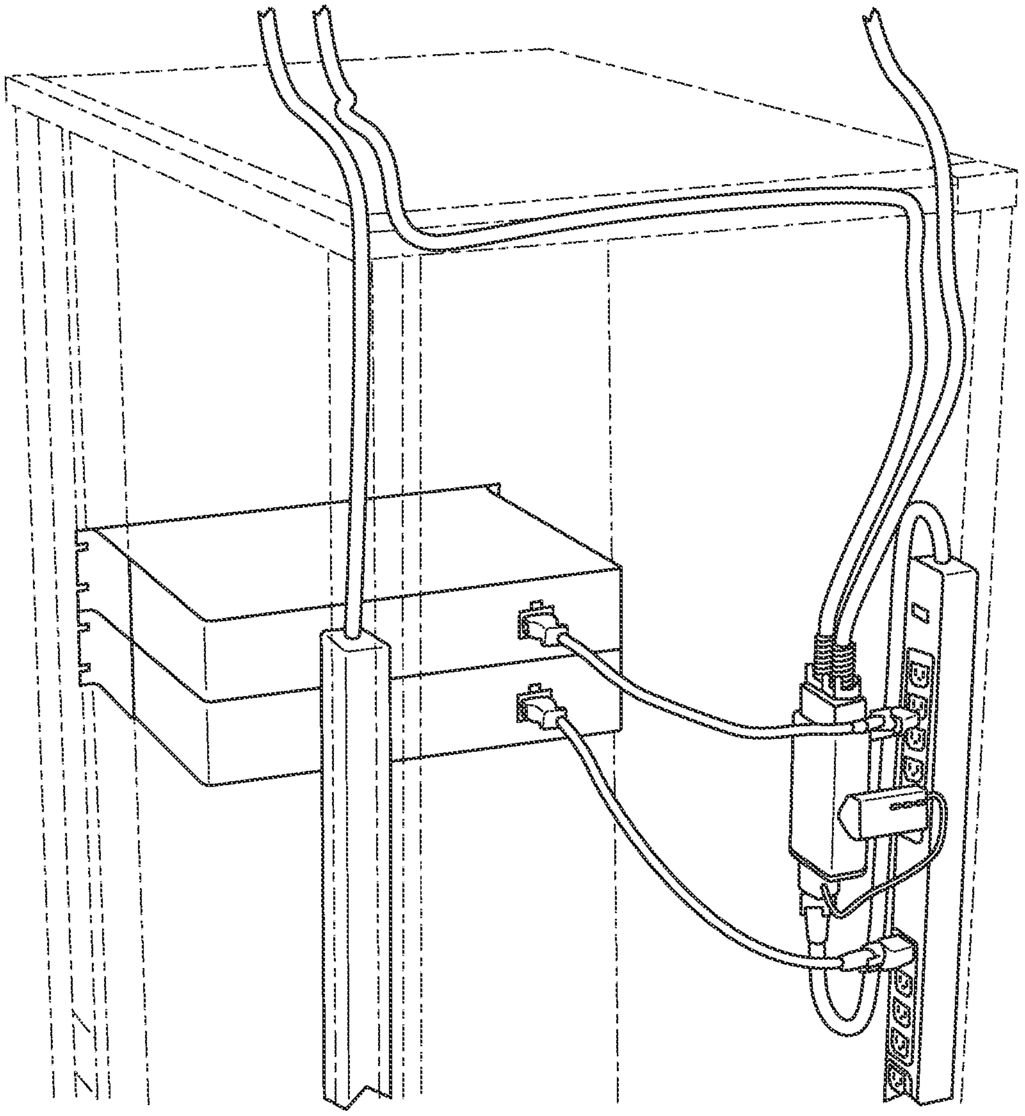
Figure 38:
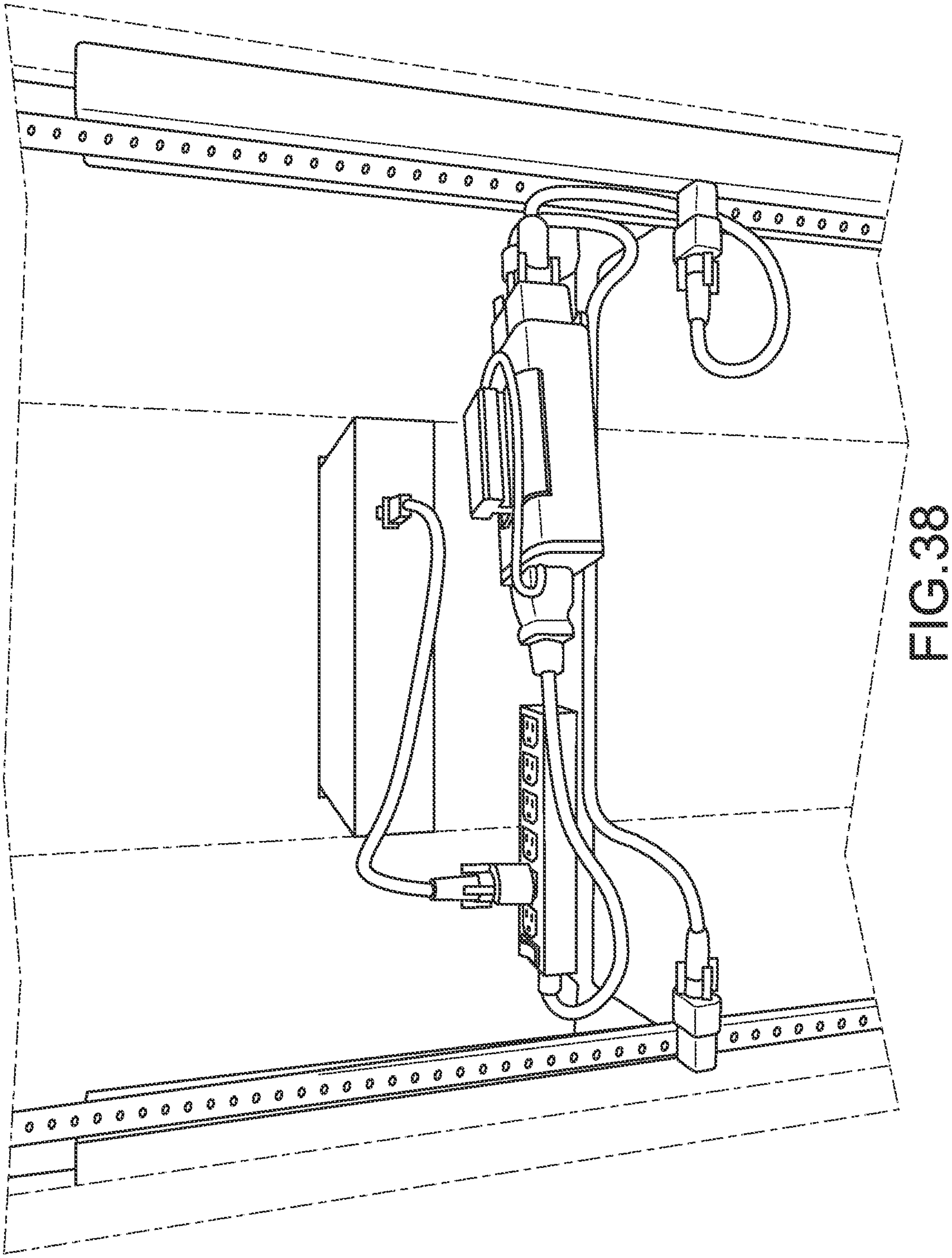
Figure 38A:
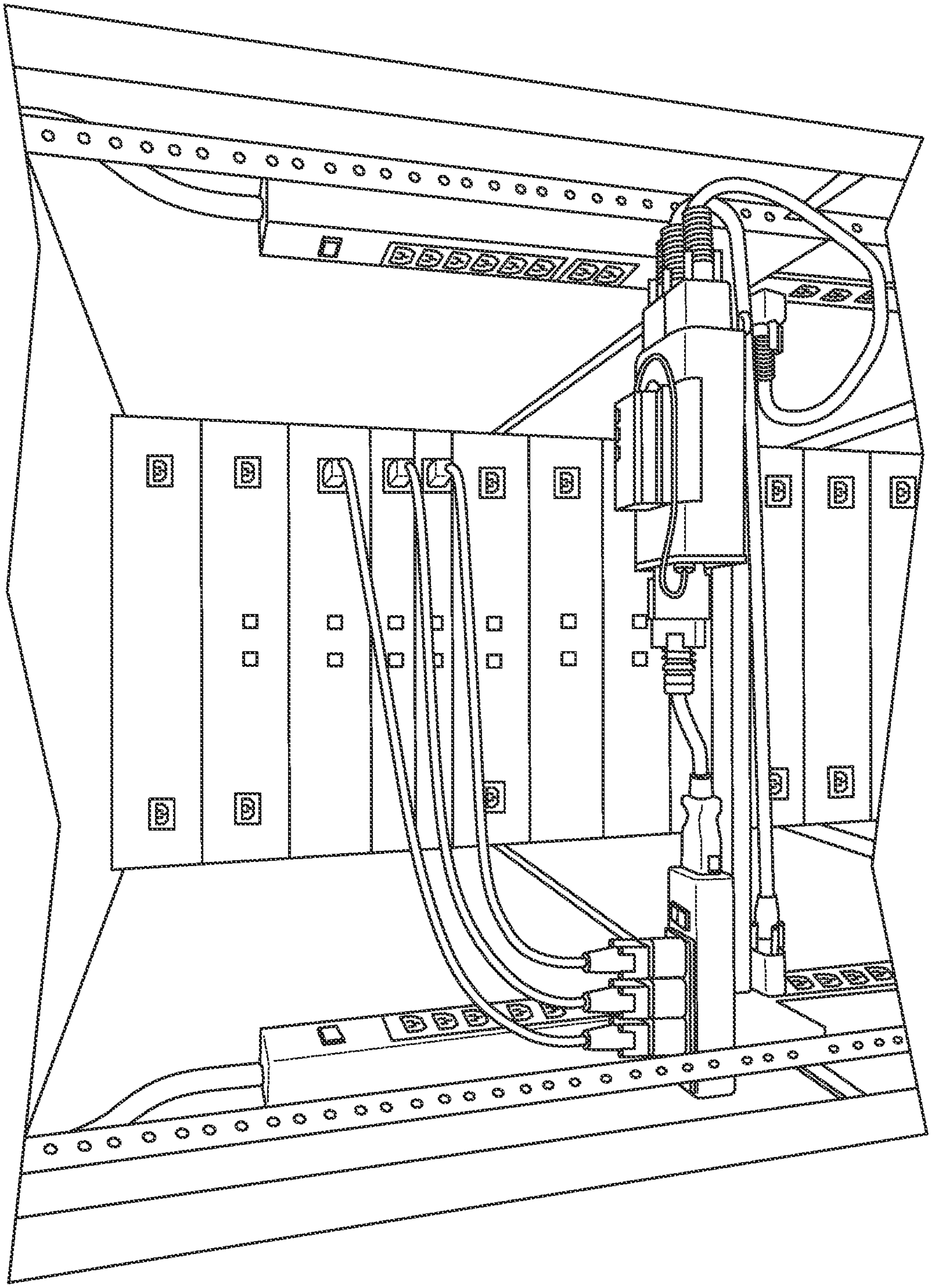

In yet another embodiment, other Zonit inventions, such as described in the Auto-Switching, ATS, ZPDS and Z-Cool cases including the Zonit ATS family of products (uATS, Mini-ATS, Arrowhead plugstrip & Arrowhead ATS, Busway ATS, Mega-ATS, Zonit cooling inventions (Z-cool v1, Z-cool v2) and other devices can incorporate the control module into their enclosures or be connected to it when it is in a stand-alone case and be monitored and/or controlled by it. FIG. 35 shows this could also be done by any compatible devices that were designed to do so. In some cases, as an example the Mega-ATS, the device can communicate selected information to the control module, but may not be monitored and/or controlled by it as is desired. An example of a Zonit ATS 3600 that is designed to communicate with and be managed and controlled by the control module 3602 is shown in FIGS. 36-38 (where like items are identified by like reference numerals). These instantiations of a Zonit ATS are further described in the ATS cases which are hereby incorporated by reference in full.

In yet another embodiment, the control module could also be integrated into another structure or another device, for example a rack door or a third-party device.

Figure 27:
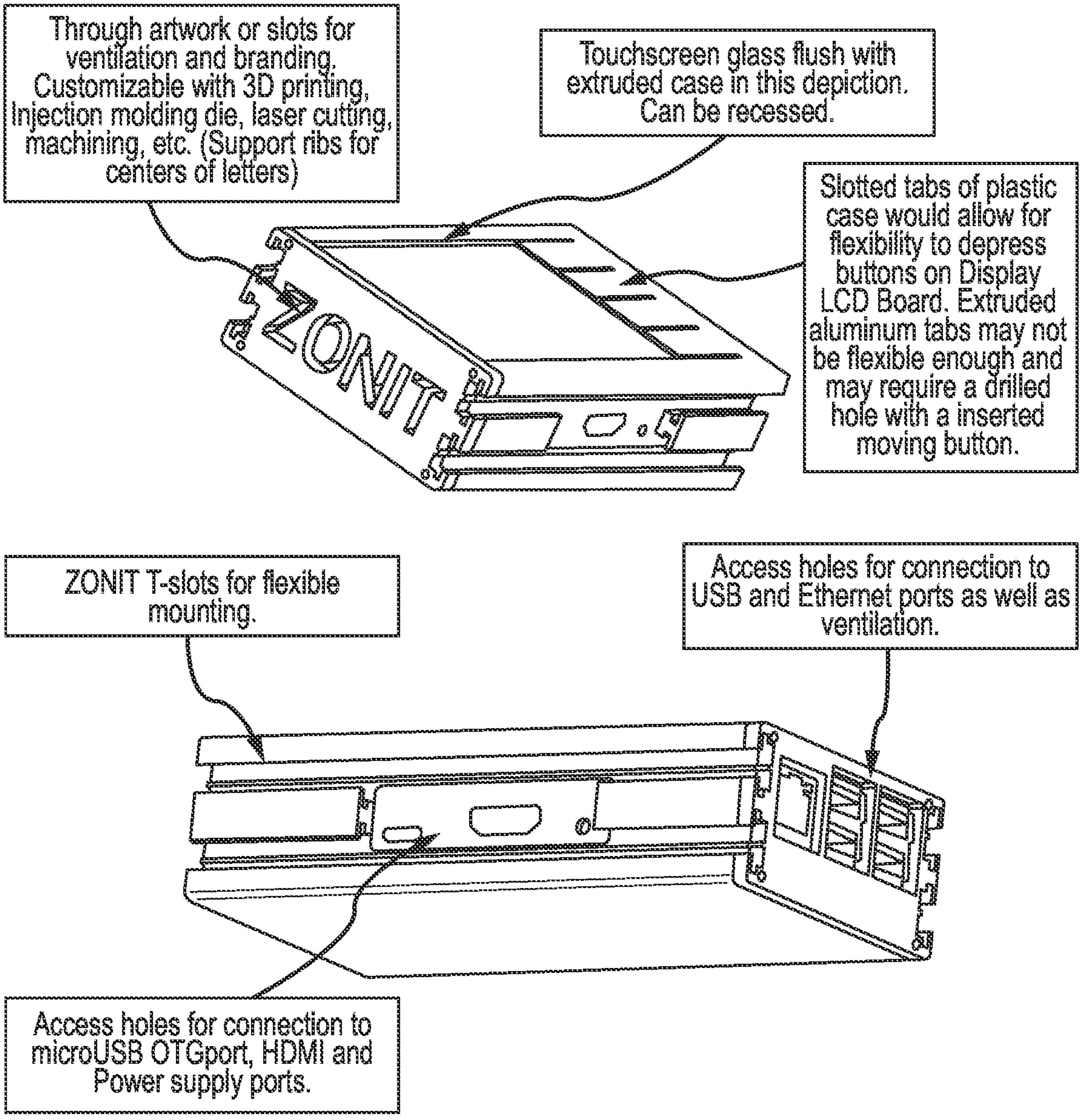
Figure 28:
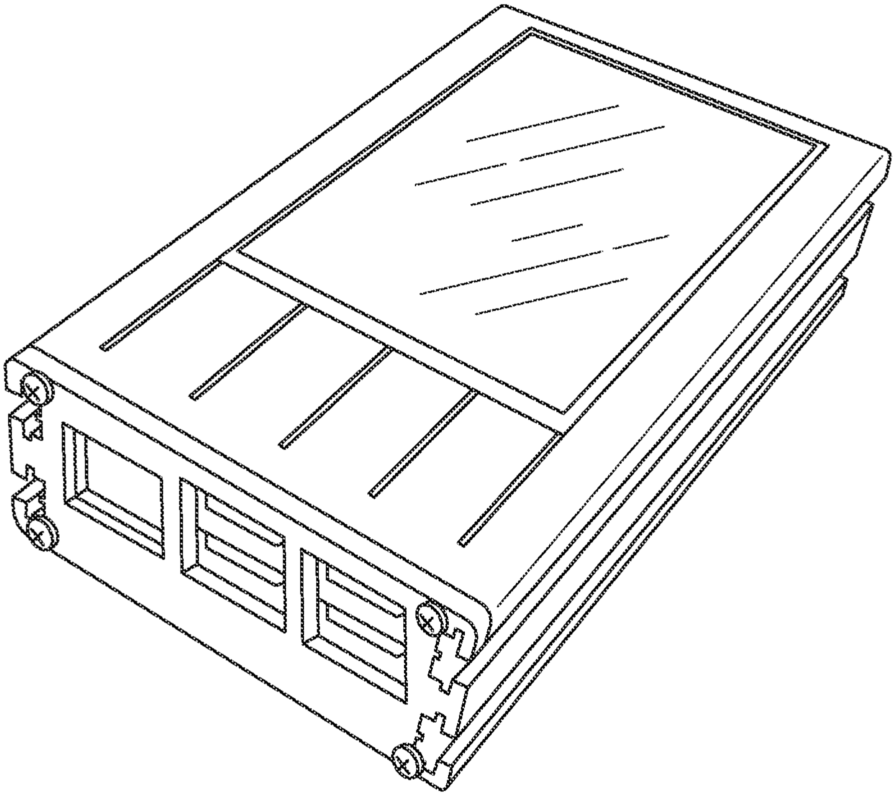
Figure 29:
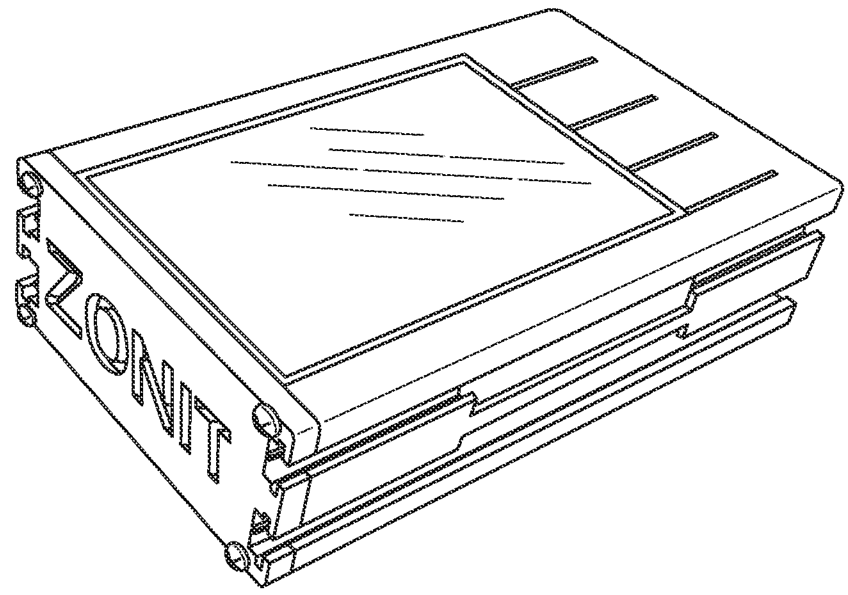
Figure 30:
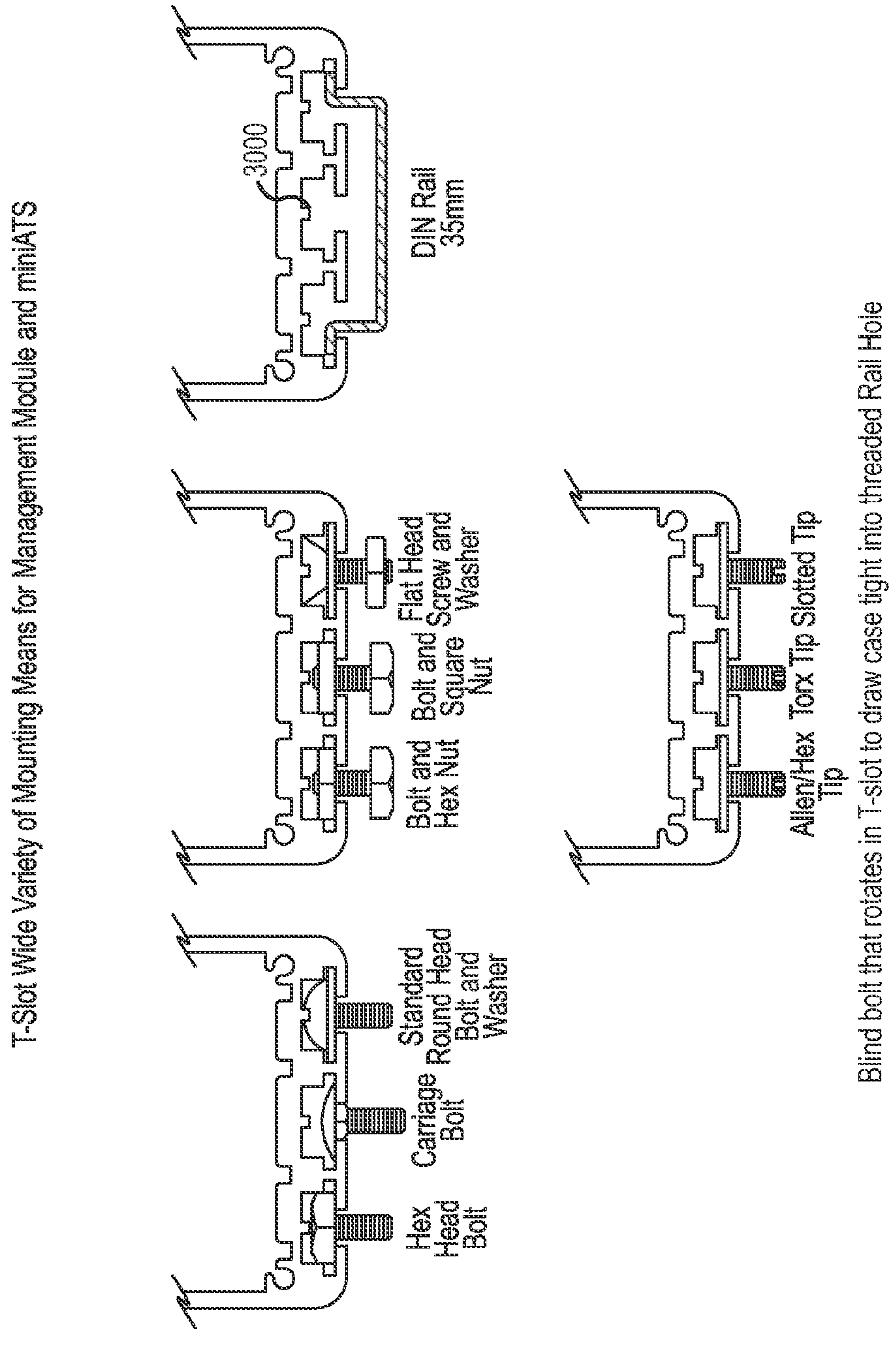

In yet another embodiment, the control module can optionally incorporate a touch display and can optionally be provided with user activated buttons for easy use as is shown in FIG. 27. It can be implemented via inexpensive mass-produced hardware, such as a Raspberry PI or other suitable single board computer (SBC). It can also be implemented as a compute module (many use a SODIMM connector) and optionally a baseboard or be integrated into the target device or stand-alone case or rack or structure in other suitable ways. Both of these, especially the compute module approach are very space efficient ways of implementing the needed functionality, which is very important in data center rack environments, where space is at a premium and other environments and applications where that is true.

The control module runs embedded Linux (or Android) and that offers a wide variety of possibilities. The user interface, data analysis and storage capabilities and possibilities for the control module benefits greatly from the choice of cell phone derived hardware (SBC or compute module+optional baseboard) hardware, both economically and in its possibilities and flexibility. The GUI can be designed to function at multiple levels and work on multiple devices with appropriate functionality to each viewing device's form factor and capabilities. For example the control module can support one or more local displays, (touch capable or not) connected via the GPIO header of the SBC or compute module+baseboard or device enclosure provided connectors or connected via an HDMI video connector or other suitable method and/or connector. This allows a wide range of display screens to be used and connected in a variety of ways as required. The local display can be optimized to show the information that is most appropriate for the user to see when they are standing at the rack. The other aspect of the GUI is that it can also have a Web display. This can be viewed as a Web interface on a remote device, although it could also be viewed on a local display. The Web interface can be viewed on a cell phone, a display tablet, a laptop computer or a desktop computer. It can be optimized for the display device and its capabilities. It is typically viewed via a TCP/IP connection (either wired or wireless) but can also be very conveniently viewed at the rack using standard or Web Bluetooth. Standard Bluetooth is higher bandwidth but higher power consumption and Bluetooth Low Energy is lower bandwidth but lower power consumption. Either could be used, depending on what functionality is desired. Web Bluetooth lets you control any Bluetooth Low Energy device (the control module, smart home appliances, health accessories like heart rate or glucose monitors, temperature sensors, etc.) directly from smart phone, tablet or PC (preferably a laptop), without having to install an app first. Web Bluetooth will eventually enable developers to build one solution that will work on all platforms, including both mobile and desktop, which means lower development costs, more open source control interfaces for various physical products, and more innovation. Web Bluetooth is designed to make accessing a device easier than using 802.11 WiFi, (and many wireless communication methods are prohibited in many data centers because of security concerns) Either version of Bluetooth is designed to be used at relatively short range such as when walking up to a kiosk with your cell phone or wearing BT headphones. Bluetooth is often acceptable in the data center when used in this manner, because it does not penetrate the walls of the building as far as WiFi or other wireless methods. This allows a user to walk up to a rack and use a convenient device like a cell phone or tablet to conveniently interact with the control module. This is believed to be a unique feature in this field of use.

In one embodiment, how the Web page interface is implemented could be combined to be advantage with Web Bluetooth. Web Bluetooth is easy to use but lower bandwidth than standard Bluetooth. The control module Web GUI can be implemented as a Single Page Application. A single-page application (SPA) is a web application or web site that interacts with the user by dynamically rewriting the current page rather than loading entire new pages from a server. This approach avoids interruption of the user experience between successive pages, making the application behave more like a desktop application. In an SPA, either all necessary code-HTML, JavaScript, and CSS—is retrieved with a single page load, or the appropriate resources are dynamically loaded and added to the page as necessary, usually in response to user actions. The page does not reload at any point in the process, nor does control transfer to another page, although the location hash or the HTML5 History API can be used to provide the perception and navigability of separate logical pages in the application. Interaction with the single page application often involves dynamic communication with the web server behind the scenes. The advantage of using SPA in this instance is that it moves most of the workload to the client device (which is likely to be a newer cell phone, tablet, laptop or desktop computer with even more processing power and graphics performance than the control module!) and after the initial download of the first page, the bandwidth requirements are reduced and the Web interface will be more responsive. This is likely a unique feature in this field of use.

Figure 75:
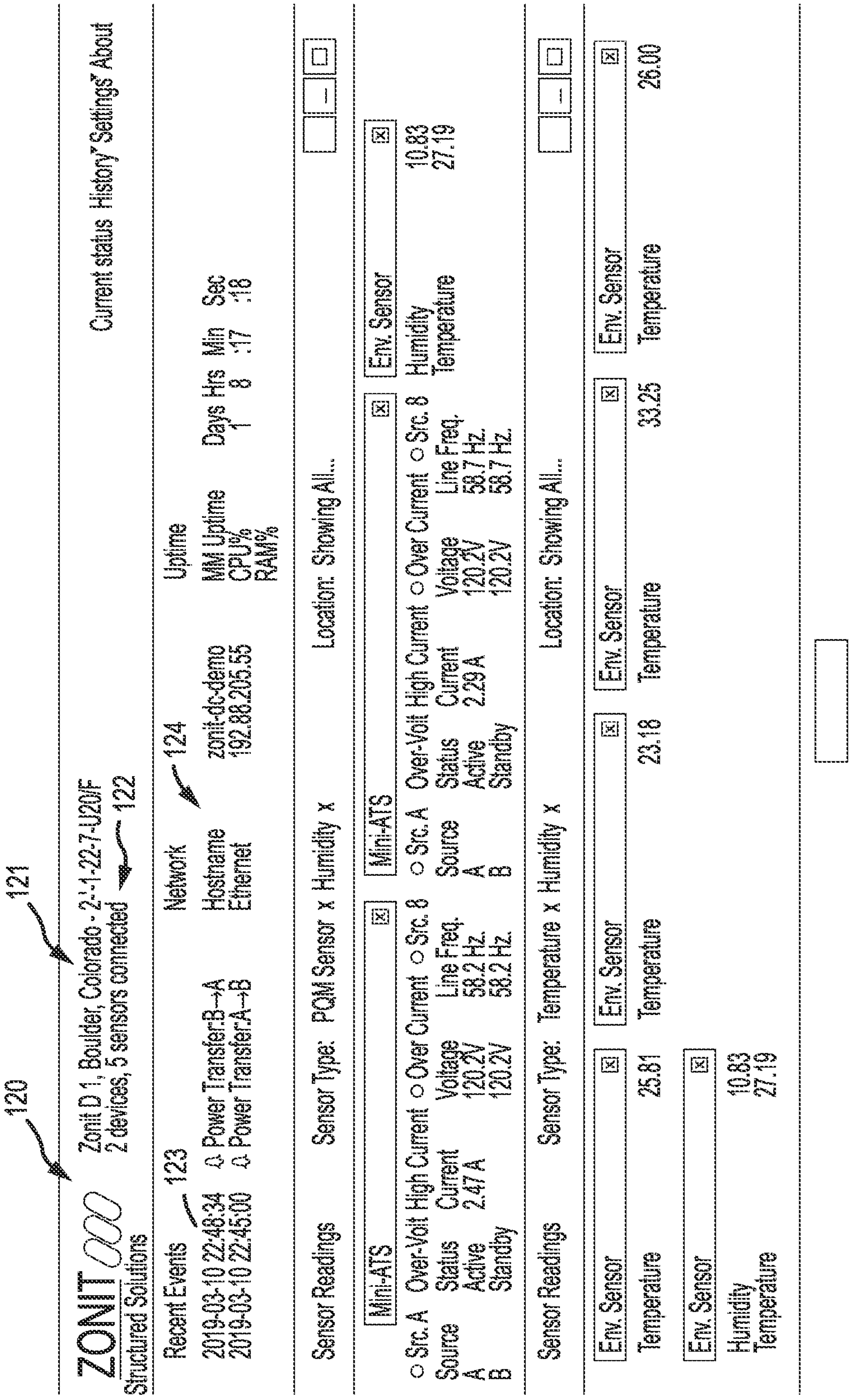
Figure 76A:
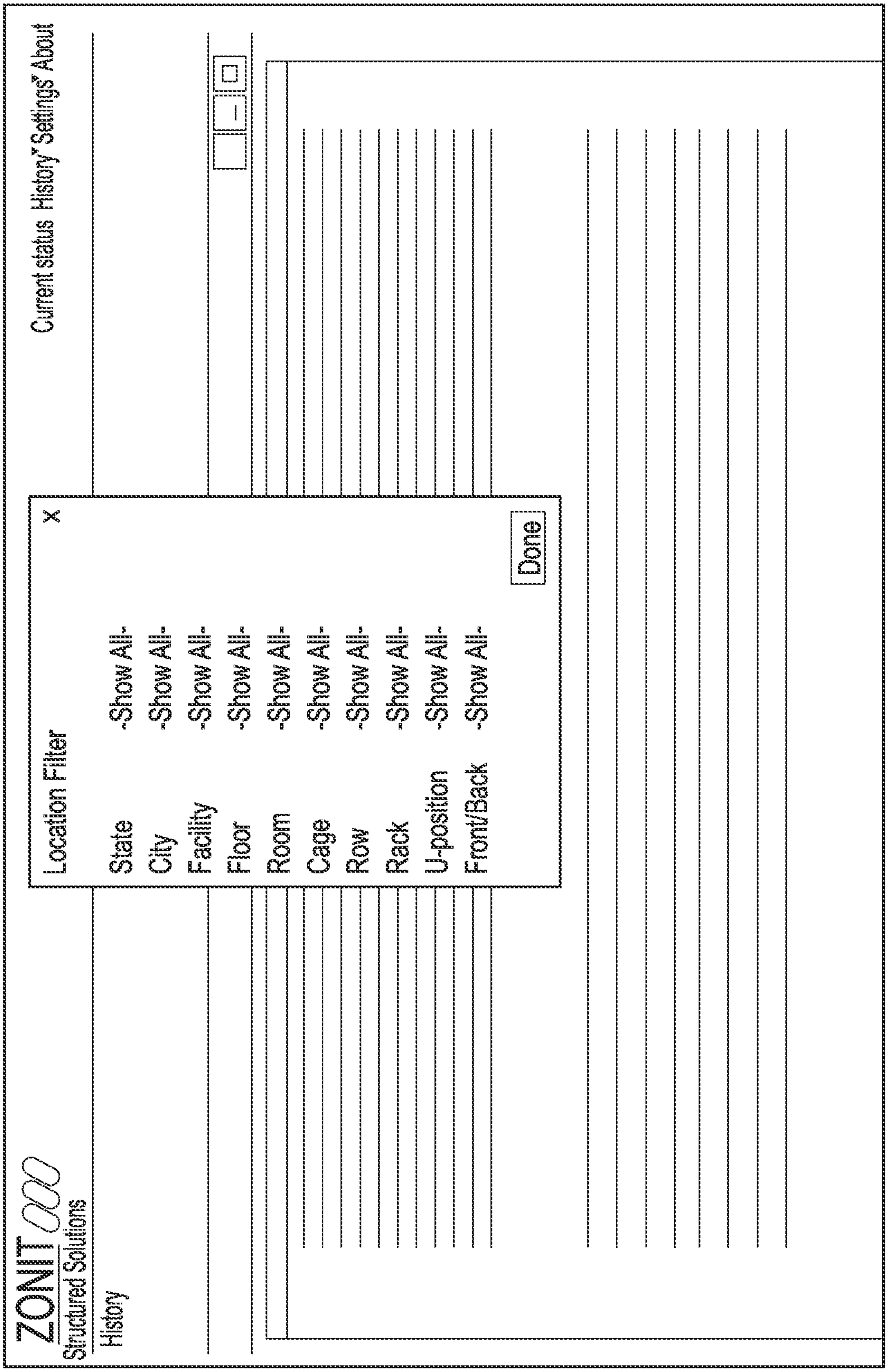
Figure 76B:
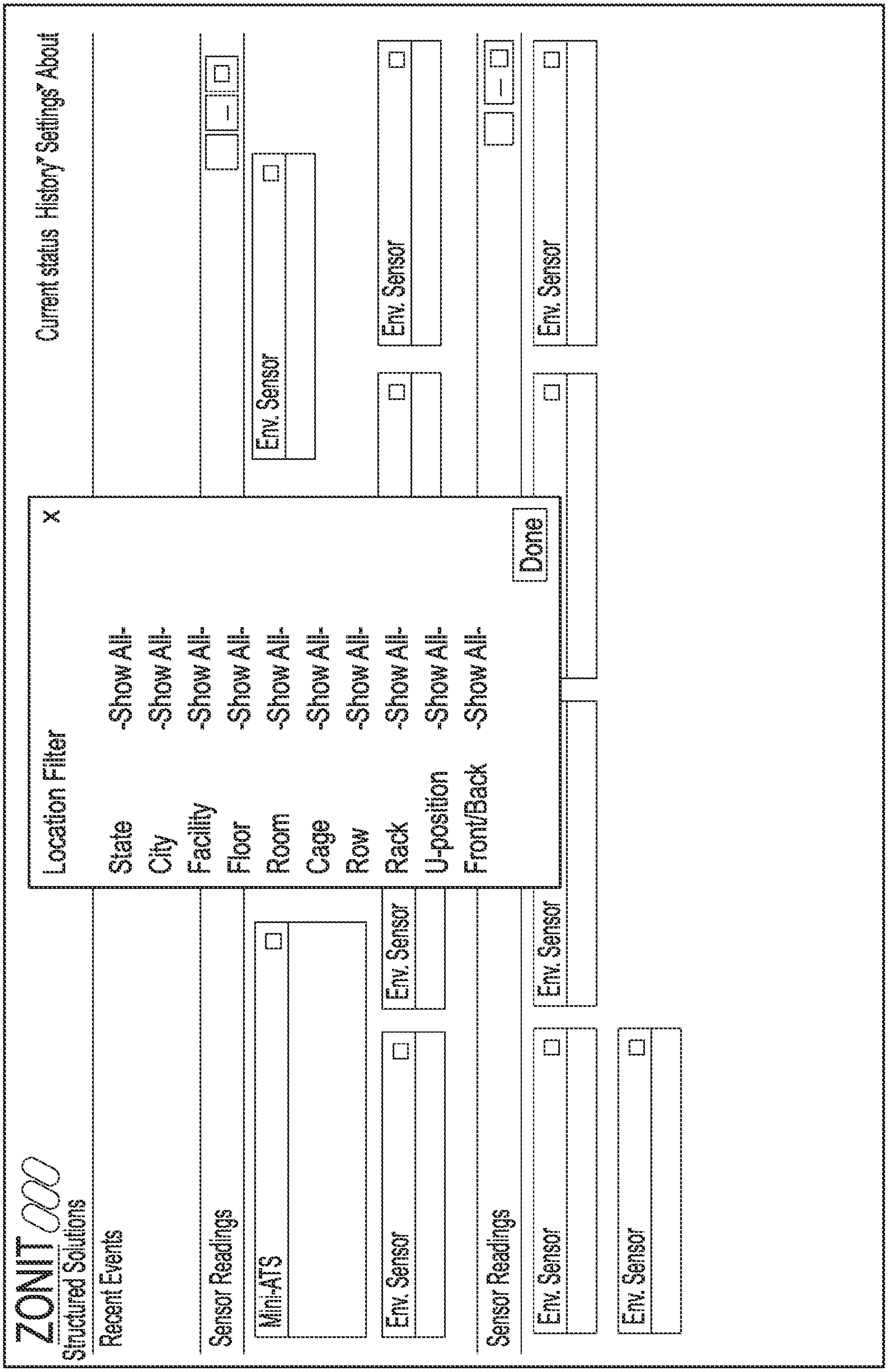
Figure 77:
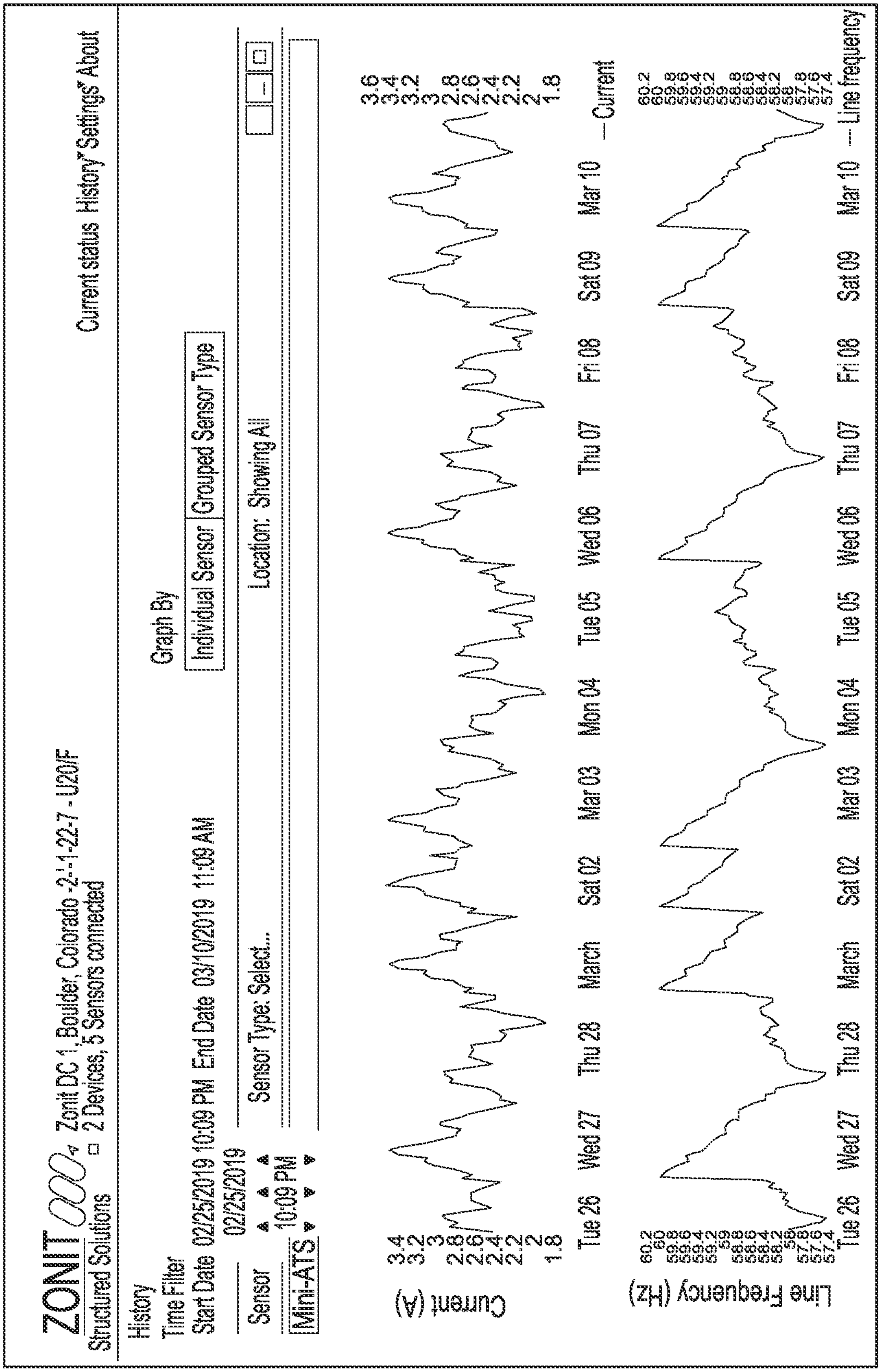

In one embodiment, consider FIG. 75. This is a possible instantiation of a home page of a Zonit control module GUI. The home page in this example is divided into several horizontal regions with different functions. The top region contains the Zonit logo 120, and then two elements, the user-set location of the Zonit control module 121 and the currently connected device and sensor totals 122. The next horizontal region is the current status of the control module divided into Alerts 123, Network Status 124 and Control module system status (nick-named the Management Module MMi or Z-MMi by marketing) with uptime, current CPU utilization percentage and RAM usage statistics. The next horizontal region is a sensor tile. Each sensor tile can filter what it currently displays by either user-defined location and/or sensor type. Sensor types can include Power-Quality-Measurement (PQM) which is provided by a Zonit compatible power distribution device such as the Zonit Mini-ATS or other compatible device for example. In this case the device can have one or more PQM sensors and the device can be reported on and managed by the Zonit control module. Other sensor types are temperature, humidity, airflow, rack door status (open/closed), water present (yes/no), smoke detected (yes/no), other sensor types could be incorporated as needed. The location of each device or sensor is set by the user when it is installed. A sample location setting is shown in FIGS. 76A-76B. The combination of these two filters is powerful. It allows an end user to define as many sensor tiles as needed and have each reflect the location (for example every sensor in a given defined row that is a temperature sensor) and sensor type(s) chosen. Turning now to the History page shown in FIG. 77, we now add the ability to view the data for a defined time period as a graph and maintain the same sensor type and location filtering capabilities. The graphs can be set to show a single sensor each or to combine like sensor data into one graph, for example all temperature sensors would display their data on one graph. The next feature of the GUI is the Graphical Search page. This page allows the user to construct a Boolean query with multiple parameters for a given time period and then view all matches to that query as a tabular list of results. Clicking on any of the tabular results gives the user a graph of the data for the time period selected. The chosen search value or value range can be shown on the graphs to allow the user to easily detect any exceptions by sight. Additional filters can be made available are sample window (all data points in the defined time period of the sample window must match the Boolean query to generate a search hit) and sample window percentage (a given percentage of the data points in the defined time period of the sample window must match the Boolean query to generate a search hit). These additional filters are very useful for searching "noisy" data and quickly figuring out what really matters in that data. The next feature of the GUI is the Events/Alerts page. Each event or alert recorded by the control module can be shown here. If additional details for a given alert are available, the alert summary can be clicked on and the detailed information shown. The next feature of the GUI is the incorporation of Graphana. Graphana is the most commonly used tool for building monitoring dashboards for Internet-centric companies with large server farms. We include it to allow end users with the skills and desire to customize the output of the Zonit control module via the most commonly used tool for that task. This is a very powerful feature for organizations that desire to customize the Zonit control module and have the skills and experience needed to do so. These are just the highlights of an example implementation of the GUI. Many other enhancements and features can be incorporated as needed and desired.

A unique feature of the Zonit control module is that the data it collects is both location and type tagged. This allows very sophisticated searches for data, such as by a rack, a row, a cage, a suite, a floor or any other location or sensor type parameter. Additional parameters can be added to each data point as needed, such as power distribution topology location, network topology distribution location, USB device topology location etc. This tagging of data points makes them much more powerful and useful. As an example, consider the following. Many USB devices such as sensors do not have unique ID's as part of what can be identified when they are plugged in. This makes using them more difficult, because if you move them, or swap out a bad one, then you can not easily determine how to associate the new sensor data with the old sensor data. The Zonit GUI eliminates this problem in a number of clever ways. When a new USB device is detected, the Zonit control module assigns it a unique ID string that is based on it's USB topological location. The following example illustrates how this is done.

```
% lsusb -t
/: Bus 02.Port 1: Dev 1, Class=root_hub, Driver=dwc_otg/1p, 480M
    |___ Port 1: Dev 2, If 0, Class=Mass Storage, Driver=usb-storage, 480M
  /: Bus 01.Port 1: Dev 1, Class=root_hub, Driver=dwc_otg/1p, 480M
    |___ Port 1: Dev 2, If 0, Class=Hub, Driver=hub/4p, 480M
        |___ Port 1: Dev 13, If 0, Class=Hub, Driver=hub/7p, 480M
            |___  Port 6: Dev 14, If 0, Class=Human Interface Device, Driver=usbhid, 12M
            |___  Port 6: Dev 14, If 1, Class=Human Interface Device, Driver=usbhid, 12M
            |___  Port 7: Dev 15, If 0, Class=Human Interface Device, Driver=usbhid, 12M
            |___  Port 7: Dev 15, If 1, Class=Human Interface Device, Driver=usbhid, 12M
        |___      Port 3: Dev 12, If 0, Class=Mass Storage, Driver=usb-storage, 480M
```

Which we can translate to for the Zonit devices and sensors we care about: The syntax is USB HOST PORT #::USB PORT #:USB END-DEVICE USB1.P6:temp-sensor
USB1.P7:temp-sensor
USB3:storage
USB5:storage Each hub added to the topology simply adds another ".PX" to the ID. For example—USB1.P6:P3:temp-sensor The user also defines a location for that USB device when it is first plugged in. The GUI prompts the user to do so. The location string for that device is now defined. For example, looking at FIG. 78 we see that the location string set for the control module is set to: Zonit DC 1, Boulder, Colorado-2-*-1-22-7-U20/F. Note that location fields that are not set default to an asterisk, and when searched on can return all data points for that field. Now that we have identified the USB devices topologically and by user set location, we can now construct a GUI page that lists each USB device shown in a tree that represents the USB topology and also lists each location. This is a great aid to users when they are trying to deploy or identify or modify their USB topology, wiring, sensors and device connections. It can also be used to associate a new USB device or sensor with an older device or sensor historic data set. In this case, assume that a USB temperature sensor goes bad. A new sensor can be inserted and the control module GUI will ask to identify the location of the device. The user can enter the location (or select a previously defined one) to identify the device. The GUI can then prompt the user to associate the new sensor with the old data and the user can approve that action. Another feature that could be added would be to allow the user to define and associate a meta-tag for each USB topology string+location string. The meta-tag offers a simple shorthand for users to use when looking at the USB GUI page or working with connected devices and sensors.

Figure 79:
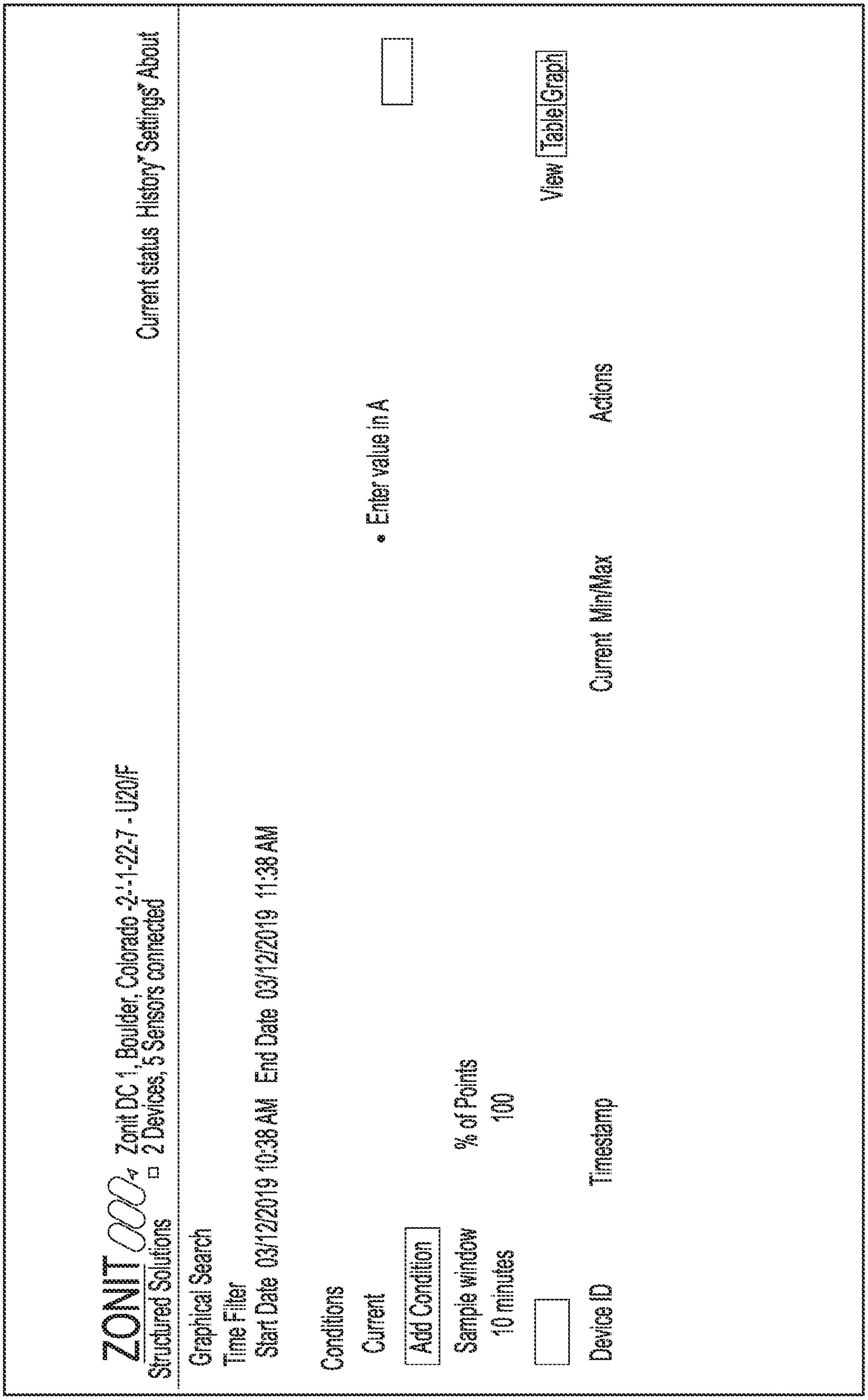
Figure 80:
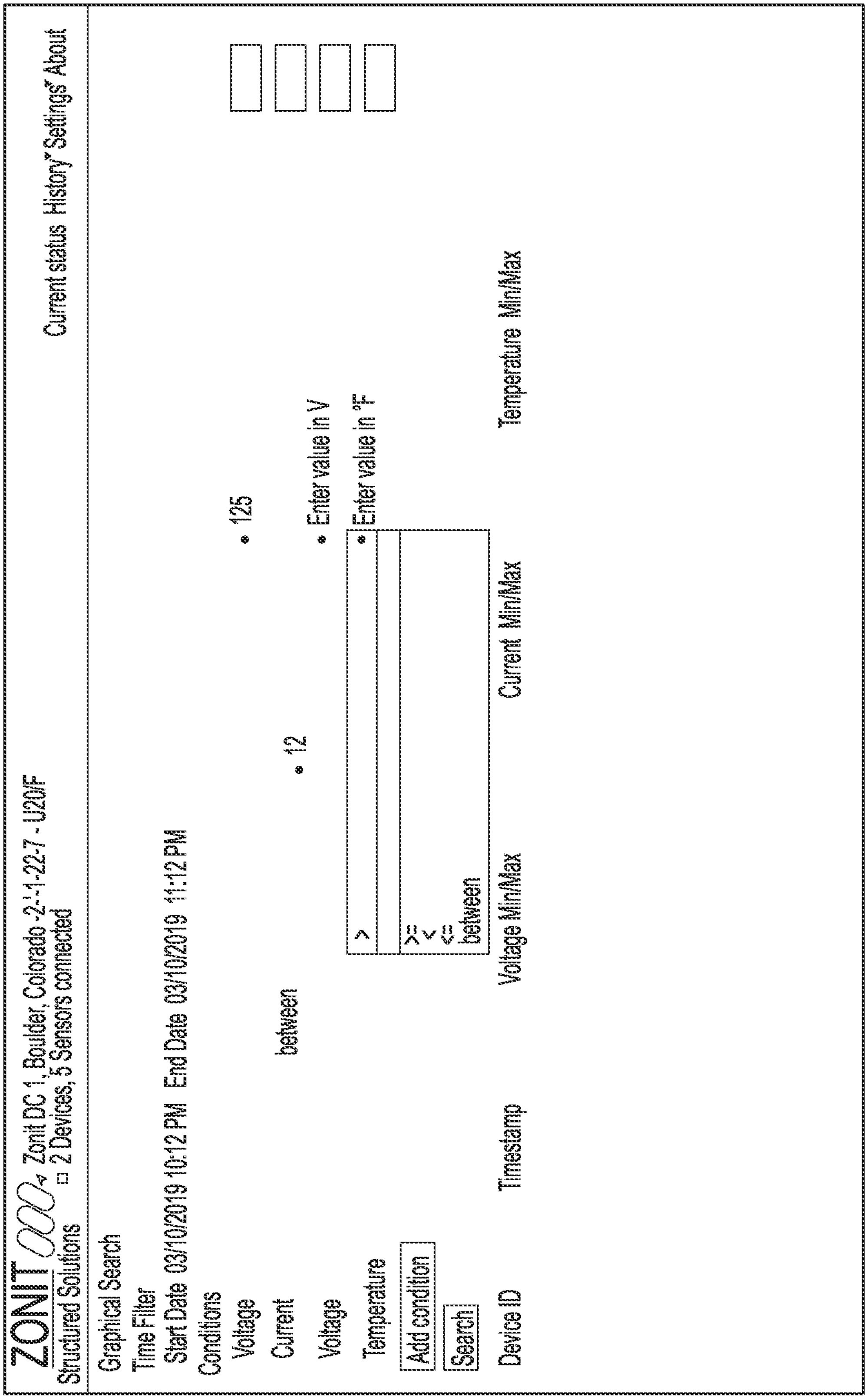
Figure 81:
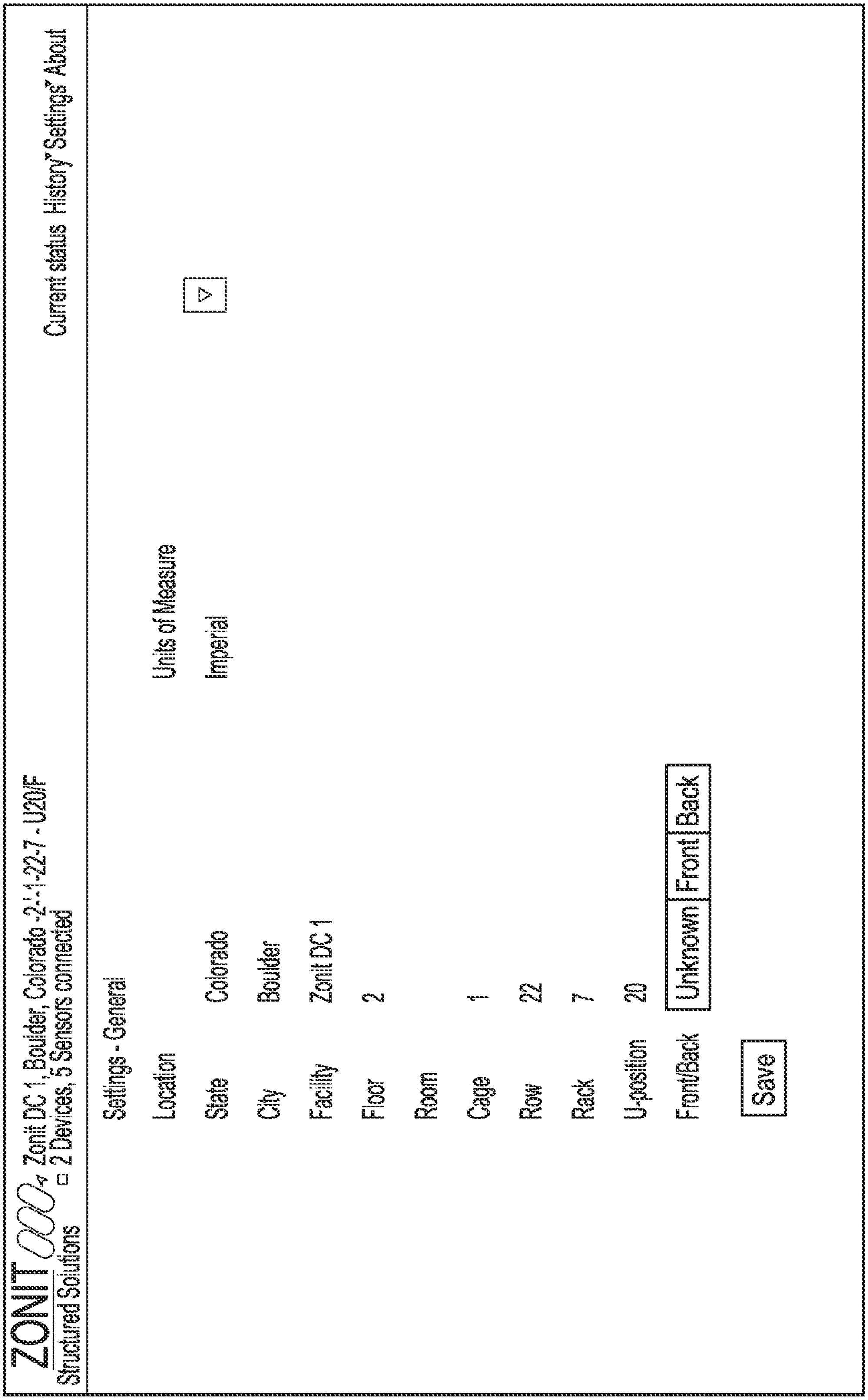
Figure 82:
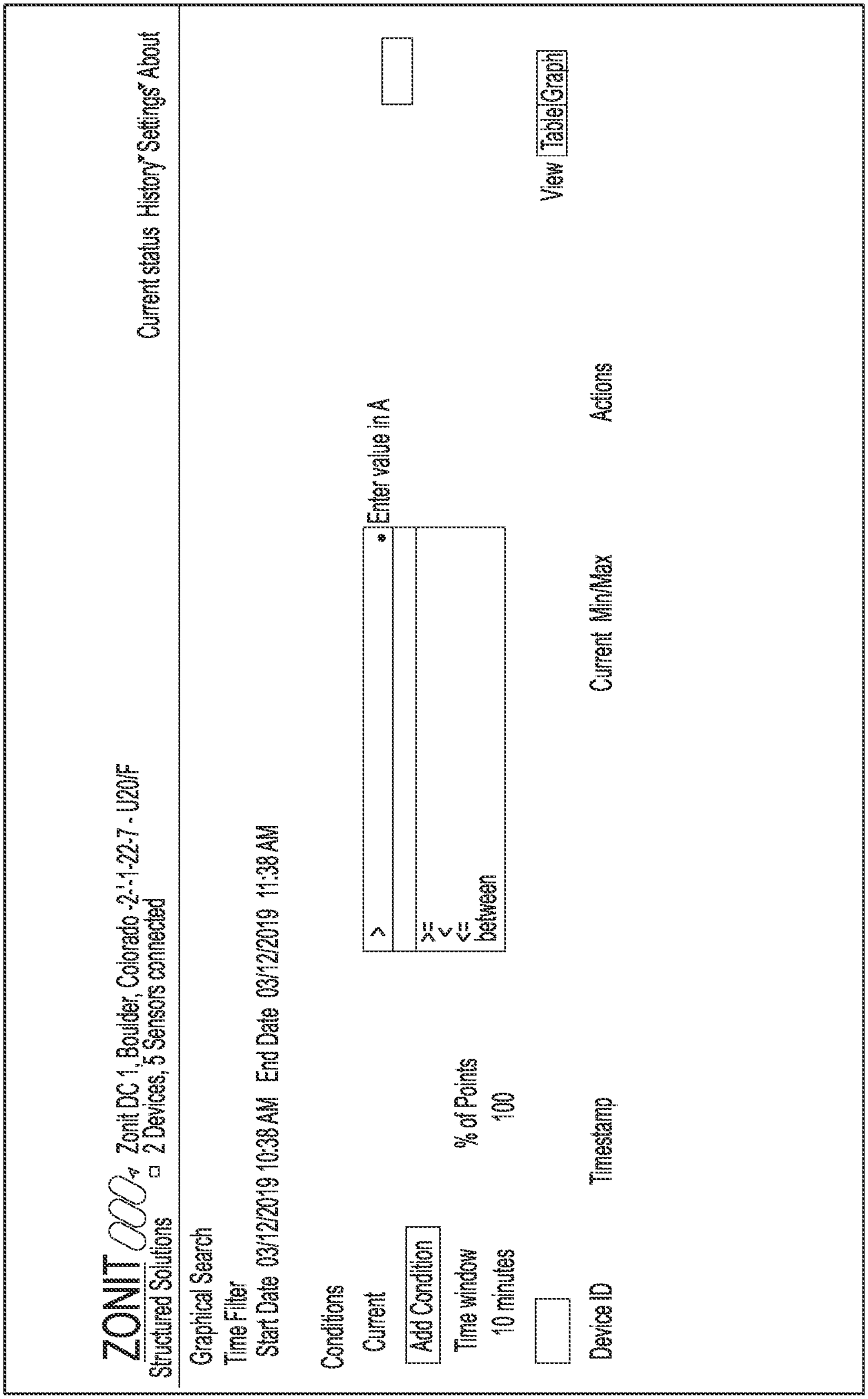

Another very useful feature of the example Zonit control module GUI described above is that it is designed to be used with Web browsers that support tabbed browsing, which all modern Web browsers do. This makes it easy and useful to view a number Zonit control modules in the same Web browser. Each individual control module can be identified by it's user defined hostname which can be shown in the tab title of the Web browser tab. An example is shown in FIG. 79. Additionally, each of the separate pages of the GUI of a Zonit control module can easily be opened in a separate Web page tab for easy viewing.

USB is the most common method to attach peripherals to single board computers like the Zonit control module. USB is useful, but it has certain limitations and issues.

1. Length of a single passive cable—Sixteen feet is a reasonable maximum for USB 2.0. Longer lengths require active repeater cables, which are essentially a hub in a cable, using up one repeater level in a USB topology.

2. Maximum number of repeaters in topology (5)—This is a reasonable maximum number, but to get it to work, you need to use powered USB hubs, which consume power outlets in data center racks, which is not desirable.
3. Quality of consumer grade cables—These vary GREATLY. The USB standard is clear, but many manufacturers cut corners to save costs, which result in USB cables that only work in simple consumer applications, but cause failures or worse unreliability when used in commercial applications where reliability is a must.
4. Quality of consumer grade USB hubs—There are a few USB driver chip suppliers for these hubs. Some are good, some not so good.
5. Robustness of USB host implementation—This varies by OS release and the hardware that is driving. It varies in practice.
6. Overall reliability when used in commercial implementations—There are too many variables to let end users just buy what they want and expect it all to work right, which is frustrating to end users and a support nightmare for a company. This is a really big problem, and the only rational solution is to limit what you support to components that you have tested together and trust to work.

We have come up with a more robust, lower-cost solution that uses available technology in a novel way. It used DTMF dial-tone technology as a “channel selector” and audio technology for the output (out via a speaker port) and input (in via a microphone port) channels. This invention uses readily available hardware to implement a robust, flexible, low-cost solution for the majority of sensors needed in the data center at-the-rack.

Advantages:

1. Cable availability & length—Can use simple, readily available audio 3 & 4 wire cables using standard audio jacks, for example the 3.5 mm jack. Because of the signaling used, these cables can be low-cost and will function reliably in very long lengths, which is desirable and could be very useful if using the Zonit control module with sensors in an industrial, office or home environment.
2. Cost—The components we are using are produced in great numbers driving down the cost point.
3. Software support—The DTMF software and audio drivers are available and function reliably.
4. Sensor support—This invention is very well suited for use with low bandwidth type sensors such as temperature, humidity, airflow, moisture present (yes/no), rack door status (open/closed), smoke detected (yes/no), and other sensors that do not require high bandwidth. It is not well suited for high-bandwidth sensors such as video cameras, etc.

Figure 83:
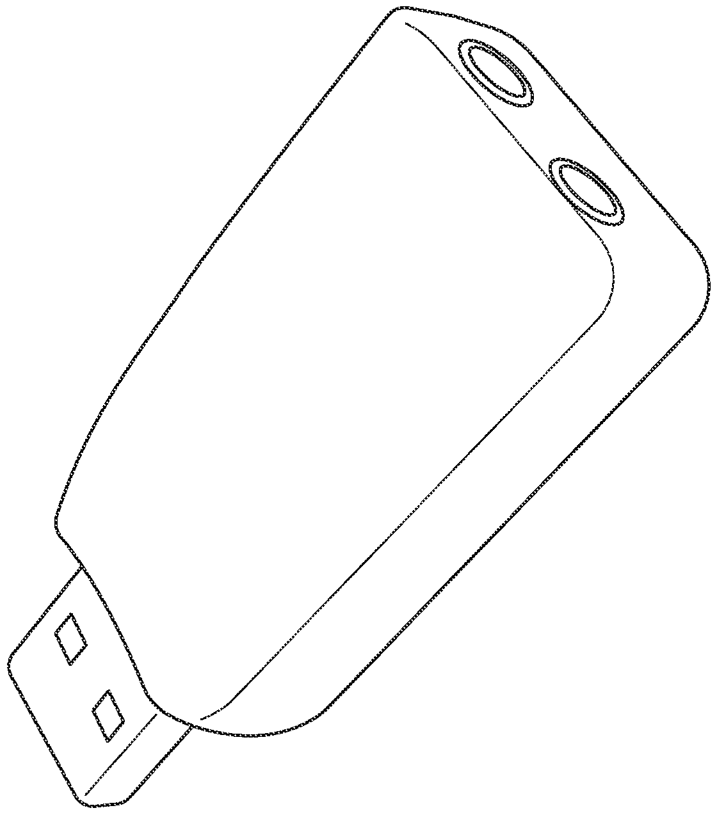
FIGS. 83-87 show control module adaptors and sensor interfaces in accordance with the present invention.
Figure 84:
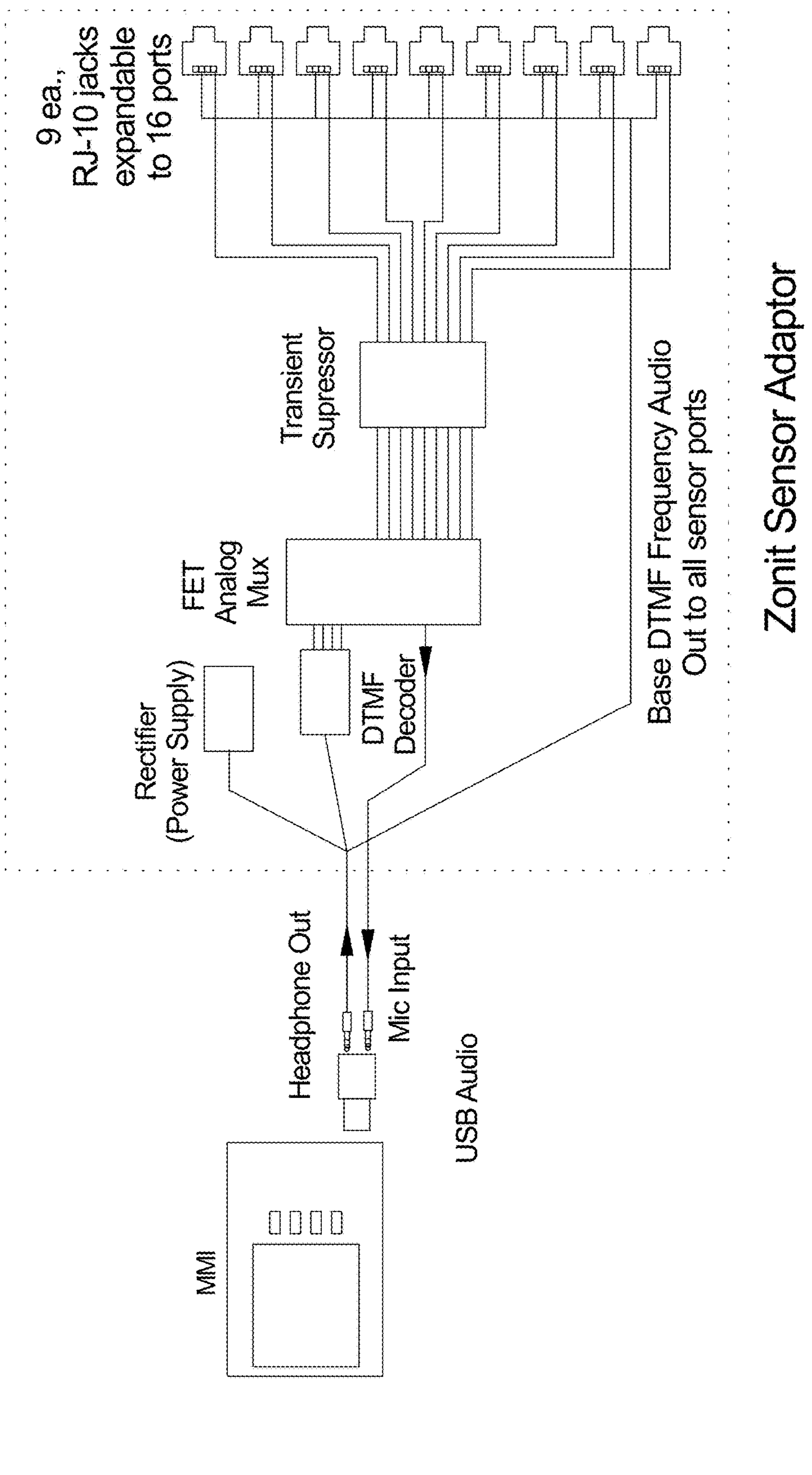
Figure 85:
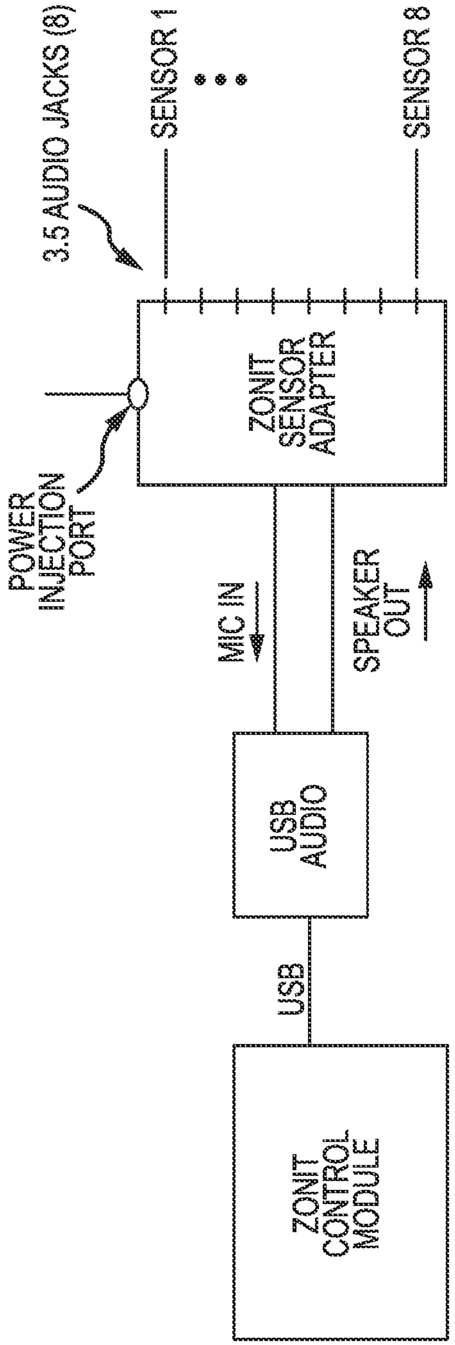
Figure 86:
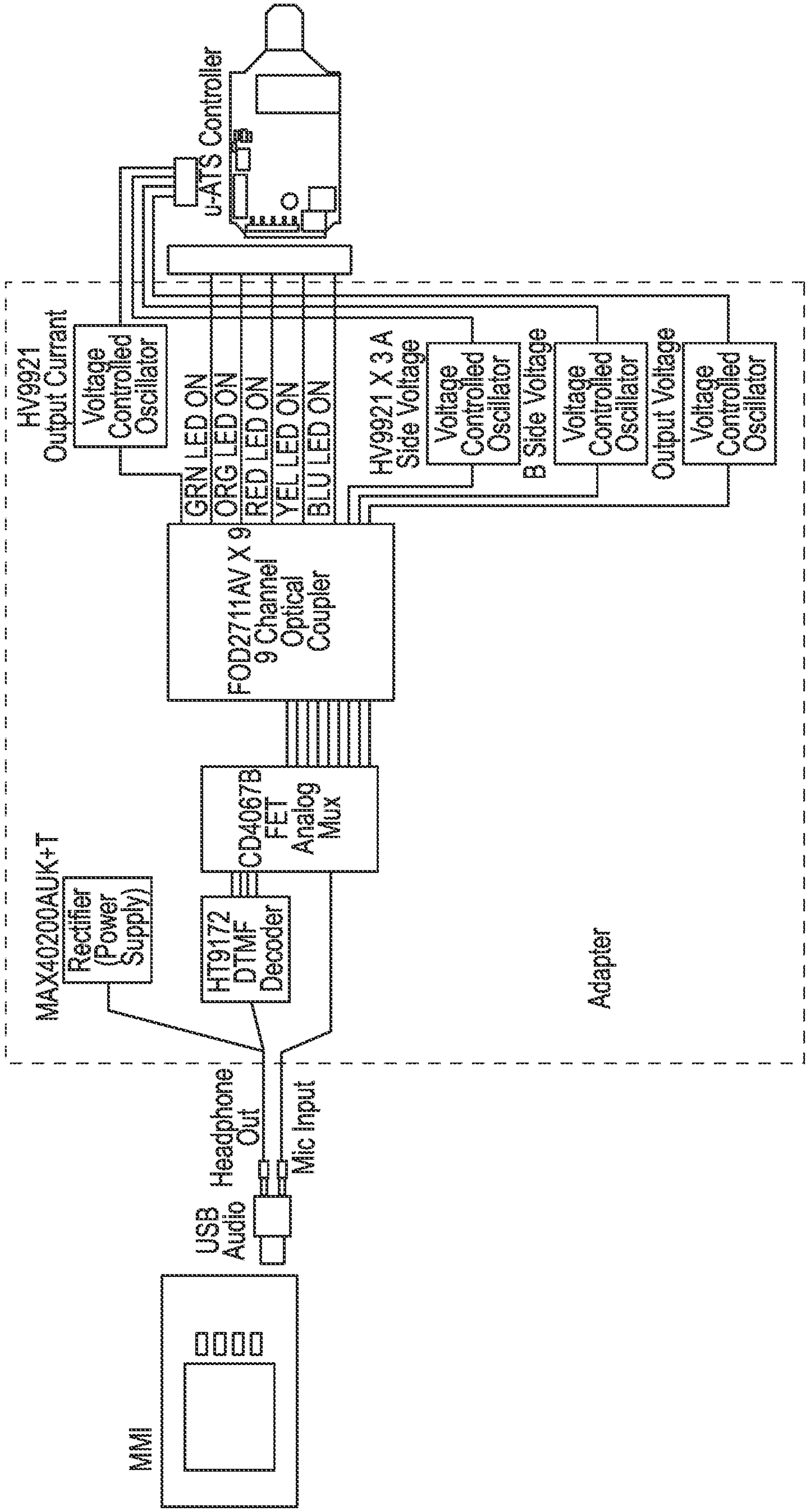

The invention consists of the following components:

1. Audio ports (microphone & speaker) on the host computer. If none are present, one can use one or more inexpensive USB audio devices, see FIG. 83 for an example. This is also a simple way to add more sensor channels to a given Zonit control module or computer.
2. The Environmental Sensor Interface and Multiplexor, (ESIM). An example instantiation of this device is shown in FIG. 84. It will be small, and for many sensor types can be powered by it’s audio connection to the control module. Airflow sensors use a bit more current than other sensor types, so the ESIM has provisions for external power injection, one option is via a standard USB port. This allows the use of a simple phone charger to provide auxiliary power to the ESIM, and they are available worldwide. It has one USB client port, one USB connector power injection port and up to 34 three or four wire 3.5 mm jacks in this example. Alternatively, RJ series connectors (RJ-10 or RJ-11 would work well) can also be used, as is shown in other figures. RJ cabling is simple to make in custom lengths, making the cabling tidy. Each jack can have one Zonit sensor attached to it. The cable length possible to the sensor is very long, hundreds of feet or more as stated earlier. A sample basic functional diagram of the ESIM is shown in FIG. 85. As noted other suitable connectors and cables could be used in this application, as needed. This might allow the convenient use of previously installed cabling systems in a data center or other structure.
3. Zonit Sensors. These can be a set of sensors that output data to the connected ESIM via suitable cabling. The data is encoded into standard audio formats and then transferred to the Zonit control module via the microphone input where it is decoded into standard digital data values.
4. Other Devices. It should be noted that the ESIM can also be modified to monitor other types of devices. An example of this is shown in FIG. 86 where a Zonit Micro ATS could be monitored as shown. The Micro ATS would be modified to have suitable connections for this purpose, but the key point is that the Micro ATS or other device can output very simple analog data and the ESIM can encode and communicate it back to the Zonit control module where the data can be stored, processed, displayed and acted upon. This means that only very simple modifications to make the analog signal available to the ESIM are needed to the target device to be monitored. The communication method shown can also be adapted to send commands to the simple device from the Zonit control module. The methods and apparatus described are very useful for adding monitoring, reporting and control to a wide variety of devices.

We will now discuss the theory of operation of the ESIM in more detail. The Environmental Sensor Interface and Multiplexor, or ESIM is designed to allow easy and economical interface between the Zonit control module and a wide range of environmental sensors commonly utilized in the Data Center. Some of the Environmental Sensors types that are applicable, but not limited to, include the following classes:

1. Temperature sensor. Simple Resistive element thermistor type sensor
2. Humidity. Honeywell HIH400 series chip Humidity sensor, analog output
3. Airflow. Dual element differential sensing, analog output
4. Door Closure. Security and access control, simple switch closure sensing
5. Smoke/Fire. For monitoring traditional Smoke and Fire alarm apparatus, utilizes switch closures
6. Under-floor Water or flood detection. Simple switch closure, electronic sensing
7. Security. Intrusion detection, optical beams, glass-break, etc. sensors, switch closure sensing
8. Audio monitoring. Simple microphone placement.

9. Pressure sensing. 4 wire 018-511 pressure differential sensor, analog output
10. Weight sensing, 4 wire strain gauge bridge modules, analog output.

Figure 87:
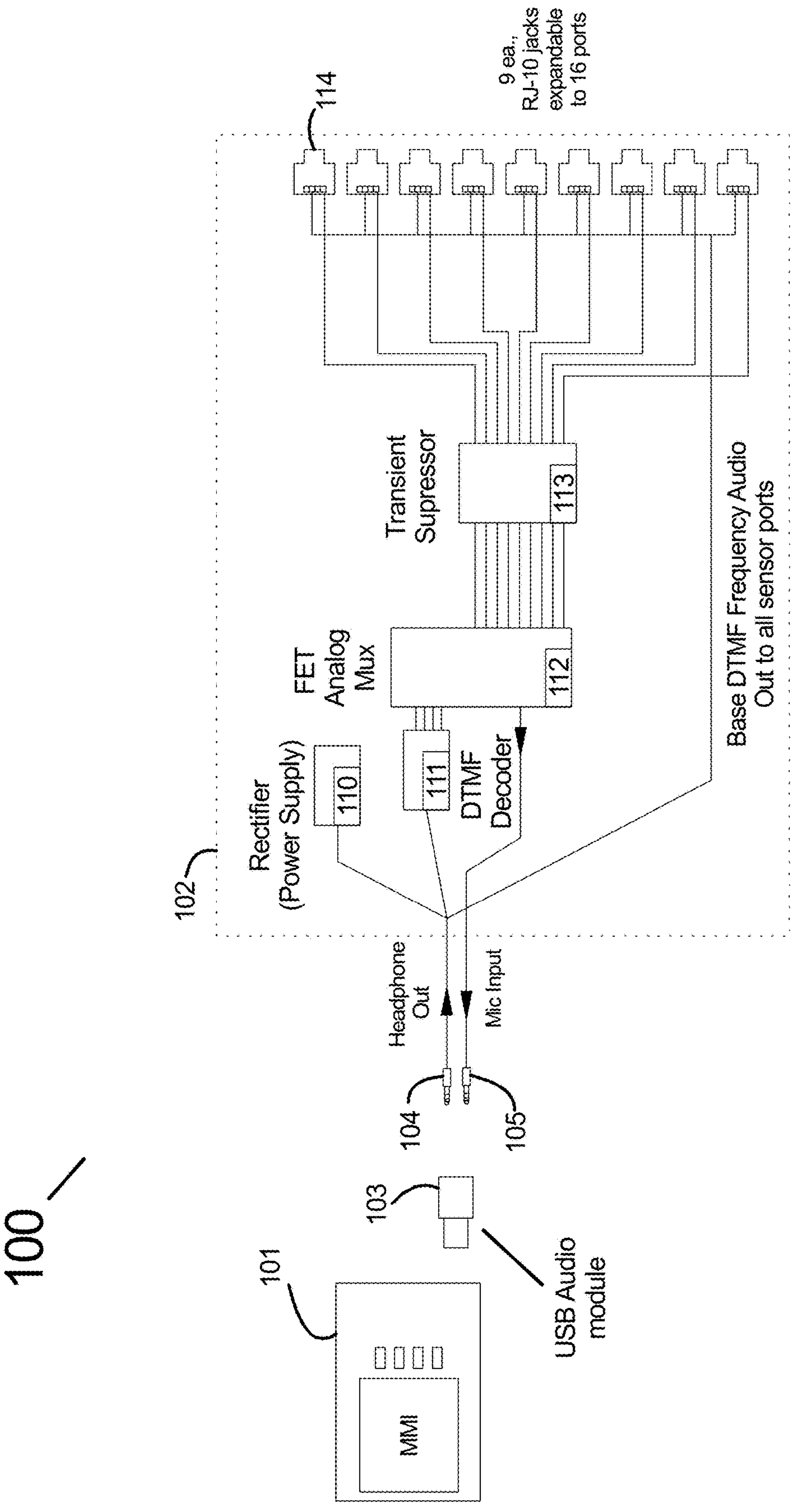

We will now describe how the ESIM functions. The controlling host, shown in this example as a Zonit control module, but it could be any computing capable device with USB ports that can be configured to communicate with industry standard USB based audio stereo codecs. Consumer grade USB audio microphone and headset interfaces are common and low cost. This can provide the interface between the host computer and the ESIM, if the host computer does not already have them or additional sensor connections are needed on that host computer. FIG. 87 shows the overview of the system. The Zonit control module (or any USB capable computer) is shown on the left side. It is interfaced to by a commercially available USB to audio module 103 codec in this example. The connection between the codec 103 and the ESIM 103 is accomplished with industry standard 3.5 mm headphone cables. The signaling is all audio frequencies, and thus the length of the cable can vary from a few centimeters to many meters with little effect on the signaling. In addition, the signaling is filtered to audio frequencies and all frequencies are in a certain band of frequencies. Thus noise immunity is excellent. This is ideal for cables and signaling used in an electrically noisy environment such as a Data Center.

The Host Computer generates a tone and sends it to the ESIM. The tone it generates will select the port on the ESIM utilizing industry standard dual-tone-multi-frequency, or DTMF. Each tone of the DTMF will be transmitted on the Left or the Right Channel of the Headphone (Audio Out). One tone on one side, the other tone on the other side. The tones can be combined at the ESIM and sent to the DTMF decoder, or kept separate and inserted into a different style of decoder. Either instance works for this application.

FIG. 87 shows the DTMF frequencies. A basic set of 12 selections can be made with the generic tone assignments. Combinations of these can be made that will allow extended numbers of channel selections, but these 12 were used in this example to demonstrate the concept. The Zonit ESIM is not limited to these 12 channels, but can add a greater number of channels by using additional tones.

FIG. 87 shows that when the audio enters the ESIM 102 via the headphone out jack 104, the audio is directed to three places.

1. To the power supply.
   The Audio sent from the Codec will be at about 2 Volts P-P. This can be rectified and converted up to 3.3 V in the power supply 110 necessary to drive the DTMF decoder and the MUX chips. This way, the audio itself is the source of the power to run the ESIM. This simplifies wiring and reduces cost.
2. To the DTMF Decoder chip.
   Here the tone sent by the computer determines the output of the chip in a binary selector fashion. See FIG. 2 for the general selections and the Binary Coded Output associated with the selecting DTMF. The output of the DTMF decoder chip 111 then controls an analog multiplexor switch 112 that then routes the selected audio channel to the Microphone Input jack 105, and into the codec 103, and finally to the Zonit control module or computer 101.
3. Audio also is connected to all of the transducer ports 114 to deliver a reference voltage and acoustic source necessary for some of the sensors to operate with.

Thus, when the Zonit control module wishes to check the environmental status of a particular sensor it merely applies the two tones necessary for that channel to the audio out port of the Codec via the USB port. That audio frequency pair determines the output of the DTMF decoder 111, which then selects one of the transducer ports 114 via the analog multiplexor 112. Whatever voltage and frequency is on that specific jack is presented back to the computer processing routine(s) by the ESIM through the audio connectors to the attached computer. This can then be appropriately translated to sensor or other device values by the computer, such as a Zonit control module. Since the signaling between the ESIM and the sensors is all analog and relatively low frequencies, the distances can be significant without degradation.

Both the Low tone and the high tone are sent to all of the ESIM transducer ports 114. This tone is bi-polar in both cases, meaning that the signal goes from minus 1.5 Volts to +1.5 volts at the frequency defined by the DTMF channel desired. By half wave rectifying each of these signals, 8 basic characterizations can be detected when listened to by the returning audio to the Computer.

1. Low tone—plus band only
2. Low tone—plus band and High tone plus band
3. Low Tone—plus band with High tone minus band
4. Low tone—minus band with high tone plus band
5. Low tone—minus band with high tone minus band
6. Low tone—minus band only
7. High tone—plus band only
8. High toe—minus band only.

Thus, depending on the installation of one or two diodes at the sensor, the returned signaling can be used to identify the class of transducer. The exception is transducers without an overtone. This class of transducer, such as an airflow sensor, will simply return a specific frequency that will be modulated to represent the applied voltage. For example, the airflow sensor requires more power than the simple audio to voltage conversion can supply. Thus, power will be derived from an external source. The air-flow sensor then generates a pulse width starting at 0% duty cycle representing zero volts, and going up to 100% to represent full scale. Thus, frequency and duty cycle is used for representing the analog value. Depending on the analog device, the base frequency can determine the identity of the device. For example, 3 KHZ could be used for (but not limited to) Airflow sensors. 5 KHZ could be used for representing pressure sensing. 9 KHZ could represent weight sensing, all of which are analog sensors requiring additional power sources.

Power supplied to the ESIM ports that is derived from an external power supply will be delivered to the ports 114 as an amplified representation of the DTMF signals normally powering that port. This allows an additional power supply to be attached to the ESIM without requiring additional wiring paths between the ESIM and the transducers. It's the same signaling scheme, but with more power available to drive the various devices.

FIG. 87 also shows a transient suppressor 113. This is used to protect the voltage sensitive analog switches from transients that are likely to be present on transducer leads. This transient protection may be necessary for the analog input 105 to the codec as well, but is not presently shown in FIG. 87.

The size of the control module can be critical in a number of applications. In one embodiment the control module would be based on a compute module and would occupy a space no more than about 30,000 mms, for example about 70×35×10 mm, and use a SODIMM style connector to connect to appropriate I/O connectors. One implementation of the control module is shown in FIGS. 26-29. The SBC or compute module+optional baseboard or device enclosure can be equipped with appropriate I/O functionality for the desired application. For example USB version 2.0 and/or 3.0, Gigabit Ethernet, HDMI, USB OnTheGo (supports input power option), CSI camera port, DSI display port, touch control port, IR port and many other ports can be provided. These ports can be located as needed in the control module case or device enclosure as required for the application. The low cost of the cell phone hardware ecosystem makes it space efficient and cost effective to customize this as required, which is easily possible and supported by the Raspberry Pi and similar SBC/compute module++baseboard hardware vendors, which is a significant advantage. In another preferred embodiment the control module would be no more than 10 cubic inches in size with or without a local display of appropriate size to fit in the specified volume. In another preferred embodiment, the size of the control module would be no greater than 20 square inches with an integrated local display of 3.2 to 3.5" measured diagonally. In another preferred instantiation, the control module would occupy the size of the directly attached local display in two dimensions and be less than 2 inches in depth in an enclosure that contained the display, SBC or compute module and baseboard. If the control module function is considered mission critical, the low cost of the hardware makes it feasible to replicate the control module for added reliability.

In another embodiment, the control module SBC (or compute module+baseboard) can be specified with or without integrated wireless capability such as WiFi or Bluetooth. For example, the SBC or compute module+baseboard could be specified without integrated wireless hardware. This has several advantages that are specific to the data center and other environments. The use of embedded Linux allows the addition of an external hardware module that contains the desired wireless functionality. This is because the drivers are there to use that external hardware and many models are available. The most common ones are low cost, about the size of a thumbnail and use a USB port (although other suitable ports could be used) to connect to the SBC (or compute module via a baseboard port or device enclosure port). The USB port powers the wireless hardware (Wifi and Bluetooth and other models are available) and the antenna is part of the external module. There are three primary advantages that can immediately be observed, others are possible. First, the wireless hardware modules are available, up-to-date, cheap and they are plug&play. Second, they can be removed! This is important. Data center managers are security conscious. However, many do not come from an IT background and they often do not trust software On/Off "switches." They DO trust that if they remove or never install the external wireless module, the control module is secure from being hacked via wireless and they can prevent someone from installing a wireless hardware module in their data center. Third, the data center is a difficult wireless environment. One can walk up to a rack with a simple AM/FM portable radio and the radio will pick up a lot of RF energy across many frequencies and hiss loudly once you get close to the equipment mounted in the racks. The fact that the most common external wireless hardware modules are small and USB powered lets the data center manager use a USB extension cable (optionally shielded and/or powered) and place the external wireless module in a location where it will work reliably. This can be a huge advantage!

In yet another embodiment, the SBC (or control module) variants offer significantly enhanced compute and storage capability, especially in the form factors described over microprocessors such as PIC's and previous SBC technology. Current SBC products (or compute modules) from Raspberry Pi, Odroid and many other manufacturers offer 4 or 8 core 32 or 64 bit CPU's clocked up to and above 1.5 Ghz. They can have up to 4 GB or more of system RAM. They can support up to 1 TB SD cards for data storage and since it is solid-state, I/O is very fast. They offer integrated GPU's (five-core capable of displaying 4K video at 60 fps!) for excellent local and remote graphics performance, including displaying video's for user how-to guides or other purposes. They have 1 or more Gigabit Ethernet ports (and the ability to bridge them together thanks to embedded Linux!). They can have 4-6 USB 2.0 or 3.0 ports (including USB OTG ports that can be used to power the SBC (or compute module+baseboard), an infrared receiver+more! They can drive multiple displays and display types. The bottom line is simple; these are real and powerful full-featured compute platforms, THAT COMFORTABLY FIT IN YOUR HAND OR ARE EVEN SMALLER!

In yet another embodiment, end user cell phones or tablets or laptops or desktop computers or servers could be utilized to do some or all control module functions and just use the control module via a remote and usually secure connection. One way in which this can be done is described herein via a communication channel that is designed to offer two types of functionality. In this case the cell phone becomes a trusted member of the command and control architecture and that may be useful for assigning access on a controlled basis by access device. This is different than the previously described command and control architecture (which just has GUI access) because of how it uses assigned or owned devices. This could allow for some useful variations of the architecture previously described.

All the embodiments of the control module described, especially the new small SBC (or compute module) variants and their displays derived from cell phone technology, provide a space efficient and cost effective very powerful platform for controlling, managing, reporting and analyzing; power distribution to and in the rack, cooling to and in the rack, environmental monitoring to and in the rack and physical security to and in the rack. These four elements are critical to data center monitoring and control Providing a single system and interface that addresses multiple, and preferably all these elements is an important advantage. This allows an integrated approach to managing all of these elements of the data center in a way that has not been done before. The SBC (or compute module) hardware capabilities and space efficiencies offer significant advantages. The enhanced GUI capabilities this approach allows are also new for this field of use and other potential applications. This new capability is further enhanced by aspects of the other inventions described or referenced in this filing.

In another embodiment, the control module can be replicated for higher availability. In this case, two or more control modules can both connect to the devices that they monitor, manage and control. One can be designated the primary, the other the backup and so on. They can synchronize state, settings, data and database contents, anything needed to make them functional duplicates. They can check on each others health and connections to the devices and sensors that they manage. They can both monitor the same set of sensors, where the connection mechanism to the sensor makes this convenient (Ethernet, TCP, wireless, others) or have connections to duplicate sensors in the same locations when it does not (USB). They can use the USB features of the Zonit Netstrip cases to duplicate data from a single USB sensor to two control modules.

Figure 1A:
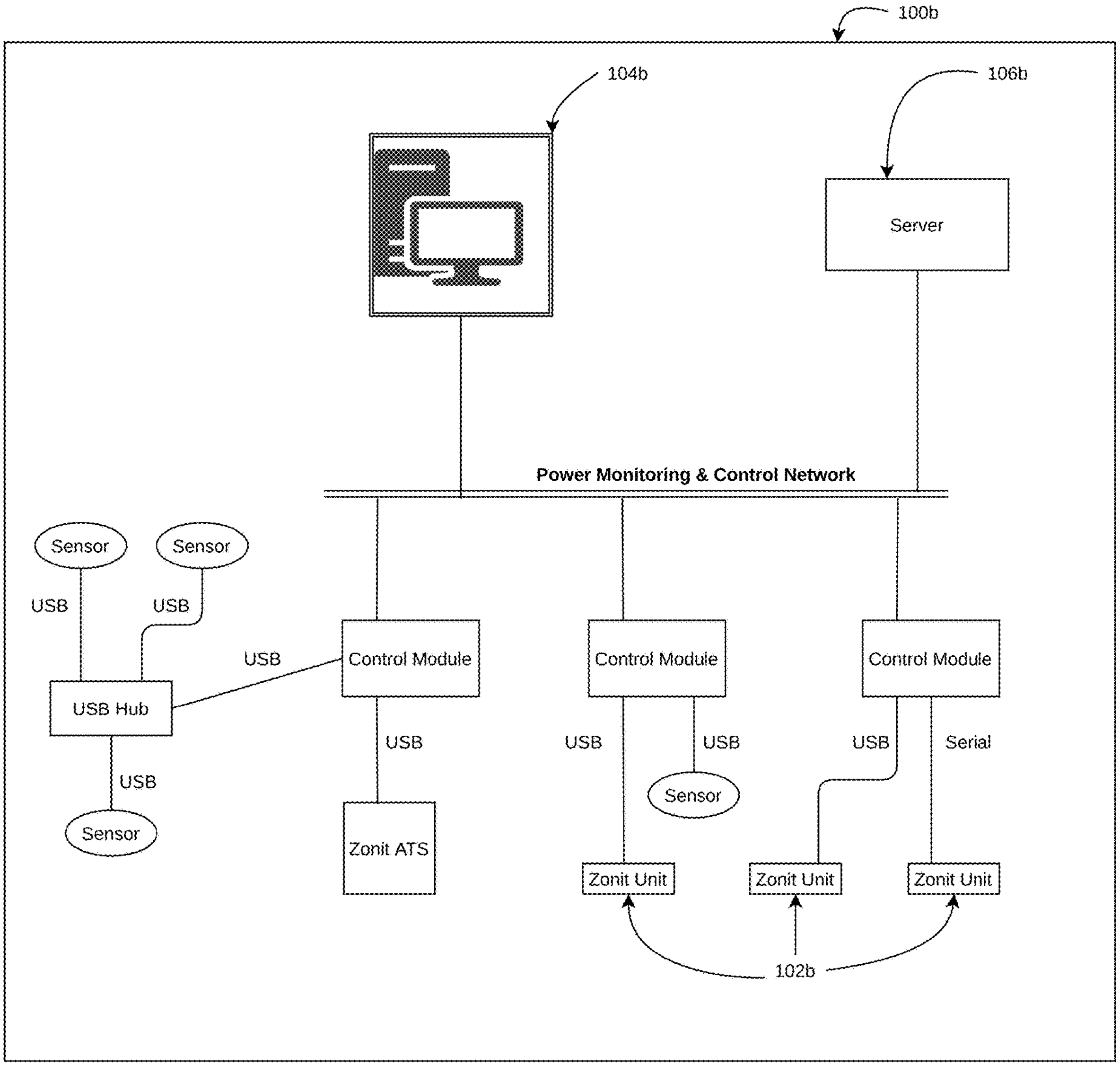

In another embodiment, the control module FIG. 1A, 102*b* can replicate it's data set via a suitable network connection to one or more back-end servers FIG. 1B, 104*b* or laptops as shown in FIG. 1A. The data set of each control module can be replicated to the server or laptop 102 which would then contain the union of all of the data sets. This accomplishes several important goals. First, the same exact control module GUI described earlier or other instantiations of that GUI can be used with that unified data set. The user does not have to learn any new GUI features, the only real thing that changes is that the data set is complete and can include every desired control module. This means that the user can use every feature of the GUI for the entire complete data set and does not have to learn a second GUI, which is the case with a DCIM software package. The GUI is the same at the rack device level vs. the entire data center level, a great advantage to the end user. This allows the user to do history searches, data mining, set alerts etc, for all available data, which can be very useful. It also means that the data set can be naturally divided which can be very beneficial to the data center manager. Consider the following. The data center may be a co-location facility with many clients, some who may compete with each other. It may be an enterprise data center used by multiple divisions that are not cooperative with each other. In either case, the data center manager may need to keep the data concerning one set of racks with one organization or division's equipment separate and not accessible from another group. The Zonit control module functionality herein described is ideal to meet these needs. One group can be given local access to only the Zonit control modules in their cabinets. Those control modules can synchronize the union of their data sets to a server controlled by that group. Another group can do the same with the set of control modules in their racks. The data center manager can have a server or laptop that synchronizes with all of the control modules in the data center since he runs the entire data center. The needs of all stakeholders are met in a simple and elegant manner. Another advantage of, having a unified copy of all of the data sets is that it is much easier to backup vs. backing up each individual Zonit control module. The data from each control module can have an additional tag that is unique to the control module the data was generated on, making restoring the data set to an individual Zonit control module easy.

The current state of most solutions in the market is that they have no or very simple Web interfaces with one GUI for in-the-rack devices and have to install a back end Data Center Information Management (DCIM) software package to gather all of the data from all of the in-rack devices that can report it. This requires IT software skills and support, which few data center groups or managers have. It also requires the users to master an interface that is complex to setup and maintain and can be difficult to use. The DCIM package may or may not offer the ability to limit what a number of different users can or can not view, manage or report on. Setting up these types of virtual walls in a DCIM is often complicated and requires in depth knowledge of the software and good system administration and application expertise. The Zonit control module solution is much easier to install and use!

In one embodiment of the server or laptop (since laptops are now very powerful computers themselves) 104*b*, the needed software capability can be distributed either as software to be installed by the end user on a standalone server or laptop or a virtual container image to be run as a virtual machine on a server or laptop. The advantage of the latter approach is that all of the dependencies involved with installing the software on the target host are compartmentalized and dealt with, making the installation of the Zonit MM management application very easy, which is a key goal. There are two types of virtual machine software containers, the first, Type 1 runs a simple hypervisor on the server hardware and the hypervisor runs all of the virtualized OS images with their applications. This is the approach taken by VMware ESXi and Microsoft Hyper-V to name a few examples. The other approach named Type 2 hypervisors is to run the hypervisor and it's virtualized host OS/Application images using a host OS that controls the server hardware. Type 2 hypervisors include VMware Fusion, Oracle VM VirtualBox, Oracle VM Server for x86, Oracle Solaris Zones, Parallels and VMware Workstation. The advantage of Type 1 hypervisors is that they perform better. The advantage of Type 2 hypervisors is that they can be installed on an already setup computer which makes installation much easier. This is important to data center managers, whom often come from a facilities management background not an IT/software background. They want and need tools that are easy to use. The Zonit control module is designed to do that.

In yet another embodiment of the control module and associated backend servers and/or laptops, yet another advanced functionality can be implemented. The ability to have the complete data set of all Zonit control modules allows the use of powerful modelling software, to model and predict data center characteristics and then compare them in real-time to actual data and thus interate the model until it matches the actual data. Examples of current software modelling packages that can do this are Matlab or Octave, combined with Simulink. Expertise in this area is available.

https://www.mathworks.com/services/consulting/proven-solutions/electrical-power-systems-simulation.html What makes the Zonit solution so powerful is that the data it collects is well organized and easily available to be plugged into these powerful modelling capabilities. This is unique in this field of use In the embodiments of the control module described above using a cell phone derived SBC or compute module, the two-tier architecture described of the where the compute platforms are located and what data they monitor, store and access and process is qualitatively different from conventional systems. The bulk of the compute power is now close to where the data is gathered and much more of it can be stored and analyzed in parallel. The combined set of compute modules have much more processing power than a few backend servers. This makes the overall system much more responsive and capable and allows many improved or new abilities. An example would be to use Hadoop or HPCC to do distributed processing of data sets, for example the power quality or security or environmental or other data set. The Hadoop project develops open-source software for reliable, scalable, distributed computing. The Hadoop software library is a framework that allows for the distributed processing of large data sets across clusters of computers using simple programming models. It is designed to scale up from single servers to thousands of machines, each offering local computation and storage. Rather than rely on hardware to deliver high-availability, the library itself is designed to detect and handle failures at the application layer, so delivering a highly-available service on top of a cluster of computers, each of which may be prone to failures. This project is so well known that it has become nearly synonymous with big data. Production versions of Hadoop currently run on Linux, although other OS versions are available for prototyping. Hadoop consulting expertise and support is available from several vendors. This demonstrates the power of the Linux ecosystem that this invention is leveraging. This ability to use multiple control modules to do complex computations and problem solving is believed to be unique in this field of use. A further example of this capability is the ability to use additional open source or other management frameworks that have been developed to run server farms and/or other devices such as network switches or storage array devices. These tools are in common use in many data center environments. Some examples of these are Redfish for servers, REST and Thrift for network switches, OpenAttic for storage and OpenStack for combined CPU, network and storage management. Zonit's use of embedded Linux makes it relatively straightforward to make the four elements of data center infrastructure visible to these frameworks and use them. This allows the data center manager to leverage the skills and staffing of other groups that use the data center, which is very powerful. Traditional solutions have great difficulty doing this and are really designed around older methods of facility and network management. This is a very large difference in the architecture of our invention vs. older solutions.

In the descriptions of the invention that follow, the ZPDU 102 is represented by the ZPDU enclosure and the control module, regardless of whether the control module 3900 is installed in the chassis of the ZPDU (FIG. 39) or a standalone case. The central management appliance 104 (which can be replicated for availability) communicates with each ZPDU 102 and collects data and offers a central dashboard, policy setting and control point. All functions can be accessed via a Secure Socket Layer (SSL) secured Web Interface and/or other appropriate secure access mechanism. The access security can be further raised via integration with 2 or multi-factor authentication systems.

A unique feature in the Zonit management architecture 10 is the design of the control and communication mechanism. Each ZPDU uses Z-Protocol, a Zonit defined protocol to communicate with Zonit intelligent adapters, plug strips and receptacles as described below. This enhances security, by using a proprietary protocol. However other proprietary or secure public protocols could be used for this purpose. Each ZPDU 102 communicates with the Zonit Power Management Station 106 via TCP/IP. However, how that communication channel is designed offers two types of functionality. The ZPDU 102 can act as an intelligent intermediary processing node that packages and presents information, status alerts and other data to the Zonit Power Management Station 106. This is appropriate for command and control functions that need or can benefit from quick feedback control or other local supervision.

A second mode of interaction is where each ZPDU 102 acts as a TCP/IP gateway to the set of controlled power monitoring points, ZPDU outlets and attached Zonit G2 intelligent adapters, plug strips and receptacles. In this mode, the ZPDU 102 is a pure communications channel, taking TCP/IP addresses and commands (which may use subsidiary TCP/IP protocols such as Simple Network Management Protocol (SNMP) and/or TCP/IP based Zonit proprietary daemon processes running on Zonit defined ports) and translating them into Z-Protocol (or other proprietary or secure public protocol) addresses and command codes and returning the resulting data and status codes. The TCP/IP communication method can be made secure by using encrypted TCP/IP links between each ZPDU 102 and the Zonit Power Management Station 106.

This mode of operation is best suited for command and control functions where a central process running on the Zonit Power Management Station 106 accesses and uses the set of Zonit ZPDU functions and ZPDU connected endpoints to do global functions that span the entire set (or a selected subset) of deployed ZPDUs 102. This unique data center power distribution architecture for command and control allows a wide range of functionality to be delivered.

The Zonit Power Management Station 106 enables integration to enterprise network management systems. It allows setting of both global and local alerting and notification parameters. A key design goal is to minimize or remove the complexity of setting alert/notification policies and integration with enterprise management systems as used in Network Operation Centers (NOC). The Zonit management architecture 100 is designed to meet current and future data center management needs in the areas of power monitoring, control and environmental and security monitoring.

3. Zonit ZPDU (Zonit Power Distribution Unit)

These are rack-distributed power distribution units that implement the Zonit methodology and incorporate other Zonit technologies. The ZPDU 102 is a device that takes A-B power source input feeds from the power whips and distributes that power through plug strips and adapters that have the required power capacity and receptacle types. The ZPDU balances loads on each phase using Zonit patented phase rotation technology (the ZPDS case, U.S. Pat. No. 6,628,009, which is incorporated herein by reference).

Figure 2:
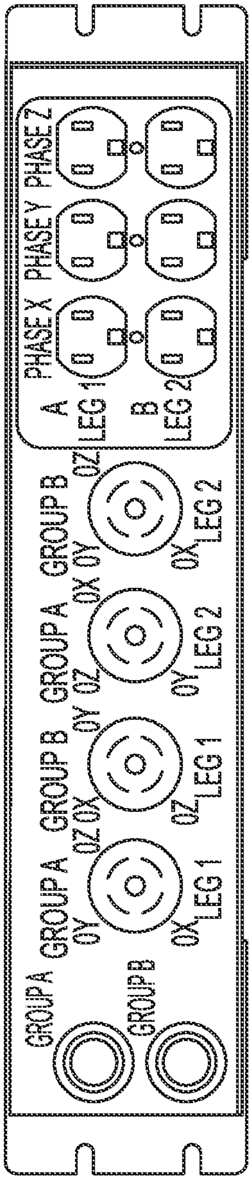
FIG. 2 is a back view of a power distribution unit that can be used in the system of FIG. 1.

FIG. 2 is a back view of a ZPDU showing receptacles associated with the different phases and sources. All the main power connections of the ZPDU use a set of foolproof twistlock NEMA connectors. The power is therefore redundant (the A-B sources are independent and separate) and able to be adapted to any needed power type in 20A (three-phase, split-single phase or single phase) and delivered in any needed receptacle type via the Zonit plug strips or plug adapters. Other amperages than 20A are possible, but 20A is the most common amperage limit that most EDP equipment use. The Zonit Generation Two (G2) ZPDU will incorporate embedded hardware that will allow it to perform command, control, management and reporting of power capacity, power distribution configuration, power/security/environment status, energy usage and power quality in the data center, all as described in more detail below.

FIG. 21 is a back view of another embodiment of a ZPDU 2100 showing a set of twelve IEC C19 receptacles 2102 (other single phase receptacles could be used). In this example, the ZPDU is shown feeding a set of 12 Zonit dual locking hydra cords 2104 powering two racks 2106. NEMA twistlock receptacles are not as common outside North America and so the use of IEC C19 receptacles in conjunction with dual locking Zonit hydra cords (described in the Power Distribution Methodology cases). This style of ZPDU can incorporate the phase rotation technology described in Zonit U.S. Pat. No. 6,628,009 as follows. The most common ways racks are loaded and power cords hooked up are to load racks from the top down and connect the equipment to the power receptacle that is closest, to minimize power cord lengths, typically via a vertical plugstrip. The hydra cords 2104 shown in FIG. 21 connected to this type of ZPDU have different main feed leg lengths and therefore will be constrained as to which set of RU spaces in the rack that each hydra is intended to service. The back panel of the ZPDS can be marked via graphics (such as simple color coding) and text to allow the user to insure that the intended phase rotation pattern can be achieved by simply plugging the hydra cords that service one or more racks into the ZPDU unit in the right order. The hydra cords can also be marked via graphics (such as simple color coding) or text to facilitate this. A simple graphic diagram and table with little or no text that shows the required plugin associations can be provided to make the work easy to do. This method is practical because the number of actual hydra cord combinations that will be built and used is fairly limited. This is because the input amperages used are a small set (US 20A, 30A, 40A, 60A most commonly), (International 10A, 16A, 32A, 64A) and the average per plug power budget is known (2-5A is typical). FIGS. 21-23 and 40-42 shows a number of common Zonit dual locking hydra cords configurations (where corresponding elements are identified by corresponding numerals) that would work well with the ZPDU unit w/C19 outlets and the per plug average amperage that they would deliver.

4. Zonit ZPDU Modular Input Method

This is a modular input method for the G2 ZPDU that allows it to accept a range of power capacity inputs, for example, A-B 30A to 60A three phase inputs), combined with an internal power distribution design that can be used with the desired range of input power capacities. This gives the data center manager the ability to upgrade the power capacity in place, without changing anything in the power distribution system at the rack level other than the power inputs to the ZPDU.

5. Zonit Generation Two Powerstrips

These are plug strips that implement power monitoring and switching functionality using Zonit technologies. They are designed to be used with the Zonit ZPDU. They a have unique security control mechanism. Additionally, they incorporate unique LED user interface functionality which is used both individually and in groups or combined with LED's on the ZPDU. They also have a method of detecting power cords that are plugged into receptacles but that are not currently drawing power.

5b. Zonit Z-strip powerstrips and Zonit Hydra Power cords

A Z-strip is a plugstrip that can incorporate any or all of the previously described Zonit G2 plugstrip features and also can incorporate the new inventions described in this filing. As has been noted earlier, the only real difference between a plugstrip and a hydra cord is that the junctions (receptacles) in the plugstrip allow the distribution legs to be changed as regards the output end type and distribution leg length and/or color. A hydra cord does the same job, but the junctions are fixed and the output end type at the end of the distribution legs cannot be changed. A hybrid hydra design can be built that uses junction technology common to hydras such as PVC over-molding or clamshell enclosures, and incorporates suitable form-factor receptacles and plugs, several types that have reduced form-factors which are advantageous for this application are described in this filing. The Zonit G2 plugstrip, Zonit hydra cords and Zonit hybrid hydra cords can all incorporate dual locking functionality as previously described if desired. Another issue that is data center managers have faced is control of power to IT equipment and the need to be able to power cycle that equipment if it freezes up. This was common in the 1990's and early 2000's but technology has advanced. Almost all modern servers have an embedded Linux daughterboard with its own network interface that is used to control many aspects of the main system. It can power the main system on and off, report on hardware health and do many other tasks. It is also under control of the IT department, not the data center manager and this is often desirable. This has made the need for switchable receptacle plugstrips much less frequent and eliminates the security issue that many data center managers fear of a remote attacker being able to turn receptacles on and off, causing havoc and downtime. We have already described one method for placing control of this issue in the hands of the data center manager via a multi-position selector on the plugstrip. This invention offers other even more flexible methods, which are described below.

A power distribution method in the rack ideally accomplishes accomplish a number of tasks;

a. Make the power distribution method in the rack as small as possible and also insure it does not require the dimensions of the rack to increase beyond the smallest practical form-factor that contains the IT equipment. It should also use no or as little payload volume as possible.
b. Get the amount of power needed to the IT equipment in the rack. The traditional way of doing this in plugstrips is to break down the input power into a set of sub-branch circuits using a rated current interrupter (a circuit breaker or fuse, note that fuses are much less commonly used, so we will only refer to circuit breakers in this section, understanding that other interrupters such as fuses could be used) to limit the current capacity of the sub-branch circuits to match the current limit of the receptacles connected to that sub-branch circuit. This is required by the National Electrical Code and other national electrical safety codes. It demands space, since the most common way of doing this is to mount a "doghouse" mini-enclosure on top of the main plugstrip enclosure to hold the needed circuit breakers, which increases the depth of the plugstrip or to incorporate the needed circuit breakers into the body of plugstrip enclosure making it much larger. This also means that you have a limit on the number of circuit breakers you can use in the "doghouse". If you use other, smaller circuit breakers (for example thermal push-button types), they are often not very sensitive and therefore will open after the circuit breakers in the power whip or busway tap box that feed the plugstrip, which means the whole plugstrip will be de-energized in an overload, not just the sub-branch circuit & its receptacles, which is not desirable. The amount of power needed per receptacle also dictates how many sub-branch circuits you have to provide in the plugstrip, each of which requires a circuit breaker, which increase the space requirements for the plugstrip. The design constraint is how many circuit breakers are required to break up the input power into sub-branch circuits that have the required amperage to feed each receptacle the desired power budget and are electrical code legal for the sub-circuit amperage feed. For example, IEC receptacles are limited to either 15A (C13/15) or 20A (C19) in North America and 10A (C13/15) or 16A (C19) internationally. So, you can either have C13/15 groups of ~5 receptacles each per sub-branch or one C19 per sub-branch. Using this information in an example; if you need an average power capacity of 3A @ 240V (~820 W) per device and you want to have 45 single phase output IEC C13 or C/15 receptacles to power a 42U rack then you need 3A×45=145 single phase amps. This power budget can be approximately supplied by a three phase 60A wye source. So to get twenty (20) C13 or C15 receptacles you need a minimum of 8 sub-branch circuits and therefore 8 circuit breakers. Common good quality circuit breakers that will open before commonly used panelboard circuit breakers require a space of 2"×2"×0.5". The photos shown in FIGS. 18-20 show how product designers have dealt with this problem. One plugstrip w/a 30A input has a "doghouse" with 2

"sub-branch" high quality circuit breakers. The doghouse increases the depth of the plugstrip by 2" and makes the plugstrip very challenging to install in a rack. Another example shows a plugstrip with 6 sub-circuits that has a circuit breaker mounted in the width of the plugstrip, increasing it to 5 inches! Contrast this against the minimal non-intelligent plugstrip shown in FIG. 19. It is only as large as it needs to be in cross-section, which is ideal.

c. Get the right cordcap(s) for the IT equipment on the end of the cord(s) that powers that device. Make sure the power connection is secure via appropriate plug and/&/or receptacle implemented secure retention mechanisms. Zonit has developed a number of suitable retention mechanisms as described in the Locking Receptacle cases and herein.

d. Limit the amount of power cord to the minimum needed to keep the rack neat and not block cooling airflow. Make the power cord itself as thin and flexible as is practical. These qualities also help keep the overall size of the rack to a minimum as previously discussed. Current 1U or 2U servers rarely use over 5-6A @ 208V and less at 240V. 120V power distribution in the data center is now rare.

e. Monitor the power at any point in the power distribution topology that is required. This is important. It costs money and space to monitor power at the branch circuit and/or the receptacle/hydra junction or cord or cordcap. In existing traditional products like intelligent plugstrips, you have to make this decision when you buy the product. You may be able to buy the plugstrip and buy its intelligence module later, but you cannot add the per receptacle sensors later. Plugboard circuit monitoring systems are common but expensive and have a big problem as a retrofit. You have to turn off the panel and take it apart, which may require a downtime window that affects a lot of racks in your data center. Downtime windows are harder and harder to come by in this 7×24×365 digital world and can be quite expensive.

f. Switch the power on and off at the points in the topology that are required. This is currently done via remote or manual control circuit breakers in panelboards and/or remotely controllable relays in panelboards or intelligent plugstrips. These methods take space which force the form factor of plugstrips to be larger than optimal. Again, you usually have to choose this switching capability when you buy the product.

g. Insure that the only authorized personnel can access and control the power.

Our invention solves all of these problems and more in a very inventive and flexible manner as will now be described. We will describe the invention and some of its possible embodiments top-down, first in a system context, then later as individual elements or basic combinations of elements.

Figure 45:
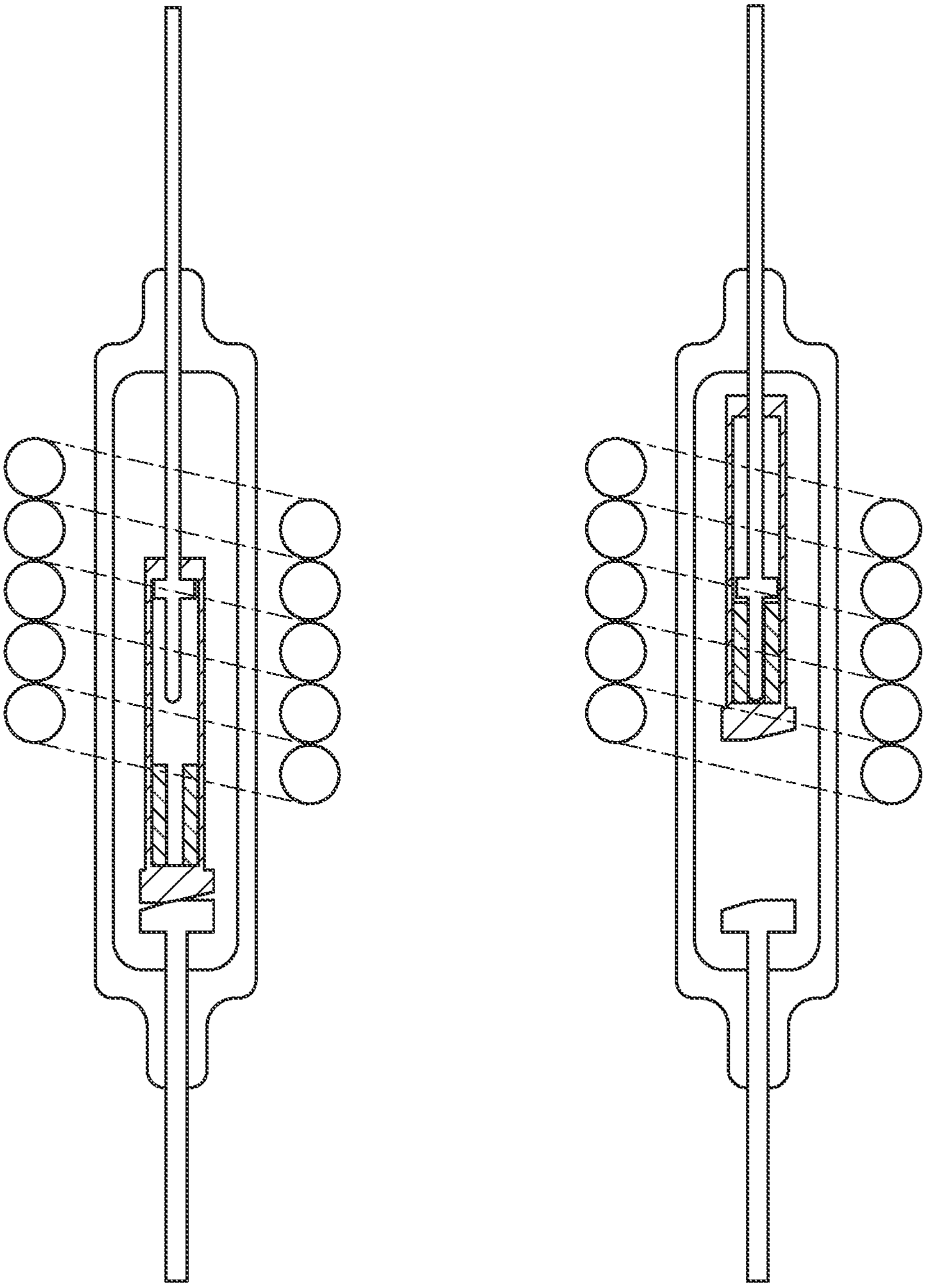
Figure 46:
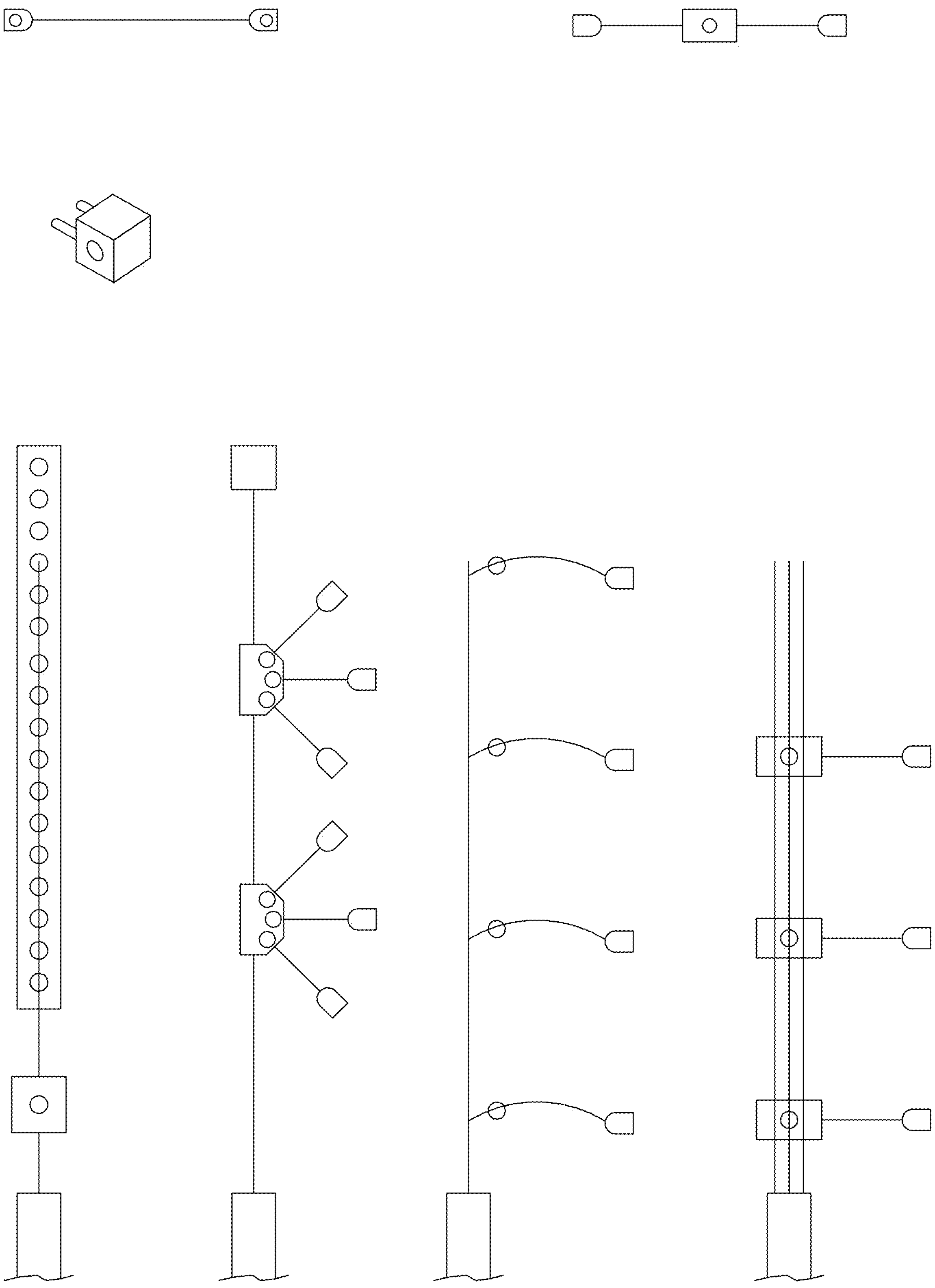
FIGS. 46-58 show various placements of the power controller in accordance with the present invention.
Figure 47:
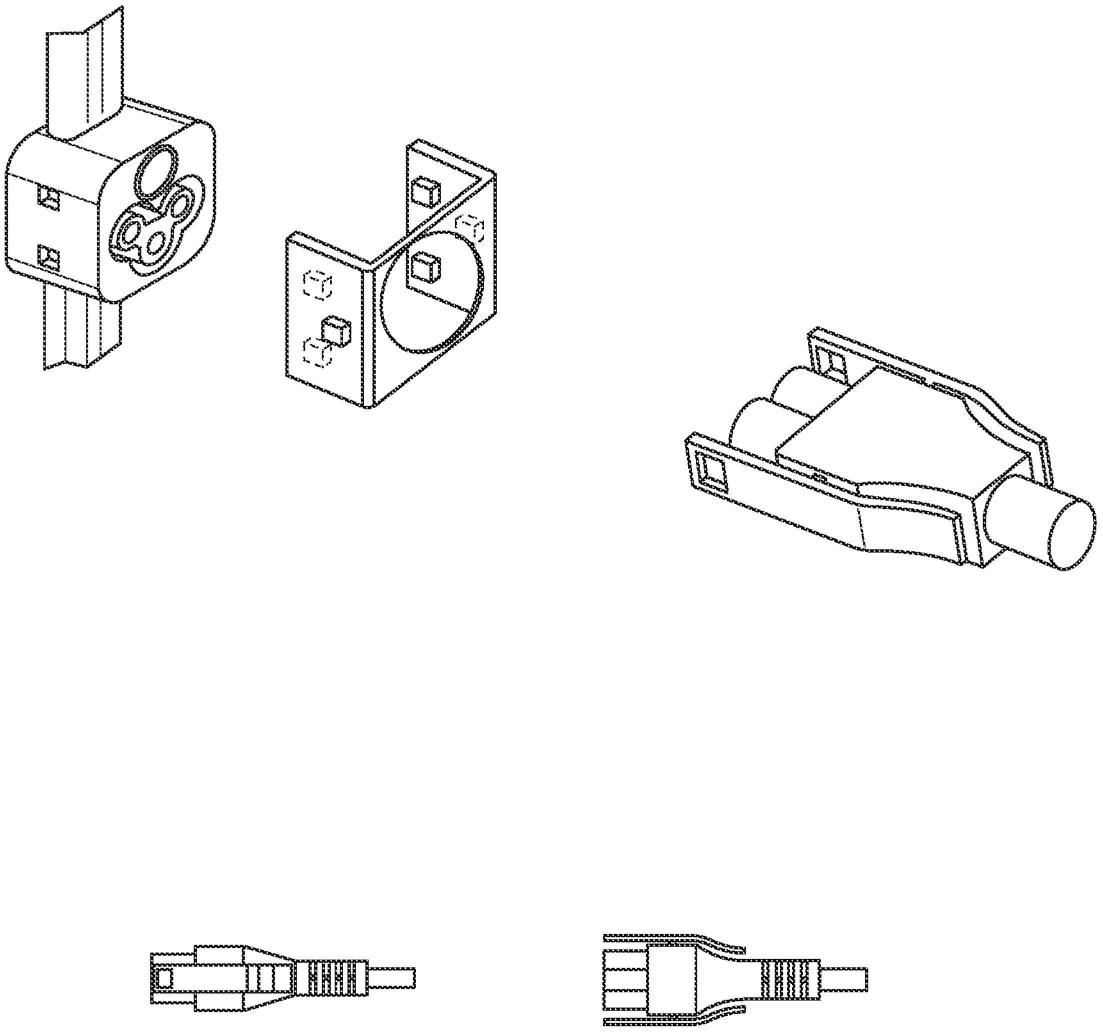
Figure 48:
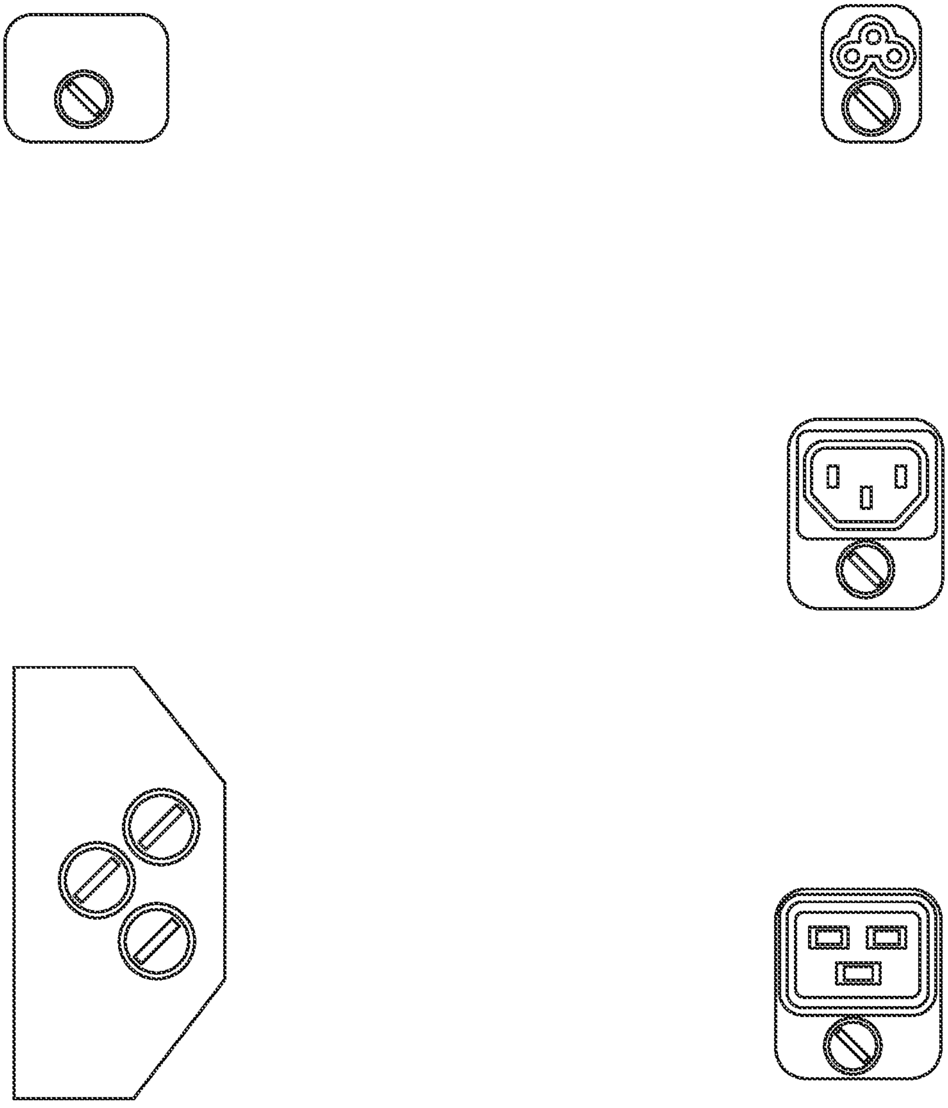
Figure 49:
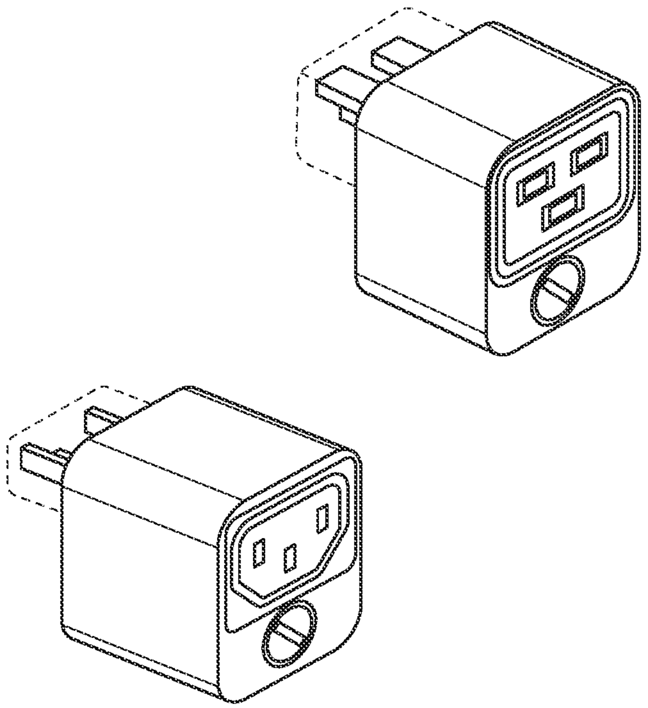

As noted earlier, it may be necessary to put circuit interrupters, power switching (on/off control) and power quality monitoring in a variety of places such as at the branch circuit level or the receptacle level. Also, it is desirable to have sufficient but not excess power capacity to the IT equipment in the rack. Our invention shrinks the form factor of the sensors, switches, fuses (or circuit breakers) and communication devices needed to build a modern intelligent power device (a plugstrip or intelligent hydra cord or intelligent power cord or pluggable power monitoring or control module or other application, for example integrated into a device or into the power distribution wiring via hardwire methods) that requires power circuit interruption, power quality monitoring, power on/off switching and the required communication channel (which can be done in a variety of ways) and control functions hard wired into a component or device or into the power distribution wiring in a very small form factor. This enables many potential new and improved power distribution embodiments. An example embodiment of the module is shown in FIGS. 43-45. In this example is it constructed in a similar form factor as a cigarette fuse. This is useful, because you can use a number of combinations of the possible capabilities to achieve the needed result, all fitting in the same connection mechanism for example a cigarette style fuse holder or other suitable form factor mechanism. This allows the module with the appropriate combination of features to be a Field Replaceable Unit, (FRU) that the end user can change or upgrade after purchase of a product. The FRU module can be designed to be hot-swappable. This means that the parts of the power topology that are downstream of and in some embodiments fed power through the FRU will experience power loss during a "hot-swap" but the other parts of the power topology will not be affected. This limits the impact of changing or replacing the FRU module. The ability to change FRU module types and capabilities is very useful because the user can buy a product with this feature, knowing that they can change its functionality to meet their requirements as they evolve and not spend money upfront for functionality they end up not needing later. In the descriptions that follow, the FRU module is used an example, but understand that if needed, the components that make up the FRU module could be hardwired into the power distribution product and/or power distribution topology as required. They can also all be integrated into the FRU module, a preferred instantiation, or distributed between the FRU module and the FRU module holder as is needed by the application and/or cost point target. The FRU module size may increase as its amperage capacity requirement increases, but usually larger capacity connectors, wiring, junction boxes, etc. have more space available. A key point is that the module hardware form factor can fit in the desired space. In the example of a data center rack, that means that addition of the FRU module does not (or minimally, and better than existing solutions) cause the amount of space in the rack needed for infrastructure elements (vs. "payload volume") to increase. In other applications, for example in a standard home or office receptacle box, the FRU module just needs to be small enough that it can fit and function. In all of these applications the FRU module can be more cost effective than traditional technology which is another incentive to adopt it. Note that the FRU module could be used with the systems described in the Smart Outlets and Auto-Switching cases.

The compact FRU can be incorporated at various points of a power distribution network as shown in FIGS. 46-56. Examples include at either or both end caps of a power cord, in-line between the endcaps of a power cord, in-line in a power cord of a plugstrip, at each (or selected) junctions of a hydra system, at each (or selected) junctions of a Z-Strip, including in connection with a twist pierce construction.

There are several functions provided by various embodiments of the FRU module. They can be combined in several ways, some of which are listed below:

1a) Current Interrupter (via a fuse or resettable fuse or E-fuse or Zonit small form factor Circuit Breaker which can optionally be remote controllable and/or auto-resetting.

2b) Current Switch (on/off and able to stay in either state, remotely controllable)

3c) Power Quality Monitoring (PQM)

4) Communication & Control (C&C) mechanism (if required) to enable the listed functions and potentially others.

Some logical combinations of these capabilities are as follows. We discuss them in the context of building new embodiments of Zonit G2 plugstrips and Zonit hybrid hydra cords and Zonit hydra cords that can have G2 functionality using the described methods. This can provide end-to-end secure power connections, which is very desirable. It is also understood that the same basic building blocks can be used in any desired power distribution topology to achieve the same results, such as in a home, office or factory or a device or system intended for use outside a data center. It is also understood that in any of the embodiments that follow and any others that are possible, any of the receptacles/or the plugs that connect to them (IEC C5, C7, C13, C14, C15, C19, C20, NEMA 5-15, NEMA L21-20, NEMA L22-30, NEMA L21-60, NEMA L22-60, and others) can optionally use Zonit designed secure power connection methods that are described in this application and the Locking Receptacle cases.

a) Circuit Interrupter Only

This is useful for building a non-intelligent Z-Strip or Zonit hybrid hydra cord or or Zonit hydra cord. In this example, we are essentially putting a circuit interrupter into a sub-branch circuit that can feed one (typical in the examples that follow) or more output legs, via receptacles or hydra cord distribution legs. This solves the sub-branch circuit issue discussed earlier in regards to traditional plugstrips and the power cords they require. It also allows you to use lighter and more flexible power cords or wiring for the power distribution cords that connect to the receptacles or the hydra power distribution legs that connect to one or more feed legs. This is a significant advantage. A preferred instantiation would be to use a Circuit Interrupter that automatically resets, good for data center applications, but in other applications the other methods listed might work better and could be used. This capability cannotcan not be remote controlled in this sole capacity.

b) Switching Only+C&C mechanism

This is for when you are building a Z-strip or Zonit hybrid hydra cord or Zonit hydra cord that you just want to be able to switch on or off some part of the power distribution topology, usually a receptacle or a hydra distribution leg. In this case you may not need to divide the one or more main feed legs into sub-circuits to connect the receptacles you want to use. An example of this would be to build a Zonit hydra cord with a zC20 input plug and zC13 or zC15 or zC20 output receptacles. This hydra cord would be limited to 20A in North America and 16A internationally. This capability would be remote controlled in this capacity combination.

c) Current Interrupter+Switching+C&C mechanism

This is for when you are building a Z-strip or Zonit hybrid hydra cord or Zonit hydra cord that you just want to be able to switch on or off some part of the power distribution topology, usually a receptacle or a hydra distribution leg. In this case you may need to divide the one or more main feed legs into sub-circuits to connect the receptacles you want to use. An example of this would be to build a Zonit Z-strip with 3 phase 60A input power and C13 and/or C15 and/or C19 and/or C5 or other Zonit small-form factor output receptacles and matching plugs, This combination could also be built as a Zonit hybrid hydra cord or a Zonit hydra cord. The receptacles of the Z-strip or the Zonit hybrid hydra cord would be limited to 20A in North America and 16A internationally. This capability would be remote controlled in this embodiment.

d) PQM+C&C mechanism

This is when you do not need to divide the one or more main feed legs into sub-circuits to connect the receptacles you want to use, and don't need switching, but do want the PQM capability.

e) Switching+PQM+C&C mechanism

This is when you do not need to divide the one or more main feed legs into sub-circuits to connect the receptacles you want to use, but do want the switching and PQM capabilities.

f) Current Interrupter+Switching+PQM+C&C mechanism

This is when you want all capabilities. It works when you want to use a larger capacity feed leg and need to sub-divide it down into smaller amperage circuits (one or more receptacles or hydra feed legs) that match the capacity limits of the receptacles and plugs you are using and give you the desired power budget for each receptacle or hydra feed leg. It allows you to do PQM monitoring of the whole Z-strip or each receptacle or any combination needed. An example of this would be a Z-Strip with 20A or 30A three-phase input power and Zonit C5 locking or other Zonit small-form factor output receptacles with switching, PQM and the required C&C mechanism.

The Current Interrupter function can be accomplished in several ways. (i. a circuit breaker that can be remote controlled if needed, several novel designs that can do this in the required form factor and amperage capacity are described in the Smart Outlets and Auto-Switching cases, or ii. a fuse [1-shot or resettable or Efuse].

The Current Switching on/off function can be accomplished in several ways, for example (i. the Zonit remote controllable circuit breaker(s) described earlier (ii. a Reed switch or another suitable switch). The Power Quality Monitoring function can be accomplished in the required form factor in a Hall Effect ASIC (recently available) or other suitable compact method.

The PQM function can be accomplished in several ways, for example it can be accomplished in the required form factor in a Hall Effect ASIC (recently available) or other suitable compact form-factor method.

The necessary communication and control functionality can be accomplished in several ways, in one embodiment by a small form-factor circuit, an example is shown in FIG. 44 that can fit in the required form factor. This circuit can be implemented in a number of ways, utilizing existing small form factor components and/or ASIC technology or as a custom ASIC or ASIC(s) as is needed and preferred. The preferred instantiation would use communication over the power wiring as previously described in this application and the Smart Outlets and Auto-Switching cases.

In another embodiment, a different type of communication over power wiring could be used. Existing power line communication mechanisms and components are designed for general purpose use over power wiring. This means that they are not optimized for the data center environment where there are many more branch circuits, and especially where the plugstrips and/or hydra cords and/or power cords used are of relatively short lengths. The general purpose hardware available uses relatively high power levels to transmit signals to guarantee that they work over long distances and maybe poor quality power wiring. Contrast that to a data center where you consider that a plugstrip may be only 66" long and have a high quality large diameter conductor cord feeding it that is under 6-10' long and the power wiring quality is good and is in a controlled temperature and humidity environment. For the general purpose hardware case you do need the filtering mechanisms described in this and other Zonit cases to limit the domain of signaling. However, by using much lower power levels that are suitable for the intended distance and conditions that the communications signal has to travel, you can minimize or eliminate the need to add this filtering. It is also possible to control and adjust the power levels used to signal either under the control of a program running on the control module or the control of the communications hardware itself to optimize the signaling level for the intended application and field conditions encountered. In many cases the native impedance changes (as it goes from one cable type to another through connectors) will attenuate the signal and that is sufficient to limit the domain of signaling in the power distribution wiring topology.

Other communication mechanisms, such as wireless (802.11, Bluetooth, other, Zonit proprietary, RFID derived) are also possible between the FRU module(s) and one or more control modules or other herein described devices, and could be useful, to solve particular customer issues and/or requirements. It should be noted that many of these system elements and their capabilities are already described in the Smart Outlets and Auto-Switching Duplex. This is an alternate embodiment that uses new methods in an even smaller form factor that opens up new applications in the data center and other environments.

It should be noted that if economically feasible, space efficiency could be enhanced by compressing the needed circuitry for all of the capabilities above into the fewest practical number of ASIC components. This could also aid manufacturing efficiency.

We will now demonstrate the utility of the FRU module in constructing a number of novel embodiments of Zonit plugstrips, hydra cords, hybrid hydra cords and power cords and discuss some other applications. A power distribution topology, like that in a data center has switching gear, UPS units, generators, panelboards, power whips (or busways w/tap boxes), power distribution devices such as vertical and horizontal plugstrips and can include ATS units at various levels of the power distribution topology. This has been described in detail in this and other Zonit cases including the Power Distribution Methodology cases. The small form factor of the FRU module makes it possible to place by integrating it into any or all of these components and/or as part of the power wiring between them. We will now discuss how to do that in some preferred embodiments which use the technology to advantage.

Figure 56:
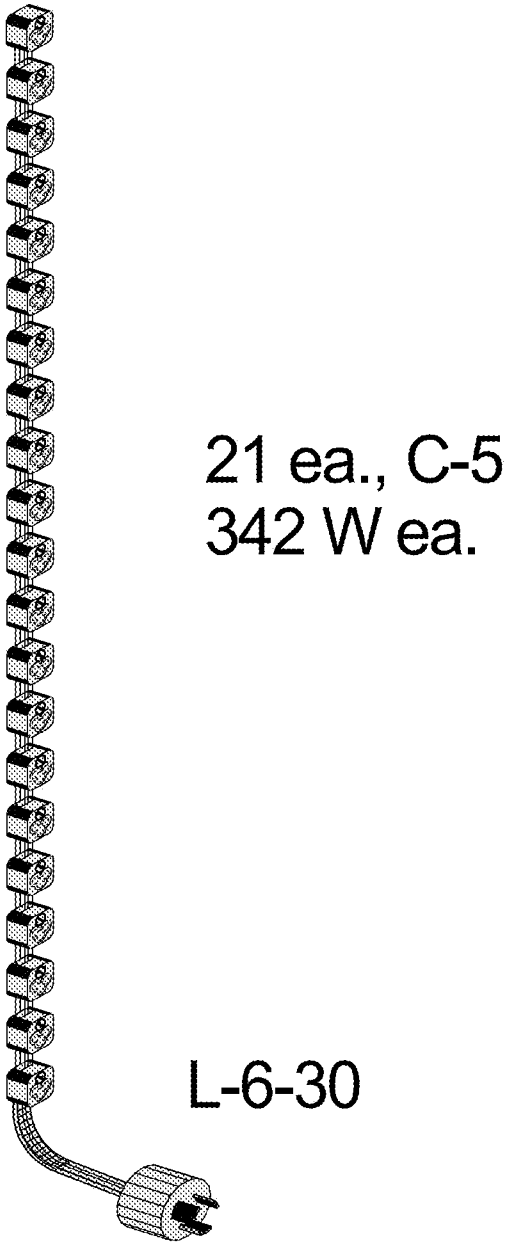
Figure 57:
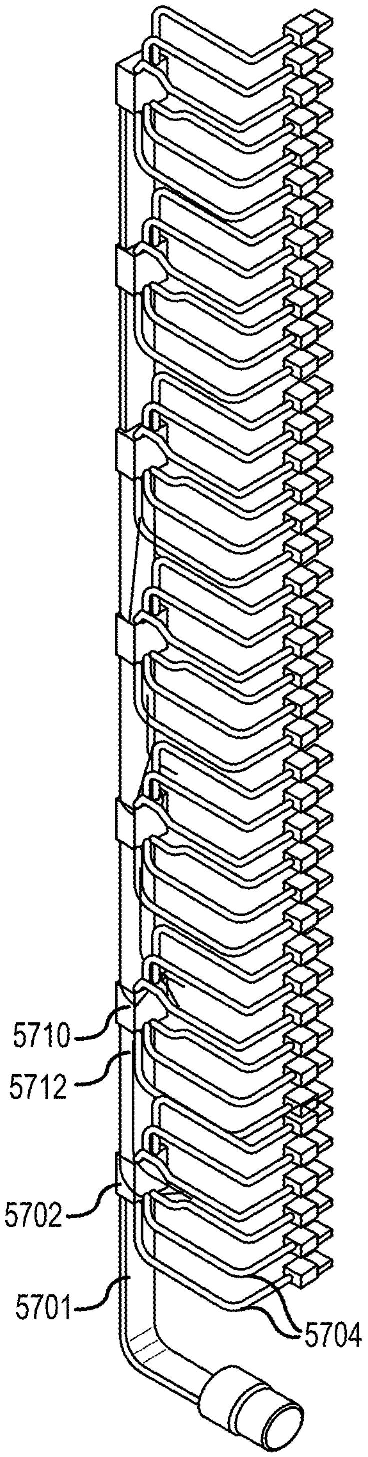
Figure 58:
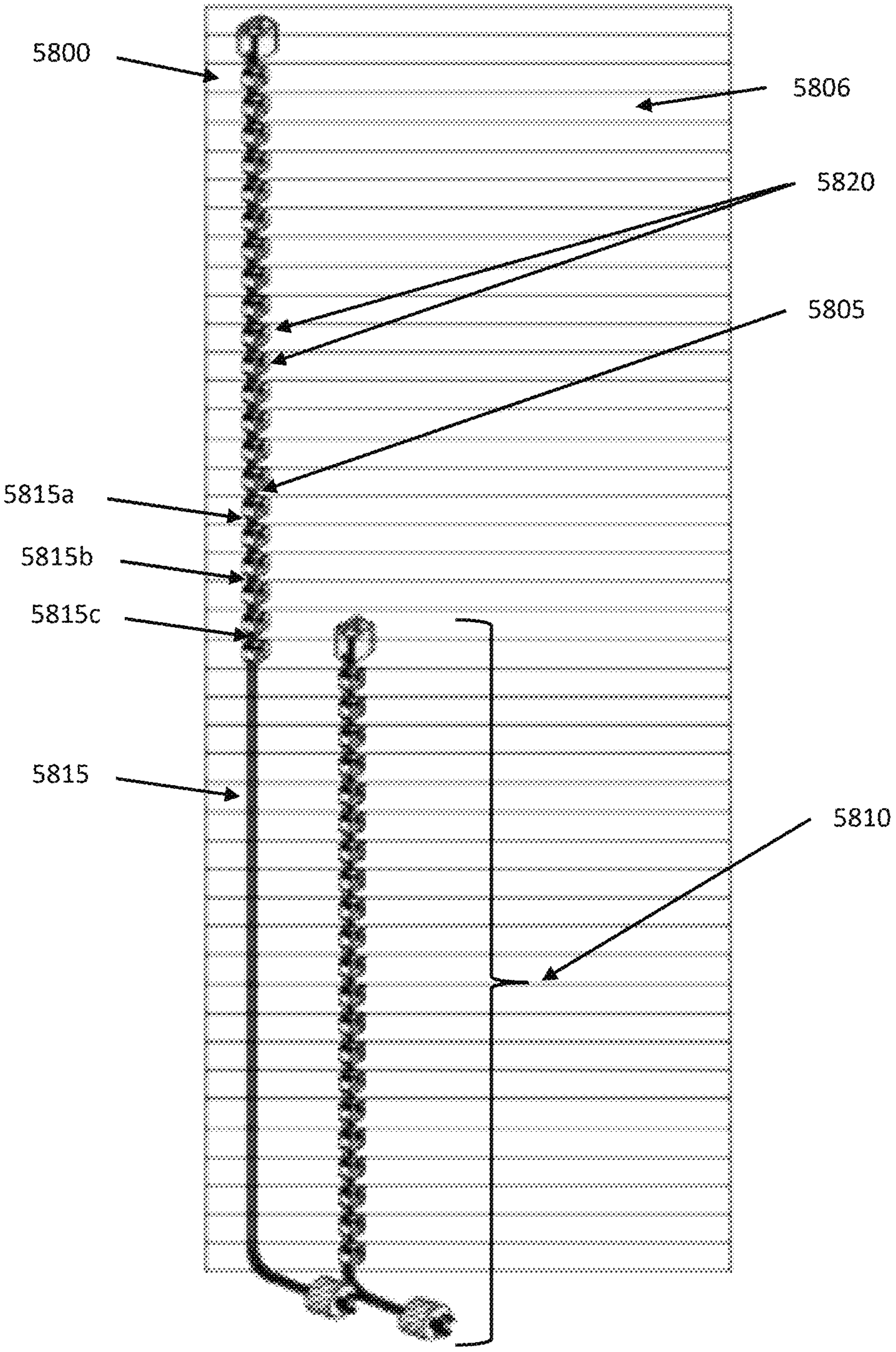

FIGS. 21-23 and 54-63 show a number of possible embodiments of Zonit G2 Z-Strip plugstrips, Zonit G2 hybrid hydra cords, Zonit G2 hydra cords. These use Zonit designed innovative components such as FRU modules, receptacles, and Zonit male and female locking plugs and receptacles. Each one shows one or more locations where an FRU module can be located to advantage. The functionality the FRU module provides can be as already described. It should be noted that you can combine different capability FRU modules (which can be in different locations in the power topology) to advantage. Another design constraint that each of these embodiments meets is to insure that the form-factor used either does not or minimally increases the size of the space in the equipment rack needed for infrastructure components We will now consider the following embodiments of a Z-Strip style plugstrip or Zonit hybrid hydra cord for the data center environment. The Circuit Interrupter capability of the FRU module makes it possible to use smaller receptacles and smaller connectors, either standard types such as IEC C-5 (with or without Zonit proprietary locking features) or Zonit proprietary or other. This saves space, cost and lets you use lighter, cheaper more flexible power cords. A number of examples of this are shown in FIGS. 56-58. You can choose to put any type of FRU module into the Z-Strip (or hydra cord) to start. To lower initial purchase price you can just put in the Circuit Interrupter Only FRU. If you later want to add power quality monitoring, you can substitute a Field Replaceable Unit (FRU) that fits in the same holder and combines a fuse with PQM capability (including the required communications and command+control functionality). If you need PQM+Switching, you can put in a FRU that has the described Zonit controllable circuit breaker (or Reed switch) and the PQM capability w/the required communications and command+control functionality). This is an extremely flexible method of building power distribution plugstrips, hydra cords and power cords (intelligent or non-intelligent) for the rack environment and has many other applications. Other FRU form factors are possible, depending on the amperage and voltage rating of the desired application. The FRU module can incorporate any or all of the possible functionalities and be placed in a number of locations in the power topology to advantage. In fact, in situations or locations that require power monitoring and/or control, the intelligence needed can designed in or added later using this small form factor technology. We will now discuss in more detail several possible embodiments of inventions that could incorporate this advance.

In one embodiment, shown in FIGS. 56-58, a Zonit Z-Strip is shown. The Z-strip design can incorporate any of the following features as needed. Many of these features can also be used to build Zonit hybrid hydra, Zonit hydra cords or Zonit intelligent (incorporating an FRU module) power cords. For Example, FIG. 58 illustrates a Z-strip 5800, mounted in an equipment rack 5806. The Z-strip 5800 FIG. 58 also includes support structure 5805 for supporting the power cords 5815 in the junction assembly 5810. In the embodiment of FIG. 58, the junction assembly 5810 includes multiple junction housings 5820 that electrically interconnect each power cord 5815*a*, 5815*b*, 5815*c*, and so forth, of the set of power cords 5815. All of the power connections in these devices can optionally have one or both ends that lock using standard or Zonit provided methods.

a) Flexibility.

Figure 59:
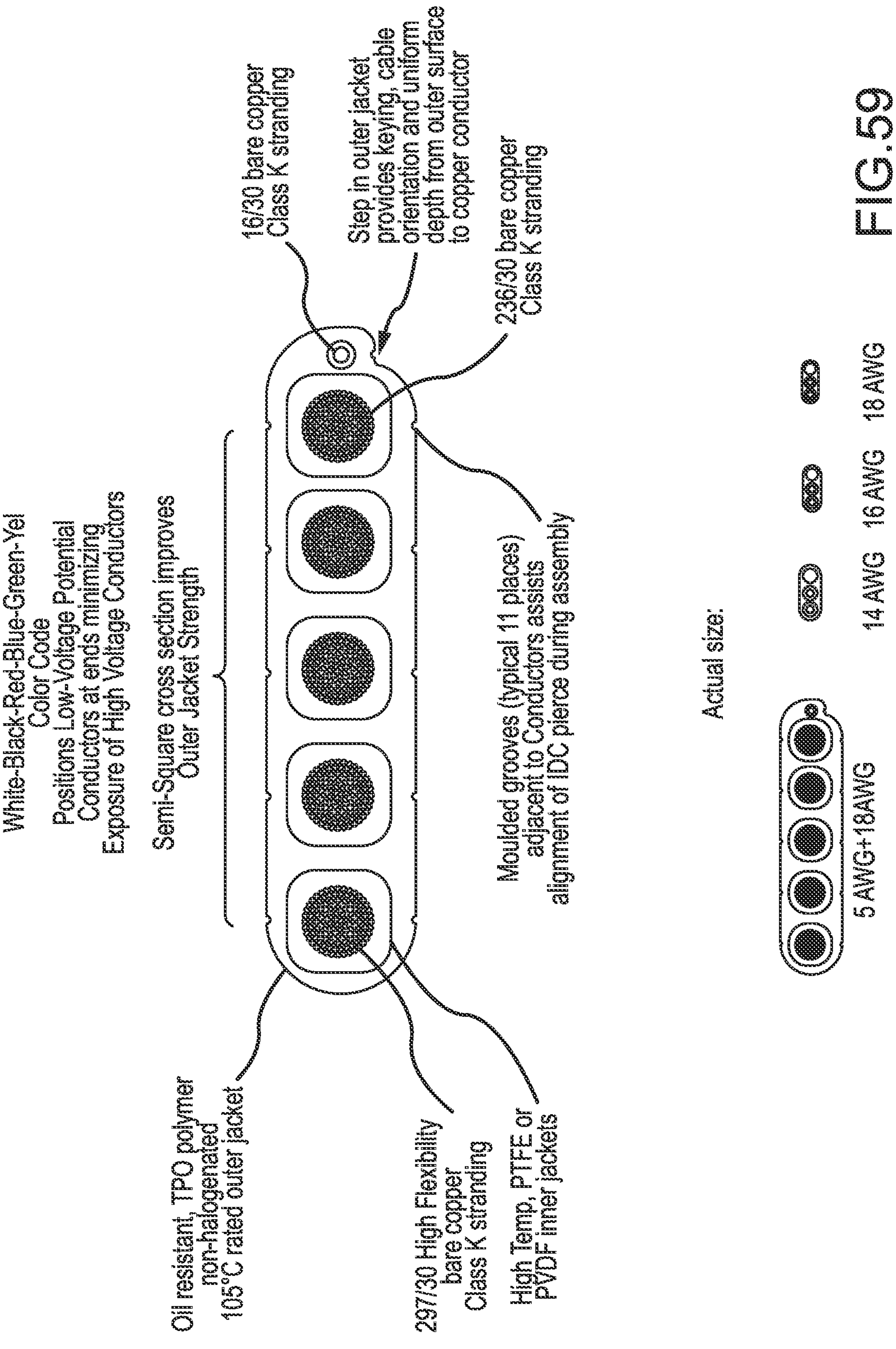
FIG. 59 shows a cross-section of a power cable system in accordance with the present invention.
Figure 60:
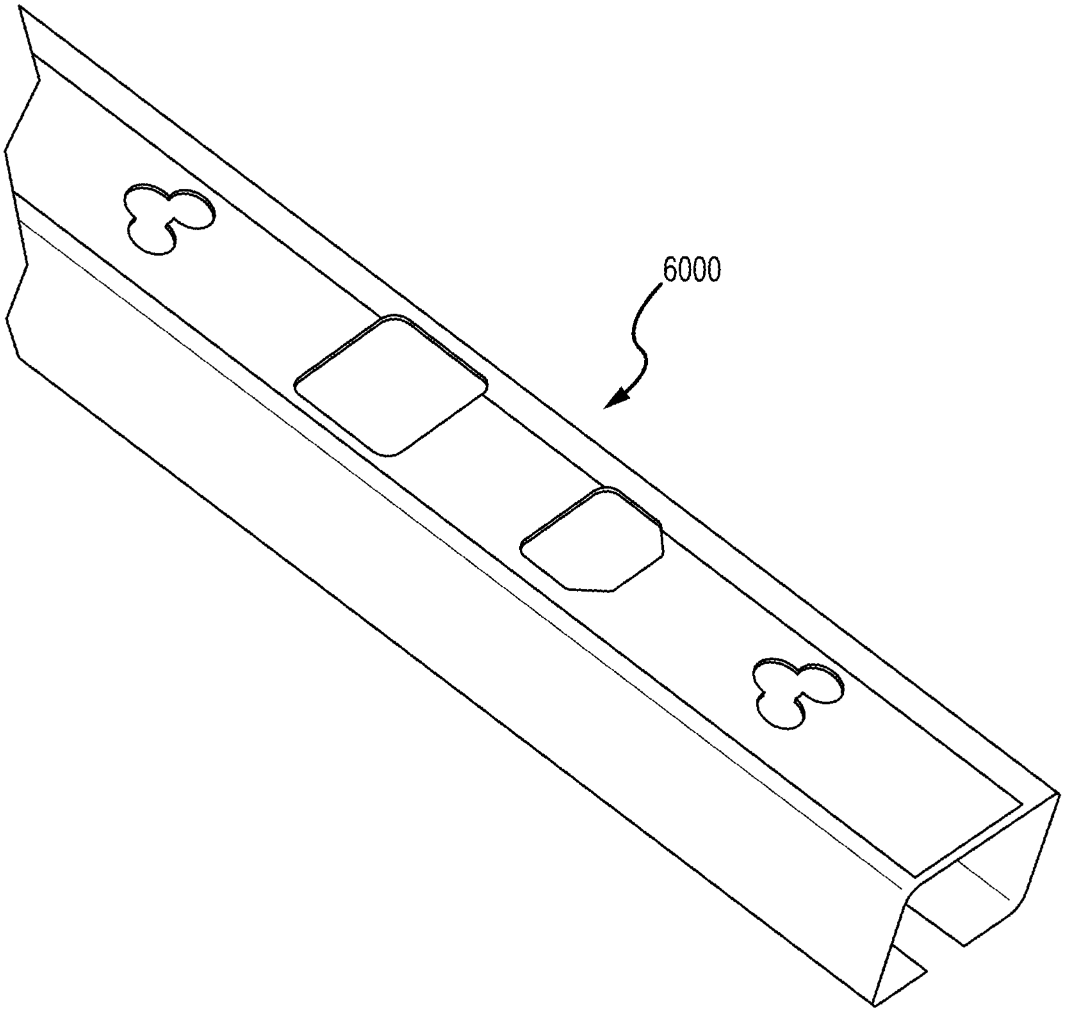
FIGS. 60-63 show cable housings in accordance with the present invention.
Figure 61:
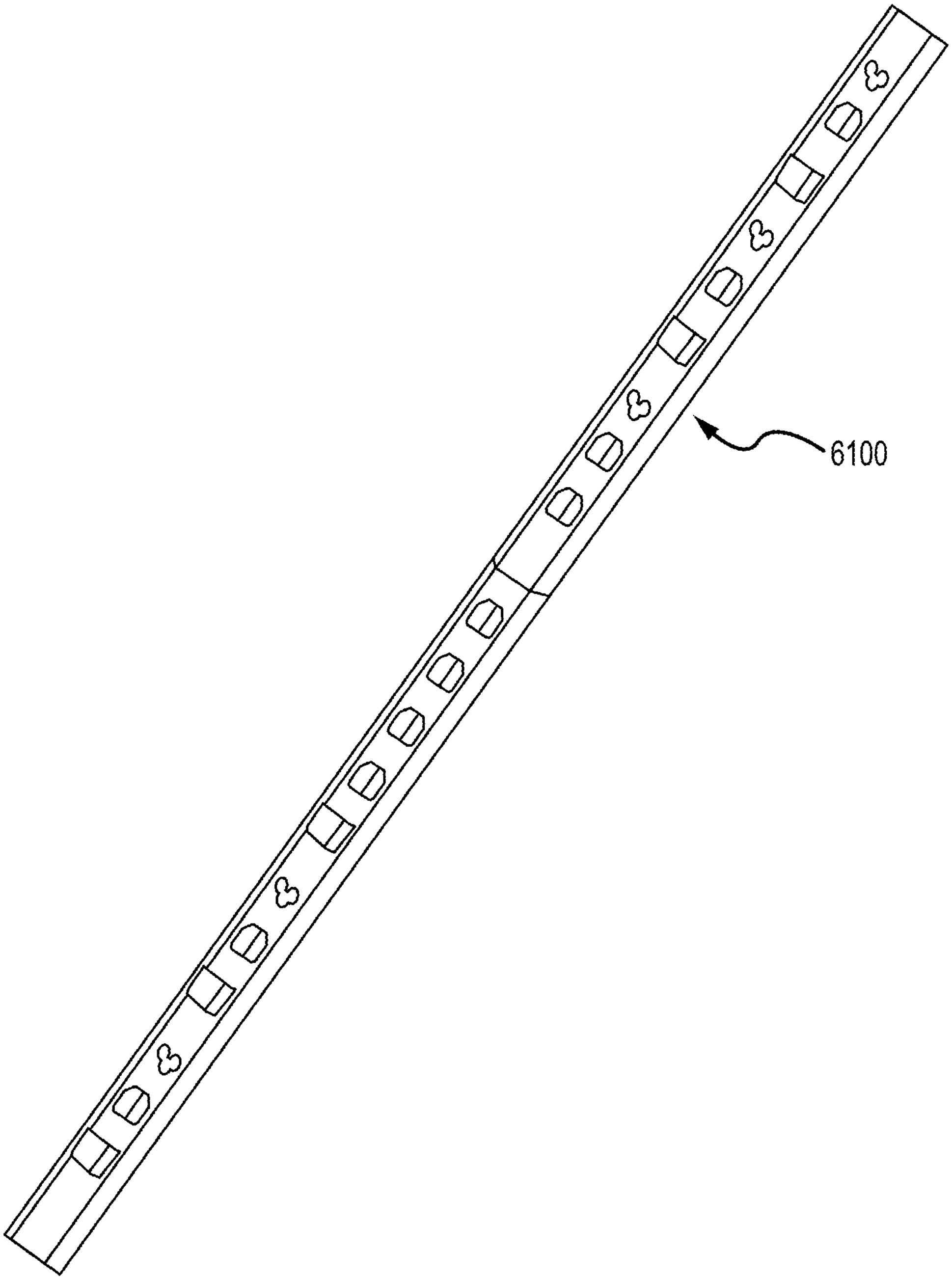
Figure 62:
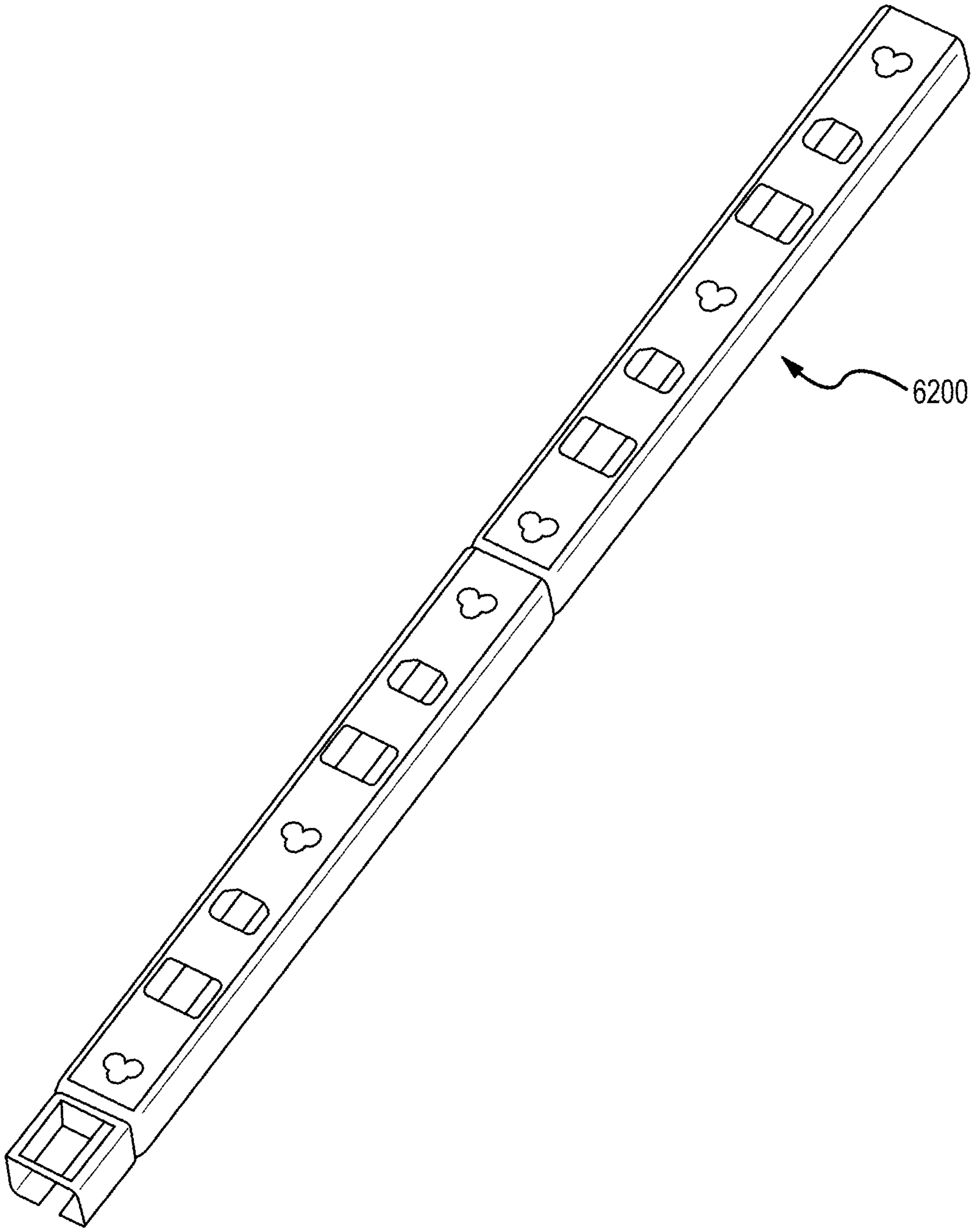
Figure 63:
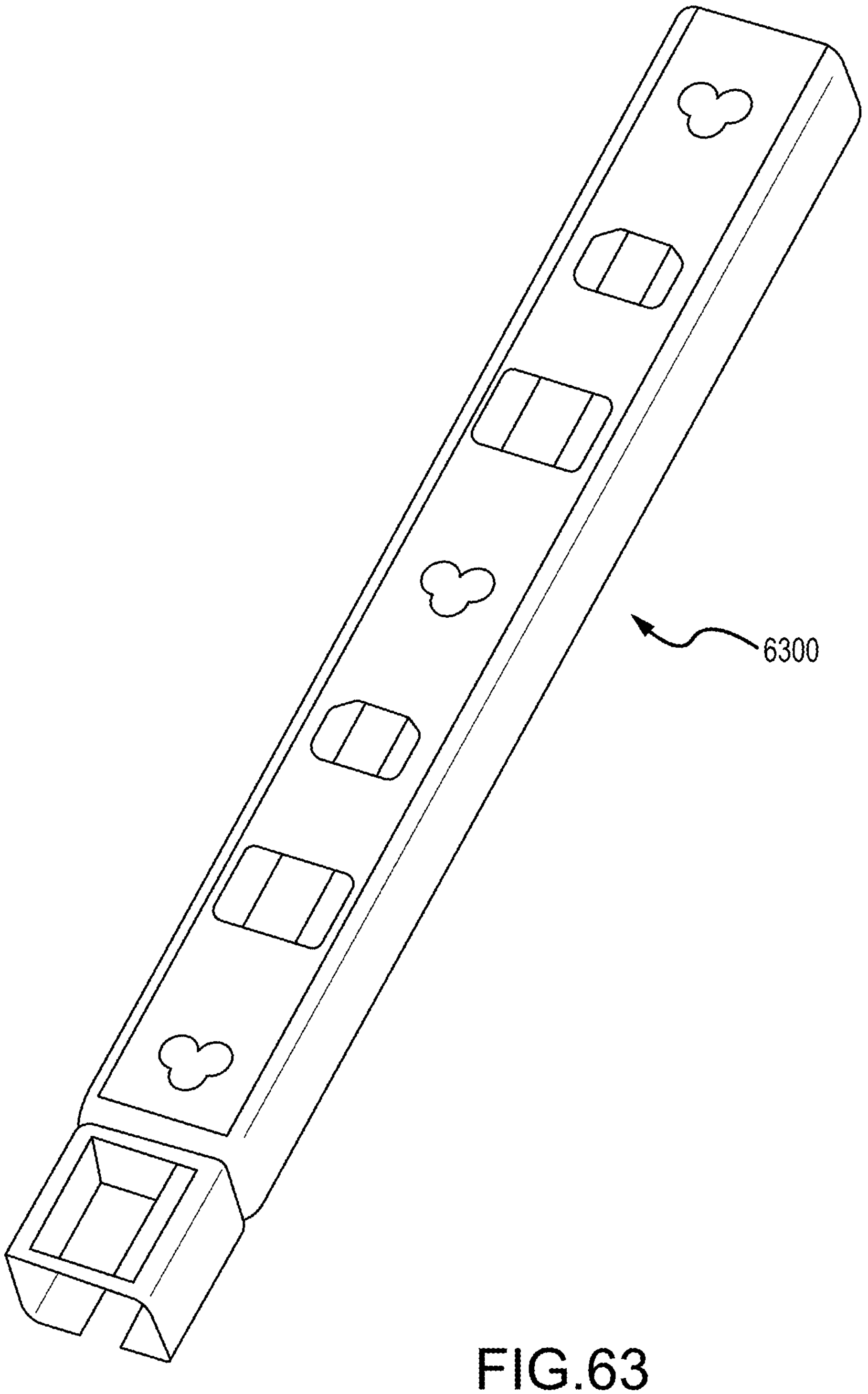

A flexible Z-strip plugstrip has a number of advantages over a rigid plugstrip. It is much easier to mount in a equipment rack or cabinet. Compare fishing a 66" long rigid vertical pole into an equipment rack (especially if it is already loaded with equipment!) vs. threading a 66" long flexible rope into the cabinet. The rope is easier by far to work with. In the embodiment shown the Z-Strip is made up of flexible flat ribbon power cabling. This can be done with 3 wire for single phase Z-strips and four or five wire for 3 phase delta or wye configuration plugstrips, a five wire embodiment is shown in FIGS. 57-59. The detailed design of a preferred instantiation for the 60A flat ribbon cable 5701 is shown in FIG. 57. This design has 5 wires, organized for best advantage and an additional wire that could be used for signaling or other purposes. Other desired power capacities, such as 10A, 16A, 20A, 32A, 40A, etc. could be built to the same design with appropriate wire gauges and insulation dimensions.

b) Shaping Via Supports or "Skins".

Sometimes a flexible Z-strip may need to be mounted in a more constrained fashion, but in a way that is easy to install. Additionally, it may be desirable to add custom graphics and/or labelling. An amazing number of equipment racks, plugstrips and power cords are sold on color or other appearance attributes! At great margins! We have invented a number of ways to meet any requirement in this area quickly, flexibly and at low cost. The first embodiment that is shown is to use a shock-corded tent pole style pole that can be expanded to full length inside the rack and then have the Z-strip clipped to it via integral or add-on mounting clips on each receptacle. Several examples are shown in FIGS. 60-63. The tent pole can have appropriate fastener types inserted in each end for attachment to the rack structure. It can be provided with mounting brackets. It can be shaped in a "D" shape or other cross-section, so that the receptacles clipped on it do not rotate when having cords installed or removed. Another embodiment is to provide a clip on the back of the receptacles that can clip onto a flat strip of sheet metal. That sheet metal can be part of the rack structure or added to it. Another embodiment is to provide a "skin" for the Z-strip (see FIGS. 60-63). The skin 6000, 6100, 6200, 6300 can be made of inexpensive light plastic (or stronger plastic or metal for higher strength needs) and have graphics and or labelling put on it. It can clip onto the Z-strip in sections, that are easy lengths to handle making it simple to install. The sections can attach to each other, an example would be via the same mechanism as a typical rain spout where the end of one section of skin is dimensioned to slide into the next section of skin. It can have cutouts or snap-in faceplates for any receptacle type as shown in FIGS. 60-63. They can offer access to the FRU module holder and any secure connection mechanism used. It can have cutouts or snap-in back plates that fit the back of the receptacle so that the receptacle mounting clips can be used. It can be straight or curved in many shapes. It can be 3D printed for quick manufacture. It can provide compatibility with existing racks and use existing plugstrip mounting brackets. It provides a simple and flexible method to meet many application requirements while not really impacting the form-factor of the basic Z-strip! So, no excess infrastructure space in the rack is needed.

c) any Needed Receptacle or Plug Type

The receptacle and plug types used on or with the Z-strip (or Zonit hydra cords) can be of any type needed (for example IEC 60320 connectors, C13, C15 & C19 are most common in the data center), (NEMA 5-15, 5-15T, 6-15, 6-20, L5-15, L5-20, L5-30, L6-15, L6-20, L6-30, L21-20, L21-30, L22-20, L22-30 and many others). The male and/or female connectors can incorporate secure retention mechanisms already described in the Zonit cases including the Locking Receptacle cases and herein. Also, the Zonit proprietary receptacle and plug types shown in FIGS. 21 and 64 can be used to for any of the connections needed and could optionally also be used to make a small form factor connection to IT equipment. The connectors described can be used to build Z-strips or Zonit hydra cords in a wide number of topologies and configurations to meet power distribution needs. It should be noted that you can build a hybrid type of hydra where each hydra junction on the main feed line has a number of receptacles and that junction can incorporate the FRU module.

d) Incorporation of the FRU Module Technology

This can be done in FRU style or integrated style as described herein. The FRU module can be placed in-line on the Z-strip main feed conductor, at any and all receptacle types or in power cord caps (male or female ends) or in-line in as part of a Zonit intelligent power cord. It can also be incorporated in the same manner in a Zonit hydra cord, the only difference is that the hydra junctions replace the Z-strip receptacles and the distribution legs of the hydra replace the Zonit intelligent power cords. The rest is the same. Some of these options for FRU location are shown in FIGS. 46-56. The FRU module also can be done as an inline plugin module that is designed to connect the FRU to the power wiring, in any appropriate location along the power wiring. That inline module could be used with existing or Zonit secure locking plug and receptacle inventions to make an intelligent power cord that has physically secure connections. The use of Zonit technology in the way described makes it very easy to retrofit to existing data centers or homes or offices regardless of what power distribution methods or products they use. It can be designed in or retrofit in a large number of ways as the client needs and desires.

e) Communication Over Power Wiring

In these embodiments the communication is between the FRU module and a Zonit device which has in its enclosure or is connected to a stand-alone control module. The communications mechanisms already described allow use of the control module and required power wiring communication hardware to communicate with the FRU modules over the power wiring and monitor and control them. In this instantiation, the transmissions to and from the FRU modules are sent over the power wiring by Zonit devices such as a ZPDU, Arrowhead, Zonit ATS or other Zonit power distribution and/or auto-switching device connected to the power distribution wiring and vise-versa. This gives the control module a communications channel to the FRU modules.

f) Use of a Small Standalone Communications Module

This allow communication between a FRU module and the ZPDU control module. There are several varieties of this for a number of situations and many have already been described. One embodiment uses a plugin module that inserts into a receptacle (on a plugstrip or a wall receptacle) or is hardwired in. The communications module can act as a transceiver for the powerline communications from and to the FRU modules and connect them to the control module via:

i) A network communications protocol, like TCP over Ethernet;

ii) a USB port as described in the NetStrip cases;

iii) any wireless communications mechanism that can communicate with the control module as previously described to allow any suitable Zonit device with a control module in its enclosure as previously described (for example a ZPDU w/control module in its enclosure) or a control module in a standalone case to communicate with the FRU modules over the described communications mechanisms and monitor and control them.

In one instantiation, the signaling from the FRU modules is transmitted over the power wiring and picked up by a plugin communications module connected to the power distribution wiring. It is possible to connect a control module in a standalone case to the FRU modules using an appropriate standalone communications module for the application. No other Zonit device would be required in this instantiation.

g) The receptacles of the example Z-strip (shown in FIGS. 57-59 and discussed later) are of Zonit design. In the embodiment shown they incorporate a new Insulation Displacement Connector (IDC) design by Zonit. This allows the use of more flexible flat ribbon power cable, which can be single phase (2 or 3 wires) or three phase (four or five wires). The cable can optionally incorporate other features, such as additional wires for communication methods or shielding or other needs. This type of construction can also be used to build Zonit hybrid hydra and Zonit hydra cords as is described later. This type of construction has several important advantages. In particular, it is very easy to build quickly with a minimum of skill and apparatus. Custom configurations are simple, just select the appropriate flat power cable, the desired receptacles and quickly assemble. You do not have to have a multi-ton plastic injection press to build these devices. This means that they can be assembled in almost any location in a variety of countries as needed. It becomes a "build-to-suit" product line, at a price point that probably is as low as volume production of traditional power cords. You do not have to stock hundreds of thousands of dollars worth of molded power cords or hydras or plugstrips that come in a fixed configurations from the factory. That is a huge win from a business standpoint and also in being able to quickly meet your customers needs.

Figure 64A:
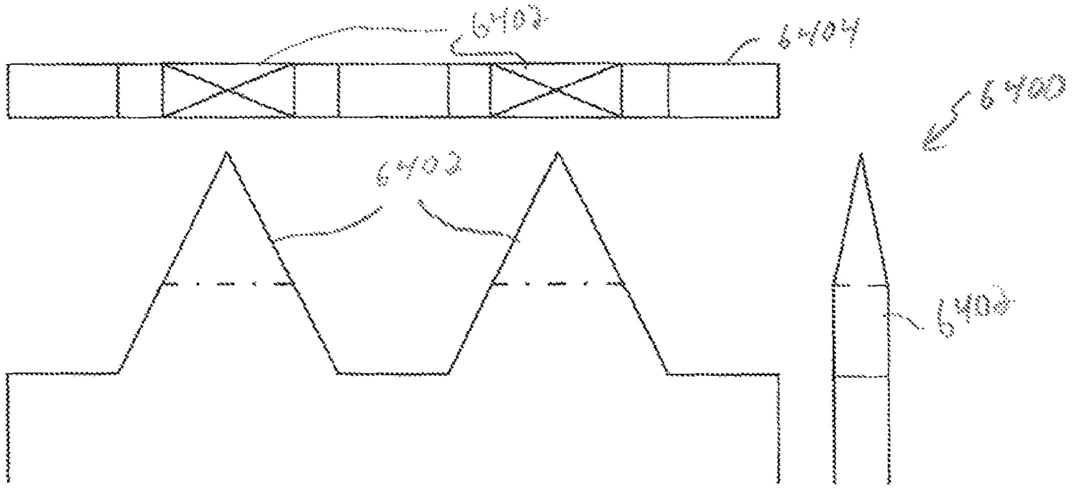
FIGS. 64A-G show a piece connect system in accordance with the present invention.

We will now discuss the Zonit IDC design. FIG. 64*a* depicts a traditional Insulation Displacement Connector (IDC) 6400 conductive element pierce (A) arrangement. The piercing tips 6402 are pressed through the insulation of the cable 6404 to be mated with. The piercing tips 6402 then enter the stranded conductors of the core of the current carrying conductors and by a spreading action inherent in the wedge shape of the piercing tips 6402, penetrate and establish a gas tight connection between the conductive element and the core wire. The disadvantage of this arrangement is that the displacement contacts a minimal cross section of the core wire and the ultimate current carrying capacity is limited. This type of IDC is commonly applied to Data Processing communication lines and telephony wiring. This type of IDC is also prone to premature failure due to the lack of any retention means to securely hold the wires in contact with the conductive element other than the malleability and elastomeric properties of the insulation.

Figure 64B:
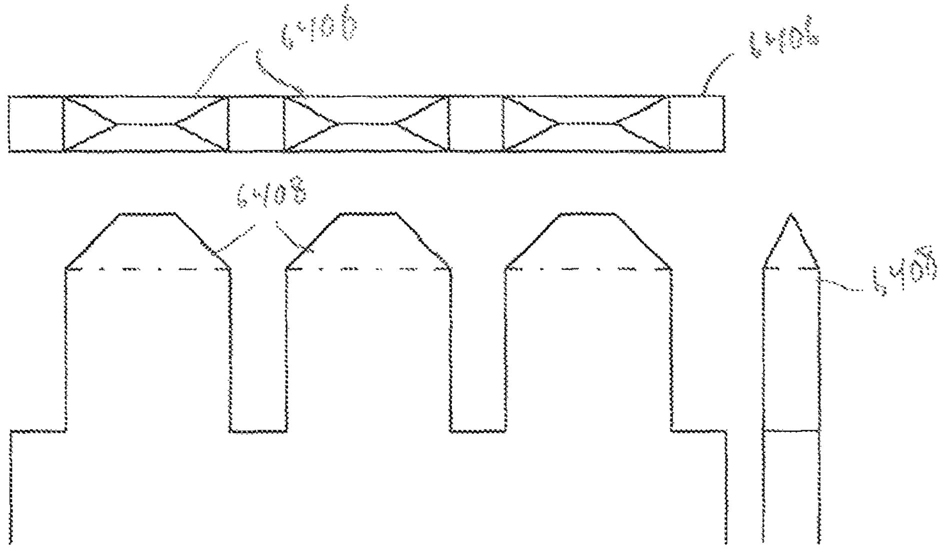

FIG. 64*b* depicts an alternative to the tapered pierce mentioned in 64*a*. It has similar connection means and very similar engagement properties to the piercing method described in 64*a* except one notable improvement. Since the wire 6406 is ultimately pressed into straight sections of the piercing elements 6408 the long-term stability of the connection is improved since the wire 6406 is not tending to be forced away by the taper of the piercing elements 6408. However, this scheme is power limited due to the fact that it is dependent on the malleability and elastomeric properties of the insulation to provide pressure on the wires to hold them against the piercing element.

Figure 64C:
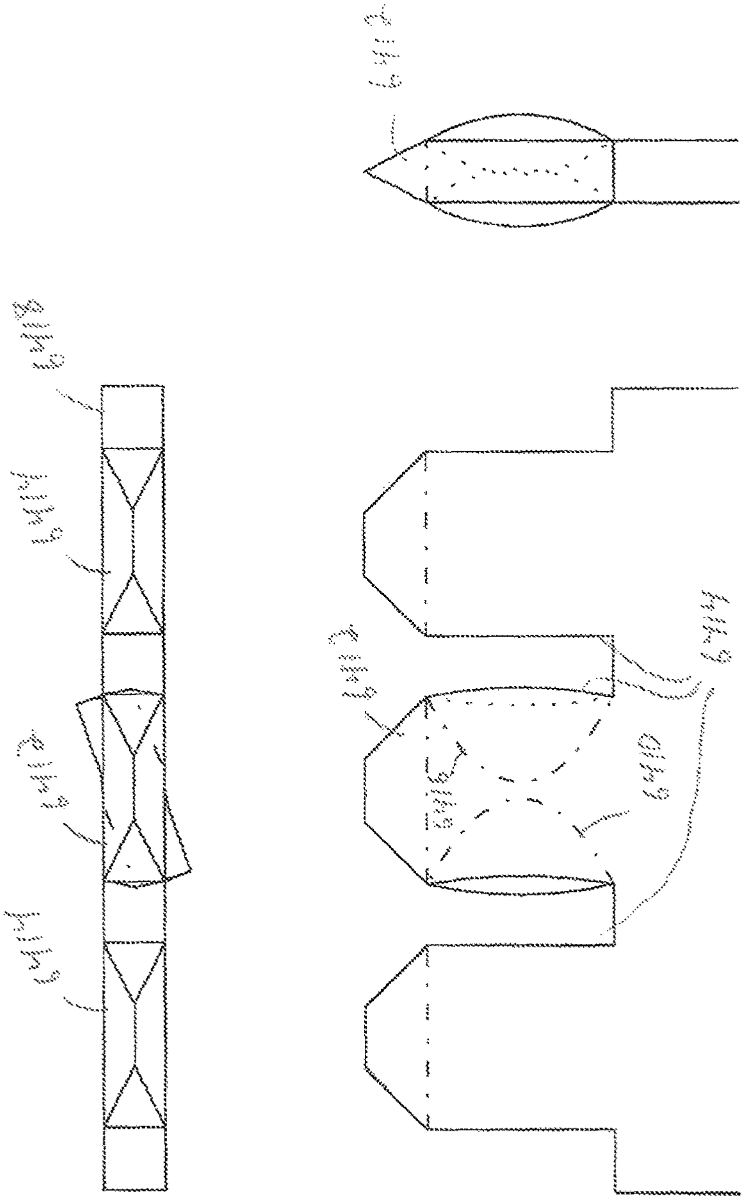

FIG. 64*c* depicts an improved version of the piercing element shown in 64*b*. A semicircular depression 6410 is stamped into the vertical axis of the center prong 6412 of the three prongs 6414 with a diametrically opposed similar depression stamped on to the opposite corner 6416. When this piercing element is inserted into a stranded cable 6418, the twisted portion of the middle prong progressively stretches some of the wires in the bundle more than others and ultimately has about half of the wires of the bundle below the apex of each of the stamped semicircles. These tend to pull away from the apex while simultaneously, the wires that are above the apexes tend to slide up the surface of the piercing element. The net outcome is a constant opposing force within the jacket of the insulation and that results in constant inward force bearing the wires towards the edges of the piercing prong. This improves the durability of the connection.

Figure 64D:
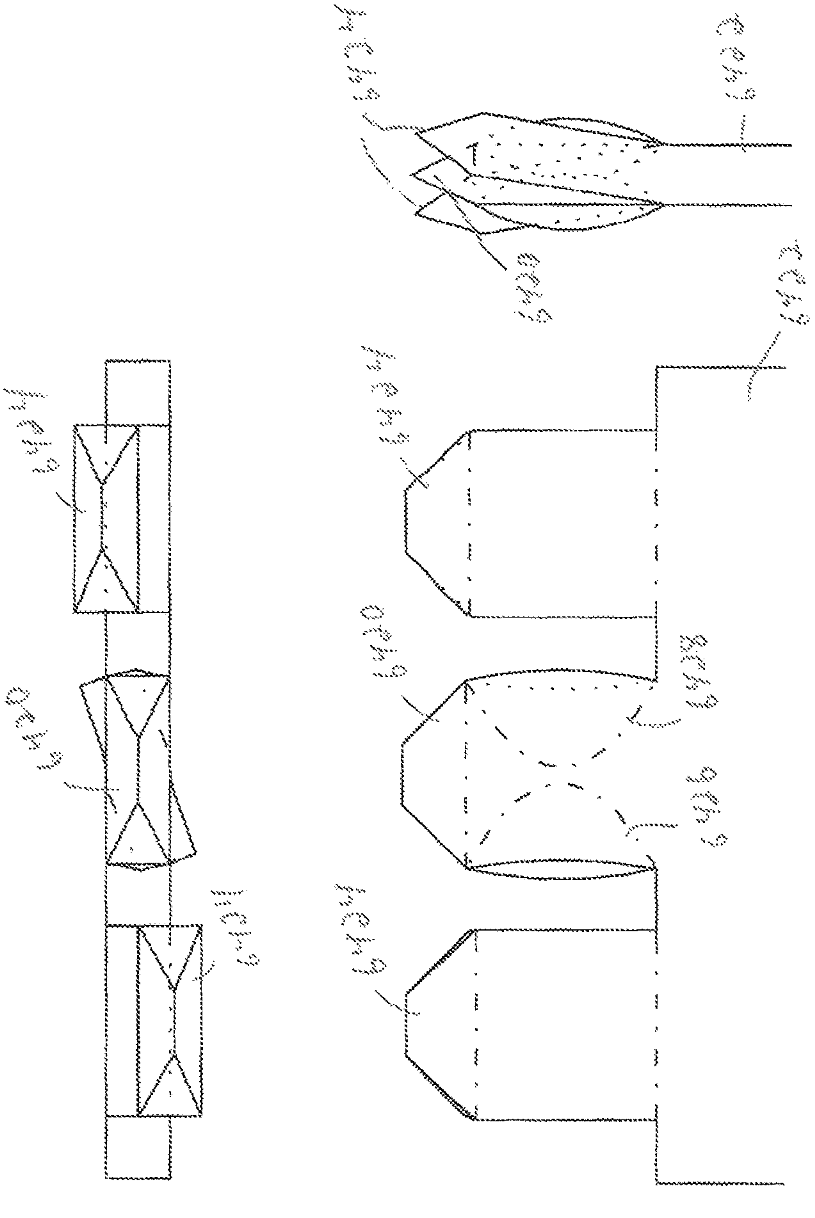

FIG. 64*d* depicts a key feature of the invention claimed by Zonit. The inner pierce 6420 is aligned on the center axis of the main body of the pierce body 6422. This pierce has the same characteristics described in 64*c*. The notable difference with this pierce body 6422 is that the outward pierce elements 6424 are displaced away from the centerline of the body 6422 in opposing directions. These displacements are in the same direction as the semicircular depressions 6426, 6428.

Figure 64E:
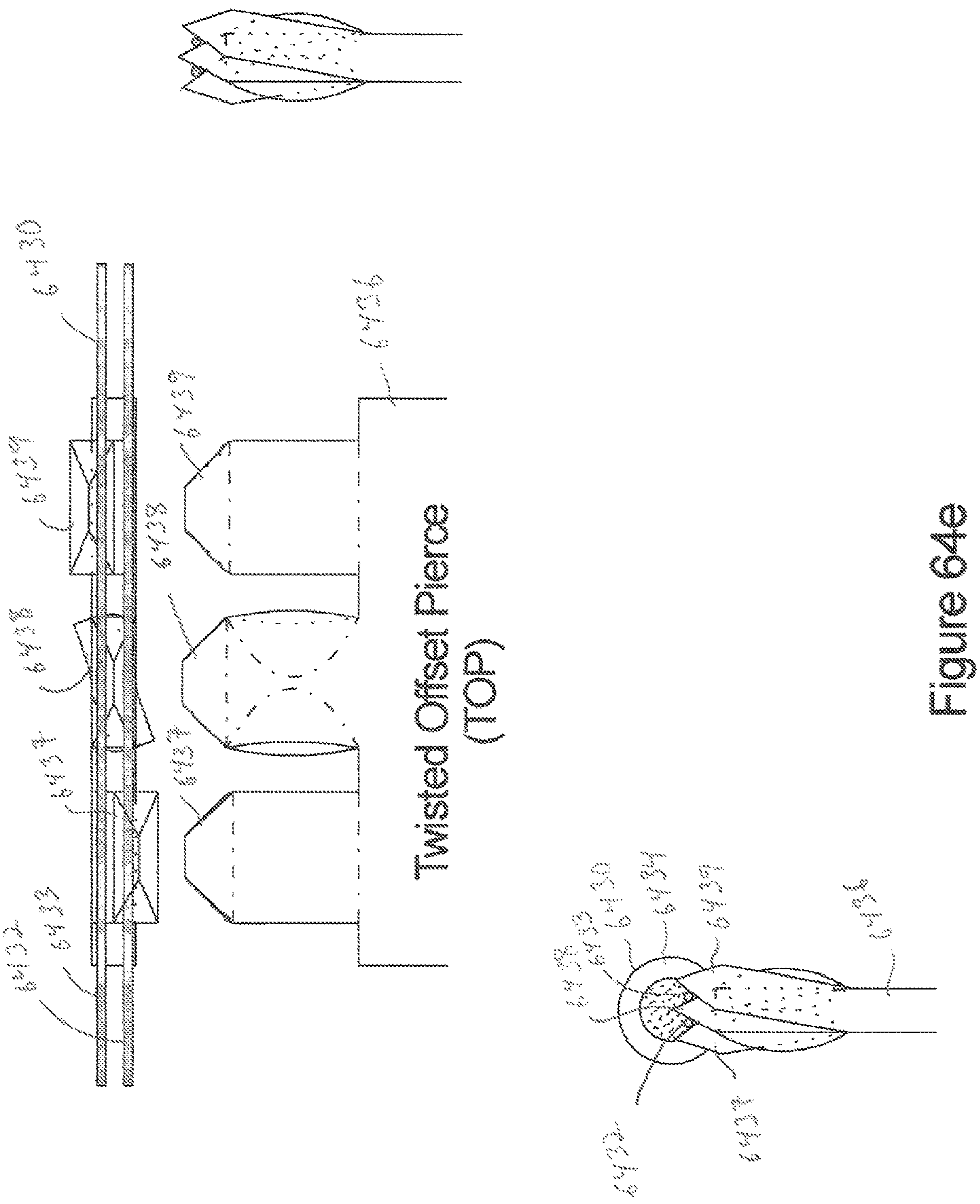
Figure 64:
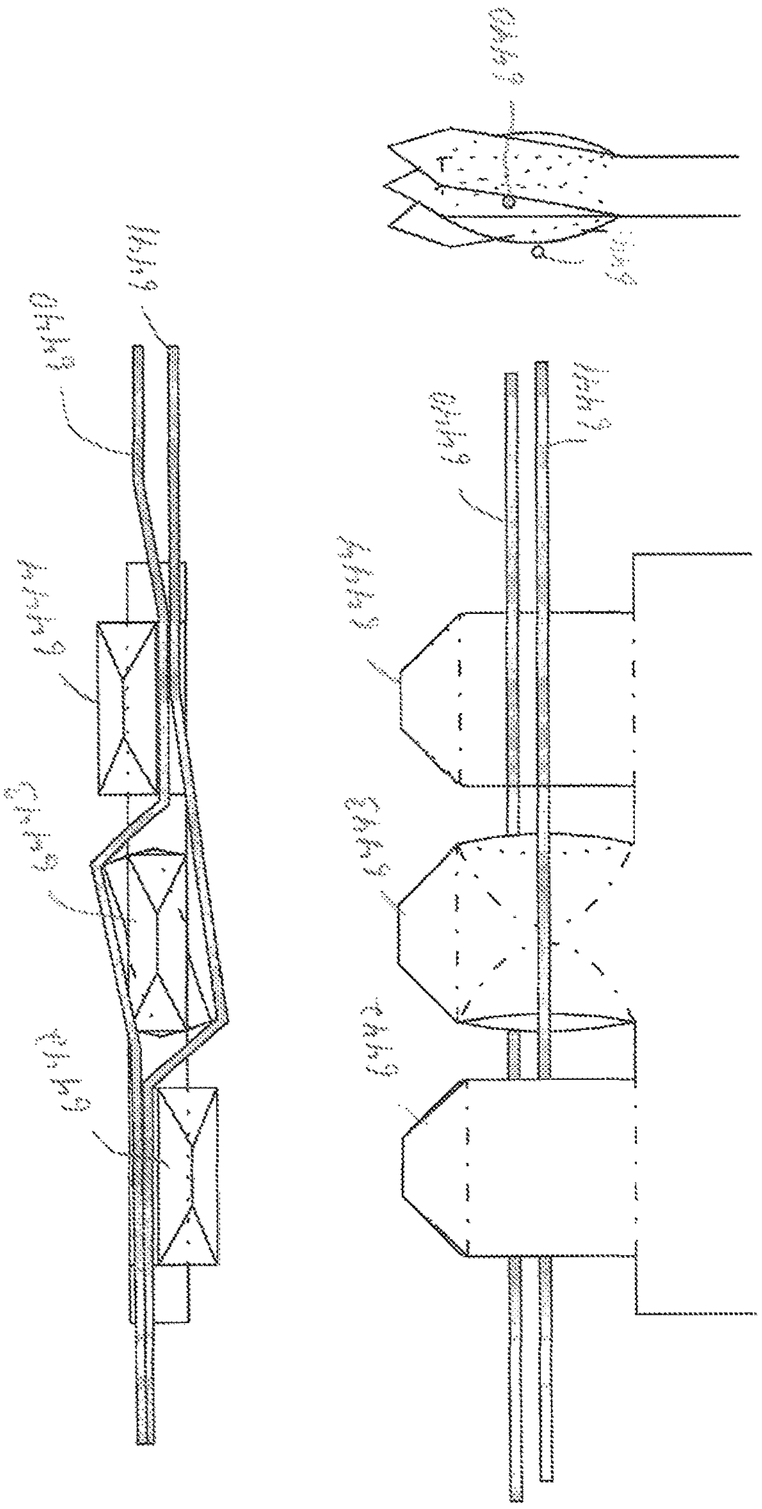

FIG. 64*e* depicts the piercing element described in FIG. 64*d* with a bundle of wires being initially pierced. Individual strands 6432, 6433 are shown contained with numerous additional strands by the insulation jacket 6434. For the purpose of visualization only two strands 6432, 6433 will be followed through with the full insertion of the body 6436, but it should be clear how the adjacent strands will behave as they simultaneously become displaced about the prongs 6438 as the insertion progresses.

Note that the top strand 6433 longitudinally spans above the tip of the left prong 6437 and the center twisted prong 6438 while passing below the tip of the right prong 6439. The end on view shows this relationship from a different view point. View 64*f* shows the progression of the two strands (and of course all of the adjacent strands to each) as the prongs 6442-6444 penetrate the wire bundle. Because both strands 6440, 6441 started out above the tip of the left prong 6442, and below the right hand prong 6444, and were divided by the middle prong 6443, the two strands 6440, 6441 take different paths as the insertion progresses. The top strand 6440 follows around the upper right edge of the center prong 6443 along the crest of the depression on that side. The lower strand 6441 does the same in the opposite direction along the lower left of the center prong 6443 riding the crest of that depression. It should be noted that as all the strands are penetrated, that some, close to the mid-line of the bundle of strands will ultimately come to rest in this position as shown, with a few strands at the apexes of the depressions of the center prong 6443, while some will have just started to be deflected when the cable bundle bottoms out. This will result in a distribution of some of the strands being stretched more than others in the final resting point of the bundle. Some strands will be straight, or nearly so, while others will zig-zag through taking a longer path, resulting in tension in those strands.

Figure 64G:
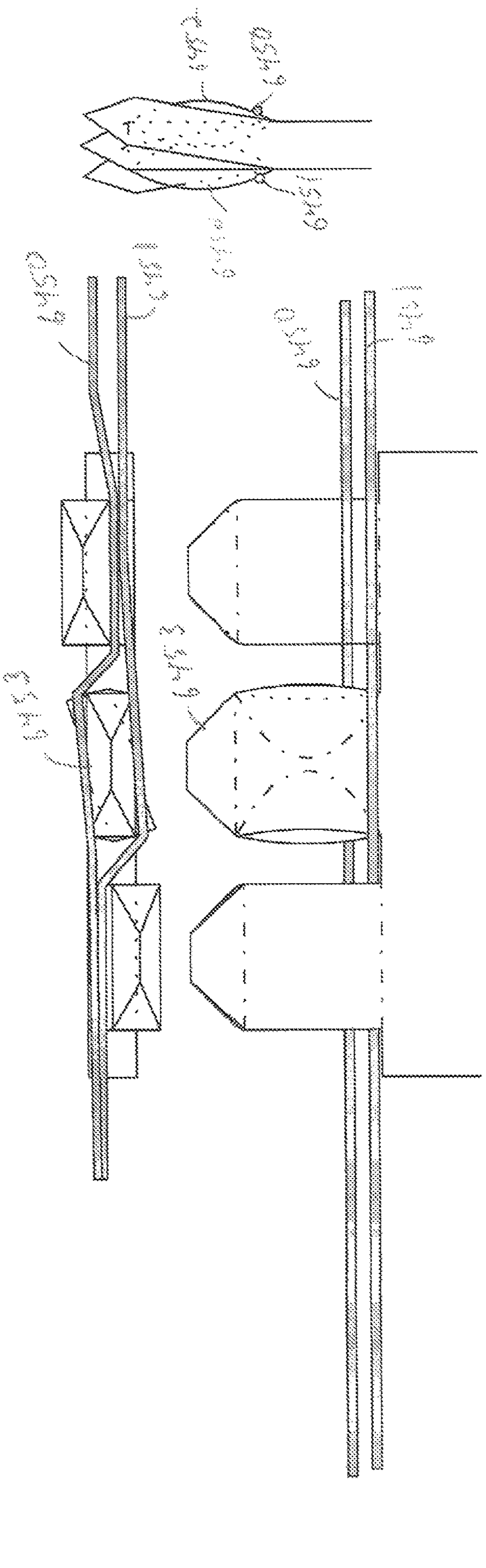

FIG. 64*g* depicts the two strands 6450, 6451 as they rest at the bottom of the prongs after full insertion of the body into the bundle. Note that the strands (3, 4) are following a much straighter path now than they had as shown in FIG. 64*f*. This results in reduced tension on these strands 6450, 6451, but more important, they tend to be forced into this position and constantly forced towards the main body direction due to the downward ramping effect of the descending crest 6452 of each of the depressions. In fact, nearly half of the strands will experience this direction of force, which tends to constantly pull the bundle towards the body of the pierce. This action coupled with the containment of the insulation, and ultimately the compressive containment by the outer insulation and housing cap, will insure longevity of the connection.

In addition, the fact that the individual strands of the bundle each have different ultimate tensions distributed along their longitudinal axises, reduces the effects of repeated heating and cooling from changes in the current and ambient temperature that have the effect of working loose the gas tight bond between the strands and the insulation jacket. As heating occurs, the strands that are more tightly strained (higher tension due to the longer path) will relax ever so slightly (as do the remaining strands) allowing the center prong 6453 to slightly rotate to the counterclockwise direction. That prong was twisted, ever so slightly, by the tension in the strands bearing clockwise on the prong 6453 when they were cold and trying to be shorter. Thus, as heat and cool cycles occur, the basic point of contact remains the same between the strands and the edges of the various prongs. The result of these improvements to the prong characteristics of this invention is increased current carrying capacity, better long-term reliability and ability to withstand heating and cooling introduced by variations in ambient temperature and varying load conditions of the current carrying conductors.

An additional feature that can be incorporated into the invention is the use of solder coatings on the IDC connectors or small "solder slugs" that are attached to an appropriate location on the IDC connector and that are melted after the IDC connector is installed via an appropriate industrial process such as induction current heating (or other process) for example. This offers improved connectivity and may be desirable for marketing reasons because IDC connectors are sometimes viewed as less robust than traditional plugstrip connection mechanisms such as receptacles with screw-down terminals.

Numerous other inventions exist for IDC connectors that have very good conduction (carry heavier loads) characteristics, have long term stability, etc., but they all have one thing in common. The axis of the body of the pierce is perpendicular to the axis of the conductors in the bundle of the cable. This means that more space is required to have multiple conductors simultaneously penetrated in a group of piercing bodies. This is problematic when designing a means to easily tap the so-called flat power cables described in numerous applications.

Thus, the benefit of this invention is not only the heavier current carrying capability and longevity, but also to accomplish that within the manufactured longitudinal placement of the conductors of the mating flat power cable. If transverse pierce bodies are utilized, it would be likely that the longitudinal bundles of wire of each conductor of the flat cable would require mechanical separation prior to being pierced to guarantee desired distances through insulation for safety and reliability.

Figure 41:
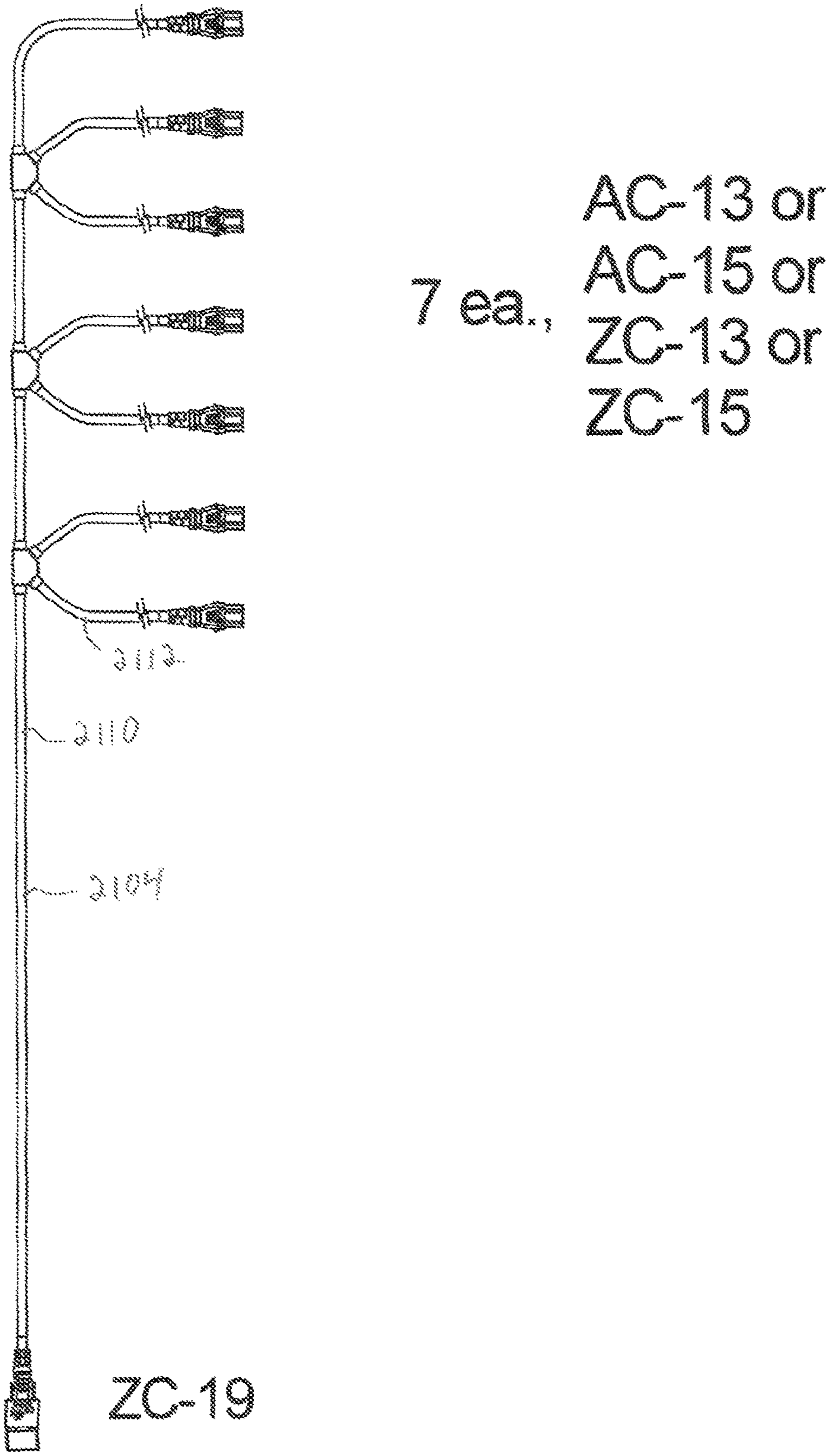
Figure 42:
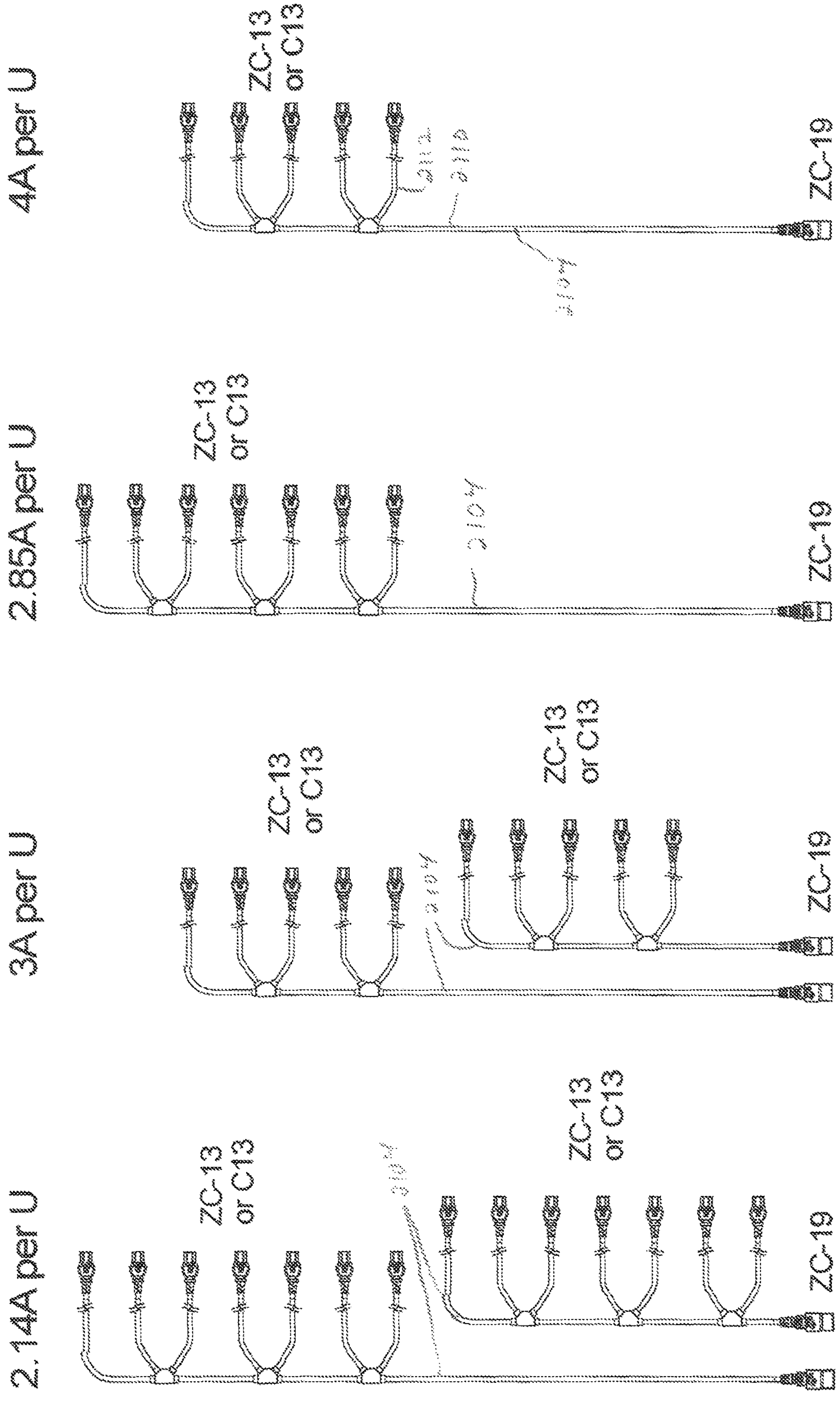
Figure 74:
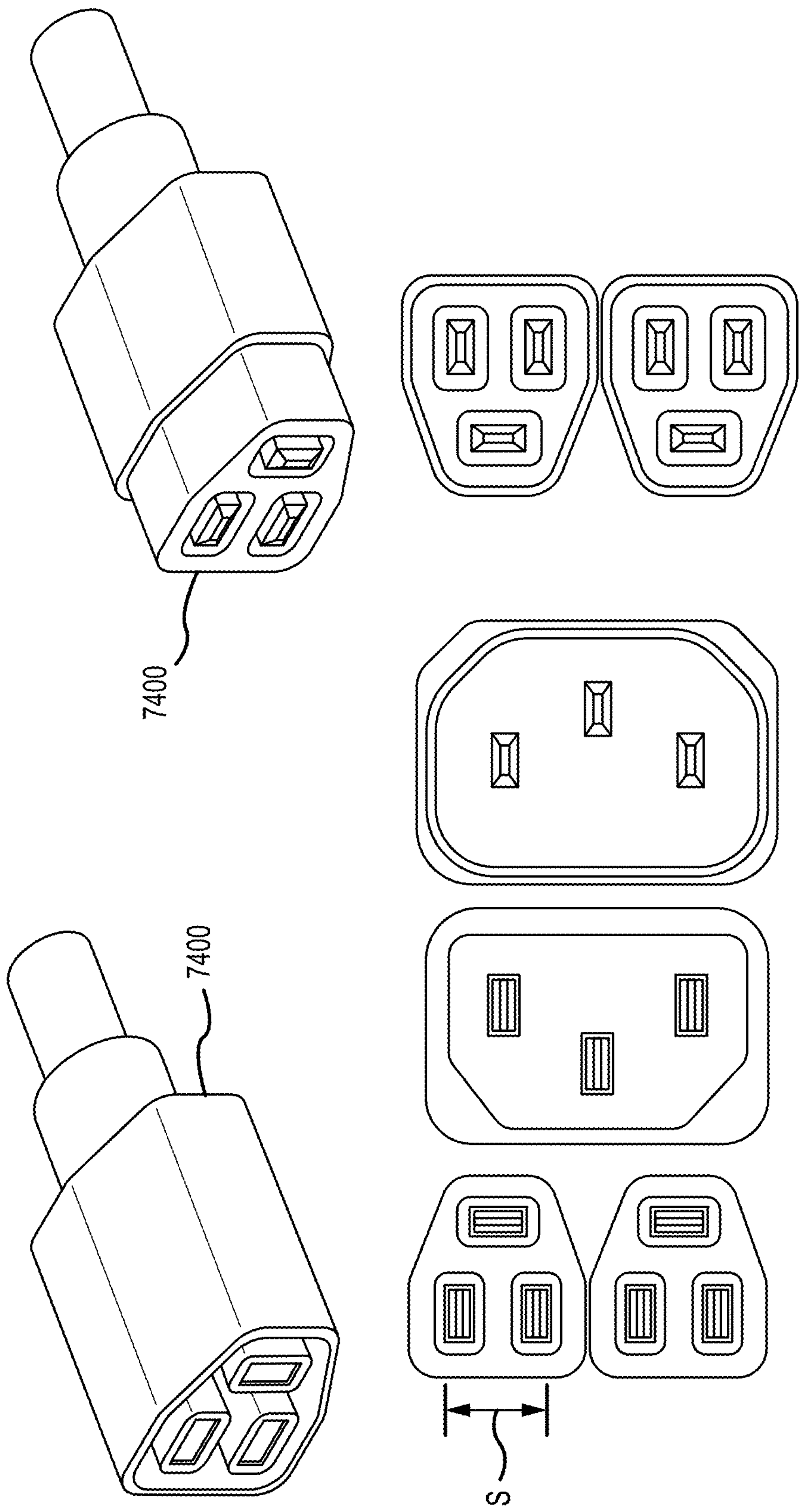
FIG. 74 shows a connector in accordance with the present invention.

Other wiring types, such as round wiring can be used for a Z-strip and that would require a different receptacle design, that uses a design that is more like a "contact carrier" in a traditional plug like a IEC C13 cordcap. The wiring from the cord enters a receptacle and is then crimped (or soldered or other appropriate connection) to an electrical contact assembly which can incorporate the FRU cigarette fuse style holder and then the power cord to the next receptacle in the Z-strip is crimped (or soldered or other appropriate connection) and exits the receptacle to go on to the next receptacle in the strip. The receptacle can incorporate appropriate strain relief mechanisms at the entry and exit points of the round wire. Supporting the use of round wire may be useful when building a Z-Strip (or Zonit hybrid hydra cord or Zonit hydra cord) using a wire type that is only made in round wire. An example is shown in FIG. 41, appropriate to the round wire. The receptacle types used on the Z-strip can be of any type needed (for example IEC 60320 connectors, C13, C15 & C19 are most common in the data center), (NEMA 5-15, 5-15T, 6-15, 6-20, L5-15, L5-20, L5-30, L6-15, L6-20, L6-30, L21-20, L21-30, L22-20, L22-30 and many others). They can incorporate secure retention mechanisms already described in the Zonit cases including the Locking Receptacle cases or described herein. Also, the Zonit proprietary receptacle types shown in FIGS. 47, 52, 56 and 74 can be used to for any of the connection types needed and could optionally also be used to make a small form factor connection to IT equipment. The small form-factor plugs 7400 (pin separation distance, indicated by "s" FIG. 74, of less than 12 mm and, preferably, no more than 10 mm) and receptacles could also be used to make all needed connections in the Z-strip and possibly directly to the IT equipment if it was equipped with the matching small-form factor receptacle. A set of legacy "adaptors" could also be designed that would function like a universal phone charger with a set of interchangeable "tips". This would allow support of legacy plug and receptacle types (IEC C5, C7, C9, C13, C15, C19, NEMA 5-15, others) as needed in the IT equipment in the rack. It would also allow you to take a power cord built from any of the small-form factor plugs and receptacles and convert it to any needed legacy power cord configuration that was needed using the appropriate set of "tip adapters" for the needed legacy plug and receptacle. This could offer great manufacturing and stocking advantages, because you greatly cut the number of SKU models you have to stock and you can just have boxes of "tip adapters" around instead of a set of legacy power cords and new reduced form-factor power cords.

h) Dual locking IDC style hydra cords in single or three-phase models

Figure 65:
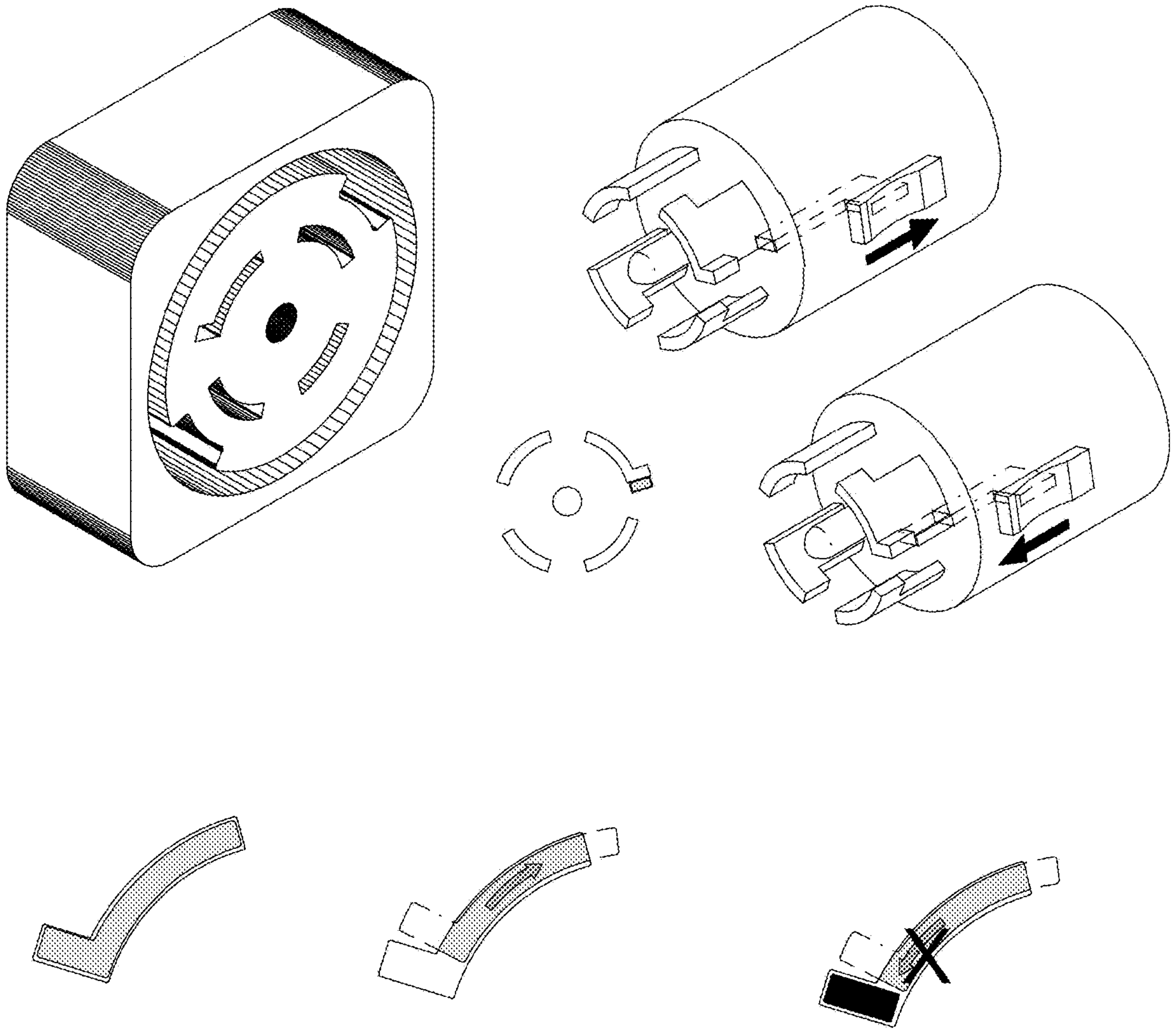
FIGS. 65-67 show controllers in accordance with the present invention.

FIG. 21 shows an example of a three-phase Zonit hydra cord 2104 of novel design. In this design, the receptacle 2102 is provided with one or more IDC connectors 2108 shown oriented at 90 degrees to each other (other orientations are possible depending on the application need). This design allows the use of flat ribbon style power wiring for both the main 2110 and distribution 2112 legs of the hydra, which is preferred for the reasons described earlier. This style of hydra can incorporate the phase rotation technology described in Zonit U.S. Pat. No. 6,628,009. This can be done in one embodiment by using Zonit NEMA L21-60 or Zonit NEMA L22-60 plugs and receptacles. The Zonit design of these plugs and receptacles is compatible with the NEMA standard, but adds a very important improvement. An example of this type of receptacle is shown in FIG. 65. The standard NEMA specification relies on the twist-lock feature to insure the physical security of the plug to receptacle connection. That works reasonably well with smaller diameter 20A and 30A L21 and L22 connectors, because the SOW cord typically used to wire them up, is not too stiff. The 60A SOW cord is very stiff, 60A ribbon cable is pretty stiff. If you twist the cord a bit during the installation process, as often happens, it can resist that twist and over time, potentially unlock the NEMA twist-lock connector. This is bad. Sixty amp three-phase power is a lot of power and could be hazardous in a partially locked connector, causing arcing and potential safety hazards, not to mention downtime. Nobody has ever brought to production the NEMA L21 or L22 60A design, and we think that is why. We created two types of mechanisms that add a drop-in locking pin, that the user can actuate (via a thumb or finger operated actuator) to prevent the any NEMA twist-lock and specifically the referenced L21 or L22 connectors from turning and undoing the twist-lock after they are connected. The NEMA twist lock designs all use one bent-blade contact that serves as a "key" to insure that the plug and receptacle mate as intended. This bent-blade contact is inserted into the matching recess via a straight push and then the plug is turned to twist-lock the connection.

Figure 39:
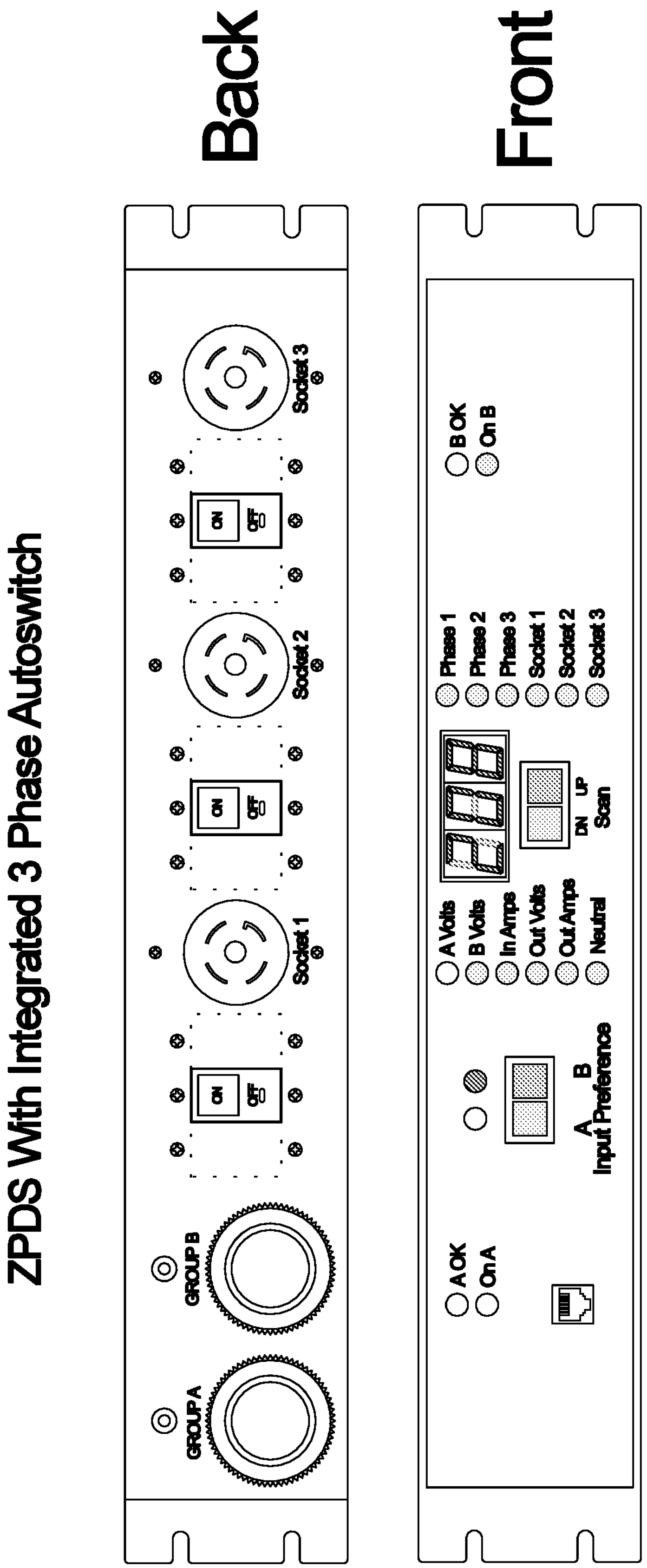
FIG. 39 shows a ZPDu with integrated three-phase ATS in accordance with the present invention.
Figure 40:
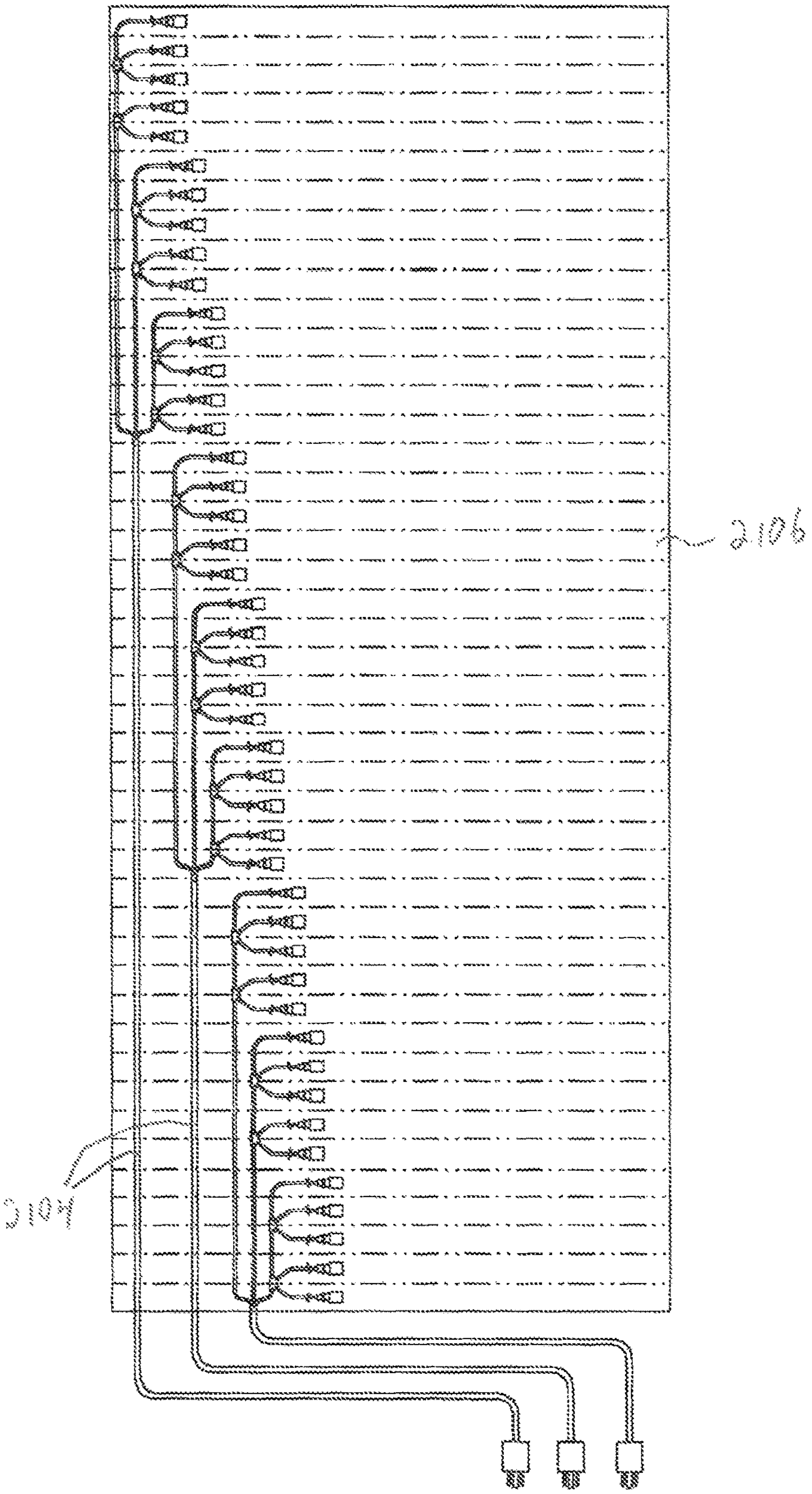
FIGS. 40-42 show hydra cords in accordance with the present invention.
Figure 66:
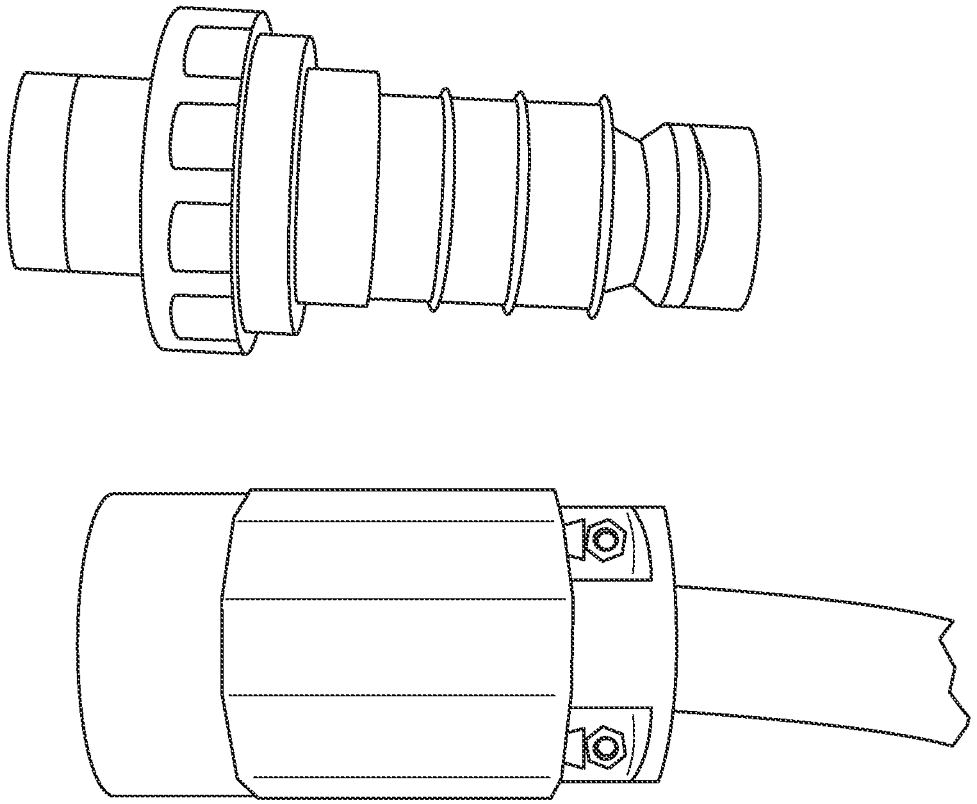
Figure 67:
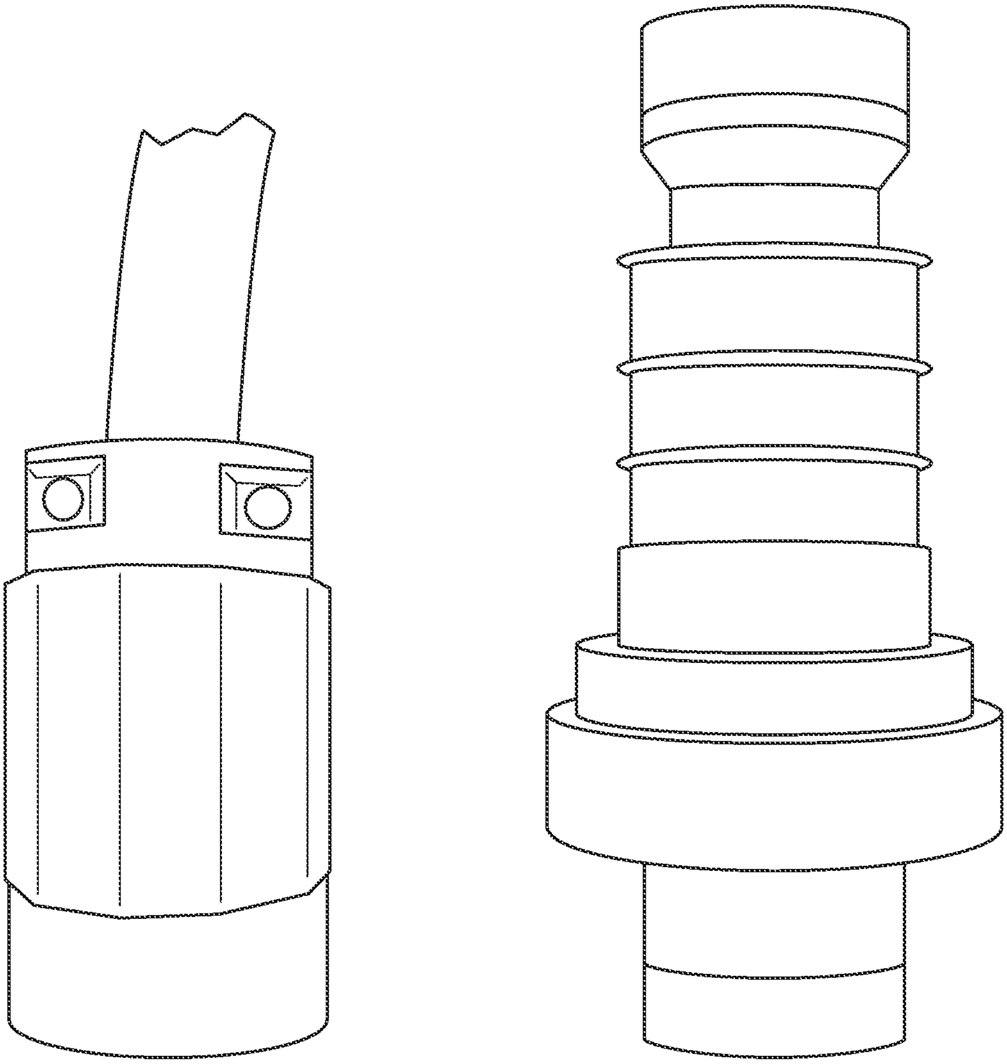
Figure 68:
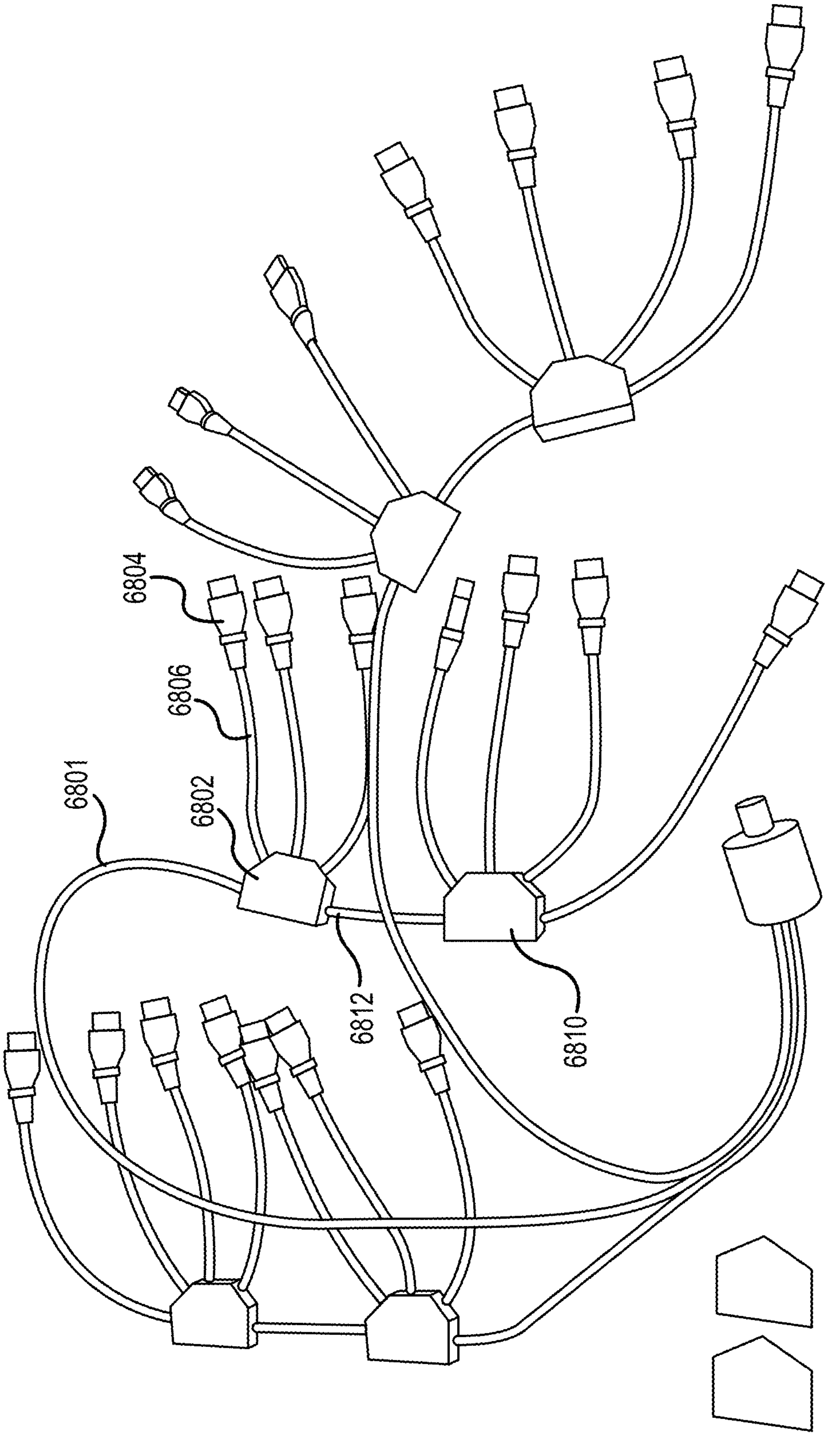
FIGS. 68-73 show hydra cords and mini-ATSs in accordance with the present invention.
Figure 69:
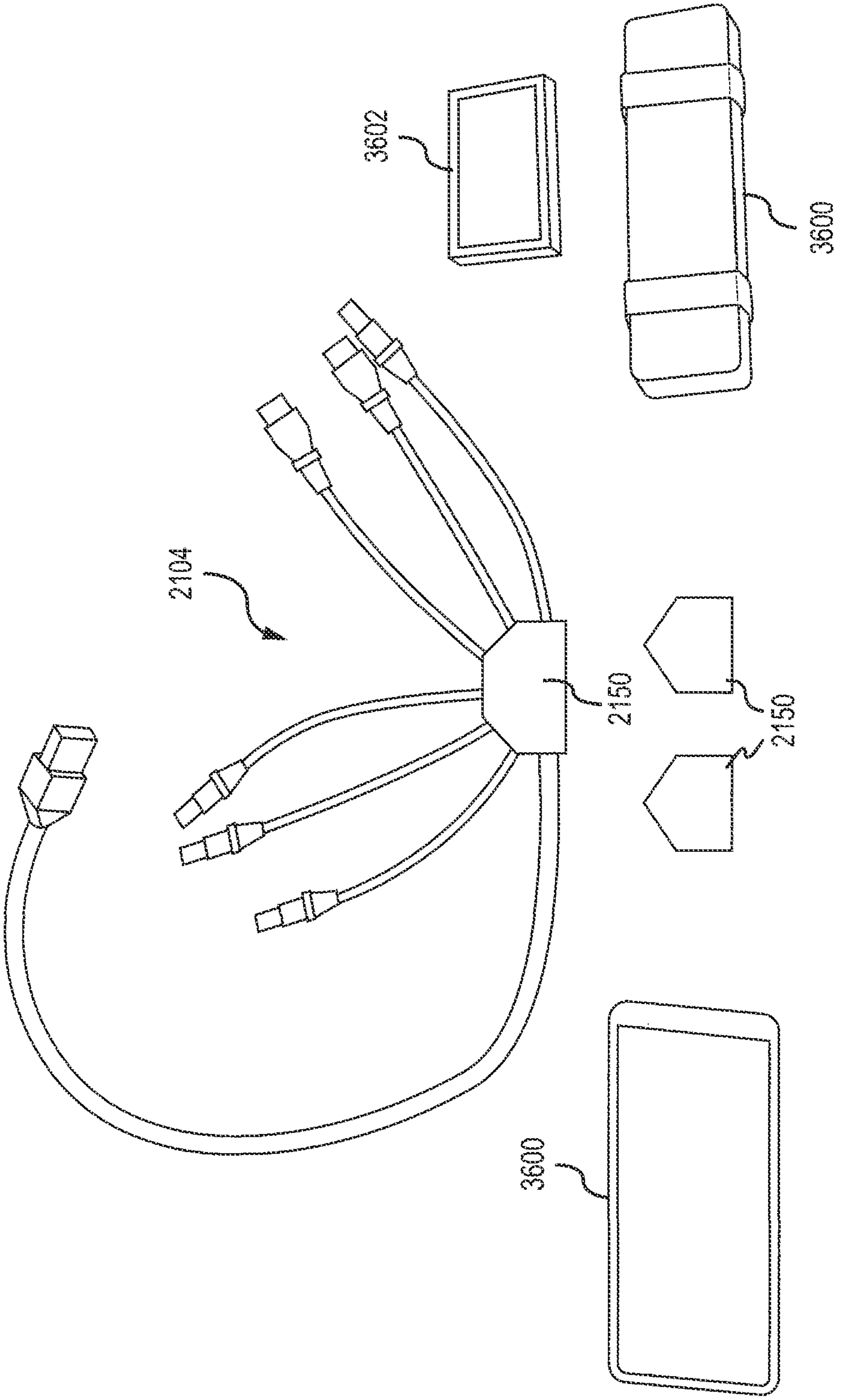
Figure 70:
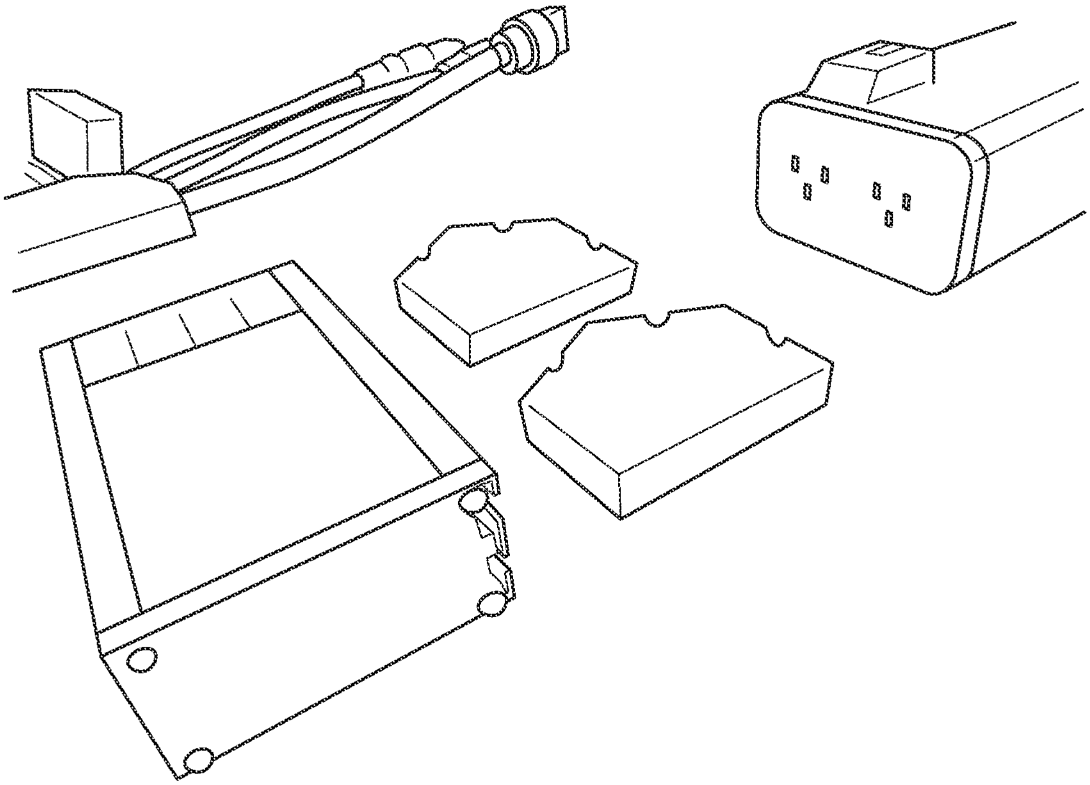
Figure 71:
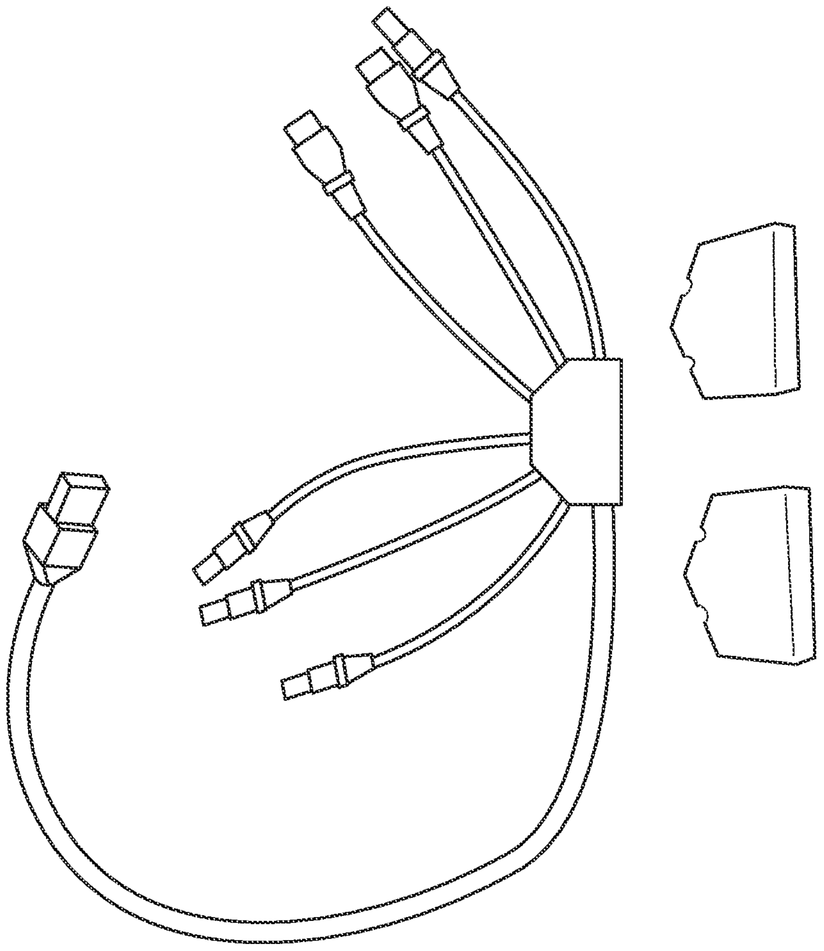
Figure 72A:
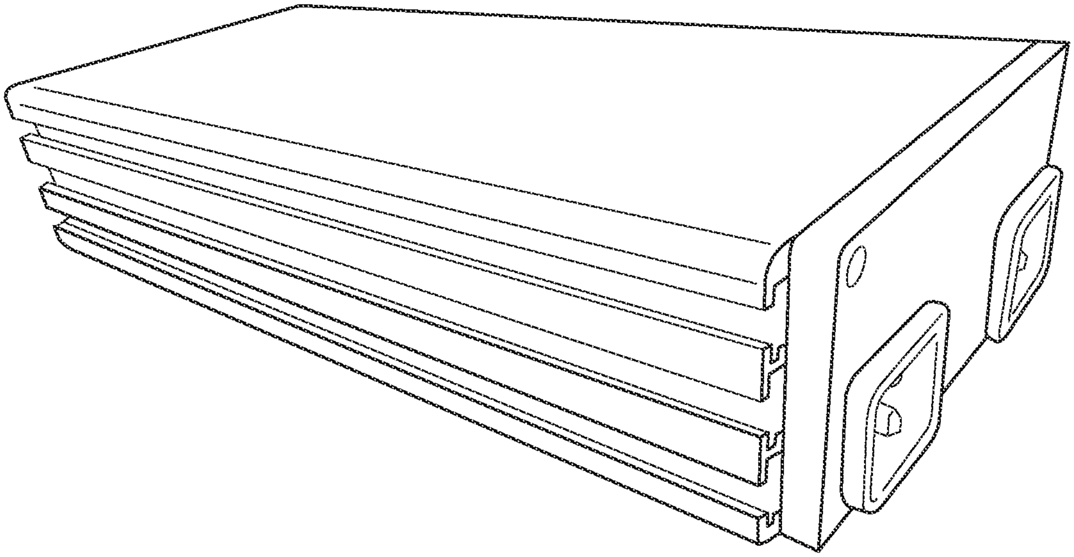
Figure 73:
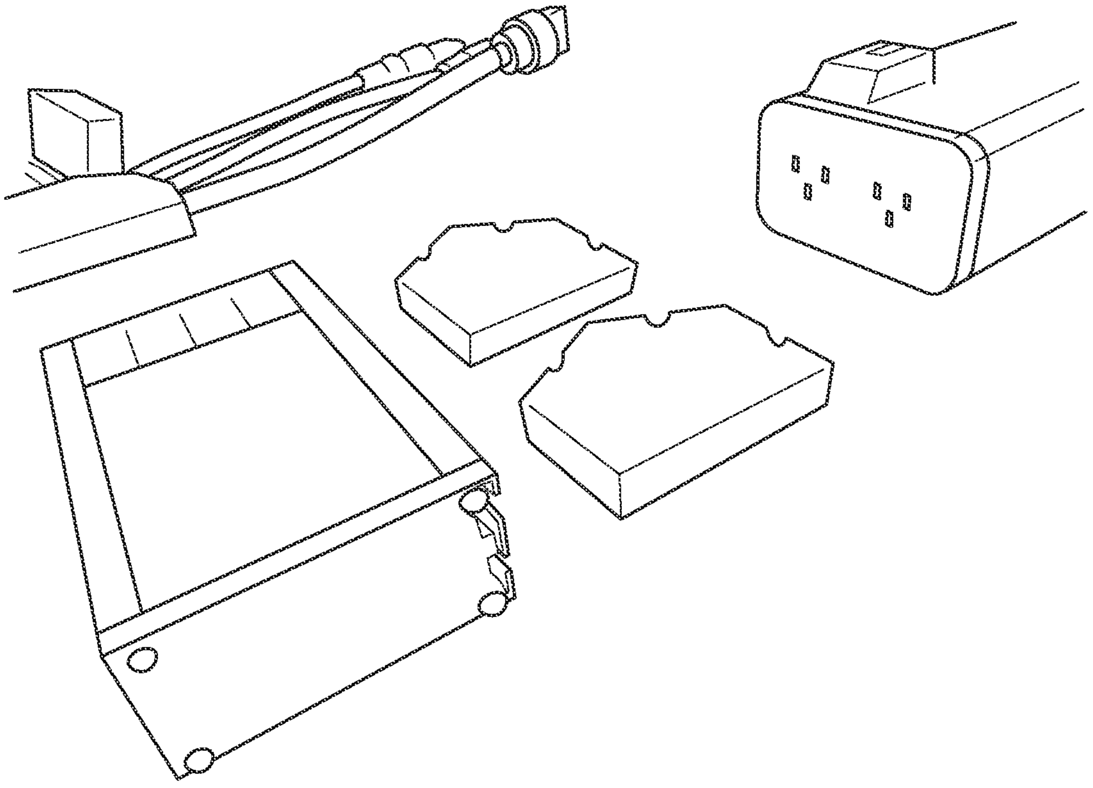

When this occurs, there is a space open where the bent contact inserted, but then vacated when it was rotated while being twist-locked. The Zonit design provides a pin as part of the plug that is pushed in and out by the actuator and that drops into that space and prevents the twist-locked plug from rotating and coming undone. The pin cannot rotate or move in the direction needed to undo the twist-lock because of the bend in the matching recess to the bent-blade contact. This is shown in FIG. 65. This method is compatible with all standard NEMA twist-lock receptacles that use a bent-blade contact design and any twist-lock receptacles of any standard or proprietary designs that are similar in operation. The pin can be located only in the plug and can be made of non-metallic materials if needed. It can be shaped as needed to work to best advantage in the desired plug type. It does not break compatibility with the NEMA standard. It could be added to any other NEMA twist-lock design if the application needed it. In our second design, we provide a hole in the receptacle and locate the pin in the plug to match that location. The only advantage of this design is that it forces the customer to buy both the plug and receptacle from Zonit, which might be an economic advantage in some circumstances. The defacto connector that is most popularly used for 60A three phase connections is either a hardwire terminal box or an IEC 60309 pin and sleeve style connector. The IEC 60309 is big, bulky and expensive. FIGS. 66-67 shows a comparison between a Zonit NEMA L21-60P 3D printed model and an IEC 60309 60A plug. Note the dimensional differences. The Zonit design will be much more compact, use less infrastructure space in the rack and be much less expensive. The NEMA L21/22-60 plug and receptacle will also fit in a standard ZPDU chassis. An example of a 60A input 3-phase ZPDU with integral ATS and 3-phase 20A auto-switched outlets is shown in FIG. 39. This embodiment and other similar embodiments can use all of the ATS methods described in the Power Distribution Methodology cases which is hereby incorporated by reference in full. The 60A Zonit NEMA L21-60 (or Zonit NEMA L22-60) plug and receptacle can fit in the current 1.5U package of the ZPDU, so a 60A ZPDU w/integral auto-switch and one 60A three-phase auto-switched output is possible.

Additional details of the products described above can be seen in FIGS. 68-73.

**6*a*** Zonit "Double-Shot" Generation Two powerstrips

These are Zonit Generation Two powerstrips that implement a unique single or double density power distribution and mounting method. They share all of the other features of Zonit Generation Two plug strips.

Figure 88:
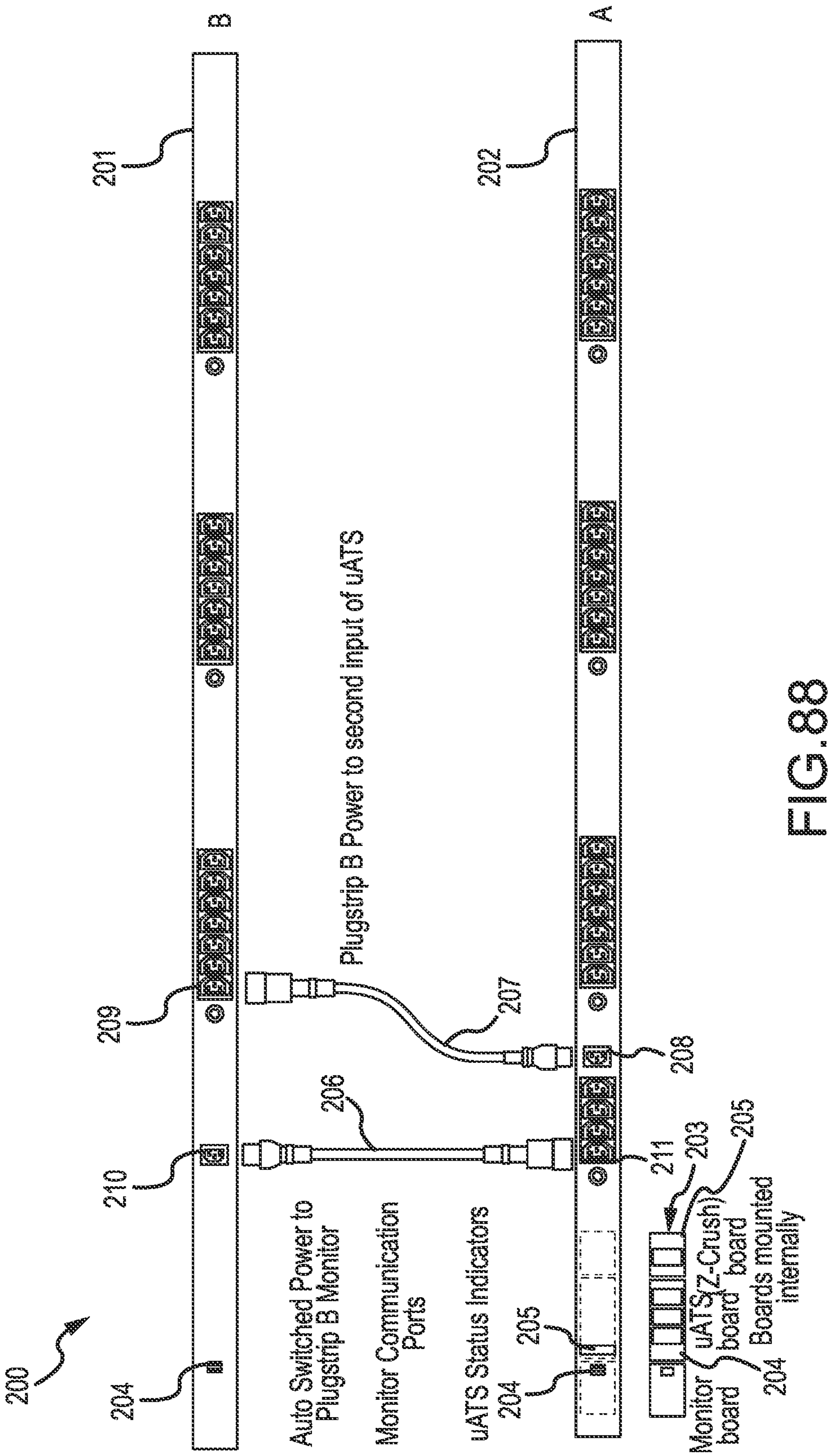
FIGS. 88-89 show plugstrips including ATS and other functionality in accordance with the present invention.
Figure 89:
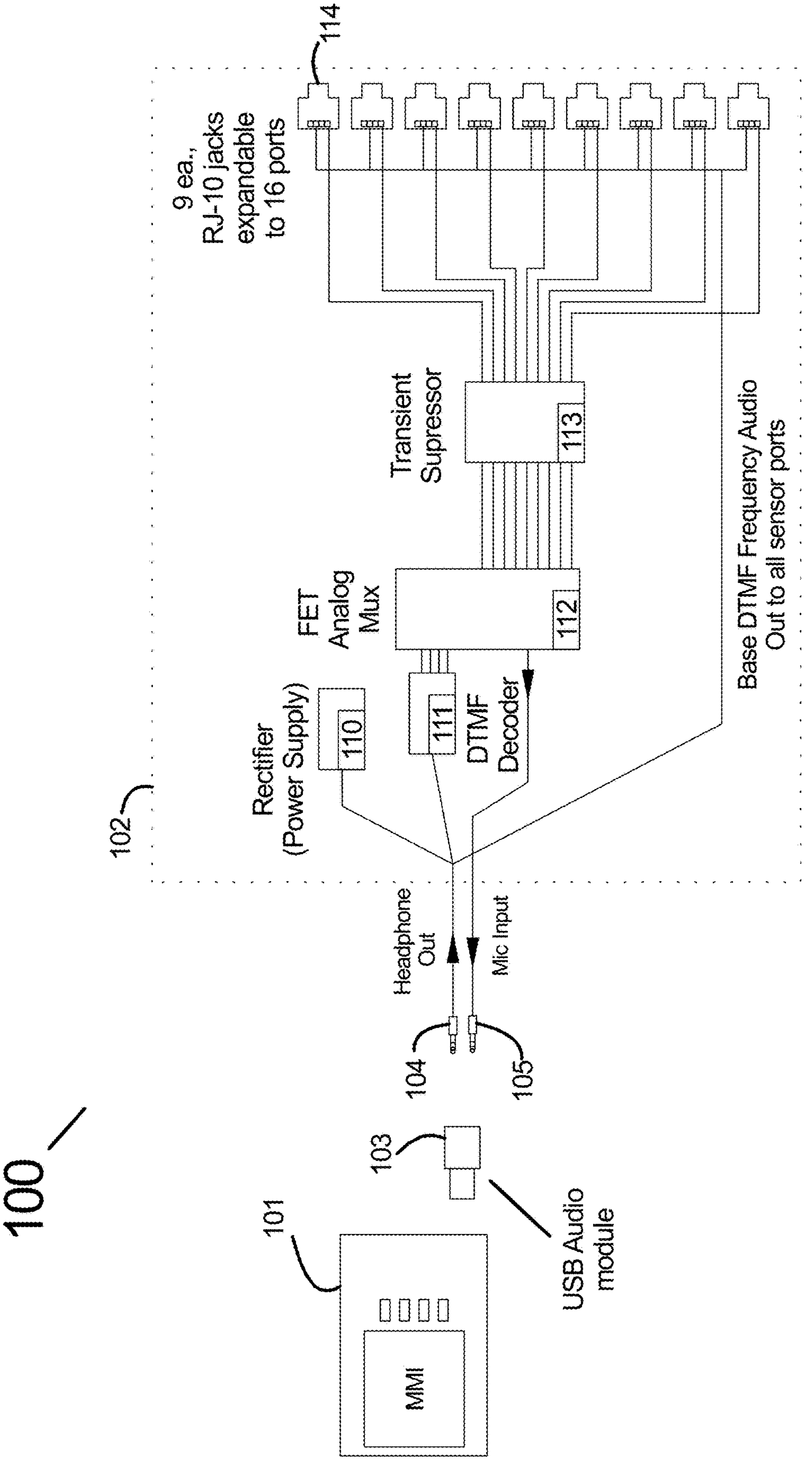

6b These are Zonit powerstrips (often called plugstrips or PDU's in the industry) that incorporate a Zonit compact form factor ATS, for example the Zonit Micro-ATS, into their enclosures, as was previously discussed in The Auto-Switching cases. FIGS. 88-89 are examples of implementation of this instantiation. The powerstrip can be managed via an external Zonit control module or via an integrated control module which could be a Zonit design or supplied by another manufacturer. The external Zonit control module variant can have an appropriate connector to communicate with the external Zonit control module.

In the sample instantiation, a pair of A-B 201 and 202 are shown with integrated control modules 203 (shown in exploded view for clarity). One or both of the powerstrips can incorporate a Zonit Micro-ATS assembly 204 (the unit without the standard plastic case, which is not needed since the module is located inside the powerstrip enclosure) in their enclosure and a Zonit "ZCrush" transient surge suppression circuit 205 as described in U.S. Provisional Application Ser. No. 62/817,456, entitled, "RELAY CONDITIONING AND POWER SURGE CONTROL", filed concurrently herewith which is herein incorporated by reference. The Zonit Micro-ATS assembly can be used to power a set of auto-switched receptacles 209, in the powerstrip. These are often desirable to put at the top of the powerstrip (when mounted in the rack) since top-of-rack network switches with a single power supply are a common use case for the Zonit Micro-ATS. In that case each powerstrip that incorporates a Zonit Micro-ATS assembly must also have a connection to an alternate power source for the Zonit Micro-ATS assembly to function. This can be done in a number of ways. A very simple method is to use a standard power cord, for example an IEC C13 to C14 and provide an alternate power source input receptacle on the powerstrip with the Zonit Micro-ATS assembly. This receptacle can be made distinctive by labeling, color-coding or any other suitable method. This receptacle can be powered by a standard power cord from the other powerstrip in the rack or any other location where alternate power is conveniently available.

Another method to do this is to use a proprietary connector to connect to the alternate power source. This connector can be provided on both powerstrips that incorporate a Zonit Micro-ATS module and those that do not. In this case, one of each type of powerstrip could be used in an A-B rack configuration. One advantage of this method is that the auto-switched power from the powerstrip with the Zonit Micro-ATS assembly can backfeed that auto-switched power to the other powerstrip without it via the proprietary connector and cabling (which must have a sufficient number of conductors to do this) where it can be used to power an integrated control module or any other mission critical element of the powerstrip. The advantage of doing this is that if power is cut off to that powerstrip, its control module is still powered up and can report a fault and/or alarm. The powerstrip with the Zonit Micro-ATS module would also power its control module from the auto-switched output of the integrated Zonit Micro-ATS module to gain the same benefit. This can be done for both integrated and external Zonit or other manufacturer supplied control modules.

6. Zonit Plug Adaptors & Phase Rotators

These are Zonit specified plug adapters that work with the Zonit methodology to deliver power to devices in the 20-60A range in three-phase, split-single phase and single phase configurations. The plug adapters either plug directly into a power whip or plug into the Zonit ZPDU. The phase rotator implements phase load balancing as described in U.S. Pat. No. 6,628,009, which is incorporated herein by reference. The phase rotator can be a separate in-line adapter or incorporated into a Zonit plug adapter.

7. Zonit USB/KVM Distribution Strips

The Zonit USB/KVM distribution strip 320 in conjunction with the Zoned Power Distribution Unit—Generation Two (ZPDU-G2) (or modular appliance) Protocol Gateway functionality was designed to meet the needs of the modern center by greatly reducing or eliminating the need to run parallel data communication cabling systems for USB or KVM functionality. It does so by providing two key types of connectivity that are needed in the equipment cabinet, USB and KVM. Note: Combined network, USB and KVM connectivity is available by using the NetZonit system as described in PCT Application Number PCT/US08/57154 which is incorporated herein by reference. That system does not require a ZPDU-G2 (or modular appliance) to perform the Protocol Gateway function, it is integrated into the NetZonit unit. The USB/KVM Distribution Strips are Zonit designed vertical distribution strips that incorporate one or more USB ports for each 1U (1.75 inches vertical) of rack space in a cabinet and a matching set of dedicated KVM ports for each 1U. They can be mounted independently or in conjunction with Zonit vertical plug strips, which can have optional mounting brackets to allow the USB/KVM distribution strips to attach to the sides of the Zonit plug strips. The USB/KVM distribution strips each connect to a Zonit ZPDU-G2 unit (or optional modular appliance that does the same job) and use that unit to connect to a data network. The ZPDU-G2 optionally contains hardware and software that is used to perform a protocol gateway function as described in PCT Application Number PCT/US08/57154, which is incorporated herein by reference. This allows each USB port to be put on a "Virtual USB Bus" as described in that patent filing. The KVM ports are connected to the ZPDU-G2 via a special connector and communicate with it via that mechanism. The KVM functionality is as also described in the PCT Application Number PCT/US08/57154 with the Zonit ZPDU-G2 optionally containing hardware and software to performing the roles of KVM and network switch logic.

Figure 3A:
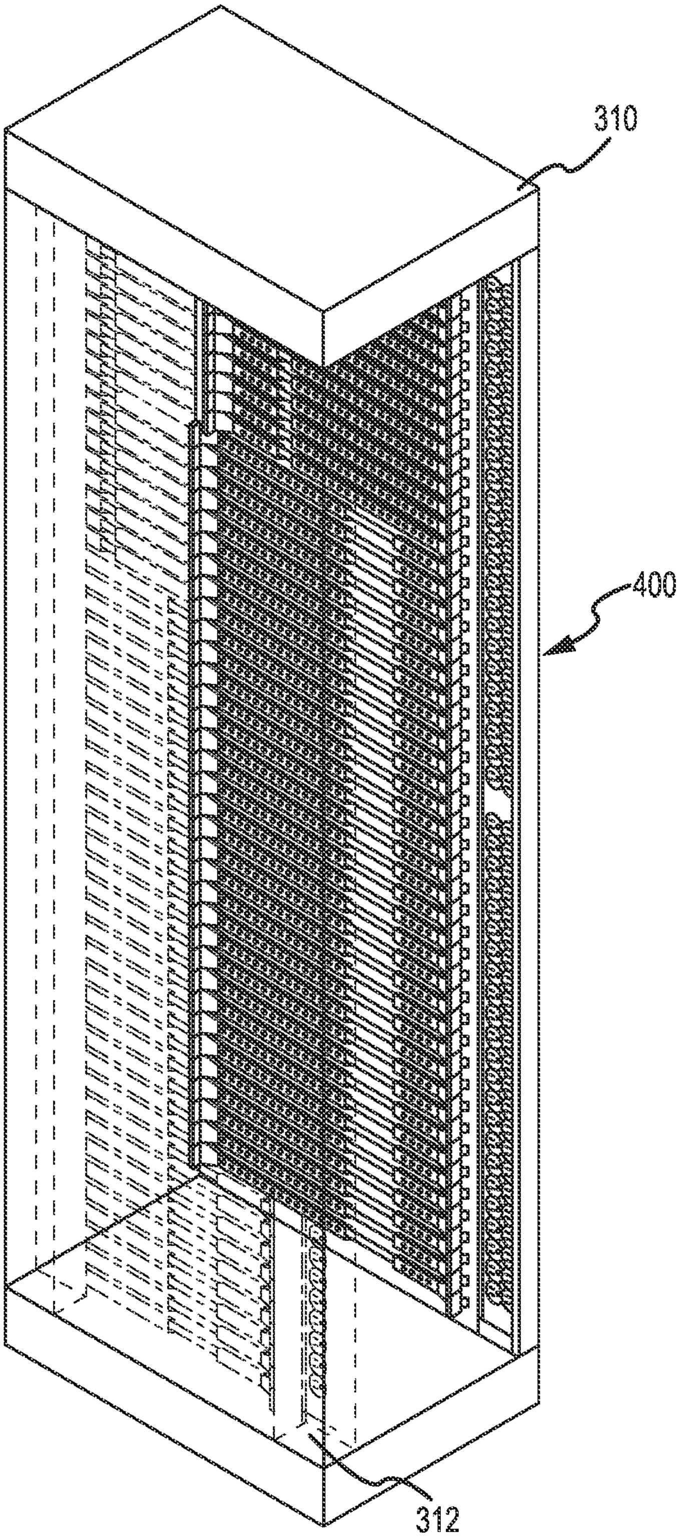
FIGS. 3A-3C show a network power strip and network port strip for assembly in a rack system of a data center in accordance with the present invention.
Figure 3B:
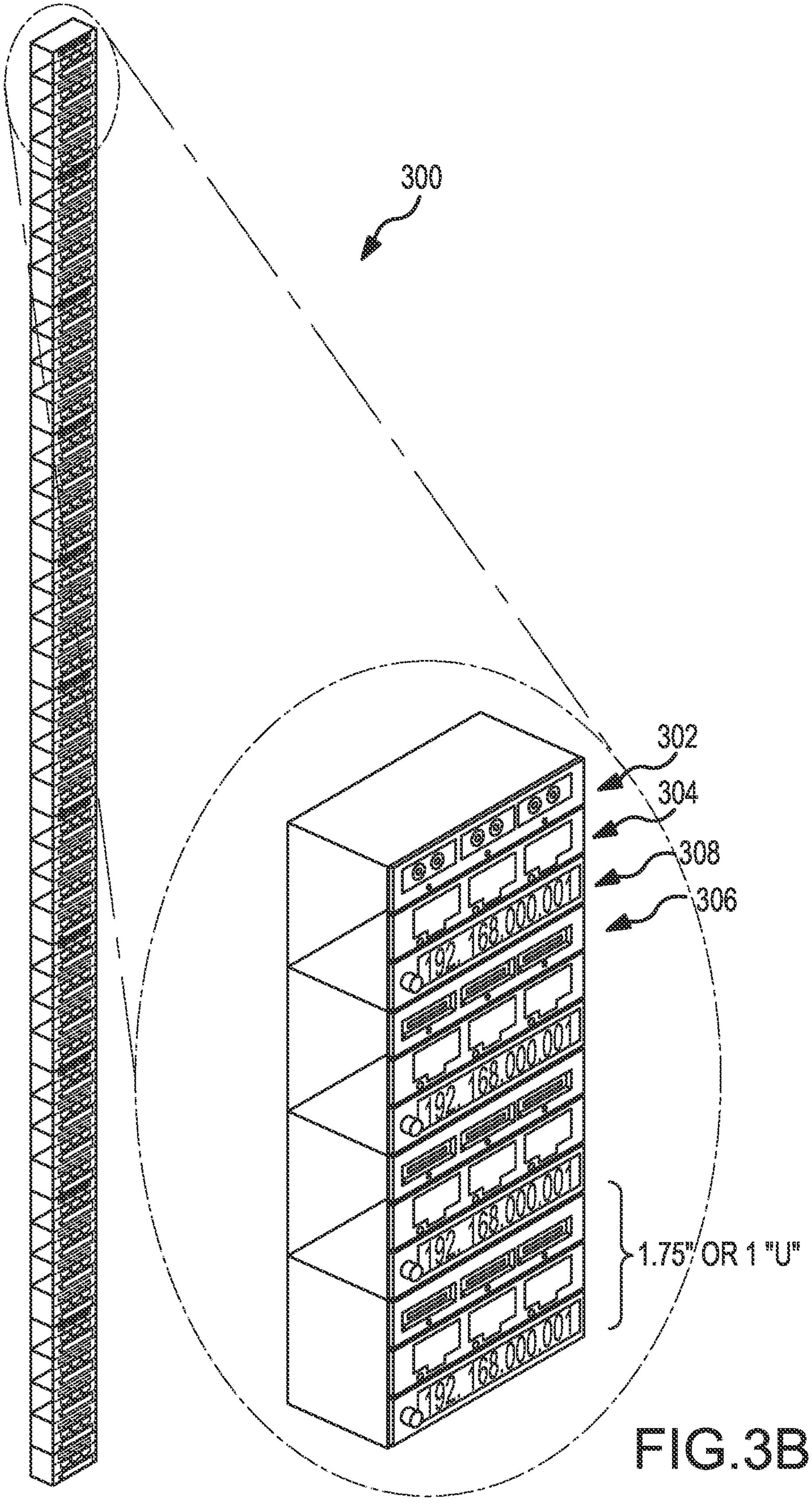

It is noted that the illustrated equipment mounting system facilitates positioning of power and network strips in a corner of the rack as shown in FIG. 3A. This mounting system is described in detail in U.S. Provisional Patent Application Ser. No. 61/040,924 which is incorporated herein by reference. In that system, the rail and slider assembly can be mounted on vertical rails on the sides of the rack which provides significant flexibility to configure the rack corners for receiving power and network strips.

II. Data Center Issues

Data centers represent large investments, especially in their core power and cooling infrastructure. Cooling towers, generators, UPS units, transfer switches, raised floor, fire suppression systems and physical security systems are all expensive investments. As a result, data centers have long life cycles and need to be designed to maximize the return on their large capital costs. The highest area of infrastructure change in data center environments is in power distribution to the racks. This is because power must be delivered to every device and the type and kind of power needed for a particular device being installed or moved into a specific rack can and does frequently dictate a change in the power distribution system configuration.

A. Data Center Power Distribution Design and Build-Out Issues

Architects and industrial engineers design the core infrastructure systems of data centers, but in traditional practice do not extend the reach of the design to the floor layout, beyond identifying where the rows of equipment cabinets or racks may be located. This is because the data center manager has control over what equipment will be located in which rack(s) and therefore, the architect and engineers do not attempt to specify this part of the data center. The data center manager generally engages and directs electricians by telling them what type and kind of power receptacles are required for each equipment rack. The electricians install them following the National Electrical Code (NEC). This is the traditional electrical contracting approach. It works well in low-change environments, but is labor intensive and dependent on the expertise and experience of the data center manager and the electricians. In a highly dense electrical environment such as a data center, the results achieved are often more expensive and less than optimum. When high operational change rates are added in, most data centers experience a decline in power distribution organization over time and the costs of making configuration changes remain constant or increase.

The Zonit Power Distribution System addresses the shortcomings of the traditional approach by using a methodology that is repeatable, delivers the same quality every time, reduces material and installation costs and provides a superior operational environment with greatly reduced risks and costs. It also allows the design architects and engineers to extend their design efforts using the Zonit methodology to the data center floor. This delivers a professional, repeatable result, vs. the variable quality of the legacy trade practices used by the traditional methodology. It does so in the following ways:

1.Power Distribution Design Issues

The Zonit system separates the design issues of capacity vs. power and receptacle type and isolates their dependencies. This allows the design process to be simplified yet insure the desired results. The whip grid configuration can be specified without worrying about the exact power or receptacle type in the rack. Instead the design process can be focused on matching the whip capacity and location to the desired rack power density throughout the data center.

2.Conduit/Raceway Issues

The NEC dictates how conduits and raceways can be installed and used. There are 3 basic ways that power is distributed in the data center;

Conduits—These are rigid or flexible metal pipes that have wires ("conductors" in NEC parlance) pulled through them. At one end they are terminated in a Power Distribution Unit (PDU), at the other in an electrical power receptacle. The assembly is called a power branch or whip.

Raceways—These are metal enclosures that can be optionally sub-divided internally and functions as a conduit. These are operable conduits, i.e., the conduit can be opened up along its axis to allow removal and insertion of conductors. They come in a variety of sizes.

Busbar Systems—These are solid metal bars "buses" that connected together to form a power distribution conductor and are used to power circuit breakers near the racks, routed inside of an insulating case. They are expensive and if they fail (usually at their connection joints), can do so quite dangerously, since they carry very high power current. They also have the issue that if they fail, all of the racks powered from them go dark, so they represent a single point of failure with multiple dependencies downstream.

One of the key issues in conduit and raceway systems is how many conductors can be routed through a conduit or raceway. NEC codes are designed to insure that the heat given off by the conductors in a conduit or raceway cannot reach dangerous levels. In a data center where power distribution levels can reach over 15 kW per rack (or over 40 kW per rack with per rack cooling systems), the problem of how to get so many conductors to each rack becomes difficult.

In the traditional approach, conduits or raceways are often used. The NEC code dictates that each conduit (or sub-divided raceway, which is considered a conduit) can only have a certain number of conductors before requiring "de-rating" which effectively means the data center operator must lower the amount of current going through the conductor or alternatively, use larger gauge conductors for the desired current capacity. The effect of this is that a great number of conduits must be provided, which is expensive and can consume valuable raised floor plenum space which impedes cooling airflow. The NEC codes allows conductors as follows:

Per Conduit

1. Up to 4 conductors (ground excluded) at 100% capacity
2. Up to 9 conductors (ground excluded) at 80% capacity
3. Up to 30 conductors maximum in any one wireway The following example will make clear how in a high power density data center this becomes a difficult design issue. Consider a data center of 14,000 square feet designed to contain 314 racks. An optimized layout could have 3 main raceways with PDU's located along those raceways to minimize the length of the conductors run in conduit for the average power whip. In one configuration, each of 14 branch raceways may have about 20 racks on average. To achieve an average power density of 10.3 kW per rack requires one 30A 208V three phase power whip per every other rack or equivalent. To make the system A-B redundant (fed independently from both an A and B power source) the number of power whips is doubled for the B source. The row of 20 racks will therefore require 20 receptacles, each containing 5 conductors (3 hot, 1 neutral, 1 ground), for a total of 100 conductors. A #6 gauge conductor is required for 30A current. A #6 gauge wire is thick, with a nominal diameter of 0.26 of an inch and heavy, weighing 1 lb. for each 10 feet. To route 100 conductors without de-rating would take 25¾" conduits or a raceway 36" wide. Standard raised floor is built on a 2'×2' grid with the supports on that modulus, so a raceway that wide does not fit.

Clearly, what is happening is that the standard approach does not scale up well to these power densities. It was not designed to supply this level of power in this small of a space.

The Zonit methodology addresses this issue and lowers installation costs by allowing for the use of prefabricated redundant A-B power whips in a limited number of configurations as follows; All Zonit ZPDU-G2 units are designed to be fed by two A-B 30, 40, 50 or 60A 208V three phase wye configured power whips with oversized (+1 gauge) neutral conductors. Other voltage/amperage combinations are possible, but at present these best match the required range of power capacities. The Zonit power whips can be pre-fabricated by using appropriately sized metal-clad "MC" cables with current carrying capacity of 30A or 60A and an oversized neutral. The length of each cable can be determined, as will be described in more detail below, from examination of a plan view of the data center with the rack layout indicated. AutoCAD® design templates, developed by Zonit Structural Solutions, LLC, facilitate this process. The designer lays out the power whip paths and specifies their capacity and type and the template calculates a bill of materials for that layout. The completed template is sent as part of the order process to Zonit Structured Solutions, LLC and the bill of materials is confirmed. The power whip lengths are computed from the site plan drawing(s). The metal-clad cables can then be pre-cut to length, labeled properly, terminated and shipped to the data center. This has several benefits;

1. Labor costs are greatly reduced because it is very time intensive for electricians to bend and install hard conduit and/or pull conductors through flexible conduits. The Zonit methodology reduces these labor costs. Also, prefabrication at a site designed for this purpose and operated in an assembly line type environment is intrinsically more efficient. The quality control can be maintained at a higher level, and pre-testing prior to leaving the factory facilitates Code compliance and final quality control.
2. The use of pre-cut MC cable insures that the ends can be properly prepared for installation and carefully labeled and coded to an installation design drawing. The metal-cladding is flexible thus easing installation routing and insuring that no EMI issues occur. It also can be specified with an internal and/or external moisture seal, for environments that need or want this feature and is more water resistant than hard conduit, since it only has one installation "joint", where it enters the outlet receptacle box. For our example, a space of 12×24" matching the 2'×2' floor grid can hold 171 MC cables each of 5 conductor 60A capacity.
3. Pre-labeling helps insure correct installation both at the PDU and receptacle.
4. The Zonit system is designed to use a modular grid of power whips that are deployed simultaneously at one point in time, preferably at the initial build-out of the data center. The power whips can be any input amperage in the range that the Zonit ZPDU will accept. In one implementation, 30 to 60A three phase wye configured branch (whip) circuits are used. The choice of what amperage to deploy (30A to 60A) of power whip wiring is straightforward and it can be done via various algorithms, including algorithms engineered by Zonit Structural Solutions, LLC. This will allow the design engineer to determine what the maximum cooling capacity of the data center will be and deploy a grid of Zonit specification power whips to match the power distribution capacity to that cooling capacity. If maximum flexibility is desired, it is best to install whips with conductors rated to the maximum power capacity that might be used. By installing 60A rated whip cables, any desired breaker capacity (30-60A) can be installed in the PDU and used for the power whip. This allows the data center manager to deliver the amount of power chosen "by the circuit" which is how many co-location facilities sell their power. The rack modulus (how many racks are powered by each pair of A-B power whips) of the grid is determined by the chosen per rack power densities. This can be refined further by choosing areas of the data center that have the best cooling airflow, to have the maximum power density. This allows lower design and material costs, because the whips required are only of two types and therefore can be produced in greater volume, reducing their price and making their layout design easier. The whip capacity can be matched to the cooling capacity, without having to worry about the exact type of power the end user needs in the rack. That is handled by the power delivery options of the Zonit ZPDU which allow power configuration changes to be made at the rack, not the PDU.

The Zonit methodology allows the data center designer to extend the design process to cover the layout of the power distribution system. This in turn helps insure consistent, repeatable, optimized results. The prefabricated materials help insure that installation costs are minimized, installation quality is maximized and errors are prevented.

Figure 5A:
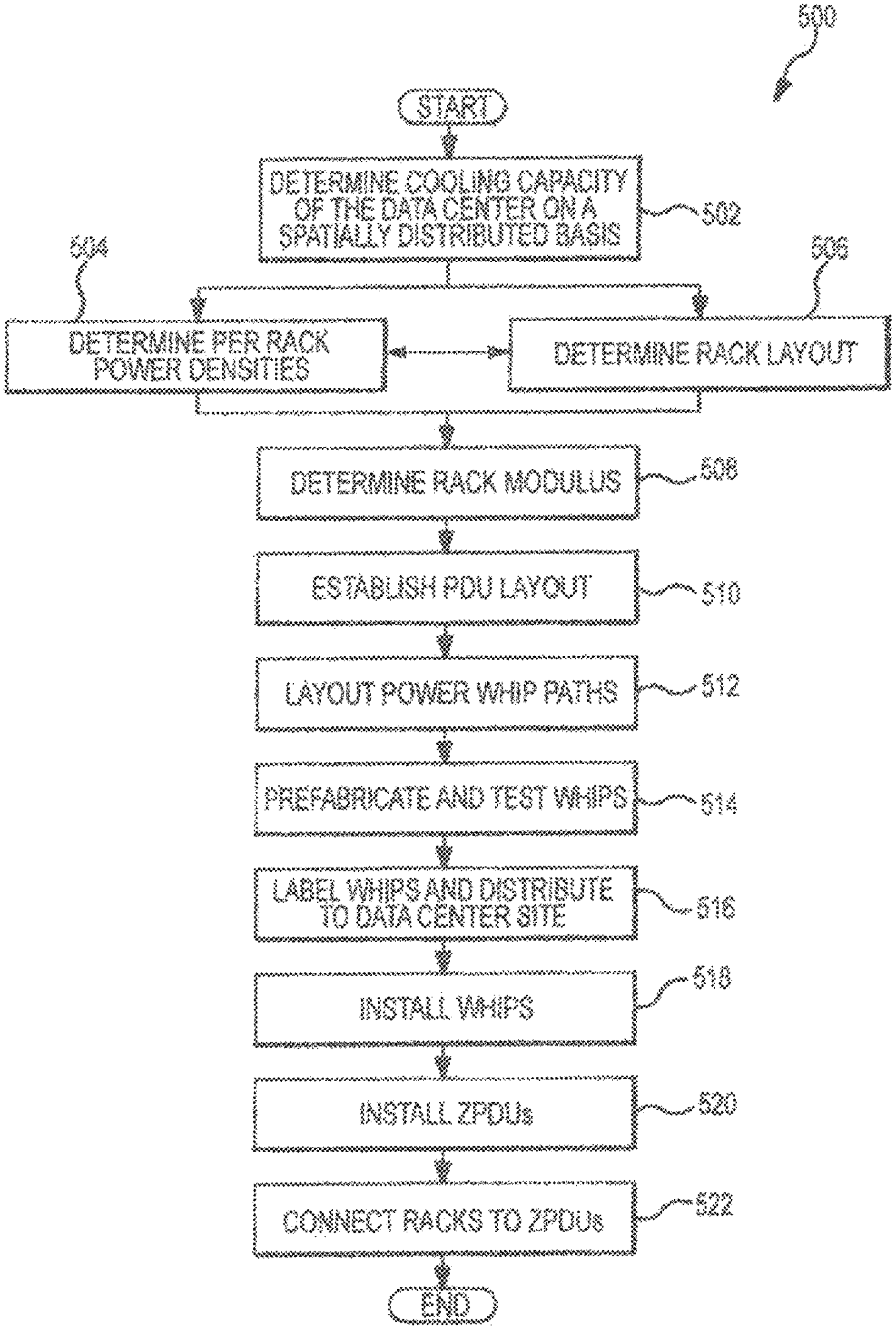
FIG. 5A is a flowchart showing a process for laying out a data center in accordance with the present invention.
Figure 5B:
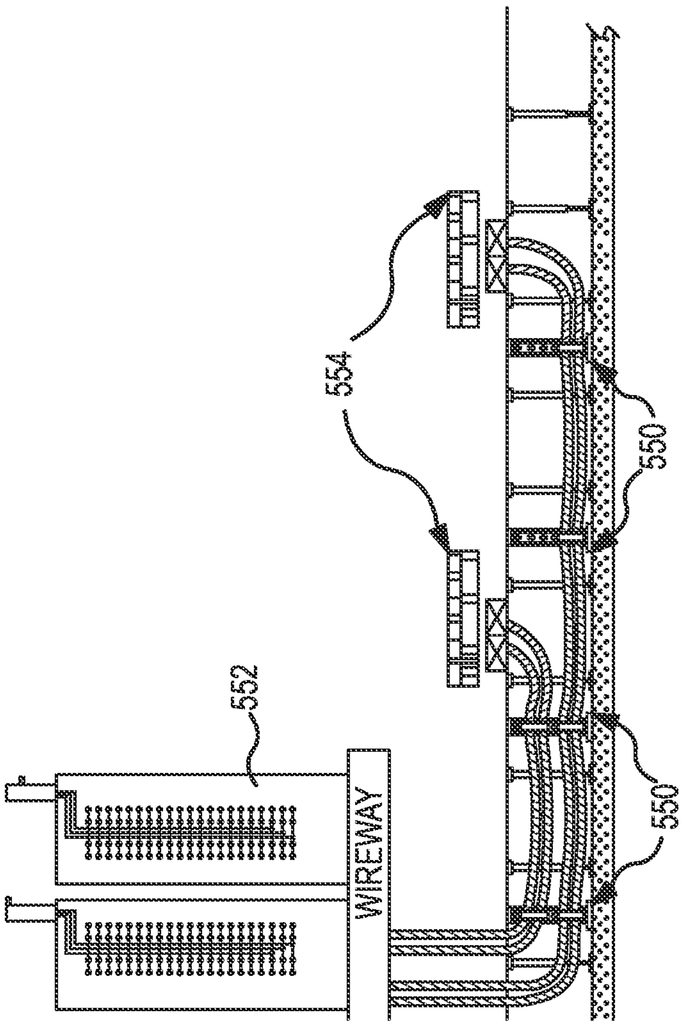
FIG. 5B shows a data center laid out with prefabricated whips in accordance with the present invention.

This process 500 can be summarized by reference to the flowchart of FIG. 5A considered in conjunction with the data center section view of FIG. 5B. The illustrated process is initiated by determining (502) the cooling capacity of the data center on a spatially distributed basis. In this regard, certain areas of the data center may have superior airflow or otherwise have greater cooling capacity. It may be desired to locate high power equipment or high power racks in these areas of the data center. The illustrated process 500 further involves determining (504) the per-rack power densities and determining (506) the rack layout. These two factors may be interdependent and may be determined jointly. That is, as noted above, different power densities may be provided for different racks, and the layout may be considered in relation to the spatially distributed cooling capacity of the data center.

Once the rack layout has been determined, the illustrated process involves determining (508) a rack modulus and establishing (510) a ZPDU layout. It will be appreciated in this regard that the number of ZPDUs required is a function of the rack modulus. The power whip paths can then be laid out (512). As shown in FIG. 5B, the layout for the whips 550 is a function of the number and location of the ZPDUs 554 as well as the location of the PDU power panel 552.

Once the length of the whips has been determined in relation to the layout, the whips can be prefabricated (514) and tested. Approved whips can then be labeled (516) and distributed to the data center site for installation (518). The ZPDUs can then be installed (520) and connected (522) to the whips so as to provide power to the racks.

B. Data Center Communication Cabling Issues

The limiting factor in modern data center deployment density is cooling. The cooling in modern data center racks is almost exclusively air cooling. Air cooling is limited by how much cooling airflow can be delivered to each equipment cabinet and effectively used. A major factor in managing this issue is the number of communication cables that need to be routed to and distributed in each equipment cabinet. A different cabling type can be used for each function within the cabinet, such as USB cables for door locks and sensors, fiber channel and Ethernet cables for data communication and additional cable for keyboard, video and mouse systems. These cables can occupy considerable space in the data center and the cabinet. These cables are rarely cut to the exact length needed, but rather are "stock lengths" with the excess contributing to the increased reduction of airflow. They can contribute very significantly to blocking cooling airflow. They also are so numerous that they become a challenge to install, document and maintain. The most common types of connectivity needed in a data center cabinet are TCP/IP connectivity (usually done via Ethernet), USB or Serial device connectivity (for environmental sensors, door lock status sensors, inexpensive video cameras, etc, and remote keyboard, video and mouse (KVM) connectivity. The system described herein addresses this issue in several different ways.

1. The Net-Zonit Netstrip as described PCT Application Number PCT/US08/57154 which is incorporated herein by reference delivers network and USB/KVM (including the required Protocol Gateway) functionality in one device.
2. The Zonit USB/KVM distribution strip 320 in conjunction with the Protocol Gateway feature of the ZPDU-G2 delivers USB/KVM functionality. The Z-Net (proprietary communications network) functionality of the ZPDU-G2 delivers supplemental limited bandwidth Ethernet and TCP/IP functionality, which is discussed below.

Figure 3C:
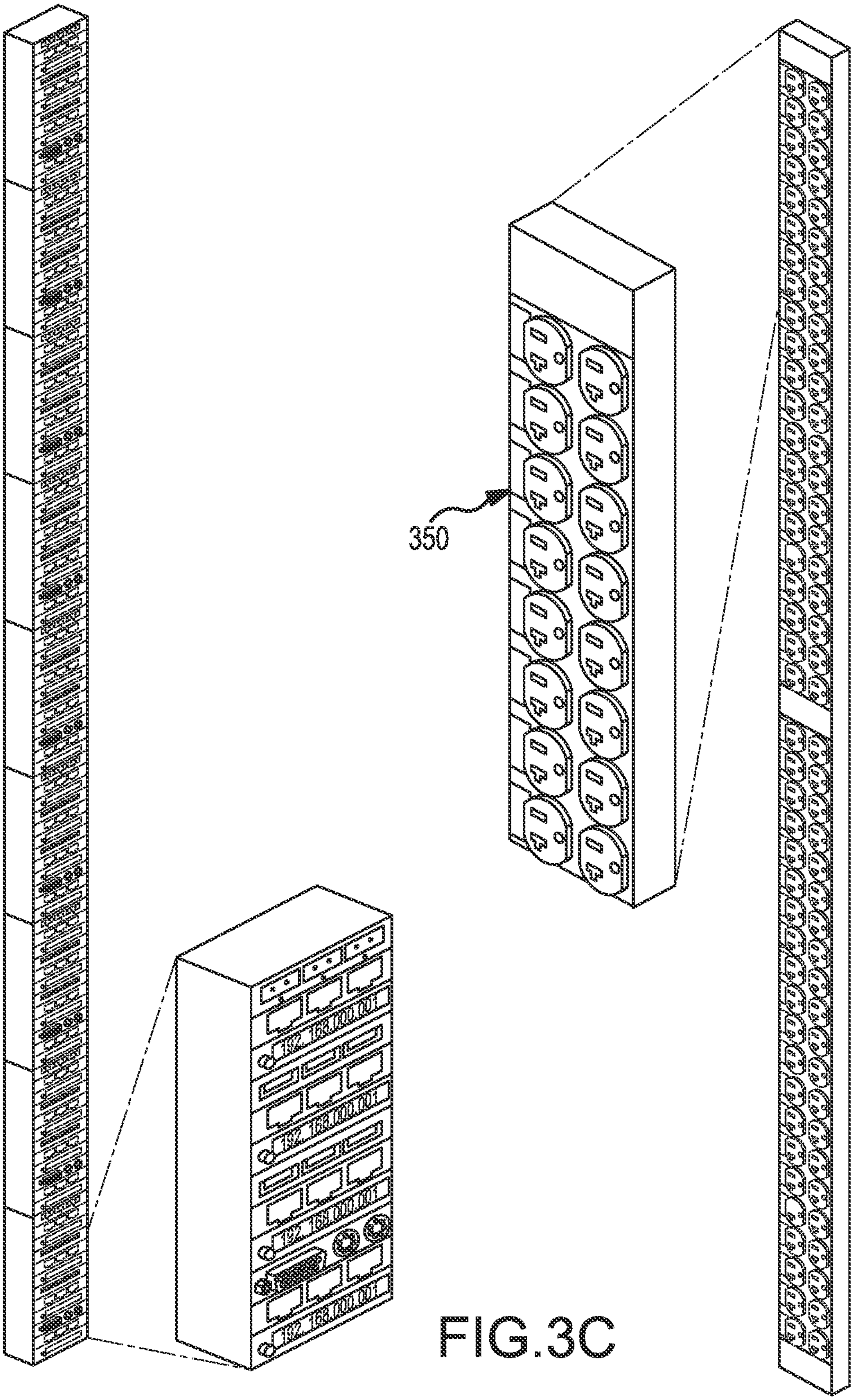
Figure 3D:
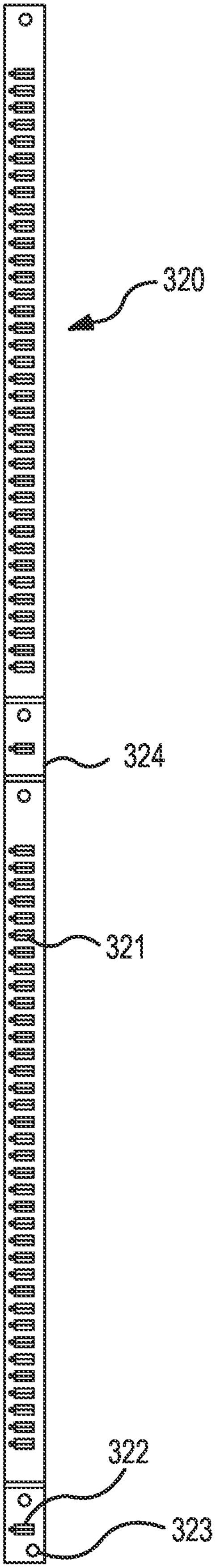
FIG. 3D show a USB/KVM port strip in accordance with the present invention.

The Net-Zonit Netstrip delivers unified network and USB/KVM connectivity. Any suitable types of network ports, industry standard or proprietary, can be supported. The ports (network, KVM and USB) can be integrated or inserted as needed using plugin modules, which allow the end-user to deploy ports when and where needed in the Netstrip and move them as necessary to insure cable length runs are minimized. In this regard, the illustrated Netstrip 300 (See FIGS. 3 3A-3C) includes fiber ports 203, Ethernet ports 304 (10, 100, 1000 Base T Modules) and USB ports 306. A KVM module can also be inserted as is shown in FIG. 3C. In addition, the Netstrip 300 includes displays 308 for displaying any desired information to data center personnel as will be discussed below. The Netstrip 300 is dimensioned to be vertically disposed in a rack 310, e.g., in a rear corner area 312 of the rack 310. The Netstrip 300 preferably extends across substantially the full vertical height of the rack 310 to provide ports at all height levels with minimal connecting cable length. The Netstrip 300 can be dimensioned to allow mounting to the rack with standard power strip hardware. In addition, the Netstrip can be provided in two or more sections (similar to the DoubleShot power strip described below) to facilitate mounting in crowded data center environments. In such cases, mating male/female connectors for all communications/power lines can be provided at the section interface(s).

The Zonit USB/KVM distribution strip in conjunction with the ZPDU-G2 (or modular appliance) Protocol Gateway functionality eliminates the need to run parallel data communication cabling systems for USB and KVM functionality. It does so by providing two key types of connectivity that are needed in the equipment cabinet, USB and KVM and eliminates the cable length limitations inherent in those systems. The system described here is a derivative of the NetZonit system that uses the Zonit ZPDU-G2 (or modular appliance) to provide the Protocol Gateway and network connectivity functions. The Zonit Netstrip functions the same as the ZPDU-G2 when performing the Protocol Gateway function for its USB/KVM ports but may have different throughput and uplink speed capacities. Only the ZPDU-G2 is used below in the description of the Protocol Gateway functionality, for purposes of brevity.

The Protocol Gateway provided by the ZPDU-G2 (or Protocol Gateway modular appliance, which will be assumed below in all references to the ZPDU-G2 in this role) is motivated by the desire to reduce cabling volume by eliminating the need for multiple cabling systems as explained above.

The protocol gateway functionality has several features.

1. Universal Serial Bus (USB) Virtual Connectivity

Each USB port on a Zonit USB/KVM distribution strip can be connected into a virtual "USB" bus. This bus is defined as a user-selected set of Zonit USB/KVM distribution strip USB ports and/or a set of Net-Zonit USB ports and/a set of Zonit Virtual USB Connectivity ports on computer workstations running this application. These ports are selected via a software interface on an application "Zonit Virtual USB Connectivity Manager" running on the Zonit ZPDU-G2 or a computer workstation or a dedicated Zonit appliance, which have TCP/IP network connectivity between them. The software interface can be done via a command line interface, Web interface or traditional GUI running on a computer workstation.

- Each Zonit USB/KVM distribution strip USB port is connected to a USB interface device, such as a computer server USB port, a USB thermometer, USB video camera, USB door lock sensor, USB moisture sensor, etc. via a standard USB cable or USB device interface plug. The USB cables can be short since the rack mounted device will be close to the Zonit USB/KVM distribution USB port, reducing cabling clutter. If the device has an integrated USB port, no cable is needed and the device will just plug into a Zonit USB/KVM distribution strip USB port, which provides a useful self-mounting capability.
- The serial data from a USB port is taken by the ZPDU-G2, encapsulated into a TCP/IP packet, and then routed to all of the other USB ports in the "virtual USB bus" which can be on any other Zonit USB/KVM distribution strip, Net-Zonit, or any computer workstation running a Zonit Virtual USB Connectivity" application. At all the other USB ports on the "Virtual USB Bus" the data from the first USB connected device is de-encapsulated and then directed to the USB port(s) on the bus and/or to a virtual USB port in a connected computer running the "Zonit Virtual USB Connectivity" application. This application takes the incoming TCP/IP data stream, de-encapsulates the original USB data and presents it to the computer application designated to receive the USB data as if it were a local USB connected port. In this way any application or service that can take input from a local USB port can use the "Zonit Virtual USB Connectivity" application to receive it from a remotely Zonit connected USB port.
- An important feature of the invention is bandwidth limiting. Based the uplink speed of the Zonit ZPDU-2 or the measured, inferred or user-defined network bandwidth between the two USB endpoints, the speed mode of the USB port or ports on the Zonit USB/KVM distribution strip will be set to be either USB mode 1.1 with a speed of 12 Mb/s or USB mode 2.0 with a speed of 480 Mb/s or USB mode 3.0 with a speed of 4.8 Gb/s. This helps to prevent the USB ports from oversubscribing the uplink capacity of the Zonit ZPDU-G2. The Zonit ZPDU-G2 may also utilize other bandwidth allocation methods to limit the amount of data traffic used by the USB Virtual Connectivity functionality.

2. KVM Functionality

The Zonit USB/KVM distribution strip supports a Keyboard, Video and Mouse (KVM) function as follows. The video output of an electronic data processing device can be connected via a KVM adapter to an adjacent USB port (which could be Ethernet or any other suitable data transport mechanism) on the Zonit USB/KVM distribution strip. The video to USB adapter can be used to digitize the analog output (or just input digital data for digital output video) and input it into the allocated USB port. The adapter also extracts the associated keyboard data, and mouse data and routes it via a Zonit Virtual USB Connection according to the user assigned KVM endpoint(s). The USB logic will then take the video data and encapsulate it into a TCP/IP packet and hand that packet off to the network switch logic. It is then transmitted to the other endpoint(s) of the remote KVM connection. In this manner, the bi-directional data characteristics of KVM connections are managed and routed to the desired endpoints utilizing the USB Virtual Connectivity functionality of the Zonit ZPDU-G2.

- The connection to the Zonit USB/KVM distribution strip KVM port from the EDP equipment can be done by a special KVM adapter cable. This is common practice. What is unique, is that the KVM video connectivity routing of the KVM connection is done with the USB virtual connectivity function and accomplished by the Zonit ZPDU-G2.
- Each KVM port on a Zonit USB/KVM distribution strip can be connected into a virtual KVM connection to other Zonit USB/KVM distribution ports (or Net-Zonit USB/KVM ports), or a dedicated device or computer workstation running the "Zonit Remote KVM Application". This connection can be and usually is point-to-point or one-to-one-with-shadow-listeners. These virtual KVM connections are defined as a user-selected pairs of Zonit USB/KVM distribution KVM ports (or a Net-Zonit KVM port) plus a set of Zonit USB/KVM distribution strip KVM ports (or Net-Zonit KVM ports) that are in shadow mode and will all receive the video information. These virtual video ports are selected via a software interface on an application "Zonit Virtual Video Connectivity Manager" running on the Net-Zonit or a computer workstation or a dedicated Zonit appliance (like a ZPDU-G2), any two of which have TCP/IP network connectivity between them. The software interface can be done via a command line interface, Web interface or traditional GUI running on a computer workstation.
- Alternatively, in instances where industry standard PS-2 keyboard and mouse data is not utilized, but rather those functions are transported over the USB interface to the attached computer(s), the keyboard and mouse functionality is handled directly by using a Zonit USB Virtual Bus Connection. This eliminates some complexity in the KVM adapter, and further simplifies the wiring. This connectivity is between a USB port on the EDP device being remotely KVM connected and a dedicated device (ZPDU-G2) or a computer workstation running the "Zonit Remote KVM Application". This application connects the remote USB port to the keyboard and mouse on the computer workstation in an appropriate manner so that the remote device "sees" the keyboard and mouse as being locally connected and active. It also takes the remote video feed and displays it on the computer workstation in the "Zonit Remote KVM Application" windows by un-encapsulating it from TCP/IP and handing it off to the Zonit application, which displays it. The application allows the user to select any of the remote EDP devices that are remote KVM connected and switch between them. The video for each can be displayed in a separate GUI window and the active GUI window in the application can indicate which remote EDP device is active and will receive keyboard and mouse input. This approach can be extended to multiple computer workstations (or dedicated device) so that multiple users can connect via the remote KVM functionality to the same remote KVM EDP device. Multiple users can be active at once or one can be active and the others in "shadow" mode with no keyboard & mouse input ability. This feature is useful for collaborative work or training.

A more direct method is to use a "plugboard" approach and use the video and USB connectivity between two Zonit USB/KVM distribution strips (or a Zonit USB/KVM distribution strip and a Net-Zonit) to connect the EDP video and USB ports to a remote keyboard and video monitor. The switching function between EDP devices can be setup by the connected ZPDU-G2 which is controlled by the user via a command line interface or Web interface. The KVM logic in each connected ZPDU-G2 insures that each KVM connected EDP device "senses" a connected virtual monitor, keyboard and mouse when it is not actively connected to the remote actual monitor, keyboard and mouse as needed to insure normal operation. In all cases, since the ZPDU-G2 system has central management responsibility of the various virtual gateway functions, an environment of serial data, PS-2, or USB Keyboard and Mouse Datastreams can be routed appropriately with the attendant video stream associated with each. The end-points do not necessarily have to have the same physical interface as each other. For example, a USB based mouse and keyboard can communicate with a PS-2 host port in the virtual gateway of the ZPDU-G2 environment.

C. Data Center communication cabling issues—part 2

As described above, the limiting factor in modern data center deployment density is cooling, which was related to the issue of reducing the number of parallel cabling systems that need to be deployed in the data center and especially in the confined space of the equipment cabinet. The NetZonit and Zonit USB/KVM distribution strip were introduced as a method to reduce or eliminate the need for parallel data cabling systems and reduce the required cabling to the shortest lengths possible. We will now introduce the Z-Net method which is focused on the reduction of cabling for TCP/IP connectivity.

The Zonit Z-Net method is used in conjunction with the ZPDU-G2. Z-Net uses commercially available Ethernet over Carrier Current technology, as used in HomePlug®, but uses the ZPDU-G2 to provide a TCP/IP gateway function. This allows any TCP/IP Ethernet device plugged into a HomePlug® 1.0 or HomePlug® AV adapter which is inserted into a Zonit G1 or G2 plug strip to talk to any TCP/IP device that the ZPDU-G2 embedded controller (single board computer or SBC) can talk to. This greatly reduces or eliminates the need to run multiple network cables to the rack for accessory functions such as Ethernet interfaced environmental sensors, video cameras, UPS smart management cards or other data center infrastructure components. The bandwidth provided by the Z-Net system is limited, since the Z-Net system functions like an Ethernet hub (all HomePlug® adapters connected to the plug strips and/or adapters plugged into a single ZPDU-G2 will "hear" the signals on their power wiring, since it is a shared waveguide.

A key point is that each ZPDU-G2 filters out the HomePlug® communication signaling from all attached Zonit plug strips and adapters so that it stops at that ZPDU-G2 and is not transmitted up the A-B power feeds. This stops the HomePlug® signaling from being picked up by another ZPDU-G2 or HomePlug® connected device and limits the Z-net communications domain to only the HomePlug® devices connected to one ZPDU-G2. This raises the average per device bandwidth available, because without this filtering it would be impractical to use HomePlug® since thousands or tens of thousands of power receptacles are interconnected in a data center power distribution system with all of its branch circuits. This is equivalent to an Ethernet hub with thousands of ports, it just would not scale up and work, there would be too many collisions when all of the ports were trying to talk at the same time. Each ZPDU-G2 provides a TCP/IP gateway for each of its HomePlug® connected devices. The ZPDU-G2 also can act as a TCP/IP firewall for all HomePlug® connected devices if that security functionality is needed.

Figure 6:
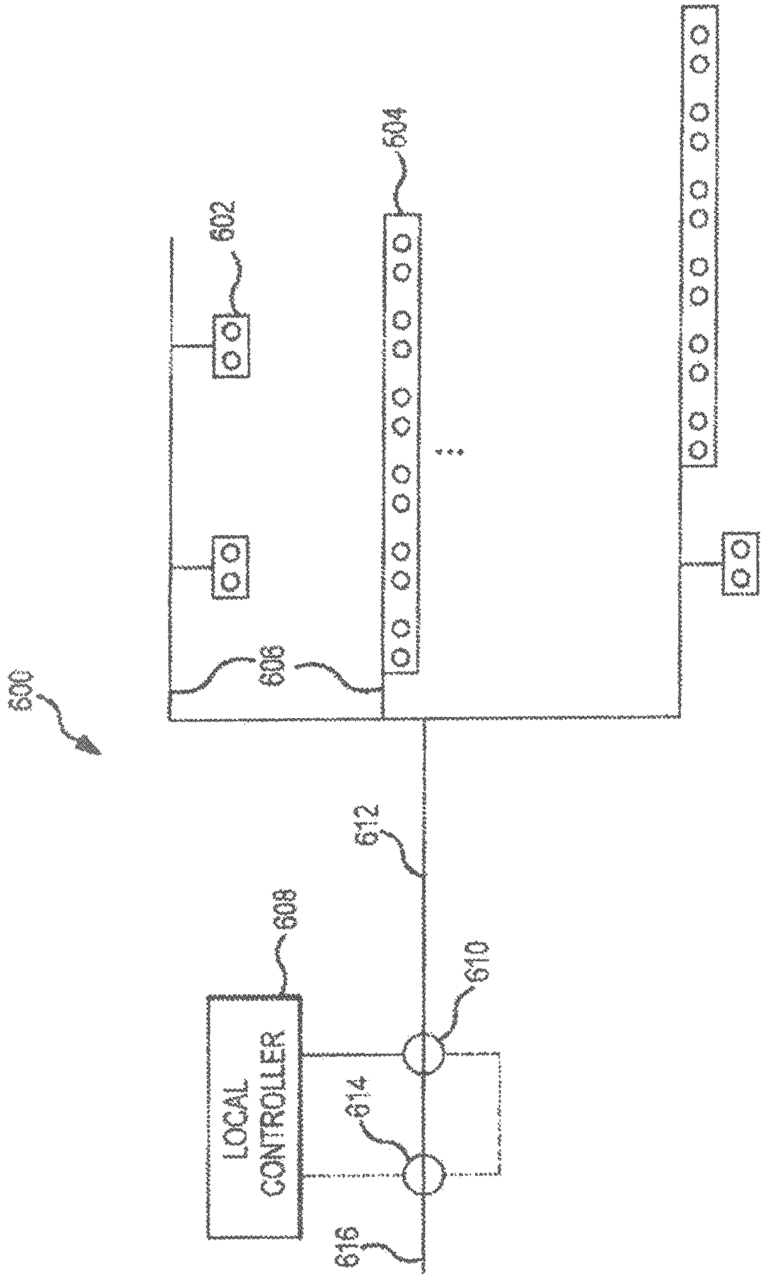
FIG. 6 is a schematic diagram illustrating a structure for enabling communications between receptacles and a local controller in accordance with the present invention.

In this regard, a single transceiver for each power source (e.g., A and B sources) of a ZPDU may be utilized to induce signals in the associated wiring and a single signal canceller or attenuator, as discussed above, may be utilized to substantially prevent transmission of communications to external power lines. This is generally shown in FIG. 6. In particular, FIG. 6 shows a control system 600 for a set of receptacles defining a controlled domain. The receptacles may include a number of receptacle outlets 602 and/or a number of plug strips 604 or adaptors (typical for data center environments) that may be arranged in one or more branch circuits 606.

The receptacles are controlled by a local controller 608, which may be, for example, embodied in a personal computer or in a single board computer incorporated into a PDU of a data center. The local controller uses a transceiver 610 to insert signals into the main 612 and branch circuits 606 for communication to the receptacles and to receive signals from the receptacles. A signal isolation device 614, which may be a signal canceller or a signal attenuator as described above, substantially prevents transmission of these signals to external (outside of the controlled domain) power lines 616. This structure may be replicated for A and B power sources in a data center. It will be appreciated that thus disposing all of the controlled receptacles on a single waveguide (or two waveguides in the case of a data center with A and B power sources) is a cost effective implementation. Communications with separate receptacles can be distinguished by use of an appropriate addressing scheme.

The signal isolation device 614, can be combined with the transceiver 610 as described in the following apparatus. A Pi filter is a device that is used to attenuate electrical signals in a conductor, usually an insulated wire. It contains a transformer core (inductor) and can be designed with additional windings for that transformer core to enable two additional functionalities.

i. Current sense capability in the attached conductor
ii. Insertion and detection of signaling in the attached conductor for communication purposes (a transceiver using the attached conductor).

The design of the additional windings can be done so that the injected communication signaling only is transmitted in one direction down the attached conductor and is attenuated in the other direction by the Pi filter.

Figure 50:
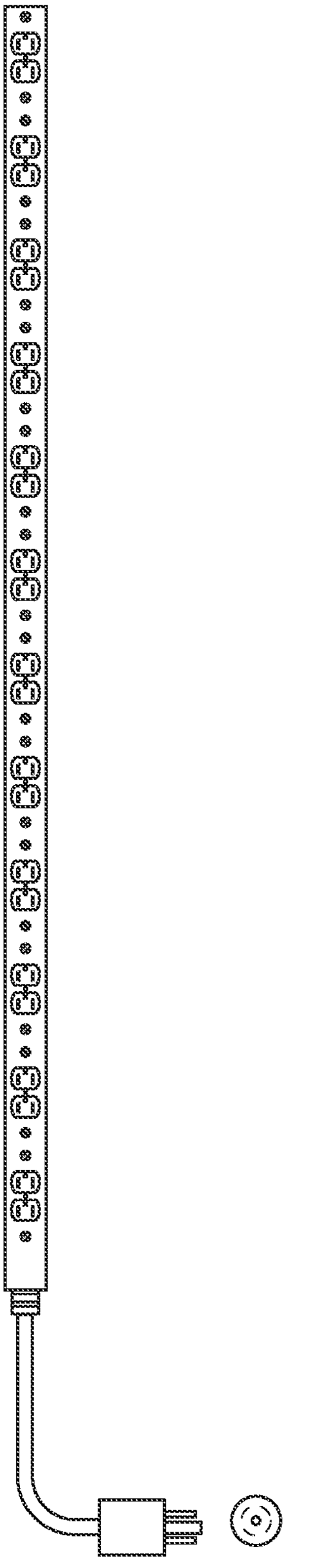
Figure 51:
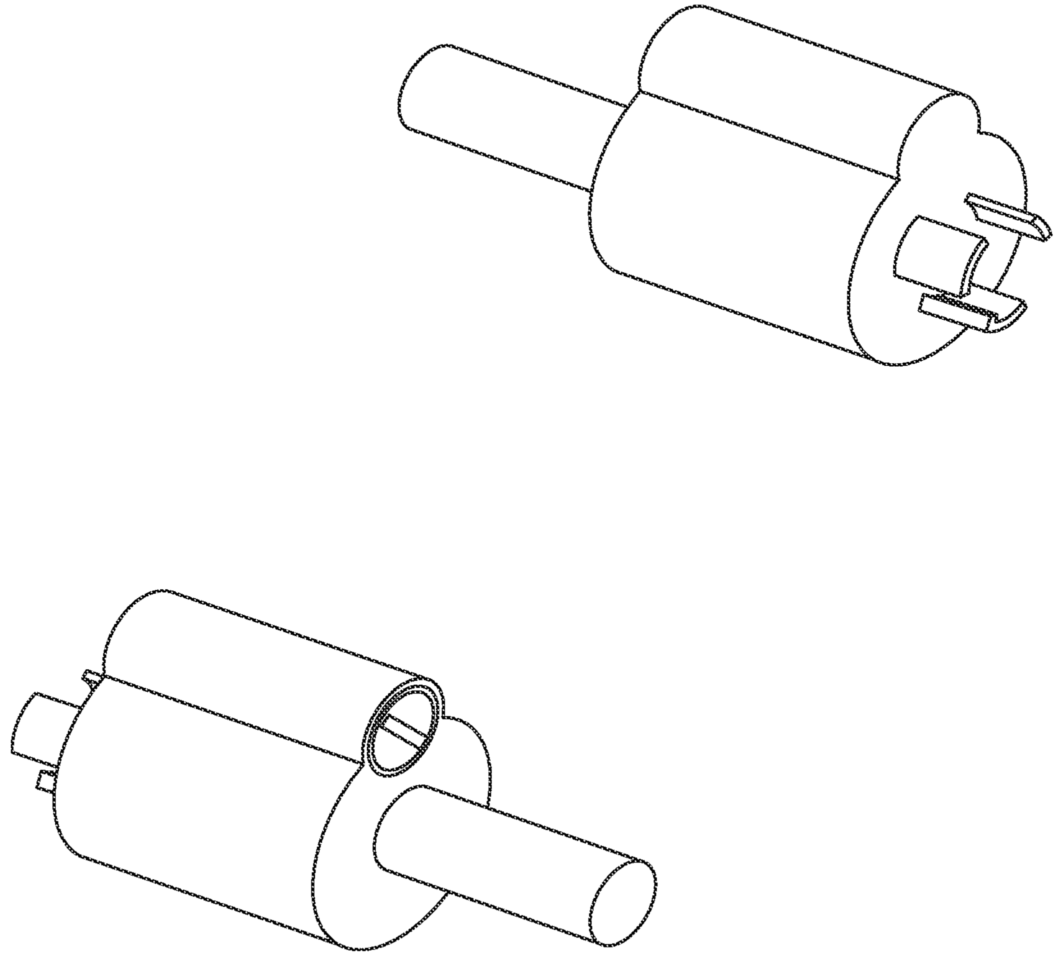
Figure 52:
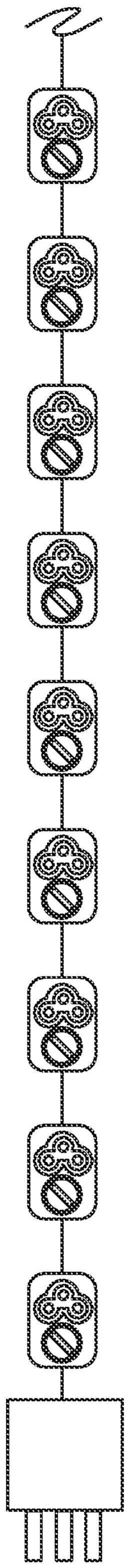
Figure 53:
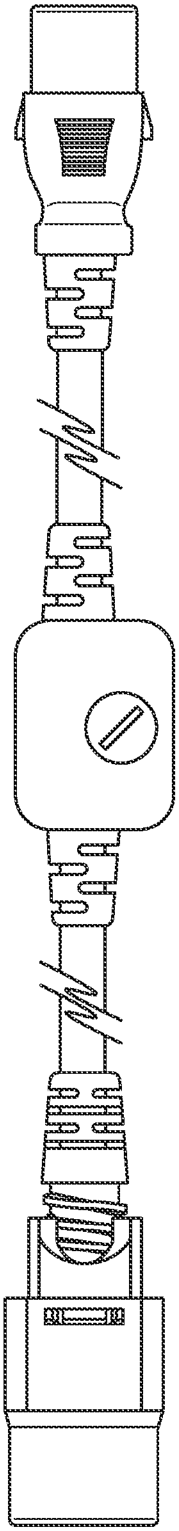
Figure 54:
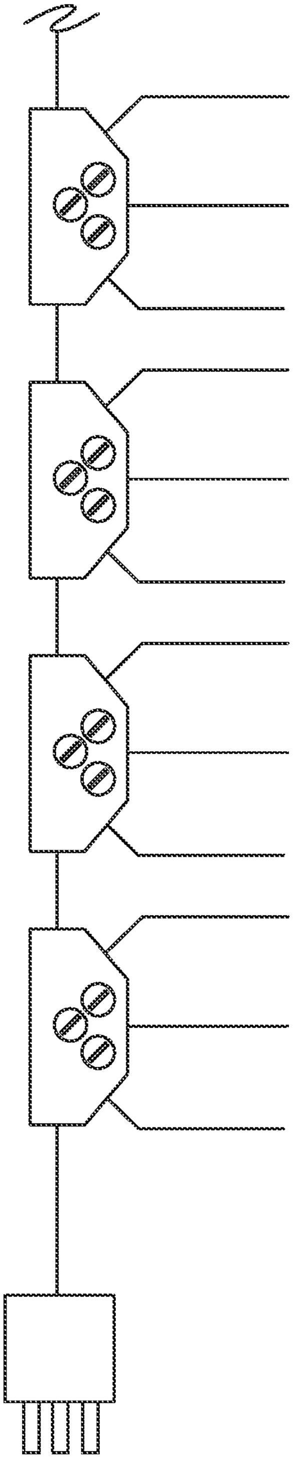
Figure 55:
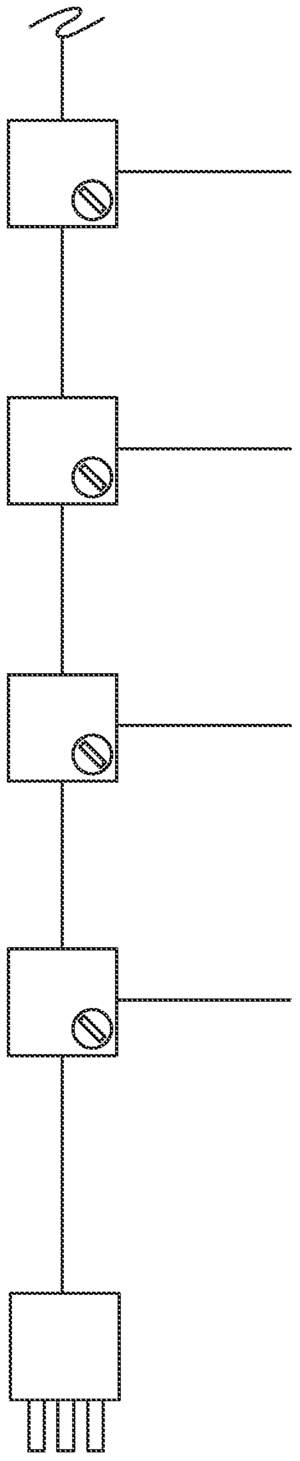

In another embodiment the following methods can be used. In FIG. 6 is shown a plugstrip on a branch circuit 604. Other outlets 602 could be present on the branch circuit. Traditional plugstrips that have integrated intelligence and/or communication features usually have to be of a certain size to allow the intelligence and/or communication module to fit in the enclosure of the plugstrip. Traditional plugstrips cannot be made much smaller than 2"×2" in cross-section. A plugstrip without intelligence can be made very small in contrast, for example 1"33 0.75" and as previously described that means that intelligent plugstrips force the rack to be larger, consuming more floor space. FIG. 50 shows an example plugstrip of a new design. It can be appreciated that the main difference between a plugstrip and a hydra cord is that the junctions (receptacles) in the plugstrip allow the distribution legs to be changed as regards the output end type and distribution leg length and/or color. A hydra cord does the same job, but the junctions 2150 (FIGS. 21-23, 69) or junction 6802 of hydra cord 6800 (FIG. 68 which includes a first junction 6802 that connects power cord 6801 to distribution power cord legs 6804; a second junction 6810 and a flexible power cord 6812 for connecting the junctions 6802 and 6810) are fixed and the output end type at the end of the distribution legs 6806 cannot be changed. In practice, in the modern data center that is not as important as it once was, because the great majority of IT equipment has standardized on IEC C13 male or C19 male inputs. See also, FIG. 57 which includes a first junction 5702 that connects power cord 5701 to distribution power cord legs 5704; a second junction 5710 and a flexible power cord 5712 for connecting the junctions 5702 and 5710. So, hydra cords are now more practical to use. Our new receptacle and plug designs are smaller form-factor than traditional plugs and receptacles (see FIGS. 21 and 64) and can be used to advantage as described herein. Very importantly our invention shrinks the form factor of the sensors, switches, fuses (or circuit breaker) and communication devices needed to build a modern intelligent plugstrip (or a Zonit intelligent hydra cord!) to a very small form factor. This is shown in FIG. 50. This module can incorporate any or all of the sensors, switches, fuses (or circuit breaker) and be placed in a number of locations in the power topology to advantage. In fact, in any situation that requires power quality monitoring and power control, the mechanisms needed to do it has been shrunk to a form-factor and cost point that makes it practical to integrate almost anyway in a power distribution topology.

D. Data Center Power Distribution Operational Issues

The operational issues a data center or co-location facility faces are many. Once the power whips have been specified and installed, the power requirements of each piece of equipment in each rack must be matched and met. New equipment will arrive over time and be installed and any new power requirements must be satisfied with little or no operational disruption, even if the power requirements are different. Equipment may be relocated in the data center to optimize cooling or meet other constraints such as cable lengths, physical security or ownership. A study by the Uptime Institute measured the change rate at the PDU for 49 Fortune 500 data centers and found that the annual change rate was 12% per year. It is very expensive but required by the traditional methodology to change 12% of the power whips in a data center and it is operationally disruptive.

The Zonit power distribution system was designed to meet the needs of the modern data center with a wide range of installed equipment and high rates of change. Over 90% of all Electronic Data Processing (EDP) equipment in a data center is designed to plug into a 20A 120V single phase circuit. A more universal way of saying this is that this equipment will never require more than 2400 watts of power and typically will need much less. The remaining 10% of EDP equipment is higher power and typically needs 30-60A input in 208-240V, in either single, split-single or three-phase power. So, ideally a perfect power distribution system is optimized to output power in the types and wattages required by the majority of the equipment but can also easily accommodate the minority of equipment that requires higher power capacity. This is exactly what the Zonit Power Distribution System does.

Changes to the power distribution system are difficult in the traditional approach and have varying degrees of risk. An ideal power distribution system will localize the changes to be made to minimize their risk and impact. It will also enable the changes to be made as easily as possible. Changes in a power distribution environment can be classified as follows:

TABLE 1

| Change | Difficulty | Cost | Risk | Locality of Change |
|---|---|---|---|---|
| Replace or move power whip | highest | highest | medium | Only the whip is normally changed but routing a new whip is difficult and installed cabling can be damaged. |
| Change circuit breaker in PDU | low | medium | highest | An error can affect everything powered from that PDU |
| Change receptacles on whip | medium | medium | Low | Only the whip is affected and it is done when the whip is powered down. |
| Change receptacles in or at rack | high | high | low | Only the rack is affected. If downtime required it can be expensive. |

Table 1 shows that replacing or moving power whips is the hardest and most expensive task. This is true because there are many of them and the space they are routed in is very confined and can be shared with many other data center infrastructure elements such as network cabling, etc. It also shows that changing circuit breakers is the highest risk task, because an error can knock out the highest number of systems. So, our ideal power distribution system should eliminate or minimize these changes and risks as much as possible. Here is how the Zonit Power Distribution System accomplishes these goals.

1. Minimize Power Whip Changes

The Zonit system does this in several ways.

Whip layout is driven by and matched to capacity need not power or receptacle type. This is made possible by using three phase power distribution and Zonit's power phase balancing method. Three phase power can be used to deliver three-phase, split-single or single phase power, which covers 99.9% of the current AC powered EDP equipment types. DC powered equipment can be supported by using rack mounted AC to DC power rectifiers, which are N+1 modular in design (to match the Zonit system A-B power redundancy) and can be connected to the whips or the Zonit ZPDU.

Installation of the whips is ideally done all at once, since the capacity planning is part of the design, and it is usually cheapest to do whip installation once, when the facility is built or upgraded. Other required Zonit apparatus is only bought and deployed as needed.

Power capacity can be matched to cooling capacity, which will determine the maximum possible power capacity. This means that you can deploy A-B 30-60A capacity whips (choose the capacity needed for the maximum required power density) and use the ZPDU with Zonit plug strips and plug adapters to deliver A-B 20A circuits from them in three-phase, split-single or single phase with whatever receptacle type is needed.

The power whip capacity can only be changed by changing the circuit breaker at the PDU. It is also possible to "downrate" a higher capacity power whip to a lower capacity by using a Zonit adapter that plugs into the whip and has circuit breakers in line to lower the capacity of the whip. This allows the whip to be used with EDP equipment that is rated to less than 60A without changing the configuration of the power whip. An example of this would be a blade server that needs 30A single-split phase power. A Zonit adapter with in-line 30A circuit breakers can be plugged into a 60A power whip to allow a blade server that needed 30A power to be connected without changing the power whip.

2. Make Power Configuration Changes at the Rack, not the PDU

Power distribution changes are done at the rack by use of a "configuration layer" which encapsulates the changes and makes them easy to accomplish. This is done in the Zonit system by the Zoned Power Distribution Unit (ZPDU) combined with Zonit plug strips and/or plug adapters or Zonit plug adapters which plug directly into the A-B power whips. Which method is used depends on the target power level. Any device that needs 20A (three-phase, split-single or single phase) is fed from the ZPDU. All other devices are powered directly from the power whips via appropriate Zonit plug adapters and phase rotators. The power whips can be configured at the PDU with circuit breakers to match the intended application or they can be "downrated" to the appropriate level with Zonit inline plug adaptors that incorporate circuit breakers.

Figure 7:
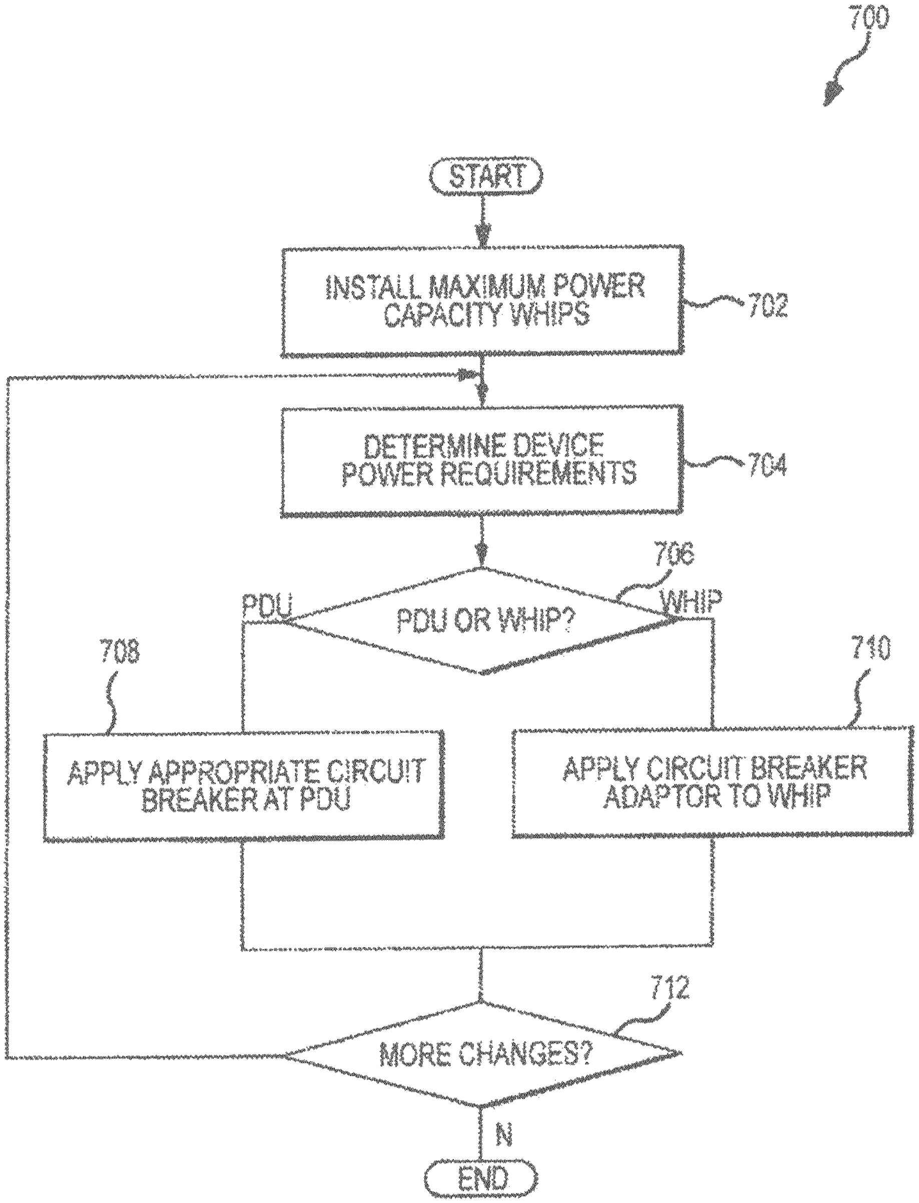
FIG. 7 is a flowchart of a process for matching a power supply from a whip to a piece of data center equipment in accordance with the present invention.

The Zonit Power Distribution system allows the needed power configuration changes to be made quickly at minimum cost, with the least risk. An associated process 700 can be summarized by reference to the flowchart of FIG. 7. The illustrated process 700 is initiated by installing (702) whips having the maximum expected power capacity. In this regard, as noted above, it is anticipated that whips rated for 60A would be sufficient for many data center applications. It will be appreciated that whips with different ratings may be utilized in this regard.

Thereafter, the power requirements are determined (704) for a particular device. Subsequent processing depends on whether the device is connected to a PDU or to a whip (706). In the case of a PDU, an appropriate circuit breaker may be applied (708) at the PDU supplying power to the equipment. In the case of a whip, a circuit breaker adapter may be applied (710) at the whip. If more changes are required (712), this process may be repeated.

E. Data Center Power Reconfiguration Issues in the Cabinet

The increasing density of data center environments has raised the difficulty of mounting power distribution system components in equipment cabinets. The cabinets tend to hold more devices on average and be fuller. This reduces the amount of working space (which is very small to begin with) in the cabinets and makes it more difficult to mount power distribution equipment such as power strips (sometimes called plug strips or power distribution units). To increase the power capacity in an equipment cabinet or change the receptacle type, may require that a plugstrip be removed from the cabinet and another installed. Or it may require that additional plug strips be installed. The basic determinant is how much and what kind of power is needed and how many & what kind of receptacles are needed to distribute it.

There are three basic elements of power distribution in an equipment cabinet;

1. Capacity: How much power can be delivered to the cabinet
2. Circuit Subdivision: How that power is subdivided into branch circuits and what amount and type of power (amperage, voltage, single phase, split-single phase or triple phase, etc.) those circuits deliver.
3. Receptacle Type and Count: What type of receptacles each circuit uses to deliver its power and how many there are of each type.

A key to meeting data center power distribution needs is to have flexibility in these elements, but do so in the least cabinet space possible. Provisions for mounting and power distribution methods that allow changes to be made with the minimum disturbance to equipment mounted in the cabinet, in tight working quarters are also crucial.

The average equipment cabinets in use worldwide range mostly range between 72"-84" high. These provide between 40-48U of rack mount space. Rack space is very valuable because of the high capital and operating costs of data center floor space and associated infrastructure. Therefore the preferred method for mounting power distribution components such as plug strips is to use methods that do not consume any space that could be used to mount EDP equipment. A very popular method is to mount these components in the sides or back of the rack, outside of the space (a rectangular solid space which occupies the central area of the cabinet defined by the standard cabinet width [19 or 23" in NEMA standard cabinets] by the depth of the cabinet [24-39"] by the height of the cabinet,) used to mount EPD equipment. A common way to distribute power in this fashion is to use vertically mounted plug strips that have the needed type and number of receptacles. These plug strips are long enough so that they can be mounted in the cabinet and each receptacle is near an associated 1 or more "U" of rack mounting space, while being less than the vertical height of the cabinet. However, the long vertical dimension of the plugstrip, which can potentially be close to the height of the cabinet so that it can supply the full height of the cabinet with receptacles, can be very hard to get into and out of the cabinet. If a long plugstrip needs to be changed, it may be necessary to remove equipment from the cabinet to do this, which is both inconvenient and may require expensive downtime, which is hard to schedule and potentially expensive. Therefore it is desirable to use methods that minimize or eliminate the necessity of changing the plugstrip location or mounting arrangements (how it attaches to the cabinet).

The present invention provides a solution to this market need that is both elegant and inexpensive. It can be used with any suitable existing equipment mounting racks or cabinets or integrated as a part of an equipment rack or cabinet design. This solution is referenced herein as the Zonit Single or Multi-Density Plugstrip Methodology. ("Zonit plugstrip method"). The Zonit plugstrip method allows any single feed substantially full-height vertical plugstrip to be replaced by multiple interconnectable plugstrips, e.g., a pair or more of vertical plug strips, that can use the same mounting brackets that the single plugstrip used and can optionally double (or triple, quadruple, etc.) the power density. Note that the Zonit plugstrip method can be used with different sized module options. The modules can be sized to be 1/N where N is the number of modules needed that make up the plugstrip. Different sized modules (combined with end-cap mounting brackets adaptors if needed, as described below) can be combined. For example a half-height module could be combined with two quarter-height modules and the required quick connect power modules to make a plugstrip. The choice of module size(s) to use is driven by the amount of power capacity per module (and module receptacle) that is needed for the application. The only restrictions on combining modules are that the space needed to mount them must be available, vertically or otherwise. The following description assumes the simplest case two half-height plugstrip modules. Some quarter-size module options are shown in FIGS. 4*d*, 4*e* and 4*f*.

Figure 4A:
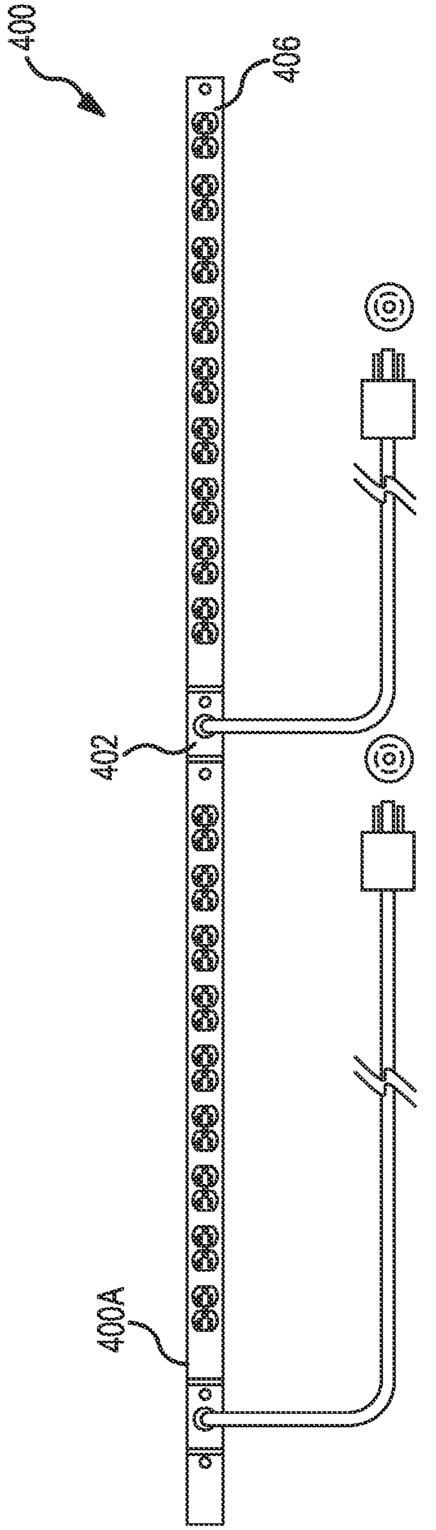
FIGS. 4A-4F show a double-shot power strip in accordance with the present invention.
Figure 4B:
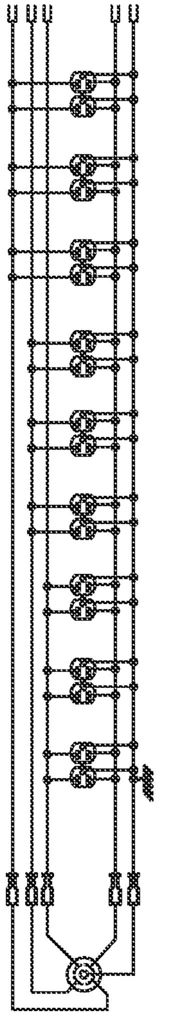
Figure 4C:
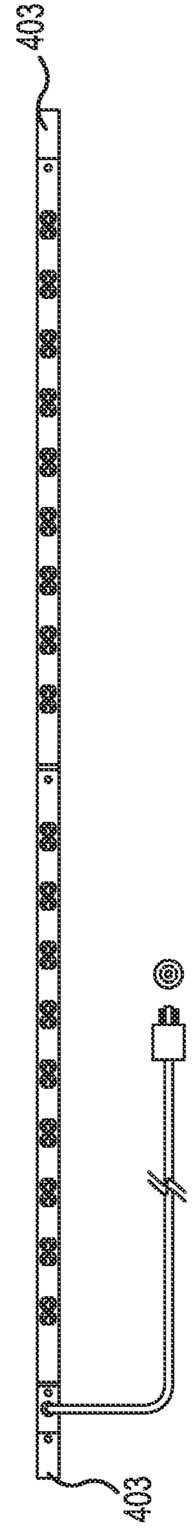
Figure 4D:
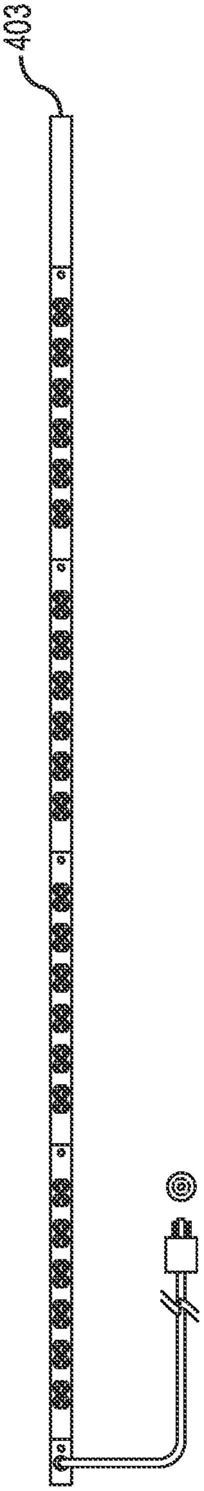
Figure 4E:
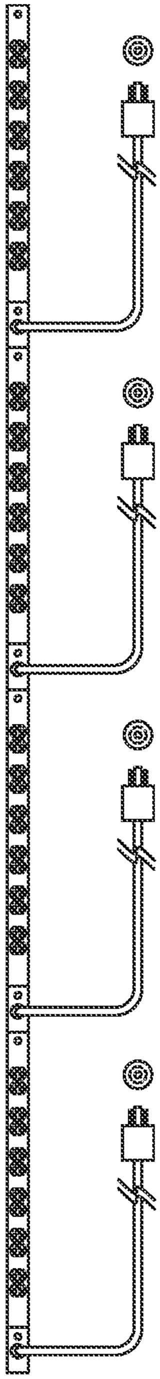
Figure 4F:
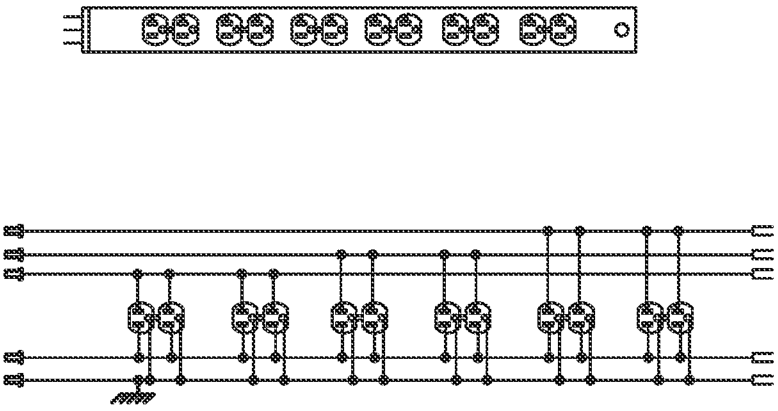

The pair of vertical half-height plug strips 400 as shown in FIGS. 3A-4C are designed so that they have the same mounting attachment points as the single vertical plugstrip and work with the same mounting hardware. The two half-height plug strips 400 are built with a universal design so that only one model of plugstrip is needed and with appropriate options can be used in any of the possible configurations. Each plugstrip 400*a* or 400*b* can be reconfigured so that the plug strips can either be fed power individually (FIG. 4A) or as a pair (FIG. 4C). They are joined together vertically by connecting together (FIG. 4A) or by a quick connect mechanism 402 (FIG. 4C) that fastens the two plug strips together and provides a power input. The associated wiring is shown in FIG. 4B. When joined together by either method they form a single unit that mounts in the same dimensions as the single plugstrip. In some cases the joined pair may be of slightly different physical dimensions, so in these cases an end cap mounting bracket adapter (403) may be supplied. This adapter attaches mechanically to an end of the assembly and makes the unit fit the mounting brackets so it can use the same mounting hardware. If a pair of plug strips is sharing one power input, they are also connected together electrically as is described below.

The method of electrical interconnect, while described for two half-height vertical plug strips, can be adapted to any suitable shape of plugstrip, such as horizontal plug strips (which mount in a rack in the space used by EDP equipment) which stack and attach vertically or horizontally back to back. The methodology described works the same and has the same benefits. The only difference is in mounting method, although this could be adapted also for a set of vertically stackable horizontal plug strips (where two half-height horizontal plug strips replace one full-height horizontal plugstrip).

In the illustrated system, each half-height plugstrip can play one of three roles:

1. Individual Half-Height Plugstrip—In this configuration, the plugstrip is used as an individual unit. It has an input power cord via the quick power connect.
2. Primary Half—In this configuration, the plugstrip has a power input cord and is connected to a power source via the quick power connect.
3. Secondary Half—In this configuration, the plugstrip draws its power from a primary half plugstrip to which it is connected. It does not have an input power cord.

The universal half-height plugstrip design has several elements.

Mechanical Connector Mechanism

Each plugstrip is designed to be mechanically connected to either another plugstrip or a power quick connect. Each plugstrip has an insertion end and a receiving end, which slide together and can be securely fixed via a hand-operated fastener. The power quick connect has the same connector design and therefore allows a power input cord to be easily connected or removed. Since the cord is modular it can be attached or detached as needed so that the plug strips can be reconfigured to be in either mode.

Electrical Connector Mechanism

The electrical connectors are designed so that the system is always in a safe configuration. Each plugstrip has a male electrical connector on one end (which is always engaged when the plugstrip is in use in either mode) and a female electrical connector on the other end which only used when the plugstrip is configured as a secondary plugstrip. This arrangement insures that no male conductors are exposed when the plugstrip is energized. Additional pins in the electrical connector are used to do logic and state signaling in the intelligent plugstrip models. This informs each plugstrip logic controller of which mode it is configured in, primary or secondary.

Quick Power Connector

This is a combination modular power input and a mechanical connector. It is used with all primary configured plug strips. Additionally it is used to mechanically connect primary-primary configured plug strips. It mechanically has a receiving end and an inserting end which are the same as the mechanical connectors on the plug strips. The power input function is accomplished by have only one female electrical connector on one end of the quick power connect. This can only connect to a male electrical connector on a plugstrip. Since the input power cords can only plug into a male connector, it is impossible to electrically connect two primary configured plug strips together, which is the intent of our design.

Uniform Mounting Dimensions and Methods

The mounting attachment points and dimensions are designed so that any mounting hardware that works with a single full-height plugstrip will work with a pair of half-height plug strips, interchangeably. Since the insertion of the power quick connect changes the vertical length of the plugstrip pair slightly, multiple mounting holes are provided to accommodate this change in length and still allow it to mount using the same hardware.

ASCII Configuration Key

QP—Quick Power Connector
PH—Primary configured half-height plugstrip
SH—Secondary configured half-height plugstrip
+—Indicates components are connected as described in document The combinations of plug strips that are valid are as follows:

1. One Individual Primary Half-Height Plugstrip

In this configuration, a mounting adapter can be used to allow the plugstrip to mount into the same brackets that a full-height plugstrip uses. It has a quick power connect that supplies the input power but no second plugstrip is connected.

Configuration—QC+PH

2. Two Primary Half-Height Plug strips (Primary-Primary)

This is two primary half plug strips each of which has a quick power connect on their male ends. The quick power connect between them only can connect electrically to one plugstrip but mechanically connects the two plug strips together.

Configuration—QC+PH+QC+PH

3. One Primary and One Secondary Half-Height Plug strips (Primary-Secondary)

In this configuration, each half plugstrip is connected together mechanically and electrically. The secondary plugstrip draws its power from the primary plugstrip by connecting its male connector to the female connector on the other plugstrip.

Configuration—QC+PH+SH

4.One Primary Half-Height and as many Secondary Half Height Plug strips as required. (Primary-Secondary-Secondary- . . . )

In this configuration, the primary plugstrip feeds as many secondary plug strips as desired. This is a novel feature, but would usually be restricted to unusual situations such as when the plug strips were used outside of a rack, for example lying on top of a long laboratory test bench.

Configuration—QC+PH+SH+SH+SH+ . . . (as many SH as needed)

This methodology has several advantages;

1. The single full-height plugstrip in the rack can be replaced with two half-height plug strips in the same space (with a slight difference in vertical height, depending on whether the pair is configured primary-primary or primary-secondary), that use the same mounting hardware. In addition, a single half-height plugstrip can be replaced with two quarter-height plugstrips as shown in FIGS. 4D and 4E. With appropriately designed mounting hardware that does not need to be removed from the rack to change the plug strips, this means that the plug strips can be replaced or reconfigured without changing the mounting brackets or plugstrip location in the rack, a real benefit.
2. The two half-height plug strips replacing the single full-height plugstrip can each have an independent power input, so the number of circuits feeding the receptacles can be doubled. This feature can be used to increase the power capacity and per receptacle power budget in the same exact location and space in the rack, so it provides a very convenient growth path as deployment density increases over the lifetime of a data center.
3. Two different types of circuits (for two primary half-height plug strips) and/or different types of receptacles (for single phase, split-single or three phase fed primary or secondary plug strips) can be used to deliver power in the rack using the same mounting brackets and plugstrip location, which is another gain in flexibility. Note that in our design, while a plugstrip module could use a single power phase from the ZPDU, it can (and usually will) be built with the wiring and connectors needed to deliver and pass (FIG. 4*b*) through all three phases, allowing other types of plugstrip modules that use two or three power phases to be connected to form a plugstrip.
4. In crowded racks, it is easier to get two half-height (or four quarter-height) plug strips into the rack and then connect them together than trying to get one large full-size plugstrip into the rack. This can be very important in very crowded racks where changing out plugstrip types can be difficult or impossible without removing already installed and running data processing equipment, which may require difficult to schedule and potentially very expensive downtime.

This plugstrip design offers great flexibility and improved ease of use to data center operators. They can use either single or double density plug strips in the exact same space and interchange them without changing the mounting hardware in the equipment cabinet. They can intermix different circuit and receptacle types of any type when using two primary configured plug strips and can intermix receptacle types for a primary-secondary configuration when using single phase, split-single or three-phase fed power, again without changing the cabinet mounting hardware. This method makes power distribution configuration changes in the equipment cabinet easier and quicker to do. The net result is reduced costs, effort and potentially downtime.

Figure 15:
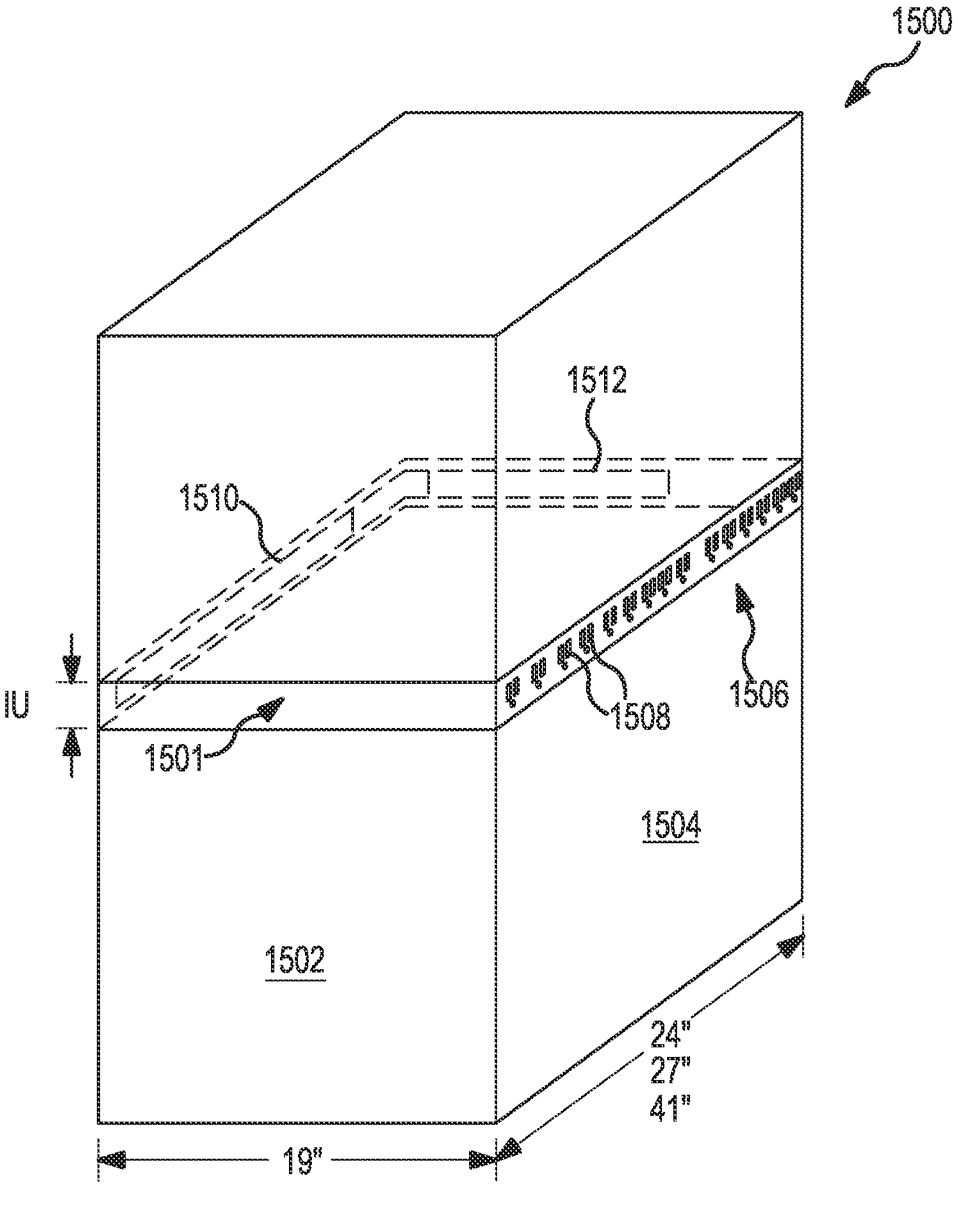
FIG. 15 is a perspective view showing side mounted power strips in accordance with the present invention.

These power supply issues in crowded data center environments can also be addressed by a side access receptacle system. An embodiment of the side access system is shown in FIG. 15. In the illustrated embodiment, at least one power strip 1506 is mounted on a data center equipment enclosure 1500. As disclosed above, the enclosure may be, for example, a rack or a cabinet. In any case, the enclosure 1500 includes a number of equipment mounting slots 1501, only one of which is shown in the drawing for clarity of illustration. The illustrated enclosure 1500 is a cabinet having a front 1502, a back opposite the front, a first side 1504 and a second side opposite the first side 1504. The cabinet will typically have a rectangular configuration. In this case, the cabinet front 1502 has a side-to-side width of 19 inches. The first side 1504 has a depth that is generally greater than the width of the cabinet front 1502.

It will be appreciated that cabinets of different widths and depths are common in data center environments, and the power strip 1506 can be made to accommodate any such cabinet. In the illustrated embodiment, the depth of the cabinet may be, for example, 24 inches, 27 inches or 41 inches. Thus, it will be appreciated that the depth of the cabinet is generally greater than the width of the cabinet so that the power strip 1506 can accommodate more outlets 1508 as may be desired. In the illustrated embodiment, the power strip 1506 may include, for example, more than 10 outlets. In the case of a cabinet having a 24-inch depth, the power strip 1506 may include at least 14 standard NEPA three-prong outlets disposed in a single row on the power strip. Where the geometry of the enclosure 1500 allows, the power strip 1506 may have outlets disposed in more than one row for even greater capacity. In the illustrated embodiment, the enclosure includes shelves having a height of 1 u. The power strip 1506 is dimensioned to be utilized in connection with a shelf of this dimension.

As shown, a second power strip 1510 may be disposed along the second side of the enclosure 1500. In this manner, a greater number of outlets can be provided in connection with the shelf. For example, the second power strip 1510 may be substantially identical to the first power strip 1506. Alternatively, the power cord for the strips 1506 and 1510 may extend from opposite ends of the strips 1506 and 1510 for mirror image right side/left side configurations. Moreover, the first and second power strips 1506 and 1510 may be associated with separate power sources. As noted above, for certain critical equipment, it is desirable to have power alternately supplied from first and second sources to ensure continuous operation even in the case of a power outage of one of the sources. For example, one of the sources may be a failsafe source. Such equipment often includes first and second power cords. In the illustrated embodiment, one of these power cords may be plugged into the first strip 1506, and the other power cord may be plugged into the second strip 1510. These strips 1506 and 1510 may then be connected to separate sources, for example, via a power distribution unit (not shown).

Alternatively, the first and second power strips 1506 and 1510 (which are still associated with separate power sources) may be powering equipment via an automatic switching unit 1512. Generally, the automatic switching unit 1512 senses a power failure in connection with a power source (associated, in this case, with one of the power strips 1506 or 1510) and automatically switches to an alternative source (associated, in this case, with other power strips 1510 or 1506). In this manner, all of the equipment may be connected to two power sources even though the equipment may have a single power cord.

Although the power strips 1506 and 1510 are shown as being disposed at side edges of the enclosure 1500 and being aligned with a front-to-back axis of the enclosure 1500, it will be appreciated that the strips 1506 and 1510 may be spaced a distance from the side edges, e.g., to provide space for plugs and power cords. In addition, the strips 1506 and 1510 may be angled relative to a front-to-back axis of the enclosure 1500, for example, to accommodate more outlets or to facilitate access to the outlets from the back of the enclosure 1500, as may be desired.

F. Data Center Power Management, Monitoring and Security Issues at the Receptacle Power monitoring and management at the receptacle level is a feature that is in increasing demand, especially in the data center market. The shift in understanding of power as a cheap utility commodity to an expensive resource with associated environmental and climate impacts is well underway. This combined with rapid power consumption growth (from less than 1% of US annual power usage to soon over 3%) in data center environments has driven a demand for the ability to monitor power usage. The other basic feature that data center managers want is the ability to remotely switch power receptacles off and on. This is especially useful for co-location facilities or "lights out" data centers that have little or no operational staff located on site. These are features that the Zonit Generation Two plug strips will provide.

Many data center managers come from facilities operations backgrounds and do not have strong Information Technology (IT) backgrounds. IT security is even more problematic for such managers as it requires a multi-level understanding of IT infrastructure to grasp the pros and cons of various IT security issues. Further, very few data center managers have IT security expertise on their staffs and must rely on corporate IT resources for this area. This makes them uncomfortable with the potential of an attacker cracking into the power distribution management systems and gaining control of the ability to remotely turn off power to devices in the data center. This is their direct responsibility and something they will be held accountable for even though they don't have direct reports with the skill to implement and maintain the IT security needed to insure attackers will be kept out.

The result of this situation is that although most data center managers would prefer to have both per receptacle monitoring and switching capabilities, they are afraid of attackers gaining control of the receptacles and switching them off. The market has responded by providing two kinds of plug strips, those that can be monitored and switched and those that can only be monitored. This forces the data center manager to choose which kind of plug strips he wants at deployment time and if he needs for some reason to switch from one type to the other he has to change out the plugstrip(s) which are affected which is both awkward and usually forces him to buy more plug strips than he wants to so that he has both kinds available when needed. The key point to understand is that data center managers prefer to rely on the physical access security features of their data center to insure security in their domain of responsibility if they have a choice. Our inventions recognize this.

Figure 8:
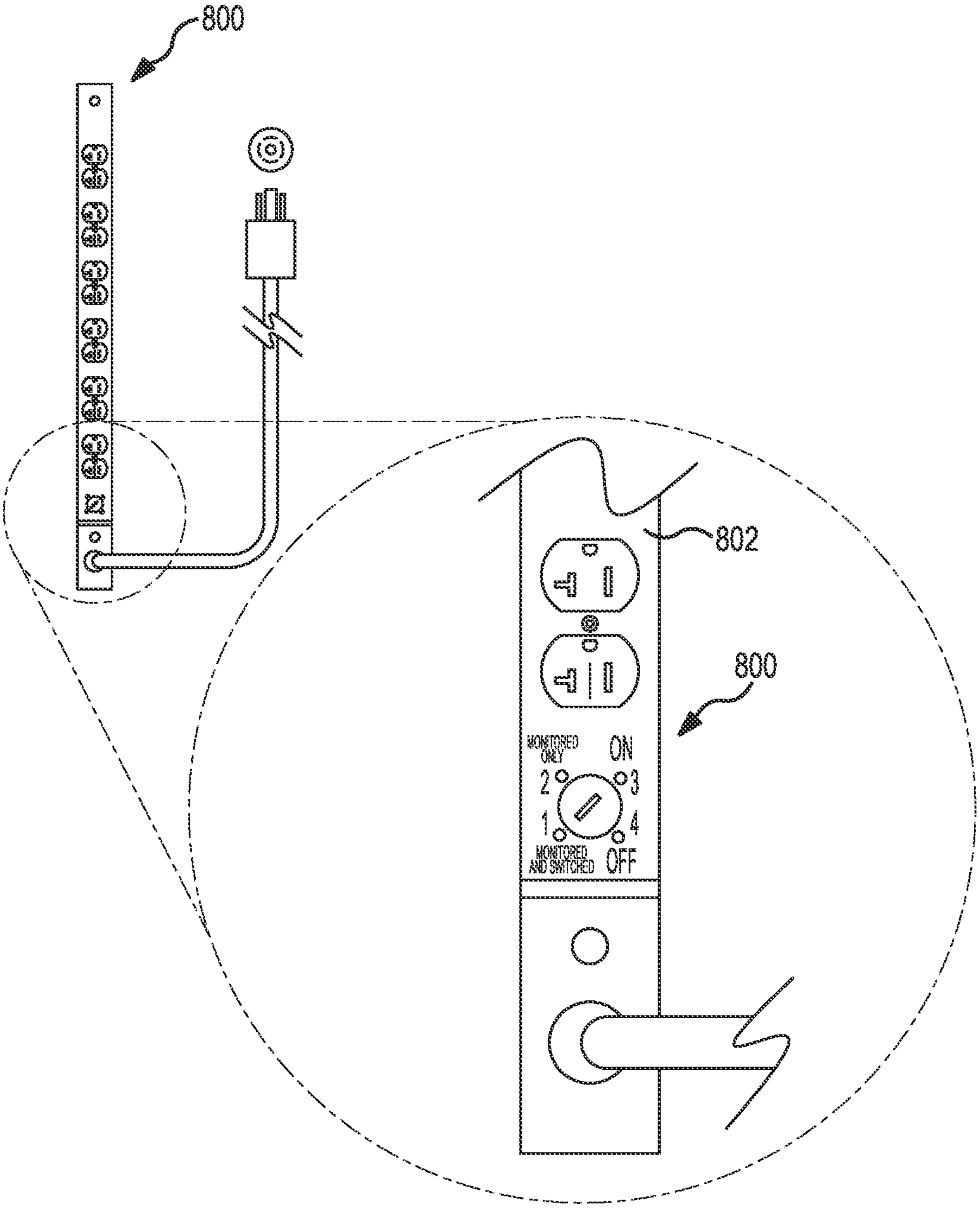
FIG. 8 is a perspective view of a key switch power strip in accordance with the present invention.

The solution we have invented to this market demand is both elegant and secure, and is referenced below, as the Zonit Secured Mode Plugstrip. The Zonit Power Distribution System-Generation Two, 1 incorporates per receptacle monitoring and switching in its plug strips. The receptacle is switched on and off via means of a relay. The relay is actuated by a separate control circuit, which can be controlled remotely, via a Web interface or other means. The relay control circuit is inserted between the logic controlled power switching and the receptacle a simple multi-position switch, which may be implemented as a key controlled switch 800 (FIG. 8) for security, although a non-lockable switch could be used. It is manually operated and has four positions:

1) All Receptacles Monitored & Switchable On/Off
2) All Receptacles Locked to last set On/Off configuration & Monitored
3) All Receptacles Powered On & Monitored
4) All Receptacles Powered Off The switch is a security override that can only be controlled manually. It controls the functional behavior of the receptacle or in the case of a plugstrip 802, receptacle(s) as follows:

1. In position 1, the override switch is closed and the relay logic control circuit controls when power is directed to the Form A relays. The power is used to open the relay(s), turning the receptacle(s) off for a moment or indefinitely which either power-cycles the attached device or shuts it off. This position also allows status of each receptacle to be monitored.
2. In position 2, the override switch is set to a position that tells the plugstrip control logic to not accept any new configuration commands. Receptacles stay in the on/off state that they were prior to the override switch being turned to position 2 and receptacle monitoring stays in its prior configuration for each receptacle.
3. In position 2, power to the relays from the control circuit is cut to the receptacles by the position of the switch. The receptacles can be monitored, but they cannot be turned off because no control circuit power can be delivered to the Form A relays, regardless of the action of the control logic. In this position, all of the receptacles will be "on" always.
4. In position 3 the relay control circuit power is "locked" on, opening the Form A relay and turning off all of the receptacles. Again, it cannot be over-ridden by the control logic, it is hard-wired.

It should be noted that this method can be used with other relay forms (B, C, etc.) and relays that are powered by AC power. The key point is using a switch mechanism as a security override of the receptacle control logic. The illustrated embodiment uses form A relays for better reliability (the relay is off when the receptacle is on, the most common state) and uses DC powered coils, but a relay that was AC powered could be used with this method as well.

This mechanism gives the data center manager the option to physically and securely select the functional mode of the receptacle or plugstrip, in a way and at a level that he is comfortable with and can absolutely trust. This in turn allows him to buy only one type of plugstrip that can serve in either role, managed and monitored or monitored-only, at the turn of a key. This is a significant improvement saving the data center manager, time, effort and money and avoiding operational disruptions.

An additional security is to implement the communications protocol (e.g., Z-protocol) directing the control logic for the receptacles as a proprietary secure method that is not published. It preferably has a simple robust encryption scheme and is separated from the higher level control functions (network connectivity and Web interface). It would be very difficult for an attacker to understand and corrupt. It would require physical access to the hardware and reloading of firmware, both virtually impossible for an attacker in an access controlled and monitored data center.

Another embodiment of this method can be constructed as follows. The control module in FIGS. 26-29 have USB ports or could be provided with other suitable ports. A USB fob could be provided to the Data Center manager that must be inserted for any reconfiguration and/or exercise of control functions by the control module. This can be done by a number of software means, but most importantly if the USB fob is not present, the control module acts in a "read-only" mode, where it can do monitoring and reporting but will not do configuration changes or commands which change the state of a connected device.

In another embodiment of the above, the USB connected fob could have a multi position switch that functions as described above. And thereby determines how the control module interacts with all of the power distribution devices (plugstrips, ATS units, Arrowhead plugstrip or ATS, ZPDU, etc.) that it can monitor and control as described above.

In another embodiment, the multi-position switch could be integrated into the control module (or remotely connected to it by a simple means such as USB or a serial port). The switch position could be read by the control module and used as previously described.

All of the above embodiments share the same basic principle, you have to have physical access to the data center to change the policy that the control module is using. This gives the data center manager the control he likes while retaining the flexibility of full "lights-out" remote management.

G. Data Center Unique User Interface Features

Co-location facilities or "lights out" data centers that have little or no operational staff located on site have certain operational needs relating to their use of power distribution in their facilities. Some data centers and co-location facilities are now reaching very large sizes, with up to or over 250,000 square feet. They have rows and rows of cabinets that go on and on. They all look similar except for labels, if present. The personnel who have access to equipment in racks can vary quite a bit in their degree of understanding, expertise and experience in working in data center environments. This is especially true in co-location facilities where client personnel as well (or in some cases only) have access to equipment and plug it into the power system when it is installed or moved.

The other variable in the market is the increasing adoption of three phase power at the cabinet, due to increasing power requirements. Three phase power is different than the traditional single phase power that most IT personnel are used to. What receptacle, phase and branch circuit you plug into can and often does, matter. There is more complexity that has to be managed and monitored. The chances for error are greater, especially with users who have never worked with three phase power distribution.

The present invention addresses this market demand by informing users at the cabinet level of information they need to work with the power distribution, but is remotely controllable via a Web interface. This means that a remote data center manager or operator can perform an action or an individual in the data center with Web access (phone, PDA, laptop, public computer, etc.) can perform an action that is reflected by what they see in the cabinet.

This is accomplished via one or more LED's (which can be white or colored) located next to a receptacle (or receptacles in the case of plug strips) or circuit breaker (in the rack or on the wall in a power distribution unit). The LED's have multiple functions, they can be used to illuminate or convey information based on their color, blink pattern or on/off state either individually or as a set or subsets. Alternatively or additionally, such information can be conveyed via an LCD or LED display 350 (FIG. 3C). Information regarding the power source (A or B), phase, or circuit association can also be provided by strip configuration (e.g., A and B sources can be in different columns) and color coding of the receptacles or adjacent face plate area.

This offers several unique abilities and many more can be developed:

1. Cabinet or Component Identification and Illumination
   LED's are now available in high output, high efficiency variants. This makes it possible to brightly illuminate the interior of an equipment cabinet, which both identifies that cabinet and illuminates the interior of that cabinet to facilitate working in it. The interiors of cabinets usually don't have built-in lighting and also are poorly lit by room lighting, which is often dimmed to save energy. Also, illuminating a component makes it easy to identify.
2. Receptacle and Circuit Breaker Location
   This offers the ability for a particular receptacle or circuit breaker to be specified from the Web interface and then identify itself by the blink pattern of the LED at that receptacle or circuit breaker. This insures that the right receptacle or breaker is identified when making a change to the power distribution configuration, such as when installing, removing or moving a piece of equipment. It is particularly useful with 3 phase power, since you can identify both the receptacle and the circuit breaker that controls it at the same time.
3. Receptacle Phase Location
   This is a capability that is very useful in three phase power distribution. It is not trivial, especially for three phase novice to correctly identify the power phase that a particular receptacle or circuit breaker is on. The data center manager may tell a technician or custom, "Plug into phase X" based on what he is seeing at the three phase UPS, because he knows that three phase power loads should be balanced for best efficiency. However, the person who performs the change at the cabinet can have a hard time figuring out what receptacle is on what phase. The present invention makes this trivial, just use the Web interface to select a mode where the phase at the receptacle is displayed.
4. Receptacle and Circuit Breaker Status and Error Codes
   LED's are usually used to indicate power receptacle or circuit breaker status, but they are usually only binary (LED lit=power on, LED off=power off). The ability to use them individually or in sets to indicate other types of information, (voltage low or high, branch circuit error, amperage level in/out of range, power quality in/out of range, many others) is quite extensive.

The present invention gives the personnel managing and working in data center environments a superior user interface to interact with each other and the power distribution system. The key points are that the LED's can be used in conjunction with Web interface(s) to enable a better way for the staff to reliably and correctly perform basic power distribution configuration changes and get information and direction and be informed of problems in the equipment cabinet.

H. Data Center Power Capacity Provisioning Management Issues

Power capacity provisioning management raises both operational and upgrades issues in a data center or co-location facility. This is especially true in co-location facilities because power is almost always sold by the branch circuit and provisioned to the equipment cabinet. The most common type of power sold is a 20A, 120V single phase circuit which is provided with each cabinet or fractional cabinet. The problem with this type of deployment is that it is inflexible, requires power whip changes to change the capacity level and if the limit is hit, the resulting circuit breaker trip can take down all equipment connected to that circuit that does not have a redundant power feed.

These kinds of problems happen with equipment deployments more frequently than one might think. This is because few data center or IT staff measure or do the research on what amount of power each piece of equipment actually draws. This research is hard to do because manufacturers do not give power consumption figures for each possible optional configuration of their equipment and the worst case numbers that they publish are often very unrealistic. So, the prevailing method is "plug it in and see if it works!"

Another issue with traditional branch circuits is that they must be capacity over-provisioned to meet the peak demand, not the average demand. This occurs because the peak demand happens during a cold start scenario, when all of the equipment connected to the branch circuit starts up at the same time. The resulting load from power supplies drawing current and fans and disk drives spinning up is the highest load point. This means that all branch circuits can only be loaded up to around 80% of their rated capacity, so that they have sufficient headroom to handle cold-start current inrush levels.

The Zonit Power Distribution Methodology solves these power capacity management issues in a unique and useful way. The Zonit system method is to implement "Virtual Circuit Breakers" that can be applied to a single or any arbitrary set of Zonit system power outlets. The Virtual Circuit Breaker is a software limit that is implemented via a proprietary hardware apparatus at each receptacle. It functions under and up to the branch circuit breaker limit via a set of user selected policies. The power policy controls both the state of the receptacle (on/off) and how that receptacle acts individually and in a single or multiple set(s) of defined receptacles. The most common sets of defined receptacles are one individual receptacle, all the receptacles that are on one branch circuit, or all of the receptacles assigned to a particular client or any other functional or political division. The enabling apparatus preferably has the following minimal capabilities:

1. Quickly measure and communicate power usage and voltage at the receptacle level. Other measurement points (such as at the input from the power whips) can be used, but are not essential. The measurement frequency and accuracy must be sufficient to allow a processing unit to compute if the branch circuit capacity is being overdrawn, and act on it before the actual branch circuit breaker trips.
2. A processing unit or units (it can be centralized or distributed and single or multi-level) that monitor and sum the current and/or voltage values. They are also responsible for the enforcement of the current power policies.
3. A method for allowing the processing unit(s) to determine which controllable receptacles are on which branch circuits. This can be done by the design of the topology of the electrical connections or how the communications protocol that talks to the receptacles works or a combination of both.
4. Receptacles that are on-off controlled, having the ability to be quickly turned on and off. The speed of response must be fast enough so that a receptacle can be turned off before a typical branch circuit thermo-magnetic circuit breaker would trip open in a mild to moderate over-current scenario.
5. The ability to allow the data center manager to identify to the processing unit which equipment is plugged into which receptacle(s) so that power policy decisions can be made on this information.

The Zonit Power Distribution Methodology allows the following functionality.

1. Power monitoring is used to determine if a branch circuit is about to trip its circuit breaker due to a change on the circuit (new equipment plugged in, existing equipment malfunctioning, etc.). If an over-capacity condition is present, the processing unit can preemptively act to prevent the circuit breaker from tripping by turning off one or more receptacles that are on that circuit. Which receptacles to turn off is a policy controllable decision, it can be last on, first off, a defined priority shutoff sequence, highest power drawing receptacle, the smallest load needed to get the power draw underneath the hard amperage limit for the circuit, etc., literally any pre-defined criteria can be used.
2. A given power limit is defined for an arbitrary set of receptacles in the facility. They could be, but do not have to be on the same branch circuit. This is a capacity provisioning soft limit set using the Virtual Circuit Breaker and is useful for facilities such as co-location data centers that want to sell power by capacity limit and have the ability to change the limit as the customer pays for more capacity. This is very useful for such facilities. It can be combined with power reporting to show customers just how much power they are using and what units use the most power.
3. Control the order and timing of receptacles and/or adapters being turned back on either as load drops or on a power-up from cold start scenario. Controlling the order of devices powering on is a very useful ability when turning on a Information Technology infrastructure because to achieve reliable startup, some devices and services need to be started in a particular order to come up reliably. This is accomplished in the Zonit Power System Methodology by allowing the data center operator to associate a particular device with a receptacle or receptacles and then set a device power-on order for all defined devices in a set or set(s). Also, the startup inrush current draw of Electronic Data Processing (EDP) equipment (when power supplies start, fans and disks startup) is usually the highest current draw time. Sequencing the startup of all of the devices connected to a particular circuit helps to insure that the inrush current maximum does not trip the branch circuit breaker.

4. The ability to do intelligent, pre-planned load shedding. A difficult issue that can arise in running a data center during a utility power brownout or outage is how to manage power loads. The backup power facilities (battery and generator) may or may not have sufficient capacity to power the entire data center during the utility outage or if fuel for the emergency generators runs out and the UPS batteries start to run down. In a traditional data center, staff must make quick decisions on what equipment to shut down and in what order. It is easy to make mistakes in these circumstances and cause inadvertent service outages.

The Zonit Power System Methodology allows pre-planned, multi-phased and time delay controlled intelligent shutdown of data center equipment based on whatever criteria the data center manager chooses. This allows the data center and co-location managers to prioritize the uptime of critical services, clients, etc. as needed.

Figure 9:
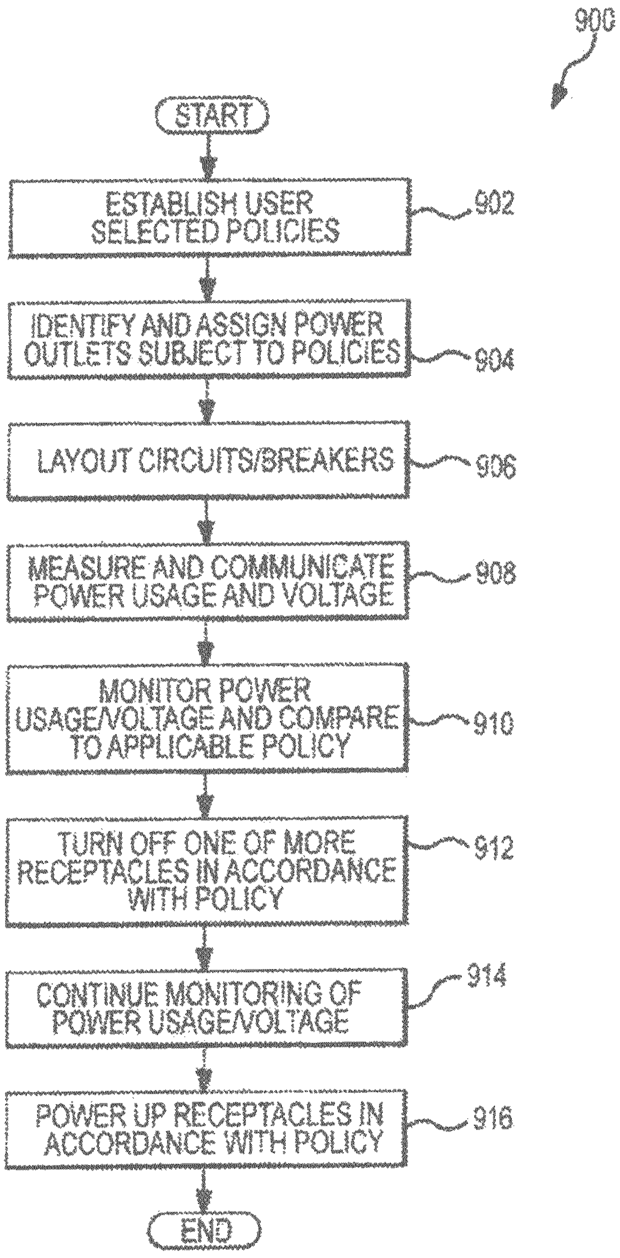
FIG. 9 is a flowchart showing a process for operating a data center according to user policies in accordance with the present invention.

This process 900 can be summarized by reference to the flowchart of FIG. 9. The illustrated process 900 is initiated by establishing (902) user selected policies. These policies may define, for example, a desired priority for powering down (or maintaining power to) pieces of data center equipment and/or a desired sequence for powering up or powering down such equipment. As noted above, policies may also be used to implement a soft circuit breaker. Power outlets subject to such policies are then identified (904). For example, the outlets associated with each piece of equipment may be entered by a user or specific equipment or equipment types may be identified based on a power signature. Virtual Circuits (one or sets of receptacles) and soft circuit breakers (current limits for each Virtual Circuit may then be defined (906) in a manner that allows for enforcement of the policies.

During use, the power usage and voltage associated with individual receptacles, branch circuits or other data center subdivisions can be measured (908) and communicated to a controller responsible for enforcing the policies. The controller can then monitor (910) power usage and voltage and compare those values to an applicable policy. When a policy violation is identified, one or more receptacles may be turned off (912) in accordance with the policy. It will be appreciated that, in certain cases, a policy violation may be addressed in a manner other than by turning off power to the receptacle, e.g., by limiting power to the receptacle or generating an alert.

The controller can then continue (914) monitoring power usage and voltage of the monitored receptacle(s). When the situation that resulted in the policy violation has been alleviated, the receptacle(s) can be powered up (916) in accordance with the policy. For example, the policy may define a priority or sequence for powering up various pieces of equipment associated with various receptacles.

I. Data Center Power Distribution Capacity Upgrade Issues

We are in a time of rapid power capacity growth in data center environments. Current rates of US electrical consumption for data centers have grown from under 1% to being estimated to soon top 3%, a threefold increase. This is driven by a number of factors such as an annual increase factor of 1.2 (which yields a 2× increase every 4 years) in the rate of CPU power consumption and a desire to increase deployment density in the data center to maximize return on investment for the large capital investment a data center requires.

The result of these trends is an increasing number of data centers that do not have enough power delivery capacity to equipment on the floor. Data center managers dread power upgrades because they are very disruptive, requiring hard to negotiate downtime or other painful measures. To upgrade the power distribution in a data center is a difficult task with a lot of issues that must be carefully managed. The power delivery capacity has to be upgraded in two main areas, the core infrastructure (power grid feeds, UPS, battery capacity and Power Distribution Units (PDUs) and the power distribution elements (power whips from the PDU to the racks, either underfloor or overhead). Upgrading the power distribution on the data center floor is the most painful part of the process for several reasons:

1. Space is Tight and "Hot" Conduits Cannot be Reused

The layout of the conduits needed to power a data center occurs in a space constrained environment when it is originally built out. To reconfigure a conduit with upgraded power capacity you must power down all conductors in that conduit, which can be difficult if you are trying to minimize downtime. This is required by the National Electrical Code (NEC). If redundant independent uniform A-B power was not part of the original data center design, (true of the majority of older data centers and almost all co-location data centers) then the original power whips usually must be left in place and new conduits run. This is painful and expensive as underfloor or overhead space is hard to come by and new conduits underfloor take up plenum space, decreasing cooling efficiency. Also working in these spaces is difficult and must be done cautiously, so that the existing infrastructure of network cabling (fiber & copper), power whips, cooling lines, etc. is not damaged. This raises labor cost and therefore expense. The optimum way to upgrade a data center is usually zone by zone, each consisting of a set of racks, but to do this, there has to be space available to clear out a zone before it is upgraded, and that requires a set of equipment shutdowns to do.

2. Multiple Shutdowns are Needed, Increasing Enterprise Service Loss Risk

Each rack that is being upgraded has to be shutdown at some point to cut over to the new upgraded power. Each shutdown has to be scheduled and has its own set of risks. The inter-dependencies of modern IT infrastructures and their applications are quite complex and may not be always fully known. A single piece of equipment may provide an underlying service that nobody realized was dependent on that device. When the power cutover occurs the larger business function that depends on that service stops, and this can be very expensive.

Restarting an IT infrastructure and the applications that run on it successfully, from either a cold-start or intermediate state is very site-specific and chancy. Most enterprise sites never test this aspect of their information systems. To do it right, you have to know the sequence and timing of network, system and application service startup and have tested and insured that it works. In any complex enterprise environment, all services do not usually recover normally if you just power everything up at the same time. Problems also can occur if you power down and power up a particular sub-component. Human intervention and manual reboots or service stop/starts are required to get everything working right. Worse, corruption of service configurations or data occasionally happens. The downtime that occurs when having these types of problems can be significant and is difficult to diagnose and fix.

There are three places that a power distribution system can require upgrades, the PDU, the power whips and the equipment rack or in a data center that uses busbars, two places, the busbars and the equipment rack. The traditional methodology requires that all of these areas be upgraded to increase power distribution capacity. The Zonit system methodology is designed to minimize the number of areas that need to be upgraded and make each upgrade process as easy and non-disruptive as possible.

1. PDU Upgrades

PDU's have two basic power constraints, the total amount of power they can distribute and the number of circuit breakers (stations) that they can have installed. The Zonit system enables a much lower number of higher capacity power whips to support a given number of racks. This in turn minimizes the number of PDU stations that are required, which helps prevent the need for PDU upgrades. If equivalent power capacities for the most common type of EDP equipment are compared, the ratio of 30A (the lowest capacity) three-phase Zonit specification whips to single phase 20A whips is 4 to 1.

2. Whip Upgrades

The Zonit system is designed to avoid or eliminate power whip upgrades as much as possible. If the client deploys 60A capacity whips uniformly at build-out, then the Zonit system supports any power need from 20-60A in three-phase, split-single or single phase, without any power whip changes. If a client deploys a mix of capacities from 30-60A, with 60A Zonit spec whip cabling, then only the PDU circuit breakers need to be changed to upgrade the power whip capacity. If the client needs to upgrade a 30A power whip (with 30A power whip cabling) it is much easier to deploy a new Zonit pre-fabricated power whip than deploy new power conduits, per the traditional method, because the Zonit whips are prefabricated, flexible and do not require any conduit to be installed.

3. Busbar Upgrades

A busbar system presents special challenges when it is upgraded. Simply put it usually powers so many racks that it is very, very painful to upgrade, since there is no way to power down entire the busbar so that only some of the racks it powers are shut down, as can be done with PDU's and power whips. The best option is to deploy busbars in A-B pairs and upgrade one source at a time. The only other way is to disconnect each device or plugstrip from the busbar and move it to another power source. This makes upgrades very hard since downtime is hard to schedule and the difficulty increases with the number of systems that must be brought down at one time. Using the Zonit Power Distribution System with busbars can ease the situation since each ZPDU can be disconnected on either the A and B side and re-connected to another power source independent of the busbar being upgraded as described below in the Zonit Upgrade Methodology.

4. Rack Upgrades

The usual issue in rack power capacity upgrades is the per receptacle power budget. There are too many power hungry servers plugged into each 20A circuit. The Zonit system methodology allows this issue to be easily addressed in several ways.

Upgrade the power input into the ZPDU unit.

The ZPDU unit has a modular input assembly which can be changed as needed. The interior power distribution harness of the unit is rated to the maximum 60A, so it can accept three-phase wye configured power from 30-60A. If the ZPDU is upgraded from 30A input to 60A inputs, the per receptacle power budget is doubled. The Zonit methodology by being designed to deliver three-phase power at the rack and specialize the power type there, allows this type of upgrade to be done. The ZPDU apparatus was designed to take advantage of this feature of the methodology.

Increase the number of 20A circuits per rack.

The Zonit "Double-Shot" power strips are designed to replace the Zonit standard size (66") vertical power strips in exactly the same form factor with the same number of receptacles using the same rack mounting brackets. This doubles the per receptacle power budget in the same form factor. Each Double-Shot power strip plugs into a 20A three-phase L31-20R outlet on the back of the ZPDU. The "Double-Shot" power strips, by plugging in two L21-20P outlets (vs. one L21-20P outlet for the standard strips) deliver twice the power per receptacle. Again, the Zonit power distribution methodology makes this both possible and easy.

The Zonit "Double-Shot" Power Strips can also be provided in a "Single-Shot" variant, which uses the same 2 half-size plug strips that connect together in the same form factor as a single full size vertical 66" plugstrip and use the same mounting brackets. However, the "Single-Shot" variant does not double the power density, the two half size plug strips connect together electrically so that they only have one common input power cord. The advantage of the Single-Shot is that it is easier to install and remove from the rack (like the Double-Shot) because it divides into two half sections. It is easier to put two half-size plugstrip into the rack and then join them rather than try to get a 66" long single plugstrip put in and mounted.

5. Upgrade Rack Power Capacity without any Operational Downtime

The Zonit Upgrade Methodology in accordance with the present invention uses two elements that when combined allow the ZPDU's power capacity to be upgraded in the rack, with minimum disruption. This is combined with an upgrade method based on the Zonit system that allows upgrades to be done with little or no downtime without having to make any other changes to the power whips or PDU (or busbar). Even better, the changes to the deployed elements of the Zonit system minimize the changes to power connections in the rack. The combination of these features makes the Zonit system a very attractive option for data center managers. The elements are the previously described modular A-B power input connector, the second, a design specification of the internal elements of the ZPDU unit (wiring harness and circuit breakers) to support the maximum power capacity the system will deliver. Together this allows the ZPDU to be upgraded to higher power capacity by just changing the modular input cord. No other elements of the Zonit power distribution system (plug strips, Zonit plug adapters or the equipment plugged into them) are affected. The average power available per receptacle is raised, supporting higher power deployment densities. This is a unique feature of the Zonit system, no other rack based power distribution product has this ability.

Power capacity upgrades can be done using the following method with minimal operational impact by utilizing the uniform independent A-B nature of the Zonit power distribution system. Every ZPDU unit is designed to be supplied with identical and independent A-B power. This allows two ways of performing power capacity upgrades in place. All that is necessary for this to happen without downtime, is that the equipment in the racks that are being power upgraded be redundantly connected to the ZPDU that is being upgraded or redundantly connected to two ZPDU units, one on the A power source, the other on the B source. The second option insures redundancy of the ZPDU unit as well as all of the other elements of the power distribution system (power source, power whip, plugstrip or plug adapter. Redundant power connections to equipment in racks is done via one of two methods in the Zonit system.

1. Dual or N+1 Power Supply/Path Devices

This is the normal configuration for enterprise mission critical equipment. It is also the optimum method to deploy the Zonit power distribution system with a pair of A-B power cords connecting each device to the Zonit ZPDU(s) via A-B plug strips or adapters.

2. Single Power Supply/Path Devices

Figure 10:
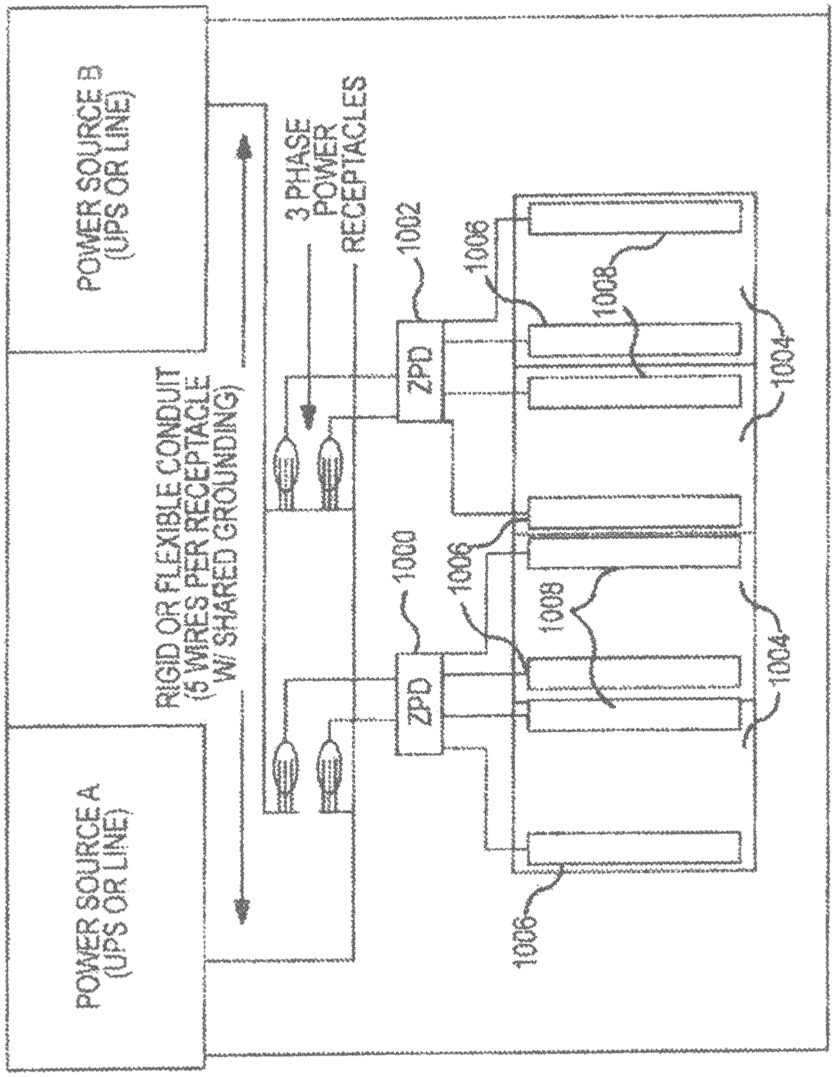
FIGS. 10 and 11 illustrate alternate configurations for providing power from redundant power sources using power distribution units in accordance with the present invention.
Figure 11:
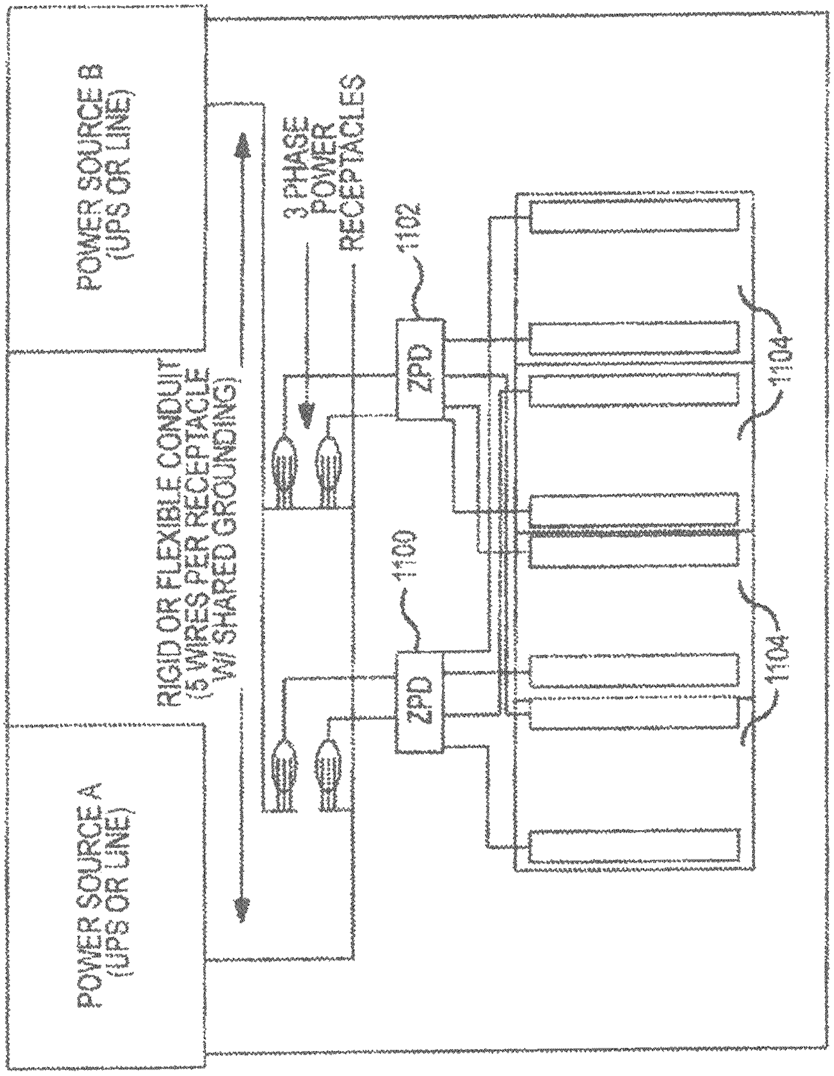

The recommended Zonit deployment configuration for such devices is to use an A-B connected Automatic Transfer Switch (ATS) to insure that the device is always connected to the A-B redundant power sources available from the Zonit ZPDU(s). The ATS is described in PCT Application No. PCT/US2008/057140, which is incorporated herein by reference. Depending on the number of such devices per rack, the ATS can be a 1U form factor device or a Zonit mini-ATS. Connecting the equipment in the rack redundantly to A-B sources allows one of the two power delivery paths (A or B) to be powered down and disconnected. If only one ZPDU 1000 or 1002 powers the rack(s) 1004 being upgraded (see FIG. 10), the A 1006 (or B 1008) side is disconnected the plug strips and or adapters connected to that ZPDU are moved to a temporary ZPDU or unused outlets on other deployed ZPDU units nearby. Then the other side of the ZPDU being upgraded can be powered down, disconnected and the unit upgraded in the rack by changing the power input cord module and the steps reversed. If the power in the rack 1104 is supplied from two different ZPDU units 1100 and 1102 (See FIG. 11), the ZPDU being upgraded can be powered down and disconnected and no equipment will be left un-powered. Then the procedure is even simpler, power down the ZPDU being upgraded, change the modular input cords, upgrade the power whip and re-power up the unit. Very quick and simple compared to the steps needed to upgrade the power distribution in the standard methodology.

Since the Zonit power distribution system is a modular system that powers 1 to 4 racks, this procedure can be repeated over and over again until the entire data center is power capacity upgraded. It breaks down the project into smaller, more manageable steps, each being essentially identical. The uniform modular nature of the Zonit system, enables such a repeatable process ZPDU by ZPDU unit.

So, to summarize the Zonit system method, the in-place power capacity upgrade is accomplished as follows.

1. The equipment in the racks being upgraded is redundantly connected to A-B power sources fed by either one ZPDU (FIG. 10) or two separate ZPDU units (FIG. 11), using the uniform A-B power delivery capability of the Zonit power distribution system. The first method has one ZPDU unit feeding each zone of racks, the second interleaves power from two ZPDU units to insure that each rack has power from two ZPDU units and neither is a single point of failure. Both methods deliver very high reliability since each ZPDU has independent A-B power inputs and independent A-B power paths within each ZPDU unit.
2. The ZPDU unit being upgraded is powered down and disconnected as described. Zonit makes three phase extension cords that are useful for this purpose.

Note: If maximum reliability during the upgrade is needed both the A and B power sources that are disconnected can be reconnected to temporary A-B alternate sources. The uniform nature of the Zonit system makes it easy to find these sources.

3. The ZPDU unit being upgraded is powered down and disconnected as described. Zonit makes three phase extension cords that are useful for this purpose. If maximum reliability during the upgrade is needed both the A and B power sources that are disconnected can be reconnected to temporary A-B alternate sources. The uniform nature of the Zonit system makes it easy to find these sources.
4. The A-B whip pair that normally feeds the ZPDU being upgraded is now powered down and capacity upgraded. This can be done in one of two ways.
   i. If the whip was originally deployed with sufficient gauge wiring to be upgradable (a Zonit recommended practice) the only changes needed to the whips are to change the circuit breakers in the PDU to a higher capacity and the outlet receptacle in the whip to a higher capacity version.
   ii. If the whip needs to be replaced to deliver higher capacity, then a prefabricated Zonit whip using MC cable can be rolled out, routed, tied down and have a new receptacle installed while the old whip is "hot". If spare PDU slots are available, the new whip can use different PDU breaker slots and be made hot in advance of powering down the old whip. This technique reduces the time needed to do the cutover and therefore makes the risk of running on only one power source (A or B) potentially acceptable if only a very short time window is needed to power down the old whip, disconnect the modular input to the ZPDU and then attach new modular input cords from the new whip and power it and the ZPDU up. This procedure can be done in a matter of minutes (inside the battery reserve time of a UPS) and therefore is very unlikely to cause a power outage due to being on one power source for a short time period. The fewer steps that are needed and the more repeatable they are delivers the most reliable result, which is crucial for data center power upgrades.
5. If busbars are in use to power the ZPDU units, then all of the ZPDU units connected to a single busbar can be moved to alternate power sources as described above. The busbar can then be powered down and upgraded.

Figure 12:
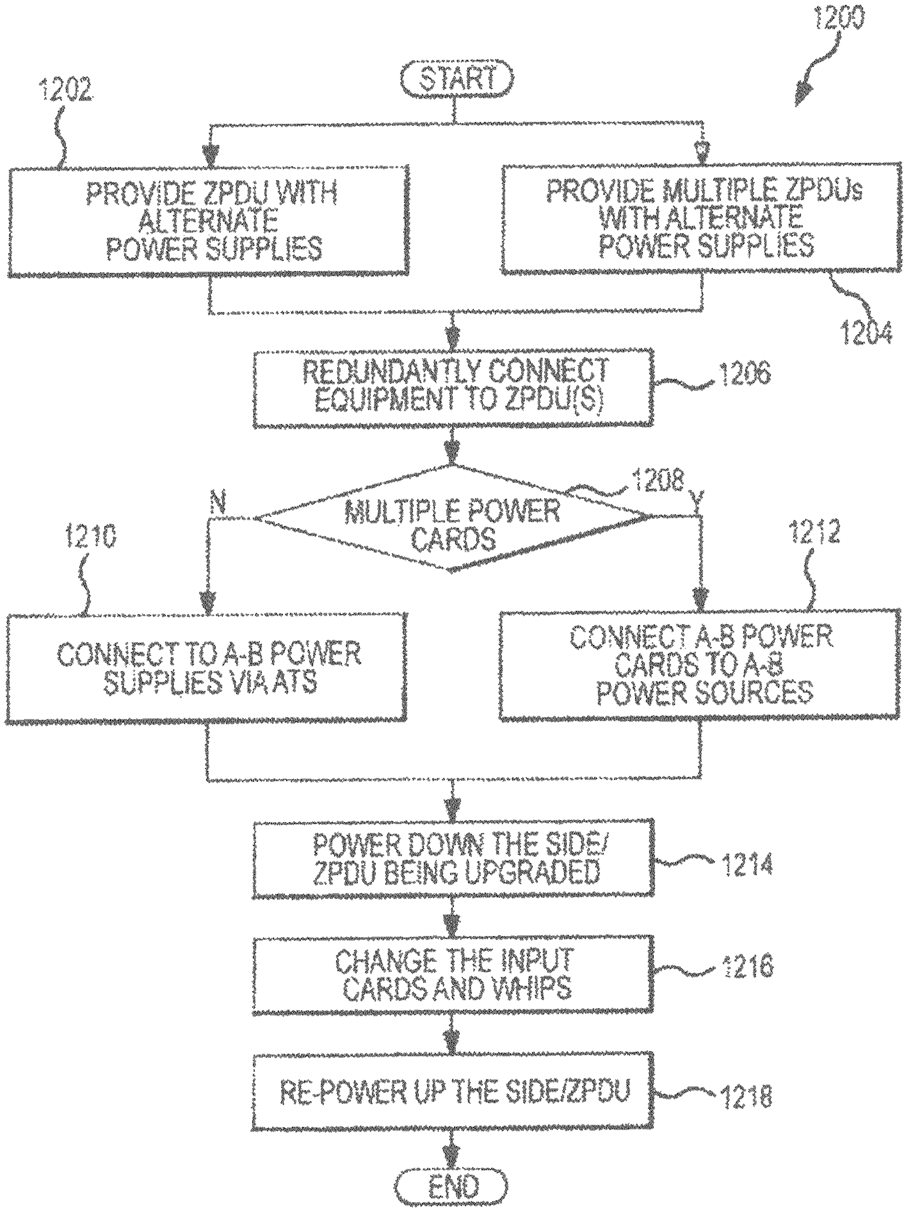
FIG. 12 is a flowchart showing a process for upgrading or changing a power source without interrupting power to data center equipment in accordance with the present invention.

FIG. 12 provides a flowchart of this process. The illustrated process 1200 may involve providing (1202) a single ZPDU with alternate power supplies for powering a piece of equipment or providing (1204) multiple interleaved ZPDUs with alternate power supplies. The equipment is then redundantly connected (1206) to the alternate power supplies via a single or multiple ZPDUs. In this regard, the manner of making this redundant connection depends on whether the equipment includes two power cords (1208). If so, the power cords may be connected (1212) to receptacles associated with different power supplies within a single or multiple power strips. If the equipment includes only a single power cord, the equipment may be connected (1210) to receptacles associated with different sources via an automatic transfer switch as described above.

Where the equipment is thus redundantly connected to multiple power sources, an upgrade can be initiated by powering down (1214) the side of the ZPDU being upgraded. The upgrade can then be executed by, for example, changing (1216) the input cords and whips being upgraded. The side of the ZPDU that has been upgraded can then be repowered (1218).

J. Data Center Power Quality Monitoring and Debugging Issues

Power quality is crucial in a data center or co-location facility. There are many potential problems in data center power distribution that can affect power quality. One is the large scope of the problem. A typical data center has many branch circuits which can number into the thousands. The number of receptacles and connected devices can number into the tens of thousands. These numbers can present significant problems when trying to find and isolate power problems. Traditional power quality measuring instruments are usually limited to 8 channels (4 power, 4 voltage). This limits the number of points in the power distribution topology that can be sampled simultaneously and that can make it very difficult to find certain kinds of power problems such as ground loops that can affect a wide number of branch circuits.

The Zonit Power Distribution Methodology solves these power quality management issues in a unique way. The Zonit system method is to implement power quality monitoring abilities on all Zonit G2 ZPDU units and Zonit G2 intelligent receptacles and/or adapters. The G2 ZPDU units can monitor power and voltage on their A-B branch circuit inputs and each intelligent adapter and all intelligent plug-strip receptacles. These capabilities offer the user an array of standardized, real time sensors that cover the entire data center power distribution system, a unique feature. The advantages of a standardized sensor array embedded in the power distribution system vs. the traditional stand-alone test instrument are many.

1. The standardized sensors are all the same for the same type of sensor location (branch circuit, adapter, plug-strip) and the sensor location, geometry and associated circuitry are the same for each location type. Since they read the current and voltage waveforms with the same hardware and it is uniform, the readings between like types of sensors can be directly compared and all sensor readings can be normalized so that the variables that are really changing are isolated and the true amount of change can be accurately measured. This is especially valuable when trying to isolate electrical problems that can be seen over large parts of the data center, and therefore only vary by a small amount when measured from different locations in the topology of the power distribution system.

Zonit has developed a unique sensor apparatus for measuring power current and voltage levels in an economical, space efficient and standardized way. We do this by use of Wire-wrapped Relays for current sensing w/Form B relays. Each Zonit intelligent receptacle uses Form B relays to control power to the receptacle. Current sensing is a feature that is needed in a variety of applications, such as the Zonit Power Distribution System, for instance. In current practice it is done via a number of ways, Hall effect sensors, current doughnut sensors and other means. Form B relays are a type that require energization of the relay to open the circuit that they are controlling the current path of. The method we have invented for this need is novel in that we take an existing relay, with an electromagnetic core, and wrap a conductor (once or as many turns as are needed by the application) around the core (either around the existing external packaging of the assembly or around a guide or other directing mechanism as needed) which provides a current loop sensor. The accuracy of the loop is either sufficient without calibration or if not, calibration is obtained by applying a known load to the assembly during manufacturing or during an auto-calibration routine during startup. This standardizes the current loop sensor. The advantages of this method vs. traditional techniques are as follows:

a. Lower cost.
      This method eliminates the traditional need for pre-calibrated current measuring devices to be used.
   b. Flexibility of implementation.
      Physical routing of the wire loop(s) can be varied as needed to maximize accuracy and/or space availability to meet the needs of the application.
   c. Can sense current when relay is not energized, e.g., circuit is closed and current path through the relay contacts is active.

Basically, the method leverages the nature of the Form B relay because that form only uses the electromagnetic core when the controlled circuit is being held open and no current is flowing. When the relay is not energized the circuit is closed and the core can be used to sense the current in conjunction w/the integrated conductor loop(s).

The traditional way of measuring power quality requires that multiple measurements be taken wherever the instrument can be inserted into the power distribution system which can require equipment shutdowns to place the sensor in-line) or wherever inductive sensors can be placed, which can vary and therefore introduce a variable which can be hard to compensate for in the measurements taken. The Zonit system power quality measuring methods eliminate these problems.

2. Problems that are time variable and transient are very hard to isolate with traditional test equipment, since the equipment must be running and monitoring the right locations in the power distribution topology to detect the problem. The Zonit system monitoring methodology easily finds such problems because it can monitor the entire power distribution topology continuously and compare reference or historical data sets to current data sets.

This offers four types of power monitoring that are unique in data center power distribution systems.

1. Real-time power quality monitoring simultaneously for a large set of selected points (branch circuit(s), receptacle(s), adapter(s)) in the power distribution topology. Each ZPDU can monitor both of its A-B source branch circuits, and all connected Zonit G2 intelligent receptacles and/or intelligent adapters.

2. Post analysis of the data set. This is done at the Zonit Power Management Station, which receives the data for the chosen monitoring points and then performs analysis on the data set. The data set can be stored for later further analysis or comparative analysis. As noted above, in another embodiment of the invention, the processing and analysis can be done via distributed processing on the control modules or done on both the Zonit Power Management Station and the distributed set of control modules. The Zonit Power Management Station can act as a high performance compute cluster controller of the distributed set of control modules in this embodiment.
3. Comparative analysis of the data set vs. reference values or previously stored data sets.
4. Analysis of any or all powered devices to watch for power supply problems and predict failures.

The Zonit system power quality monitoring abilities adds an additional feature in the area of receptacle availability and inventory. The power quality monitoring hardware can be used to inject a suitable low level signal into any power outlets or receptacles that are currently not drawing any measurable power. This signal will travel up any attached power cord over a minimum length (about 2 inches) and then reflect back to the receptacle when it reaches the end of the power cord. This reflection can be sensed, which determines that the receptacle or outlet has a power cord plugged into it. This capability can be used to keep a real time inventory of the number of actual available (vs. occupied but not active) receptacles in the Zonit power distribution system. This is useful information for remote data center operators and data center managers. An alternative method is to install an optical sensor that senses if the receptacle is occupied. Another method is to place an appropriate located microswitch to detect when the receptacle is occupied. All of these methods can be used to implement this functionality.

Figure 13:
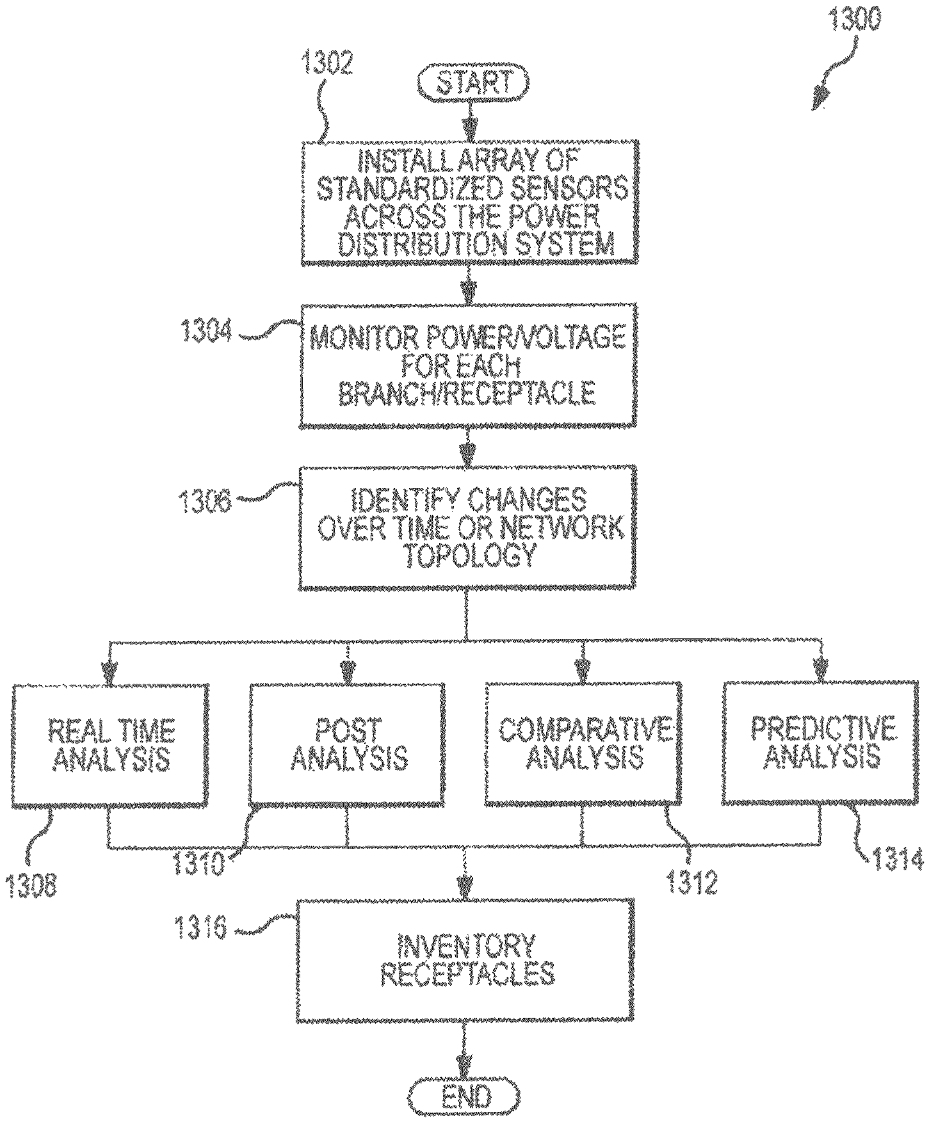
FIG. 13 is a flowchart showing a process for monitoring data center equipment in accordance with the present invention.

FIG. 13 provides a flowchart of this process. The illustrated process 1300 is initiated by installing (1302) an array of standardized sensors across the power distribution system. The outputs from the sensors can then be used to monitor (1314) the power and voltage for each monitored branch or receptacle of the data center. A monitoring controller can then identify (1306) changes over time or network topology. This monitoring can be used for real time analysis (1308) post-analysis (1310) based on accumulated data, comparative analysis (1312) based on comparisons of values over time or different areas of the data center topology, and/or predictive analysis (1314) to identify potential malfunctions or errors. This process can also be used to inventory (1316) receptacles to identify which receptacles are and are not in use, as described above. The data center manager is usually responsible for power, cooling, fire suppression and physical security in the data center. This is referenced to herein as the data center environment. Other Information Technology (IT) groups usually monitor and run the higher level functions such as network connectivity, servers, storage, databases, applications, etc. that use the EDP equipment located in the data center.

The data center manager does not only want to know what is going on in the data center environment as a whole, he wants to subdivide the status into sets of racks or individual racks (especially in a co-location facility) and he wants to group the information into meta-groups that represent information he needs, such as all of the racks occupied by a particular client or group, all racks with storage devices, etc.

Existing data center environment monitoring products suffer from the problem that they do not have known, uniform topologies for how they distribute their environmental and security sensors and therefore each sensor must be manually addressed if the monitoring product is to build a picture of what is happening at any sub-level of the data center, such as the rack or technical political subdivision. This is clumsy and requires more work by the data center staff. Also, it is inflexible, as sensors must in essence be readdressed if they move.

The Zonit Power Distribution Methodology solves these data center environmental monitoring and management issues in a unique way. The Zonit system method is to use the known topology associations of the Zonit power distribution system (each ZPDU powers a given set of racks) and the power quality monitoring features (a power fingerprint can be developed to identify a particular piece of equipment) to associate sensors with racks and equipment with receptacles and/or adapters. In the Zonit system, provisions are made to connect sensors to ZPDU units. This associates sensors to a set of racks, and if the connections are made on a per plugstrip or adapter basis to a particular rack. Once the data center staff identify the rack location of any piece of equipment plugged into a particular receptacle to the Zonit power monitoring station database, the Zonit system can automatically label every receptacle on that plugstrip as being in that rack and every sensor plugged into that plugstrip as being in that rack. This methodology can be used in the same way for a set of racks which are powered by a ZPDU (in the interleave method, racks are associated with whichever ZPDU provides the A side power), to associate all of the sensors that plug into that ZPDU with that set of racks. In another embodiment of this invention, if a control module is used to monitor more than one ZPDU (or other Zonit devices or other 3rd party devices) the control module can be configured to store which sets of racks (or sub-racks, down to a set of RU locations if needed and/or individual devices such as IT equipment with specific power, cooling environmental, security characteristics and/or policies) it is responsible for and associated to. It can be associated to multiple sets of racks and store those associations. It can also keep one or more lists or other data structures of associations of the FRU modules that it is managing. That can be generated when a control module is first connected to one or more communication mechanisms that allows communications with a set of FRU modules. The FRU module can have a factory ID code which would normally be static, such as a serial number. It can also have a control module association code (or additional codes, for other purposes such as a redundant control module function or virtual circuit identification or client association, other functions, etc.), any of which can be changed. This information can also be managed at an upper level of the hierarchy, for example at the Zonit Power Management Station, where a unified view of all FRU module to control module associations would be available and could be managed and used to advantage.

A unique capability for tracking equipment moves and automatically updating the equipment database also exists using the Zonit system methodology and capabilities. If a piece of equipment is to be moved within the data center it is marked for movement. A power "fingerprint" is taken of the equipment, which can conveniently done via the Zonit Web interface. The equipment is then shutdown, moved and re-powered. The Zonit system will detect the equipment, and then request confirmation of the move via the Web interface. At that point the Zonit power management station database will be updated to reflect the move and all associations in the database for that piece of equipment will be transferred as part the move. The power management station can then update the involved control modules informing them of the move and change in associations as part of the move process.

Figure 14:
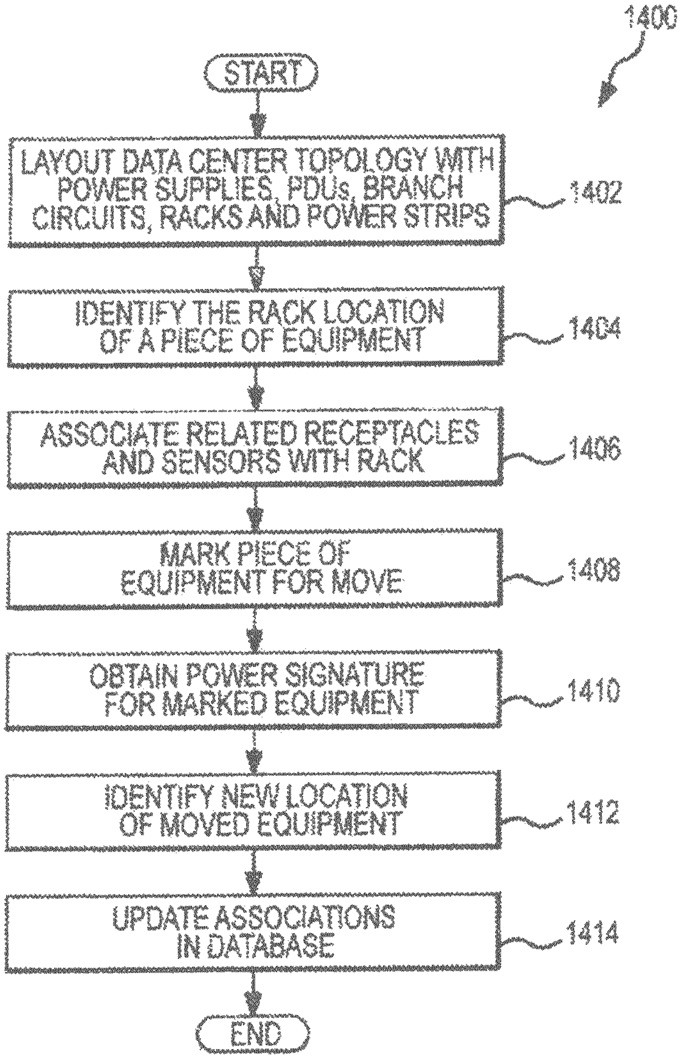
FIG. 14 is a flow chart illustrating a process for tracking equipment locations in a data center in accordance with the present invention.

FIG. 14 provides a flow chart of this process. The illustrated process 1400 is initiated by laying out (1402) the data center topology with power supplies, PDUs, branch circuits, racks and power strips. The rack location of a piece of equipment can then be identified (1404). In this regard, the locations of pieces of equipment may be entered by a user or the locations may be determined by recognizing the power fingerprint of a piece of equipment or type of equipment. Once a piece of equipment has been located, related receptacles and sensors may be associated (1406) with the same rack.

When it is desired or necessary to move a piece of equipment, that piece of equipment may be marked (1408) for the move. A power signature may then be obtained (1410) for the marked equipment. After the piece of equipment has been moved, the new location may be identified (1412) by recognizing a receptacle associated with the power signature. The equipment associations in a database can then be updated (1414) based on the identified new location of the equipment.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such or other embodiments and with various modifications required by the particular application(s) or use(s) of the present invention. It is intended that the appended claims be construed to include alternative embodiments to the extent permitted by the prior art.

What is claimed is:

1. A power cord apparatus, comprising:

a primary power cord for connecting to a power port of a power source;

at least one junction assembly for electronically interconnecting said primary power cord to each power cord of a set of power cords, wherein:

each power cord of the set of power cords is electrically connected in a serial configuration with respect to the primary power cord;

the at least one junction assembly comprises:

a first junction housing supporting a first junction; and a second junction housing supporting a second junction, wherein the first and second junction housings are fixed to each respective power cord of the set of power cords; and said set of power cords includes a flexible power cord for interconnecting the first and second junction housings; and a support structure between said first and second junction housings, said support structure having a longitudinal dimension no greater than a length of said flexible power cord, wherein said support structure is configured to:

support and restrain movement of the at least one junction assembly and allow mounting of the junction assembly along a longitudinal axis on a server rack in a data center.

2. An apparatus as set forth in claim 1, wherein said junction assembly includes at least one mini-junction assembly having a maximum pin spacing dimension of no more than about 12 mm.

3. An apparatus as set forth in claim 2, wherein said maximum pin spacing is no more than about 10 mm.

4. An apparatus as set forth in claim 2, wherein said mini-junction assembly is a female junction assembly having recesses for receiving pins of a male coupler and said maximum pin dimension is defined by two of said recesses.

5. An apparatus as set forth in claim 2, further comprising a power connector assembly for connecting said mini-junction assembly to a power port of a piece of electronic equipment, said power port having a maximum pin spacing of greater than 12 mm.

6. An apparatus as set forth in claim 5, wherein said junction assembly comprises at least one distribution power cord leg.

7. A method for using a power cord apparatus, comprising:

providing a power cord apparatus including a set of power cords and at least one junction assembly for electronically interconnecting each power cord of the set of power cords, wherein:

said junction assembly comprises:

a first junction housing supporting a first junction, a second junction housing supporting a second junction, and said set of power cords includes a flexible power cord for interconnecting said first and second junction housings, and said first and second junction housings interconnect each power cord of the set of power cords; and each of the first and second junction housings are fixed to each respective power cord of the set of power cords;

providing a support structure between said first and second junction housings, said support structure having a longitudinal dimension no greater than a length of said flexible power cord, wherein said support structure is operable for supporting and restraining movement of said junction assembly and for allowing mounting of the junction assembly along a longitudinal axis on a server rack in a data center;

using said support structure for mounting said junction assembly on said a server rack;

connecting said power cord to a power port of a power source; and connecting at least some of a second power cord portion and a third power cord portion to electronic equipment in said server rack in a data center.

8. A method as set forth in claim 7, wherein said junction assembly includes at least one mini-junction assembly having a maximum pin spacing dimension of no more than about 12 mm.

9. A method as set forth in claim 8, wherein said mini-junction assembly is a female junction assembly having recesses for receiving pins of a male junction assembly and said maximum pin dimension is defined by two of said recesses.

10. A method as set forth in claim 8, further comprising a power connecter assembly for connecting said mini-junction assembly to a power port of a piece of electronic equipment, said power port having a maximum pin spacing of greater than 12 mm.

11. A method as set forth in claim 10, wherein said junction assembly comprises at least one distribution power cord leg.

* * * * *